United States Patent

(12) Saegusa et al.

(10) Patent No.: US 9,152,048 B2
(45) Date of Patent: Oct. 6, 2015

(54) ACTINIC-RAY- OR RADIATION-SENSITIVE RESIN COMPOSITION AND METHOD OF FORMING PATTERN USING THE COMPOSITION

(75) Inventors: Hiroshi Saegusa, Shizuoka (JP); Kaoru Iwato, Shizuoka (JP); Yusuke Iizuka, Shizuoka (JP); Kousuke Koshijima, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 272 days.

(21) Appl. No.: 12/905,742

(22) Filed: Oct. 15, 2010

(65) Prior Publication Data

US 2011/0091809 A1    Apr. 21, 2011

(30) Foreign Application Priority Data

Oct. 15, 2009    (JP) ................. 2009-238284

(51) Int. Cl.
  G03F 7/004   (2006.01)
  G03F 7/38    (2006.01)
  G03F 7/039   (2006.01)
  G03F 7/075   (2006.01)
  G03F 7/20    (2006.01)

(52) U.S. Cl.
  CPC ............ G03F 7/0397 (2013.01); G03F 7/0045 (2013.01); G03F 7/0046 (2013.01); G03F 7/0758 (2013.01); G03F 7/2041 (2013.01); G03F 7/38 (2013.01)

(58) Field of Classification Search
  CPC ....... G03F 7/0397; G03F 7/2041; G03F 7/38; G03F 7/0758
  USPC ............ 430/270.1–288.1, 905, 910, 326, 330
  See application file for complete search history.

(56) References Cited

U.S. PATENT DOCUMENTS

| 7,157,207 B2 * | 1/2007 | Funatsu et al. ............ 430/270.1 |
| 7,423,102 B2 * | 9/2008 | Lee et al. .................... 526/200 |
| 7,666,967 B2 | 2/2010 | Harada et al. |
| 7,678,530 B2 | 3/2010 | Hasegawa et al. |
| 2003/0170561 A1 | 9/2003 | Iwasawa et al. |
| 2004/0214951 A1 * | 10/2004 | Kennedy et al. ................ 525/90 |
| 2005/0058940 A1 * | 3/2005 | Schadt et al. ............. 430/270.1 |
| 2007/0224538 A1 * | 9/2007 | Hada et al. ................. 430/270.1 |
| 2008/0248421 A1 * | 10/2008 | Fukuhara et al. .......... 430/281.1 |
| 2008/0305433 A1 | 12/2008 | Kanda et al. |
| 2010/0028804 A1 * | 2/2010 | Iwato et al. ................ 430/270.1 |
| 2010/0055606 A1 * | 3/2010 | Mimura et al. ............ 430/270.1 |
| 2010/0248144 A1 * | 9/2010 | Iwai et al. .................. 430/285.1 |

FOREIGN PATENT DOCUMENTS

| EP | 1 720 072 A1 | 11/2006 |
| JP | 2003-173027 A | 6/2003 |
| JP | 2004-300230 A | 10/2004 |
| JP | 2005-221714 A | 8/2005 |
| JP | 2006-309245 A | 11/2006 |
| JP | 2007-153982 A | 6/2007 |
| JP | 2007-182488 A | 7/2007 |
| JP | 2007-304537 A | 11/2007 |
| WO | 2004/076535 A1 | 9/2004 |
| WO | 2008/111251 A1 | 9/2008 |

OTHER PUBLICATIONS

Japanese Office Action dated Feb. 4, 2014, issued in application No. 2010-230645.

* cited by examiner

*Primary Examiner* — John S Chu
(74) *Attorney, Agent, or Firm* — Sughrue Mion, PLLC

(57) ABSTRACT

According to one embodiment, an actinic-ray- or radiation-sensitive resin composition includes (A) a resin that when acted on by an acid, increases its solubility in an alkali developer, (B) a compound that when exposed to actinic rays or radiation, generates an acid, and (C) a resin containing at least one group selected from among the following groups (x) to (z) and further containing at least either a fluorine atom or a silicon atom, in which three or more polymer chains are contained through at least one branch point, (x) an alkali-soluble group, (y) a group that when acted on by an alkali developer, is decomposed to thereby increase its solubility in the alkali developer, and (z) a group that when acted on by an acid, is decomposed to thereby increase its solubility in an alkali developer.

12 Claims, No Drawings

ACTINIC-RAY- OR RADIATION-SENSITIVE RESIN COMPOSITION AND METHOD OF FORMING PATTERN USING THE COMPOSITION

CROSS-REFERENCE TO RELATED APPLICATIONS

This application is based upon and claims the benefit of priority from prior Japanese Patent Application No. 2009-238284, filed Oct. 15, 2009, the entire contents of which are incorporated herein by reference.

BACKGROUND OF THE INVENTION

1. Field of the Invention

The present invention relates to an actinic-ray- or radiation-sensitive resin composition for use in a lithography operation employed in a semiconductor production process for an IC or the like, production of a circuit board for a liquid crystal, a thermal head or the like and other photofabrication, and relates to a method of forming a pattern using the composition. More particularly, the present invention is concerned with an actinic-ray- or radiation-sensitive resin composition that is suitable for exposure using a liquid-immersion projection exposure apparatus in which a far ultraviolet light of wavelength 300 nm or shorter is employed as a light source and with a method of forming a pattern using the composition.

2. Description of the Related Art

In accordance with the miniaturization of semiconductor elements, the wavelength shortening of the exposure light source and the realization of high numerical apertures (high NA) for projector lenses have been advanced. For achieving the enhancement of resolving power by further wavelength shortening, it is heretofore known to employ a method in which the space between a projector lens and a sample is filled with a liquid of high refractive index (hereinafter also referred to as an "immersion liquid"), generally called a liquid-immersion method. The liquid-immersion method is effective in all pattern configurations. Further, this can be combined with a super-resolution technology, such as a phase shift method or a modified illumination method, now under study.

Since the emergence of the resist for a KrF excimer laser (248 nm), it has been of common practice to, in order to compensate for any sensitivity deterioration caused by light absorption, employ an image forming method through chemical amplification as a resist image forming method. Brief description of a positive image forming method through chemical amplification is given below by way of example. Upon exposure, an acid generator is decomposed in exposed areas to thereby generate an acid. At the bake after the exposure (Post-Exposure Bake: PEB), the generated acid is used as a reaction catalyst so that an alkali-insoluble group is converted to an alkali-soluble group. Thereafter, alkali development is carried out to thereby remove the exposed areas. Thus, the relevant image forming method is provided.

The resist for an ArF excimer laser (193 nm) utilizing this chemical amplification mechanism is now becoming mainstream. However, in the liquid-immersion exposure, the resist has posed not only the problem of pattern collapse such that a formed line pattern collapses to thereby cause a defect in device production but also the problem of line edge roughness involving roughening of pattern side walls.

Moreover, it is pointed out that when such a chemical amplification resist is applied to liquid-immersion exposure, as the resist layer is brought into contact with the immersion liquid during the exposure, not only would the resist layer suffer a property alteration but also components having an unfavorable influence on the immersion liquid would leach from the resist layer. In this connection, patent references 1 to 4 describe examples of inhibiting the leaching by the addition of a resin containing a silicon atom or a fluorine atom.

Further in the liquid-immersion exposure process, in the event of exposure using a scan type liquid-immersion exposure machine, the exposure speed is decreased when the immersion liquid fails to move while tracking a moving lens. This would negatively affect productivity. When the immersion liquid is water, it is preferred for the resist film to be hydrophobic from the viewpoint of superiority in water tracking properties.

However, even when the liquid-immersion exposure is carried out using the above-mentioned technology, it is likely to encounter development defects, known as blob defects, and scumming. Thus, overcoming these problems is demanded.

[Patent reference 1] Jpn. Pat. Appln. KOKAI Publication No. (hereinafter referred to as JP-A-2006-309245),
[Patent reference 2] JP-A-2007-304537,
[Patent reference 3] JP-A-2007-182488, and
[Patent reference 4] JP-A-2007-153982.

BRIEF SUMMARY OF THE INVENTION

It is an object of the present invention to provide an actinic-ray- or radiation-sensitive resin composition that is enhanced in the line edge roughness, blob defects and scumming and that can form a pattern which ensures favorable immersion-liquid tracking property in the stage of liquid-immersion exposure. It is another object of the present invention to provide a method of forming a pattern using the resin composition.

According to an aspect of embodiments, the present invention is as described below.

(1) An actinic-ray- or radiation-sensitive resin composition comprising:

(A) a resin that when acted on by an acid, increases its solubility in an alkali developer, (B) a compound that when exposed to actinic rays or radiation, generates an acid, and (C) a resin containing at least one group selected from among the following groups (x) to (z) and further containing at least either a fluorine atom or a silicon atom, in which three or more polymer chains are contained through at least one branch point, (x) an alkali-soluble group, (y) a group that when acted on by an alkali developer, is decomposed to thereby increase its solubility in the alkali developer, and (z) a group that when acted on by an acid, is decomposed to thereby increase its solubility in an alkali developer.

(2) The actinic-ray- or radiation-sensitive resin composition according to item (1), wherein the content ratio of the resin (C) is in the range of 0.01 to 20 mass % based on the total solids of the composition.

(3) The actinic-ray- or radiation-sensitive resin composition according to item (2), wherein the content ratio of the resin (C) is in the range of 0.1 to 10 mass % based on the total solids of the composition.

(4) The actinic-ray- or radiation-sensitive resin composition according to any of items (1) to (3), wherein the resin (C) comprises a repeating unit containing at least one of groups of any of general formulae (F2) to (F4) and general formulae (CS-1) to (CS-3):

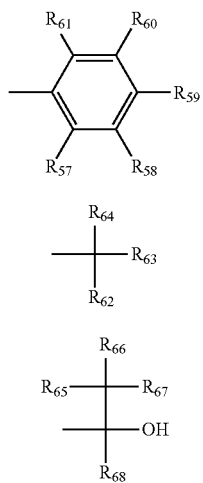

in general formulae (F2) to (F4), each of $R_{57}$ to $R_{68}$ independently represents a hydrogen atom, a fluorine atom or an alkyl group, provided that at least one among $R_{57}$ to $R_{61}$, among $R_{62}$ to $R_{64}$ and among $R_{65}$ to $R_{68}$ is a fluorine atom or an alkyl group substituted with at least one fluorine atom, and provided that $R_{62}$ and $R_{63}$ may be linked to each other to thereby form a ring, and

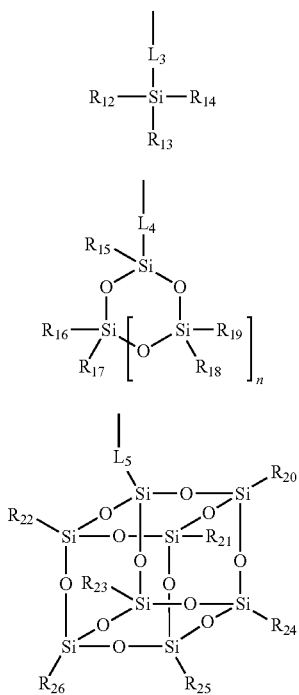

in general formulae (CS-1) to (CS-3), each of $R_{12}$ to $R_{26}$ independently represents an alkyl group or a cycloalkyl group, each of $L_3$ to $L_5$ independently represents a single bond or a bivalent connecting group, and n is an integer of 1 to 5.

(5) The actinic-ray- or radiation-sensitive resin composition according to any of items (1) to (4), wherein the resin (C) comprises a repeating unit containing in its side chain a group (y) that when acted on by an alkali developer, is decomposed to thereby increase its solubility in the alkali developer, which side chain contains at least either a fluorine atom or a silicon atom.

(6) The actinic-ray- or radiation-sensitive resin composition according to any of items (1) to (5), wherein the resin (C) is a comb polymer.

(7) The actinic-ray- or radiation-sensitive resin composition according to any of items (1) to (5), wherein the resin (C) is a star polymer.

(8) The actinic-ray- or radiation-sensitive resin composition according to any of items (1) to (7), wherein the resin (A) comprises a repeating unit containing a lactone structure.

(9) The actinic-ray- or radiation-sensitive resin composition according to item (8), wherein the resin (A) comprises at least any of repeating units of general formula (1) as the repeating unit containing a lactone structure,

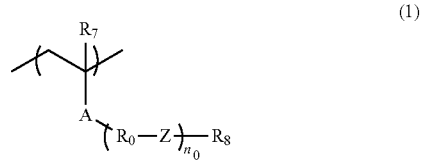

in which

A represents an ester bond (—COO—) or an amido bond (—CONH—), $R_0$ represents an alkylene group, a cycloalkylene group or a combination thereof, provided that a plurality of $R^0$'s may be identical to or different from each other, Z represents an ether bond, an ester bond, a carbonyl bond, an amido bond, a urethane bond or a urea bond, provided that a plurality of Z's may be identical to or different from each other, $R_8$ represents a monovalent organic group with a lactone structure, $n_0$ is the number of repetitions of the structure of the formula —$R_0$—Z—, being an integer of 1 to 5, and $R_7$ represents a hydrogen atom, a halogen atom or an alkyl group.

(10) The actinic-ray- or radiation-sensitive resin composition according to any of items (1) to (9), which produces a film that before exposure, exhibits a receding contact angle of 70° or greater with water.

(11) A resist film produced from the actinic-ray- or radiation-sensitive resin composition according to any of items (1) to (10).

(12) A method of forming a pattern, comprising forming the actinic-ray- or radiation-sensitive resin composition of any of items (1) to (10) into a film, exposing the film and developing the exposed film.

(13) The method of forming a pattern according to item (12), wherein the exposure is carried out by a liquid immersion exposure.

By virtue of the present invention, there can be provided an actinic-ray- or radiation-sensitive resin composition that is enhanced in the line edge roughness, blob defects and scumming and that can form a pattern which ensures favorable immersion-liquid tracking property in the stage of liquid-immersion exposure and further provided a method of forming a pattern using the composition.

DETAILED DESCRIPTION OF THE INVENTION

The present invention will be described in detail below.

With respect to the expression of a group (atomic group) used in this specification, the expression even when there is no mention of "substituted and unsubstituted" encompasses groups not only having no substituent but also having substituents. For example, the expression "alkyl groups" encompasses not only alkyls having no substituent (unsubstituted alkyls) but also alkyls having substituents (substituted alkyls).

[1] Resin (C)

The actinic-ray- or radiation-sensitive resin composition of the present invention comprises the resin (C) containing at least one group selected from among the following groups (x) to (z) and further containing at least either a fluorine atom or a silicon atom, in which three or more polymer chains are contained through at least one branch point, (x) an alkali-soluble group, (y) a group that when acted on by an alkali developer, is decomposed to thereby increase its solubility in the alkali developer, and (z) a group that when acted on by an acid, is decomposed to thereby increase its solubility in an alkali developer.

The fluorine atom or silicon atom contained in the resin (C) may be introduced, or may not be introduced, in the repeating unit containing a group selected from among the groups (x) to (z). Also, the fluorine atom or silicon atom contained in the resin (C) may be introduced in the principal chain of the resin or, as a substituent, in a side chain thereof.

First, the repeating unit (c1) containing at least either a fluorine atom or a silicon atom will be described below.

It is preferred for the repeating unit containing a fluorine atom to be a repeating unit containing, as a partial structure, an alkyl group having a fluorine atom, a cycloalkyl group having a fluorine atom or an aryl group having a fluorine atom.

The alkyl group containing a fluorine atom (preferably having 1 to 10 carbon atoms, more preferably 1 to 4 carbon atoms) is a linear or branched alkyl group having at least one hydrogen atom thereof substituted with a fluorine atom. Further, other substituents may be possessed.

The cycloalkyl group containing a fluorine atom is a cycloalkyl group of a single ring or multiple rings having at least one hydrogen atom thereof substituted with a fluorine atom. Further, other substituents may be contained.

As the aryl group containing a fluorine atom, there can be mentioned one having at least one hydrogen atom of an aryl group, such as a phenyl or naphthyl group, substituted with a fluorine atom. Further, other substituents may be contained.

As preferred alkyl groups containing a fluorine atom, cycloalkyl groups containing a fluorine atom and aryl groups containing a fluorine atom, there can be mentioned groups of the following general formulae (F2) to (F4), which however in no way limit the scope of the present invention.

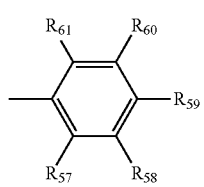
(F2)

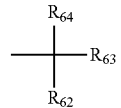
(F3)

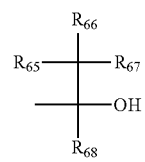
(F4)

In general formulae (F2) to (F4), each of $R_{57}$ to $R_{68}$ independently represents a hydrogen atom, a fluorine atom or a linear or branched alkyl group, provided that at least one among $R_{57}$ to $R_{61}$, among $R_{62}$ to $R_{64}$ and among $R_{65}$ to $R_{68}$ is a fluorine atom or an alkyl group (preferably having 1 to 4 carbon atoms) having at least one hydrogen atom thereof substituted with a fluorine atom.

It is preferred that all of $R_{57}$-$R_{61}$ and $R_{65}$-$R_{67}$ represent fluorine atoms. Each of $R_{62}$, $R_{63}$ and $R_{68}$ preferably represents a fluoroalkyl group (preferably having 1 to 4 carbon atoms), more preferably a perfluoroalkyl group having 1 to 4 carbon atoms. When each of $R_{62}$ and $R_{63}$ represents a perfluoroalkyl group, it is preferred for $R_{64}$ to represent a hydrogen atom. $R_{62}$ and $R_{63}$ may be bonded with each other to thereby form a ring.

Specific examples of the groups of the general formula (F2) include a p-fluorophenyl group, a pentafluorophenyl group, a 3,5-di(trifluoromethyl)phenyl group and the like.

Specific examples of the groups of the general formula (F3) include a trifluoromethyl group, a heptafluorobutyl group, a hexafluoroisopropyl group, a heptafluoroisopropyl group, a hexafluoro(2-methyl)isopropyl group, a nonafluorobutyl group, an octafluoroisobutyl group, a nonafluorohexyl group, a nonafluoro-t-butyl group, a perfluoroisopentyl group, a perfluorooctyl group, a perfluoro(trimethyl)hexyl group, a 2,2,3,3-tetrafluorocyclobutyl group, a perfluorocyclohexyl group and the like. Of these, a hexafluoroisopropyl group, a heptafluoroisopropyl group, a hexafluoro(2-methyl)isopropyl group, an octafluoroisobutyl group, a nonafluoro-t-butyl group and a perfluoroisopentyl group are preferred. A hexafluoroisopropyl group and a heptafluoroisopropyl group are more preferred.

Specific examples of the groups of the general formula (F4) include —C(CF$_3$)$_2$OH, —C(C$_2$F$_5$)$_2$OH, —C(CF$_3$)(CF$_3$)OH, —CH(CF$_3$)OH and the like. —C(CF$_3$)$_2$OH is preferred.

The partial structure containing a fluorine atom may be directly bonded to the principal chain, or may be bonded to the principal chain through a group selected from the group consisting of an alkylene group, a phenylene group, an ether group, a thioether group, a carbonyl group, an ester group, an amido group, a urethane group and a ureylene group, or through a group composed of a combination of two or more of these groups.

As preferred repeating units having a fluorine atom, there can be mentioned the repeating units represented by the general formulae below.

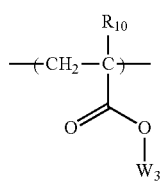

(C-Ia)

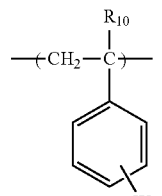

(C-Ib)

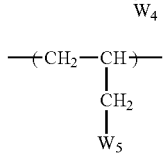

(C-Ic)

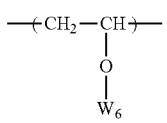

(C-Id)

In the formulae, each of $R_{10}$ and $R_{11}$ independently represents a hydrogen atom, a fluorine atom or an alkyl group. The alkyl group is preferably a linear or branched alkyl group having 1 to 4 carbon atoms, and may have a substituent. As the substituted alkyl group, there can be mentioned, in particular, a fluorinated alkyl group.

Each of $W_3$ to $W_6$ independently represents an organic group containing at least one fluorine atom. As such, for example, there can be mentioned the atomic groups of general formulae (F2) to (F4) above.

Further, besides these, the resin (C) may have the following units as the repeating unit containing a fluorine atom.

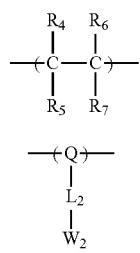

(C-II)

(C-III)

In the formulae, each of $R_4$ to $R_7$ independently represents a hydrogen atom, a fluorine atom or an alkyl group. The alkyl group is preferably a linear or branched alkyl group having 1 to 4 carbon atoms, and may have a substituent. As the substituted alkyl group, there can be mentioned, in particular, a fluorinated alkyl group.

At least one of $R_4$ to $R_7$ represents a fluorine atom. $R_4$ and $R_5$, or $R_6$ and $R_7$ may cooperate with each other to thereby form a ring.

$W_2$ represents an organic group containing at least one fluorine atom. As such, for example, there can be mentioned the atomic groups of general formulae (F2) to (F4) above.

$L_2$ represents a single bond or a bivalent connecting group. As the bivalent connecting group, there can be mentioned a substituted or unsubstituted arylene group, a substituted or unsubstituted alkylene group, a substituted or unsubstituted cycloalkylene group, —O—, —$SO_2$—, —CO—, —N(R)— (in the formula, R is a hydrogen atom or an alkyl group), —$NHSO_2$— or a bivalent connecting group consisting of a combination of two or more of these.

Q represents an alicyclic structure. The alicyclic structure may have a substituent, and may be monocyclic or polycyclic. The alicyclic structure when being polycyclic may be a bridged one. The alicyclic structure when being monocyclic is preferably a cycloalkyl group having 3 to 8 carbon atoms. As such, there can be mentioned, for example, a cyclopentyl group, a cyclohexyl group, a cyclobutyl group, a cyclooctyl group or the like. As the polycyclic one, there can be mentioned a group with, for example, a bicyclo, tricyclo or tetracyclo structure having 5 or more carbon atoms. A cycloalkyl group having 6 to 20 carbon atoms is preferred. As such, there can be mentioned, for example, an adamantyl group, a norbornyl group, a dicyclopentyl group, a tricyclodecanyl group, a tetracyclododecyl group or the like. The carbon atoms of the cycloalkyl group may be partially replaced with a heteroatom, such as an oxygen atom. A norbornyl group, a tricyclodecanyl group and a tetracyclododecyl group are especially preferred.

Repeating units containing a silicon atom will be described below.

It is preferred for the repeating unit containing a silicon atom to have an alkylsilyl structure (preferably a trialkylsilyl group) or a cyclosiloxane structure as a partial structure having a silicon atom.

As the alkylsilyl structure or cyclosiloxane structure, there can be mentioned, for example, any of the groups of the following general formulae (CS-1) to (CS-3) or the like.

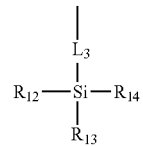

(CS-1)

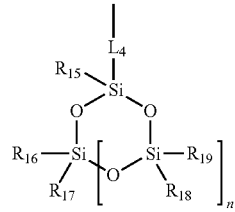

(CS-2)

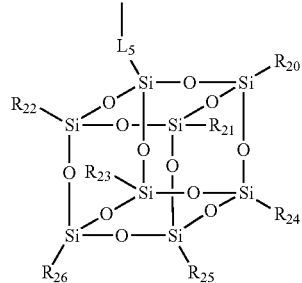

(CS-3)

In general formulae (CS-1) to (CS-3), each of $R_{12}$ to $R_{26}$ independently represents a linear or branched alkyl group (preferably having 1 to 20 carbon atoms) or a cycloalkyl group (preferably having 3 to 20 carbon atoms).

Each of $L_3$ to $L_5$ represents a single bond or a bivalent connecting group. As the bivalent connecting group, there can be mentioned any one or a combination of two or more groups selected from the group consisting of an alkylene group, a phenylene group, an ether group, a thioether group, a carbonyl group, an ester group, an amido group, a urethane group and a urea group.

In the formulae, n is an integer of 1 to 5. n is preferably an integer of 2 to 4.

It is preferred for the repeating unit (c1) containing at least either a fluorine atom or a silicon atom to be a (meth)acrylate repeating unit.

Particular examples of the repeating unit (c1) will be shown below, which however in no way limit the scope of the present invention.

In particular examples, $X_1$ represents a hydrogen atom, —$CH_3$, —F or —$CF_3$, and $X_2$ represents —F or —$CF_3$.

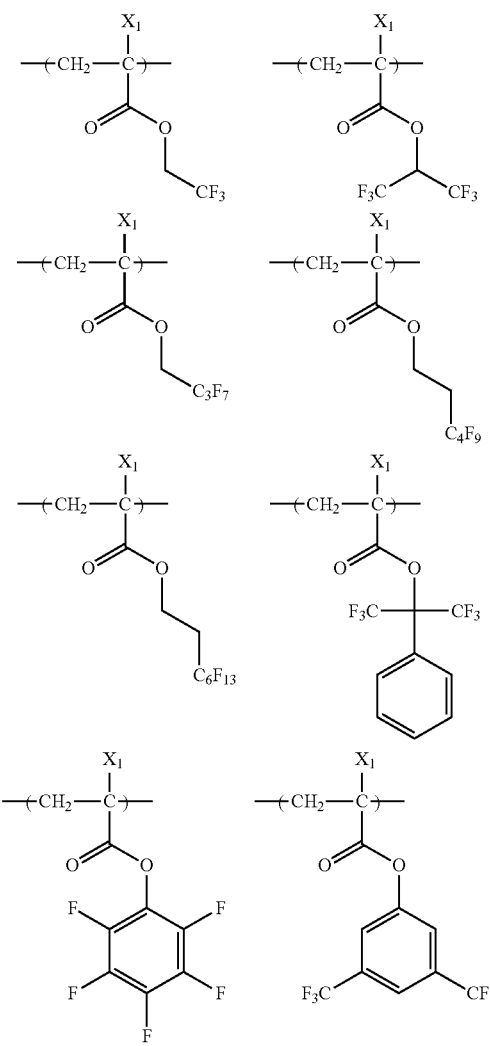

-continued

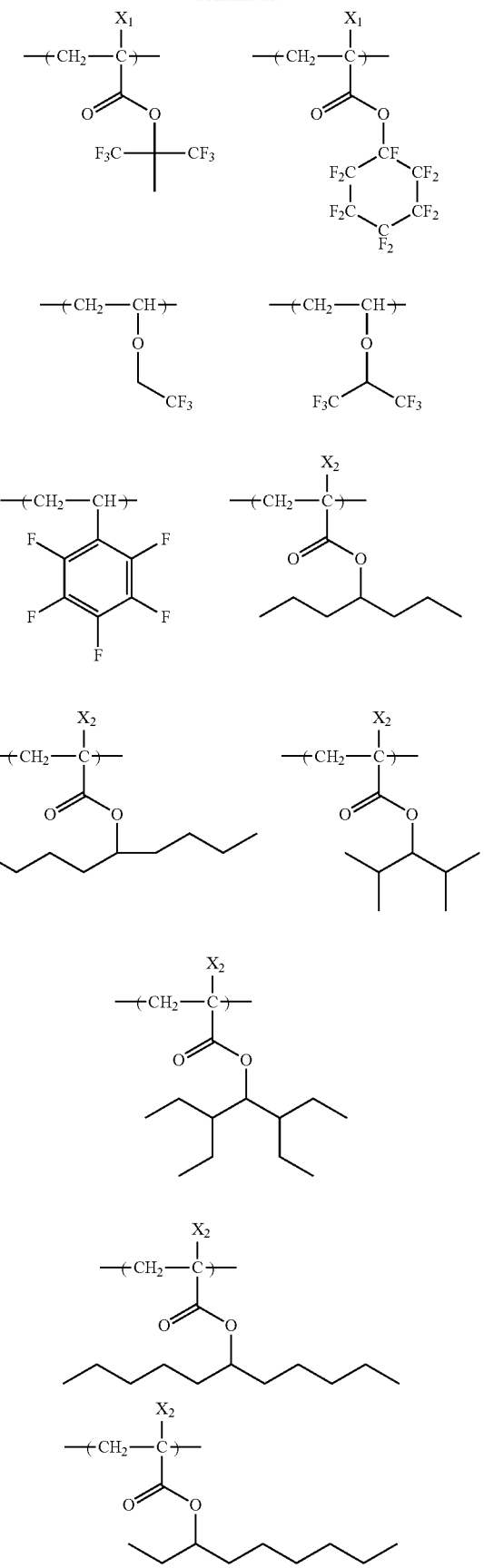

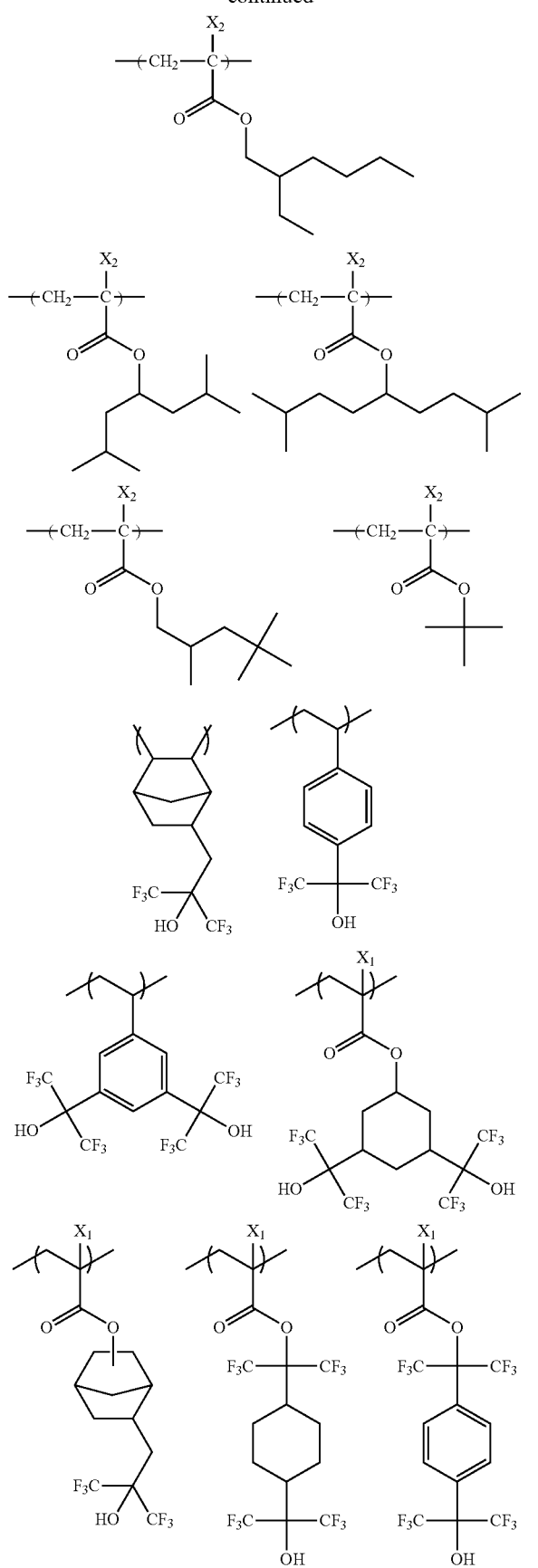
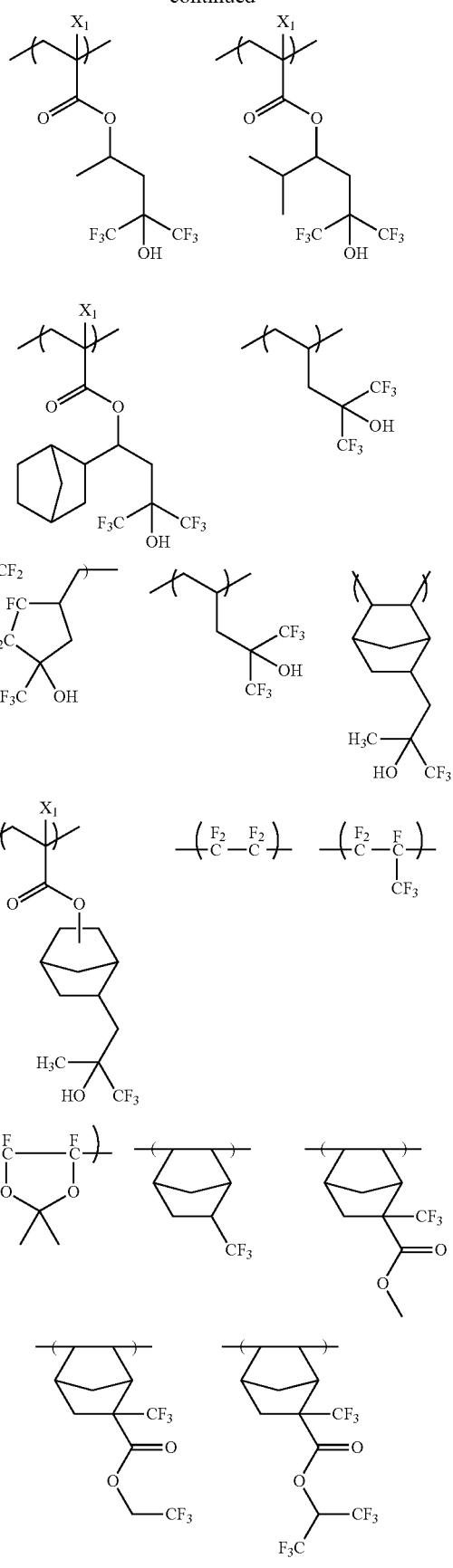

-continued

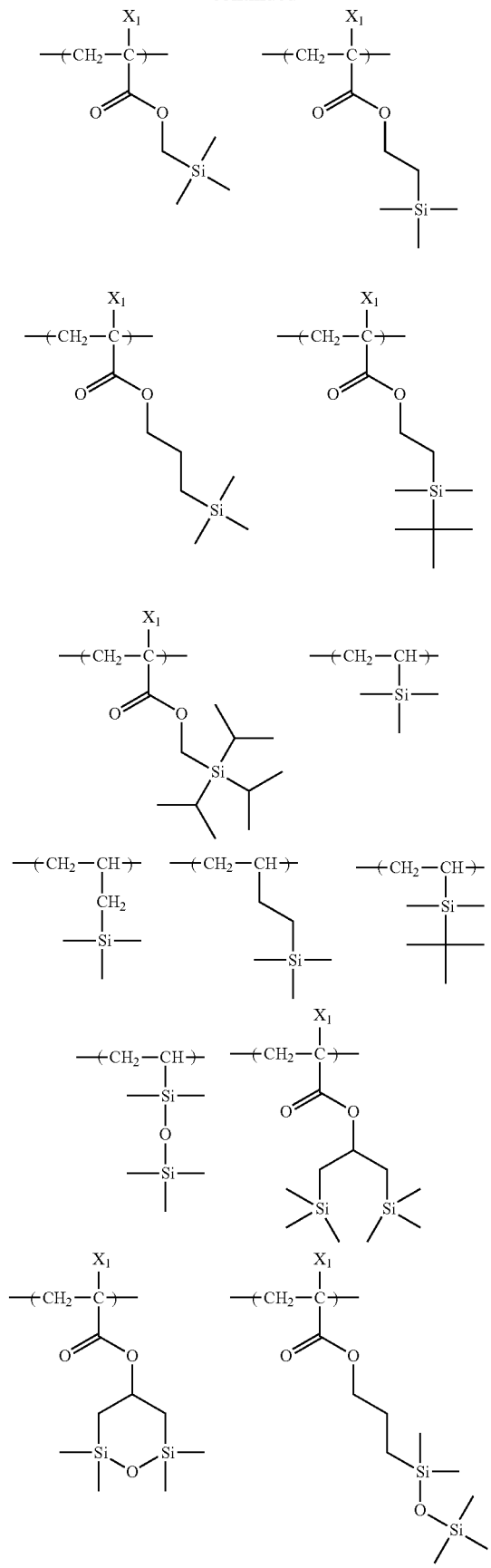
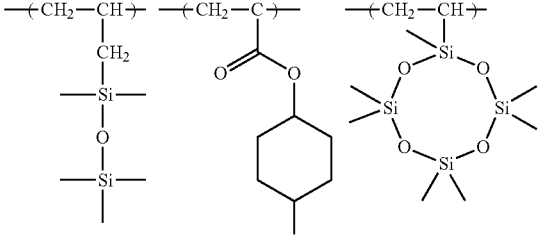
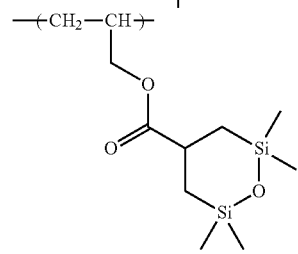
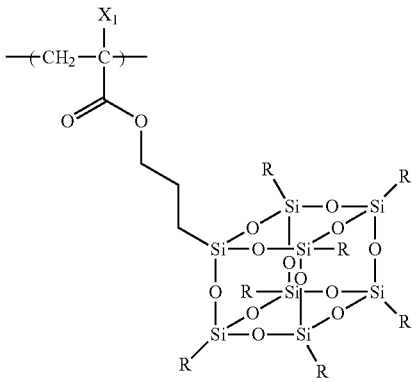
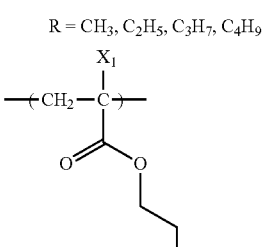

The resin (C) contains at least one group selected from among the following groups (x) to (z), (x) an alkali-soluble group, (y) a group that when acted on by an alkali developer, is decomposed to thereby increase its solubility in the alkali developer (hereinafter also referred to as a "polarity conversion group"), and (z) a group that when acted on by an acid, is decomposed to thereby increase its solubility in an alkali developer.

Of these, the alkali-soluble group (x) and the polarity conversion group (y) are preferred, and the polarity conversion group (y) is more preferred.

As the alkali soluble group (x), there can be mentioned a phenolic hydroxyl group, a carboxylate group, a fluoroalcohol group, a sulfonate group, a sulfonamido group, a sulfonylimido group, an (alkylsulfonyl)(alkylcarbonyl)methylene group, an (alkylsulfonyl)(alkylcarbonyl)imido group, a bis (alkylcarbonyl)methylene group, a bis(alkylcarbonyl)imido group, a bis(alkylsulfonyl)methylene group, a bis(alkylsulfonyl)imido group, a tris(alkylcarbonyl)methylene group, a tris (alkylsulfonyl)methylene group or the like.

As preferred alkali soluble groups, there can be mentioned a fluoroalcohol group (preferably hexafluoroisopropanol), a sulfonimido group and a bis(carbonyl)methylene group.

The repeating unit containing the alkali-soluble group (x) can be a repeating unit wherein the alkali-soluble group is directly bonded to the principal chain of a resin, such as repeating units of acrylic acid or methacrylic acid, a repeating unit wherein the alkali-soluble group is bonded via a connecting group to the principal chain of a resin, or the like. Further, the alkali-soluble group can be introduced in a terminal of a polymer chain by using a chain transfer agent or polymerization initiator containing the alkali-soluble group in the stage of polymerization. All of these repeating units are preferred.

The content ratio of repeating units having an alkali soluble group (x) is preferably in the range of 1 to 50 mol %, more preferably 3 to 35 mol % and still more preferably 5 to 20 mol % based on all the repeating units of the hydrophobic resin.

Specific examples of the repeating units having an alkali soluble group (x) will be shown below, which however in no way limit the scope of the present invention.

In the formulae, Rx represents H, $CH_3$, $CF_3$ or $CH_2OH$.

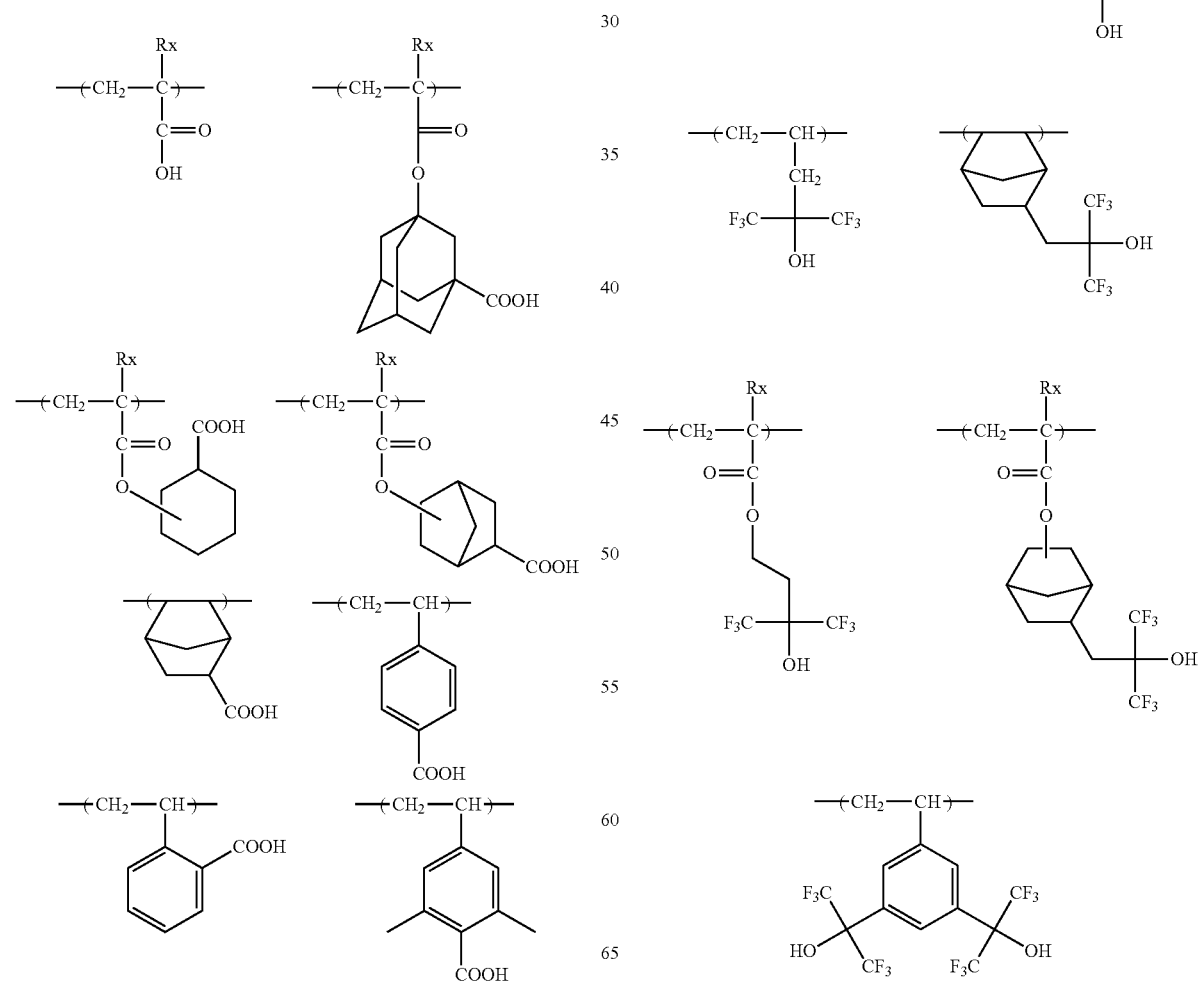

-continued

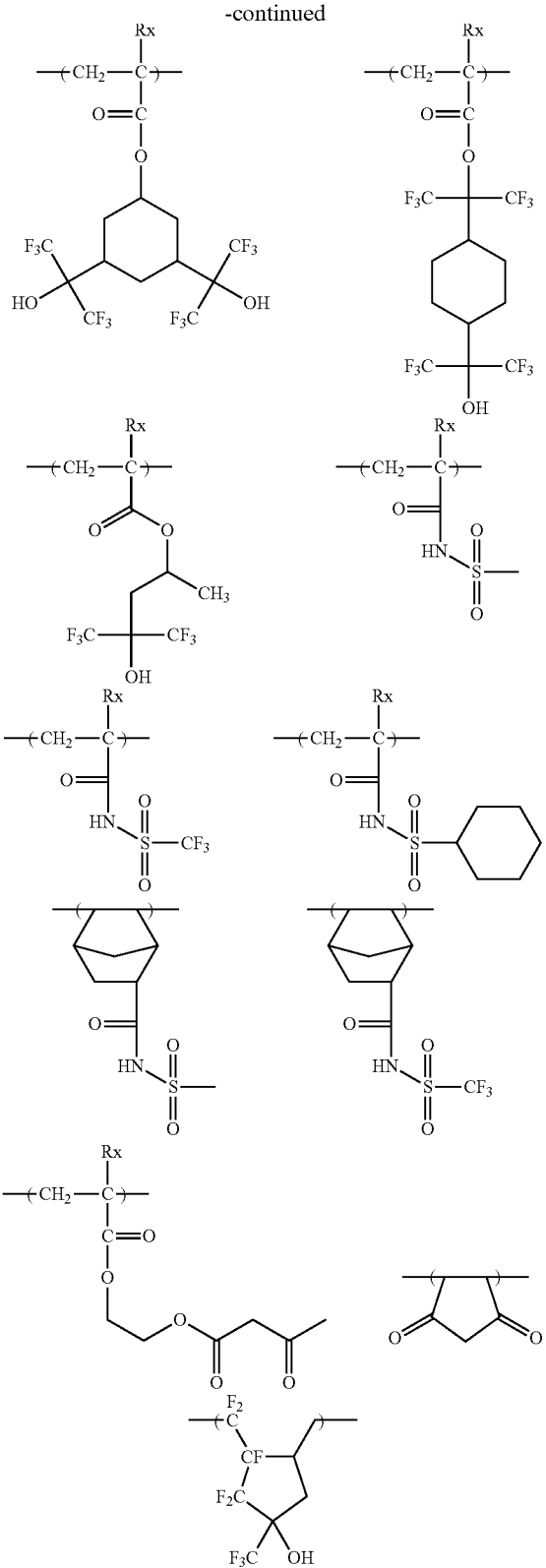

As the polarity conversion group (y), there can be mentioned, for example, a lactone group, a carboxylic ester group (—COO—), an acid anhydride group (—C(O)OC(O)—), an acid imido group (—NHCONH—), a carboxylic thioester group (—COS—), a carbonic ester group (—OC(O)O—), a sulfuric ester group (—OSO$_2$O—), a sulfonic ester group (—SO$_2$O—) or the like. Of these, a lactone group is preferred.

The polarity conversion group (y) in its one form is contained in the repeating unit of, for example, an acrylic ester or a methacrylic ester and thus is introduced in a side chain of a resin. The polarity conversion group (y) in its another form is introduced in a terminal of a polymer chain by using a chain transfer agent or polymerization initiator containing the polarity conversion group in the stage of polymerization. Both of these forms are preferred.

As specific examples of the repeating unit (c) having a polarity conversion group (y), there can be mentioned those similar to the repeating units having a lactone structure set forth with respect to after-mentioned resin (A). The content ratio of the repeating unit (c) is preferably in the range of 1 to 40 mol %, more preferably 3 to 30 mol % and still more preferably 5 to 15 mol % based on all the repeating units of the resin (C).

Moreover, it is preferred for the repeating unit (c) containing the polarity conversion group (y) to a repeating unit containing at least either a fluorine atom or a silicon atom. The resin in which this repeating unit (c) is introduced is hydrophobic. However, this resin is preferred from the viewpoint of, in particular, suppression of blob defects.

As the repeating unit (c), there can be mentioned, for example, any of the repeating units of formula (K0) below.

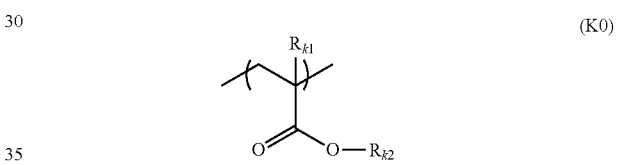

(K0)

In the formula, $R_{k1}$ represents a hydrogen atom, a halogen atom, a hydroxyl group, an alkyl group, a cycloalkyl group, an aryl group or a group containing a polarity conversion group, and $R_{k2}$ represents an alkyl group, a cycloalkyl group, an aryl group or a group containing a polarity conversion group;

provided that at least one of $R_{k1}$ and $R_{k2}$ is a group containing a polarity conversion group.

The polarity conversion group, as mentioned above, refers to a group that when acted on by an alkali developer, is decomposed to thereby increase its solubility in the alkali developer. The polarity conversion group is preferably the group represented by X in the partial structures of general formula (KA-1) or (KB-1) below.

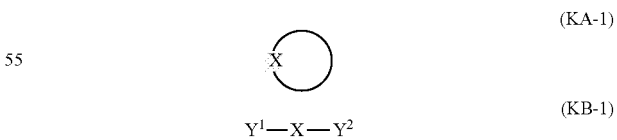

(KA-1)

(KB-1)

In general formula (KA-1) or (KB-1), X represents a carboxylic ester group (—COO—), an acid anhydride group (—C(O)OC(O)—), an acid imido group (—NHCONH—), a carboxylic thioester group (—COS—), a carbonic ester group (—OC(O)O—), a sulfuric ester group (—OSO$_2$O—) or a sulfonic ester group (—SO$_2$O—).

$Y^1$ and $Y^2$ may be identical to or different from each other, and each thereof represents an electron withdrawing group.

The repeating unit (c) can have a preferred group that increases its solubility in the alkali developer through the introduction therein of any of groups with the partial structures of general formula (KA-1) or (KB-1). When the partial structures have no bonding hand as in the case of the partial structures of general formula (KA-1) or the partial structures of general formula (KB-1) in which $Y^1$ and $Y^2$ are monovalent, the groups with the above partial structures refer to those containing a monovalent or higher-valent group resulting from the deletion of at least one arbitrary hydrogen atom from the partial structures.

The partial structures of general formula (KA-1) or (KB-1) are linked at an arbitrary position to the principal chain of the resin (C) via a substituent.

First, the partial structures of general formula (KA-1) will be described in detail below.

The partial structures of general formula (KA-1) are each arranged so as to form a ring structure in cooperation with a group represented by X.

In general formula (KA-1), X is preferably a carboxylic ester group (namely, in the case of the formation of a lactone ring structure as KA-1), an acid anhydride group or a carbonic ester group. More preferably, X is a carboxylic ester group.

A substituent may be introduced in any of the ring structures of general formula (KA-1). For example, nka substituents, the substituent referred to as $Z_{ka1}$, may be introduced in any of the ring structures.

$Z_{ka1}$, or each of a plurality of $Z_{ka1}$s independently, represents a halogen atom, an alkyl group, a cycloalkyl group, an ether group, a hydroxyl group, an amido group, an aryl group, a lactone ring group or an electron withdrawing group.

$Z_{ka1}$s may be linked to each other to thereby form a ring. As the ring formed by the mutual linkage of $Z_{ka1}$s, there can be mentioned, for example, a cycloalkyl ring or a heterocycle (for example, a cycloether ring or a lactone ring).

The above nka is an integer of 0 to 10, preferably 0 to 8, more preferably 0 to 5, further more preferably 1 to 4 and most preferably 1 to 3.

The electron withdrawing groups represented by $Z_{ka1}$ are the same as those represented by $Y^1$ and $Y^2$ to be described hereinafter. These electron withdrawing groups may be substituted with other electron withdrawing groups.

$Z_{ka1}$ is preferably an alkyl group, a cycloalkyl group, an ether group, a hydroxyl group or an electron withdrawing group. $Z_{ka1}$ is more preferably an alkyl group, a cycloalkyl group or an electron withdrawing group. It is preferred for the ether group to be one substituted with, for example, an alkyl group or a cycloalkyl group, namely, to be an alkyl ether group or the like. The electron withdrawing group is the same as the above-mentioned electron withdrawing group.

As the halogen atom represented by $Z_{ka1}$, there can be mentioned a fluorine atom, a chlorine atom, a bromine atom, an iodine atom or the like. Among these, a fluorine atom is preferred.

The alkyl group represented by $Z_{ka1}$ may contain a substituent, and may be linear or branched. The linear alkyl group preferably has 1 to 30 carbon atoms, more preferably 1 to 20 carbon atoms. As the linear alkyl group, there can be mentioned, for example, a methyl group, an ethyl group, an n-propyl group, an n-butyl group, a sec-butyl group, a t-butyl group, an n-pentyl group, an n-hexyl group, an n-heptyl group, an n-octyl group, an n-nonyl group, an n-decanyl group or the like. The branched alkyl group preferably has 3 to 30 carbon atoms, more preferably 3 to 20 carbon atoms. As the branched alkyl group, there can be mentioned, for example, an i-propyl group, an i-butyl group, a t-butyl group, an i-pentyl group, a t-pentyl group, an i-hexyl group, a t-hexyl group, an i-heptyl group, a t-heptyl group, an i-octyl group, a t-octyl group, an i-nonyl group, a t-decanyl group or the like. It is preferred for the alkyl group represented by $Z_{ka1}$ to be one having 1 to 4 carbon atoms, such as a methyl group, an ethyl group, an n-propyl group, an i-propyl group, an n-butyl group, an i-butyl group or a t-butyl group.

The cycloalkyl group represented by $Z_{ka1}$ may contain a substituent and may be monocyclic or polycyclic. When polycyclic, the cycloalkyl group may be a bridged one. Namely, in that case, the cycloalkyl group may have a bridged structure. The monocycloalkyl group is preferably one having 3 to 8 carbon atoms. As such a cycloalkyl group, there can be mentioned, for example, a cyclopropyl group, a cyclopentyl group, a cyclohexyl group, a cyclobutyl group, a cyclooctyl group or the like. As the polycycloalkyl group, there can be mentioned a group with, for example, a bicyclo, tricyclo or tetracyclo structure having 5 or more carbon atoms. This polycycloalkyl group is preferably one having 6 to 20 carbon atoms. As such, there can be mentioned, for example, an adamantyl group, a norbornyl group, an isobornyl group, a camphonyl group, a bicyclopentyl group, an α-pinel group, a tricyclodecanyl group, a tetracyclododecyl group, an androstanyl group, the following structures or the like. The carbon atoms of each of the cycloalkyl groups may be partially replaced with a heteroatom, such as an oxygen atom.

(1)

(2)

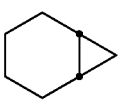

(3)

(4)

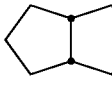

(5)

(6)

(7)

(8)

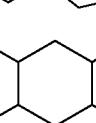

(9)

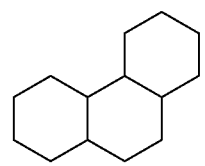
(10)
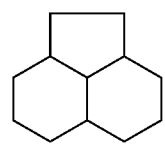
(11)
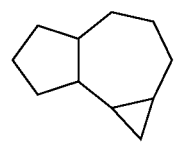
(12)
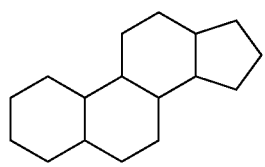
(13)
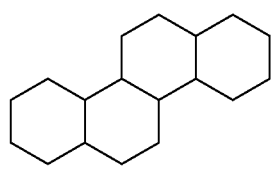
(14)
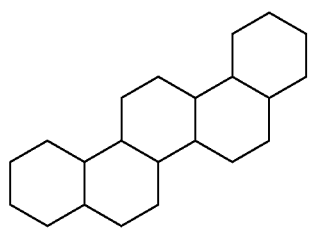
(15)
(16)
(17)
(18)
(19)
(20)
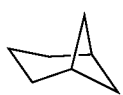
(21)
(22)
(23)
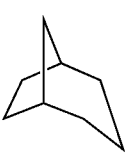
(24)
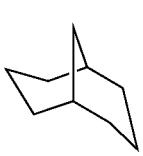
(25)
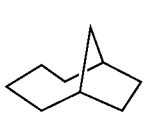
(26)
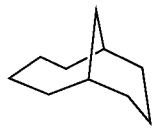
(27)
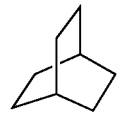
(28)
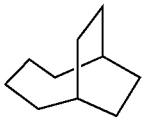
(29)
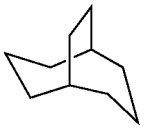
(30)
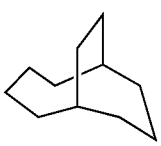
(31)

(33) 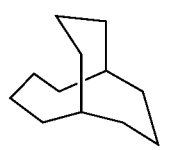

(34) 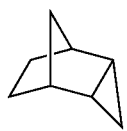

(35) 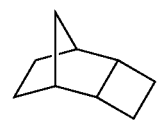

(36) 

(37) 

(38) 

(39) 

(40) 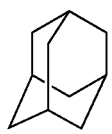

(41) 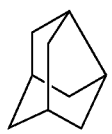

(42) 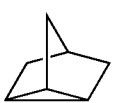

(43) 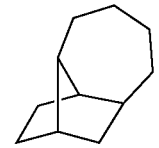

(44) 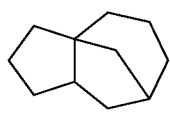

(45) 

(46) 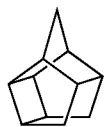

(47) 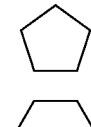

(48) 

(49) 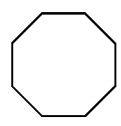

(50)

As preferred alicyclic moieties among the above, there can be mentioned an adamantyl group, a noradamantyl group, a decalin group, a tricyclodecanyl group, a tetracyclododecanyl group, a norbornyl group, a cedrol group, a cyclohexyl group, a cycloheptyl group, a cyclooctyl group, a cyclodecanyl group and a cyclododecanyl group. As more preferred alicyclic moieties, there can be mentioned an adamantyl group, a decalin group, a norbornyl group, a cedrol group, a cyclohexyl group, a cycloheptyl group, a cyclooctyl group, a cyclodecanyl group, a cyclododecanyl group and a tricyclodecanyl group.

As a substituent that can be introduced in these alicyclic structures, there can be mentioned an alkyl group, a halogen atom, a hydroxyl group, an alkoxy group, a carboxyl group or an alkoxycarbonyl group. The alkyl group is preferably a lower alkyl group, such as a methyl group, an ethyl group, a propyl group, an isopropyl group or a butyl group. More preferably, the alkyl group is a methyl group, an ethyl group, a propyl group or an isopropyl group. As preferred alkoxy groups, there can be mentioned those each having 1 to 4 carbon atoms, such as a methoxy group, an ethoxy group, a propoxy group and a butoxy group. As a substituent that may be introduced in these alkyl and alkoxy groups, there can be mentioned a hydroxyl group, a halogen atom, an alkoxy group (preferably having 1 to 4 carbon atoms) or the like.

The above groups may further have a substituent. As further substituents that may be introduced in the above groups, there can be mentioned a hydroxyl group; a halogen atom (fluorine, chlorine, bromine or iodine); a nitro group; a cyano group; the above alkyl groups; an alkoxy group, such as a methoxy group, an ethoxy group, a hydroxyethoxy group, a propoxy group, a hydroxypropoxy group, an n-butoxy group, an isobutoxy group, a sec-butoxy group or a t-butoxy group; an alkoxycarbonyl group, such as a methoxycarbonyl group or an ethoxycarbonyl group; an aralkyl group, such as a benzyl group, a phenethyl group or a cumyl group; an aralkyloxy group; an acyl group, such as a formyl group, an acetyl group, a butyryl group, a benzoyl group, a cyanamyl group or a valeryl group; an acyloxy group, such as a butyryloxy group; the above alkenyl groups; an alkenyloxy group, such as a vinyloxy group, a propenyloxy group, an allyloxy group or a butenyloxy group; the above aryl groups; an aryloxy group, such as a phenoxy group; an aryloxycarbonyl group, such as a benzoyloxy group; and the like.

Preferably, X of general formula (KA-1) represents a carboxylic ester group and the partial structures of general formula (KA-1) are lactone rings. A 5- to 7-membered lactone ring is preferred.

Further, as shown in formulae (KA-1-1) to (KA-1-17) below, each of 5- to 7-membered lactone rings as the partial structures of general formula (KA-1) is preferably condensed with another ring structure in such a fashion that a bicyclo structure or a spiro structure is formed.

The adjacent ring structures to which the ring structures of general formula (KA-1) may be bonded can be, for example, those shown in formulae (KA-1-1) to (KA-1-17) below, or those similar to the same.

It is preferred for the structures containing a lactone ring structure of general formula (KA-1) to be those of any of formulae (KA-1-1) to (KA-1-17) below. The lactone structures may be directly bonded to the principal chain. As preferred structures, there can be mentioned those of formulae (KA-1-1), (KA-1-4), (KA-1-5), (KA-1-6), (KA-1-13), (KA-1-14) and (KA-1-17).

KA-1-1

KA-1-2

KA-1-3

KA-1-4

KA-1-5

KA-1-6
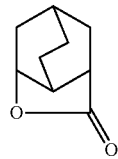

KA-1-7
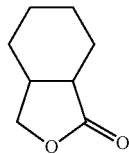

KA-1-8
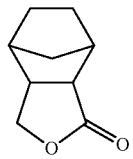

KA-1-9
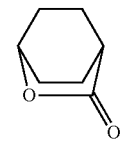

KA-1-10
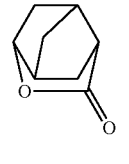

KA-1-11
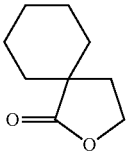

KA-1-12
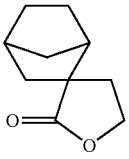

KA-1-13
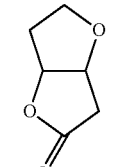

KA-1-14
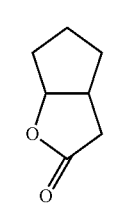

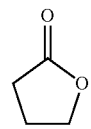
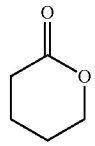
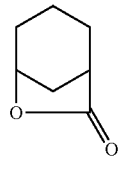
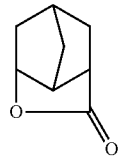
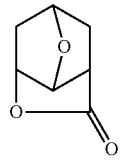

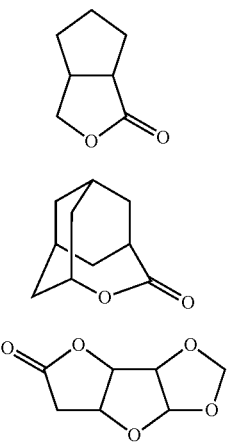

KA-1-15

KA-1-16

KA-1-17

It is optional for the above structures containing a lactone ring structure to contain or not to contain a substituent. Preferred substituents are the same as those represented by $Z_{ka1}$ that may be introduced in the ring structures of general formula (KA-1) above.

Now, the partial structure of general formula (KB-1) will be described in detail.

In general formula (KB-1), X is preferably a carboxylic ester group (—COO—).

In general formula (KB-1), each of $Y^1$ and $Y^2$ independently represents an electron withdrawing group.

Each of the electron withdrawing groups is the partial structures of formula (EW) below. In formula (EW), * represents either a bonding hand directly bonded to the structures of general formula (KA-1) or a bonding hand directly bonded to X of general formula (KB-1).

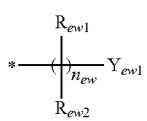

(EW)

In formula (EW), $n_{ew}$ is the number of repetitions of each of the connecting groups of the formula —C($R_{ew1}$)($R_{ew2}$)—, being an integer of 0 or 1. When $n_{ew}$ is 0, a single bond is represented, indicating the direct bonding of $Y_{ew1}$.

$Y_{ew1}$ can be any of a halogen atom, a cyano group, a nitrile group, a nitro group, any of the halo(cyclo)alkyl groups or haloaryl groups of the formula —C($R_{f1}$)($R_{f2}$)—$R_{f3}$, an oxy group, a carbonyl group, a sulfonyl group, a sulfinyl group and a combination thereof. The electron withdrawing groups may have, for example, the following structures. Herein, the "halo(cyclo)alkyl group" refers to an at least partially halogenated alkyl group or cycloalkyl group, and the "haloaryl group" refers to an at least partially halogenated aryl group. In the following structures, each of $R_{ew3}$ and $R_{ew4}$ independently represents an arbitrary structure. Regardless of the types of the structures of $R_{ew3}$ and $R_{ew4}$, the partial structures of formula (EW) exhibit electron withdrawing properties, and may be linked to, for example, the principal chain of the resin. Preferably, each of $R_{ew3}$ and $R_{ew4}$ is an alkyl group, a cycloalkyl group or a fluoroalkyl group.

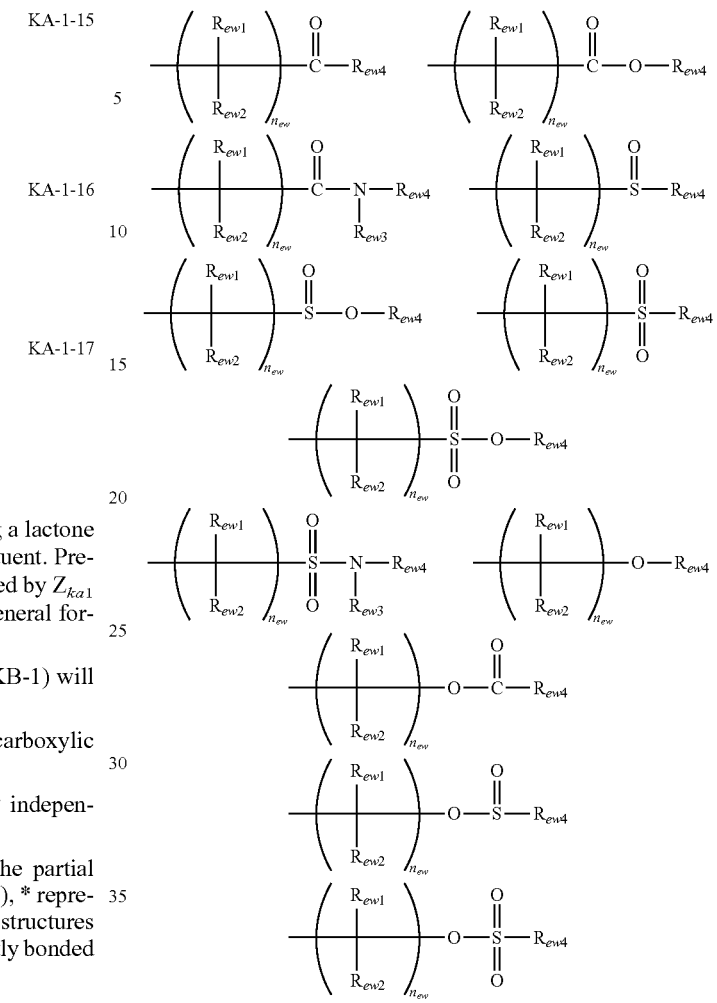

When $Y_{ew1}$ is a bivalent or higher-valent group, the remaining bonding hand or hands form a bond with an arbitrary atom or substituent. At least any of the groups represented by $Y_{ew1}$, $R_{ew1}$ and $R_{ew2}$ may be linked via a further substituent to the principal chain of the resin (C).

$Y_{ew1}$ is preferably a halogen atom or any of the halo(cyclo)alkyl groups or haloaryl groups of the formula —C($R_{f1}$)($R_{f2}$)—$R_{f3}$.

Each of $R_{ew1}$ and $R_{ew2}$ independently represents an arbitrary substituent, for example, a hydrogen atom, an alkyl group, a cycloalkyl group or an aryl group.

At least two of $R_{ew1}$, $R_{ew2}$ and $Y_{ew1}$ may be linked to each other to thereby form a ring.

In the above formula, $R_{f1}$ represents a halogen atom, a perhaloalkyl group, a perhalocycloalkyl group or a perhaloaryl group. $R_{f1}$ is preferably a fluorine atom, a perfluoroalkyl group or a perfluorocycloalkyl group, more preferably a fluorine atom or a trifluoromethyl group.

Each of $R_{f2}$ and $R_{f3}$ independently represents a hydrogen atom, a halogen atom or an organic group. $R_{f2}$ and $R_{f3}$ may be linked to each other to thereby form a ring. As the organic group, there can be mentioned, for example, an alkyl group, a cycloalkyl group, an alkoxy group or the like. It is preferred for $R_{f2}$ to represent the same groups as by $R_{f1}$ or to be linked to $R_{f3}$ to thereby form a ring.

$R_{f1}$ to $R_{f3}$ may be linked to each other to thereby form a ring. As the formed ring, there can be mentioned a (halo)cycloalkyl ring, a (halo)aryl ring or the like.

As the (halo)alkyl groups represented by $R_{f1}$ to $R_{f3}$, there can be mentioned, for example, the alkyl groups mentioned above as being represented by $Z_{ka1}$ and structures resulting from halogenation thereof.

As the (per)halocycloalkyl groups and (per)haloaryl groups represented by $R_{f1}$ to $R_{f3}$ or contained in the ring formed by the mutual linkage of $R_{f2}$ and $R_{f3}$, there can be mentioned, for example, structures resulting from halogenation of the cycloalkyl groups as mentioned above with respect to $Z_{ka1}$, preferably fluorocycloalkyl groups of the formula —$C_{(n)}F_{(2n-2)}H$ and perfluoroaryl groups of the formula —$C_{(n)}F_{(n-1)}$. The number of carbon atoms, n, is not particularly limited. Preferably, it is in the range of 5 to 13, more preferably 6.

As preferred rings that may be formed by the mutual linkage of at least two of $R_{ew1}$, $R_{ew2}$ and $Y_{ew1}$, there can be mentioned cycloalkyl groups and heterocyclic groups. Preferred heterocyclic groups are lactone ring groups. As the lactone rings, there can be mentioned, for example, the structures of formulae (KA-1-1) to (KA-1-17) above.

The repeating unit (c) may contain two or more of the partial structures of general formula (KA-1), or two or more of the partial structures of general formula (KB-1), or both any one of the partial structures of general formula (KA-1) and any one of the partial structures of general formula (KB-1).

A part or the whole of any of the partial structures of general formula (KA-1) may double as the electron withdrawing group represented by $Y^1$ or $Y^2$ of general formula (KB-1). For example, when X of general formula (KA-1) is a carboxylic ester, the carboxylic ester can function as the electron withdrawing group represented by $Y^1$ or $Y^2$ of general formula (KB-1).

The repeating unit (c) may be a repeating unit (c') simultaneously containing on a side chain thereof at least either a fluorine atom or a silicon atom and a polarity conversion group, or a repeating unit (c*) containing a polarity conversion group but containing neither a fluorine atom nor a silicon atom, or a repeating unit (c″) in which a polarity conversion group is introduced in its one side chain while at least either a fluorine atom or a silicon atom is introduced in a side chain other than the above side chain within the same repeating unit. However, it is preferred for the resin (C) to contain the repeating unit (c') as the repeating unit (c).

When the resin (C) contains the repeating unit (c*), it is preferred for the resin (C) to be a copolymer with a repeating unit (above-mentioned repeating unit (c1)) containing at least either a fluorine atom or a silicon atom. In the repeating unit (c″), it is preferred for the side chain containing a polarity conversion group and the side chain containing at least either a fluorine atom or a silicon atom to be bonded to the same carbon atom of the principal chain, namely to be in a positional relationship shown in formula (K1) below.

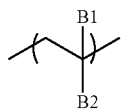

(K1)

In the formula, B1 represents a partial structure containing a group whose solubility is increased in an alkali developer, and B2 represents a partial structure containing at least either a fluorine atom or a silicon atom.

In the repeating unit (c*) and repeating unit (c″), it is highly preferred for the polarity conversion group to be a partial structure represented by —COO— in the structure of general formula (KA-1).

The receding contact angle with water of the film of the resin composition after alkali development can be decreased by the decomposition of the polarity conversion group under the action of an alkali developer and according attainment of polarity conversion. Decreasing the receding contact angle with water of the film after alkali development is preferred from the viewpoint of suppression of development defects.

The receding contact angle between the film after alkali development and water is preferably 50° or less, more preferably 40° or less, further more preferably 35° or less and most preferably 30° or less at 23±3° C. in a humidity of 45±5%.

The receding contact angle refers to a contact angle determined when the contact line at a droplet-substrate interface draws back. It is generally known that the receding contact angle is useful in the simulation of droplet mobility in a dynamic condition. In brief, the receding contact angle can be defined as the contact angle exhibited at the recession of the droplet interface at the time of, after application of a droplet discharged from a needle tip onto a substrate, re-indrawing the droplet into the needle. Generally, the receding contact angle can be measured according to a method of contact angle measurement known as the dilation/contraction method.

The above receding contact angle of the film after alkali development refers to the contact angle of the following film measured in accordance with the dilation/contraction method mentioned in the Examples to be described hereinbelow. The film was formed as follows. An organic antireflection film ARC29A (produced by Nissan Chemical Industries, Ltd.) was applied onto a silicon wafer (8-inch caliber) and baked at 205° C. for 60 seconds, thereby forming a 98 nm-thick anti-reflection film. Each of the compositions of the present invention was applied thereonto and baked at 120° C. for 60 seconds, thereby forming a 120 nm-thick film. The film was developed with an aqueous solution of tetramethylammonium hydroxide (2.38 mass %) for 30 seconds, rinsed with pure water and spin dried. The receding contact angle of the thus obtained film was measured in accordance with the dilation/contraction method.

The rate of hydrolysis of the hydrophobic resin in an alkali developer is preferably 0.001 nm/sec or greater, more preferably 0.01 nm/sec or greater, further more preferably 0.1 nm/sec or greater and most preferably 1 nm/sec or greater.

Herein, the rate of hydrolysis of the hydrophobic resin in an alkali developer refers to the rate of decrease of the thickness of a film formed from the hydrophobic resin only in 23° C. TMAH (a 2.38 mass % aqueous tetramethylammonium hydroxide solution).

Preferably, the resin (C) in the present invention contains the repeating unit (c) containing at least two polarity conversion groups and also contains at least either a fluorine atom or a silicon atom.

When the repeating unit (c) contains at least two polarity conversion groups, it is preferred for the repeating unit to contain a group with any of the partial structures having two polarity conversion groups of general formula (KY-1) below. When any of the structures of general formula (KY-1) has no bonding hand, it is a group with a mono- or higher-valent group resulting from the removal of at least any one of the hydrogen atoms contained in the structure.

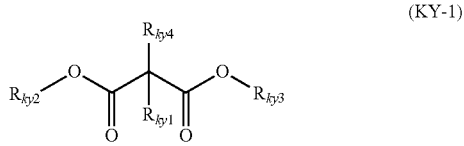

(KY-1)

In general formula (KY-1), each of $R_{ky1}$ and $R_{ky4}$ independently represents a hydrogen atom, a halogen atom, an alkyl group, cycloalkyl group, a carbonyl group, a carbonyloxy group, an oxycarbonyl group, an ether group, a hydroxyl group, a cyano group, an amido group or an aryl group. Alternatively, both $R_{ky1}$ and $R_{ky4}$ may be bonded to the same atom to thereby form a double bond. For example, both $R_{ky1}$ and $R_{ky4}$ may be bonded to the same oxygen atom to thereby form a part (=O) of a carbonyl group.

Each of $R_{ky2}$ and $R_{ky3}$ independently represents an electron withdrawing group. Alternatively, $R_{ky1}$ and $R_{ky2}$ are linked to each other to thereby form a lactone structure, while $R_{ky3}$ is an electron withdrawing group. The formed lactone structure is preferably any of the above-mentioned structures (KA-1-1) to (KA-1-17). As the electron withdrawing group, there can be mentioned any of the same groups as mentioned above with respect to $Y^1$ and $Y^2$ of general formula (KB-1). This electron withdrawing group is preferably a halogen atom, or any of the halo(cyclo)alkyl groups or haloaryl groups of the formula —C($R_{f1}$)($R_{f2}$)—$R_{f3}$. Preferably, $R_{ky3}$ is a halogen atom, or any of the halo(cyclo)alkyl groups or haloaryl groups of the formula —C($R_{f1}$)($R_{f2}$)—$R_{f3}$, while $R_{ky2}$ is either linked to $R_{ky1}$ to thereby form a lactone ring, or an electron withdrawing group containing no halogen atom.

$R_{ky1}$, $R_{ky2}$ and $R_{ky}4$ may be linked to each other to thereby form a monocyclic or polycyclic structure.

As $R_{ky1}$ and $R_{ky4}$, there can be mentioned, for example, the same groups as set forth above with respect to $Z_{ka1}$ of general formula (KA-1).

The lactone rings formed by the mutual linkage of $R_{ky1}$ and $R_{ky2}$ preferably have the structures of formulae (KA-1-1) to (KA-1-17) above. As the electron withdrawing groups, there can be mentioned those mentioned above as being represented by $Y^1$ and $Y^2$ of general formula (KB-1).

It is more preferred for the structures of general formula (KY-1) to be the structures of general formula (KY-2) below. Each of the structures of general formula (KY-2) is a group with a mono- or higher-valent group resulting from the removal of at least any one of the hydrogen atoms contained in the structure.

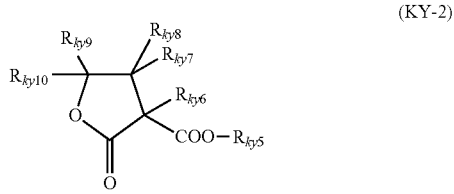

(KY-2)

In formula (KY-2), each of $R_{ky6}$ to $R_{ky10}$ independently represents a hydrogen atom, a halogen atom, an alkyl group, a cycloalkyl group, a carbonyl group, a carbonyloxy group, an oxycarbonyl group, an ether group, a hydroxyl group, a cyano group, an amido group or an aryl group.

At least two of $R_{ky6}$ to $R_{ky10}$ may be linked to each other to thereby form a monocyclic or polycyclic ring.

$R_{ky5}$ represents an electron withdrawing group. As the electron withdrawing group, there can be mentioned any of the same groups as set forth above with respect to $Y^1$ and $Y^2$. This electron withdrawing group is preferably a halogen atom, or any of the halo(cyclo)alkyl groups or haloaryl groups of the formula —C($R_{f1}$)($R_{f2}$)—$R_{f3}$.

As $R_{ky5}$ to $R_{ky10}$, there can be mentioned, for example, the same groups as set forth above with respect to $Z_{ka1}$ of general formula (KA-1).

It is more preferred for the structures of general formula (KY-2) to be the partial structures of general formula (KY-3) below.

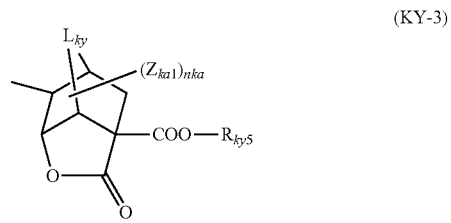

(KY-3)

In general formula (KY-3), $Z_{ka1}$ and nka are as defined above in connection with general formula (KA-1). $R_{ky5}$ is as defined above in connection with general formula (KY-2).

$L_{ky}$ represents an alkylene group, an oxygen atom or a sulfur atom. As the alkylene group represented by $L_{ky}$, there can be mentioned a methylene group, an ethylene group or the like. $L_{ky}$ is preferably an oxygen atom or a methylene group, more preferably a methylene group.

The repeating units (c) are not limited as long as they are derived by polymerization, such as addition polymerization, condensation polymerization or addition condensation. Preferred repeating units are those obtained by the addition polymerization of a carbon to carbon double bond. As such repeating units, there can be mentioned, for example, acrylate repeating units (including the family having a substituent at the α- and/or β-position), styrene repeating units (including the family having a substituent at the α- and/or β-position), vinyl ether repeating units, norbornene repeating units, repeating units of maleic acid derivatives (maleic anhydride, its derivatives, maleimide, etc.) and the like. Of these, acrylate repeating units, styrene repeating units, vinyl ether repeating units and norbornene repeating units are preferred. Acrylate repeating units, vinyl ether repeating units and norbornene repeating units are more preferred. Acrylate repeating units are most preferred.

The repeating unit (c) can be any of the repeating units with the following partial structures.

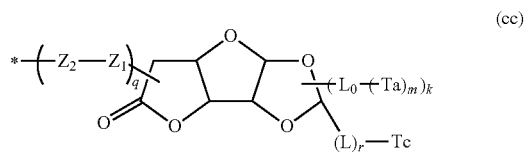

(cc)

In general formula (cc), $Z_1$, or each of $Z_1$s independently, represents a single bond, an ether bond, an ester bond, an amido bond, a urethane bond or a urea bond. An ester bond is preferred.

$Z_2$, or each of $Z_2$s independently, represents a chain- or cycloalkylene group. An alkylene group having 1 or 2 carbon atoms and a cycloalkylene group having 5 to 10 carbon atoms are preferred.

Ta, or each of Tas independently, represents an alkyl group, a cycloalkyl group, an alkoxy group, a nitrile group, a hydroxyl group, an amido group, an aryl group or an electron withdrawing group (having the same meaning as that of the electron withdrawing group represented by $Y^1$ or $Y^2$ of general formula (KB-1)). An alkyl group, a cycloalkyl group and an electron withdrawing group are preferred. An electron withdrawing group is more preferred. Two or more Tas may be bonded to each other to thereby form a ring.

$L_0$ represents a single bond or a hydrocarbon group with a valence of m+1 (preferably having 20 or less carbon atoms). A single bond is preferred. $L_0$ is a single bond when m is 1. The hydrocarbon group with a valence of m+1 represented by $L_0$ is, for example, one resulting from the removal of any m−1 hydrogen atoms from an alkylene group, a cycloalkylene group, a phenylene group or a combination thereof.

L, or each of Ls independently, represents a carbonyl group, a carbonyloxy group or an ether group.

Tc represents a hydrogen atom, an alkyl group, a cycloalkyl group, a nitrile group, a hydroxyl group, an amido group, an aryl group or an electron withdrawing group (having the same meaning as that of the electron withdrawing group represented by $Y^1$ or $Y^2$ of general formula (KB-1)).

In the formula, * represents the bonding hand to the principal chain or a side chain of the resin. Specifically, any of the partial structures of formula (cc) may be directly bonded to the principal chain, or may be bonded to a side chain of the resin.

In the general formula, m is an integer of 1 to 28, preferably an integer of 1 to 3, more preferably 1;

k is an integer of 0 to 2, preferably 1;

q is an integer of 0 to 5, preferably 1 or 2; and r is an integer of 0 to 5.

The moiety -(L)r-Tc may be replaced with -$L_0$-(Ta)m.

It is also preferred to contain a fluorine atom at an end of a sugar lactone and further contain a fluorine atom on a side chain different from the side chain on the side of the sugar lactone within the same repeating unit (repeating unit (c")).

As particular structures of the repeating units (c), the repeating units with the following partial structures are preferred.

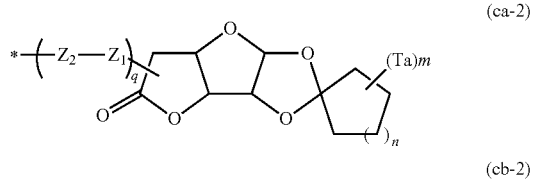

(ca-2)

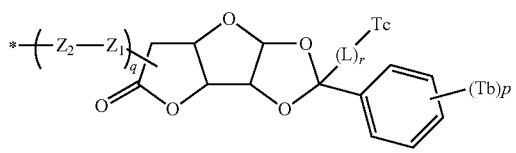

(cb-2)

In general formulae (ca-2) and (cb-2), n is an integer of 0 to 11; and p is an integer of 0 to 5.

Tb, or each of Tbs independently, represents an alkyl group, a cycloalkyl group, an alkoxy group, a nitrile group, a hydroxyl group, an amido group, an aryl group or an electron withdrawing group (having the same meaning as that of the electron withdrawing group represented by $Y^1$ or $Y^2$ of general formula (KB-1)). When a plurality of Tb's are contained, they may be bonded to each other to thereby form a ring.

$Z_1$, $Z_2$, Ta, Tc, L, *, m, q and r are as defined above in connection with general formula (cc), and preferred examples thereof are also as set forth there.

General formula (c) in its one form expresses the repeating units containing the partial structures of general formula (KY-4) below.

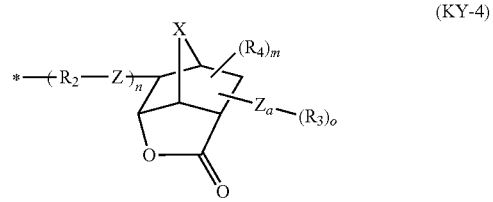

(KY-4)

In general formula (KY-4), $R_2$ represents a chain- or cycloalkylene group, provided that two or more $R_{2s}$ may be identical to or different from each other.

$R_3$ represents a linear, branched or cyclic hydrocarbon group whose hydrogen atoms on constituent carbons are partially or entirely substituted with fluorine atoms.

$R_4$ represents a halogen atom, a cyano group, a hydroxyl group, an amido group, an alkyl group, a cycloalkyl group, an alkoxy group, a phenyl group, an acyl group, an alkoxycarbonyl group or any of the groups of formula R—C(=O)— or R—C(=O)O— in which R is an alkyl group or a cycloalkyl group. Two or more $R_{4s}$ may be identical to or different from each other, and may be bonded to each other to thereby form a ring.

X represents an alkylene group, an oxygen atom or a sulfur atom.

Each of Z and Za independently represents a single bond, an ether bond, an ester bond, an amido bond, a urethane bond or a urea bond. When there are a plurality of Zs or Zas, they may be identical to or different from each other.

In the formula, * represents the bonding hand to the principal chain or side chain of the resin;

O is the number of substituents, being an integer of 1 to 7;

m is the number of substituents, being an integer of 0 to 7; and n is the number of repetitions, being an integer of 0 to 5.

The structure —$R_2$—Z— is preferably any of the structures of formula —$(CH_2)_l$—COO— in which l is an integer of 1 to 5.

The repeating units having any of the partial structures of general formula (KY-5) are more preferred.

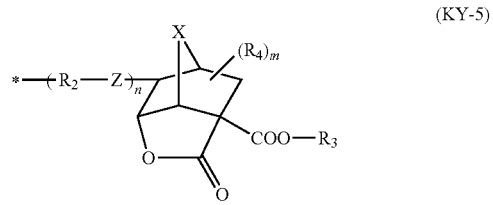

(KY-5)

In general formula (KY-5), $R_2$ represents a chain- or cycloalkylene group, provided that two or more $R_{2s}$ may be identical to or different from each other.

$R_3$ represents a linear, branched or cyclic hydrocarbon group whose hydrogen atoms on constituent carbons are partially or entirely substituted with fluorine atoms.

$R_4$ represents a halogen atom, a cyano group, a hydroxyl group, an amido group, an alkyl group, a cycloalkyl group, an alkoxy group, a phenyl group, an acyl group, an alkoxycarbonyl group or any of the groups of formula R—C(=O)— or R—C(=O)O— in which R is an alkyl group or a cycloalkyl group. Two or more $R_{4s}$ may be identical to or different from each other, and may be bonded to each other to thereby form a ring.

X represents an alkylene group, an oxygen atom or a sulfur atom.

Z represents a single bond, an ether bond, an ester bond, an amido bond, a urethane bond or a urea bond. When there are a plurality of Zs, they may be identical to or different from each other.

In the formula, * represents the bonding hand to the principal chain of side chain of the resin;

n is the number of repetitions, being an integer of 0 to 5; and m is the number of substituents, being an integer of 0 to 7.

It is preferred for the structures of the formula —$R_2$—Z— to be those of the formula —$(CH_2)_l$—COO— in which l is an integer of 1 to 5.

As particular structures of the repeating units (c), there can be mentioned the repeating units with the following partial structures.

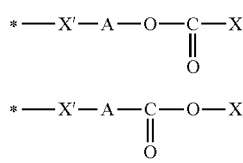

In general formulae (rf-1) and (rf-2),

X' represents an electron withdrawing substituent, preferably a carbonyloxy group, an oxycarbonyl group, an alkylene group substituted with a fluorine atom or a cycloalkylene group substituted with a fluorine atom.

A represents a single bond or a bivalent connecting group, preferably a single bond, an alkylene group optionally substituted with a fluorine atom or a cycloalkylene group optionally substituted with a fluorine atom.

X represents an electron withdrawing group, preferably a fluoroalkyl group, a fluorocycloalkyl group, an aryl group substituted with fluorine or a fluoroalkyl group, or an aralkyl group substituted with fluorine or a fluoroalkyl group.

* represents a bonding hand to the principal chain or a side chain of a resin, namely, a bonding hand bonded to the principal chain of a resin through a single bond or a connecting group, provided that when X' is a carbonyloxy group or an oxycarbonyl group, A is not a single bond.

As the partial structure containing a fluorine atom within the repeating unit (c), there can be mentioned those as set forth hereinbefore, preferably the groups of general formulae (F2) to (F4) above.

As the partial structure containing a silicon atom within the repeating unit (c), there can be mentioned those as set forth hereinbefore, preferably the groups of general formulae (CS-1) to (CS-3) above.

The content of the repeating unit (c), based on all the repeating units of the resin (C), is preferably in the range of 10 to 100 mol %, more preferably 20 to 100 mol %, further more preferably 30 to 100 mol % and most preferably 40 to 100 mol %.

Specific examples of the repeating units (c) containing polarity conversion groups will be shown below, which in no way limit the scope of the appropriate repeating units.

In the following specific examples, Ra represents a hydrogen atom, a fluorine atom, a methyl group or a trifluoromethyl group.

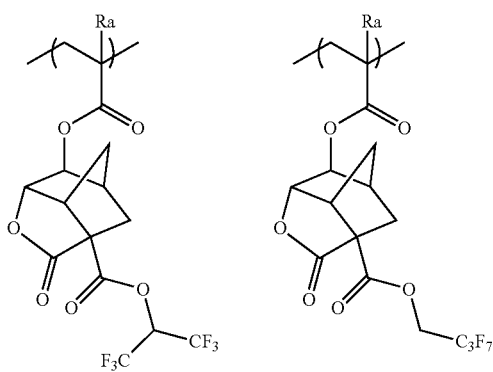

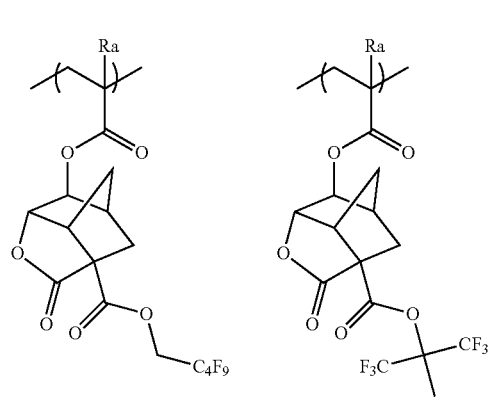

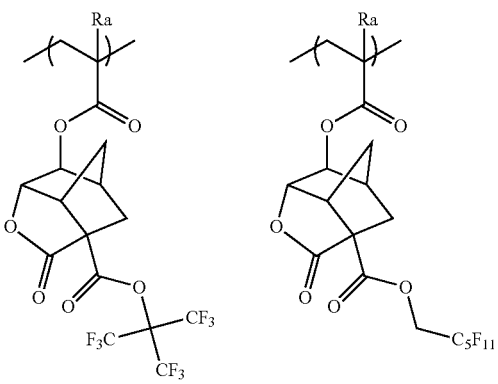

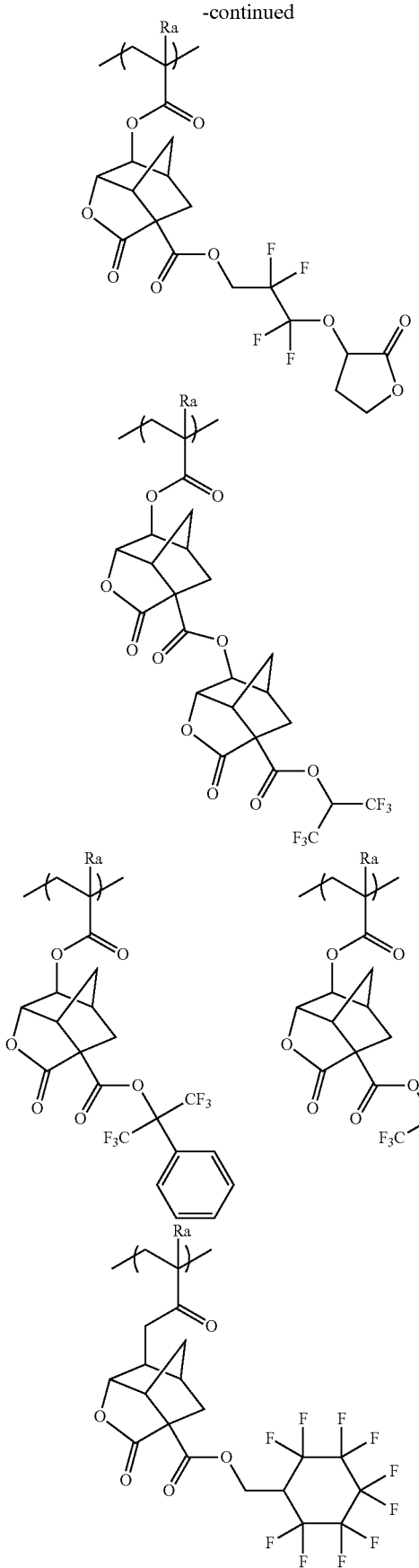
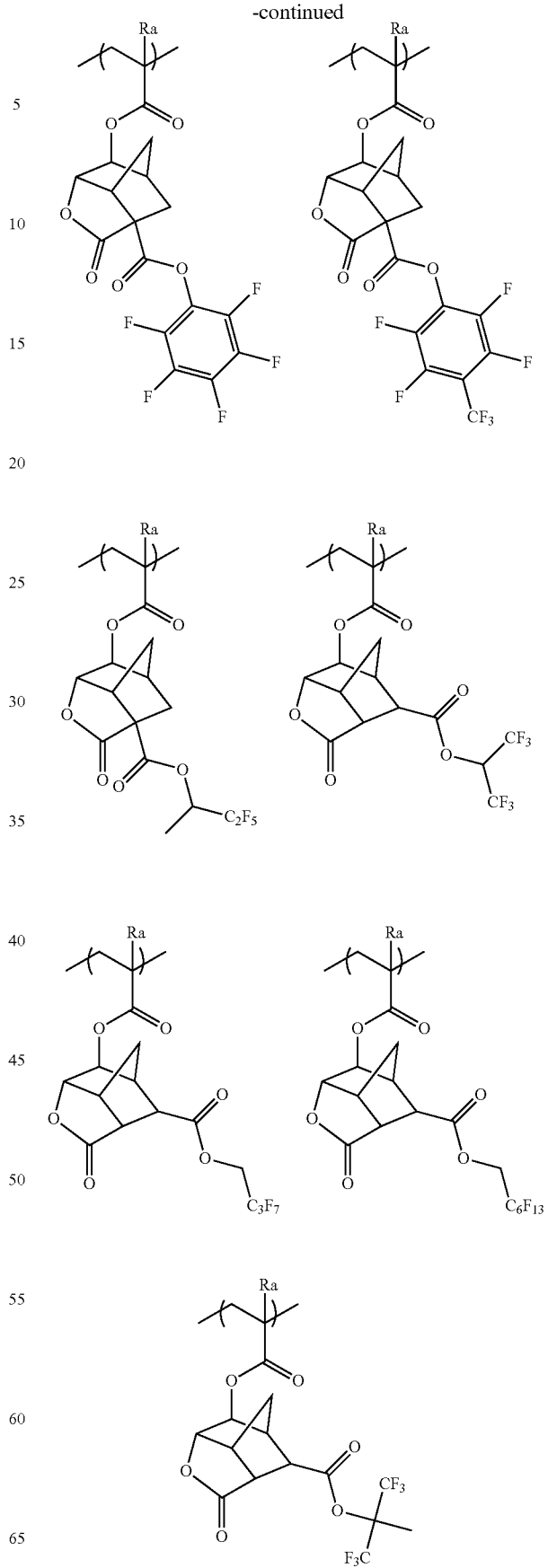

39 40
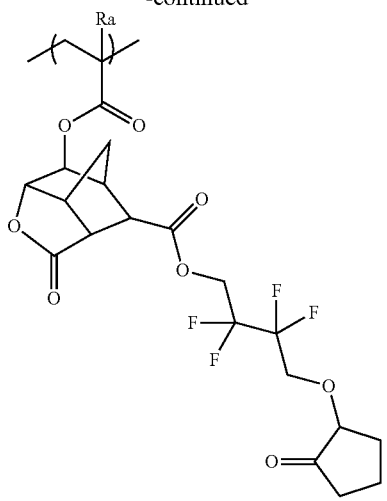
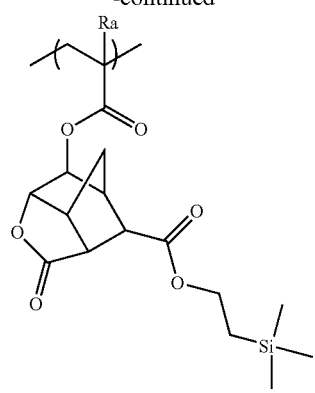
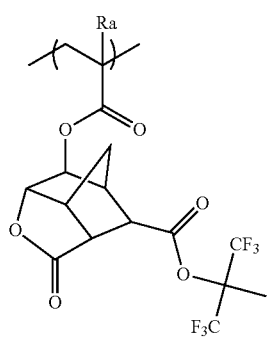
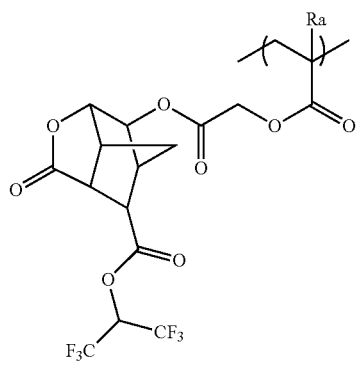
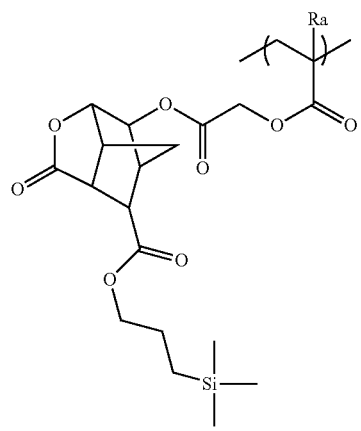
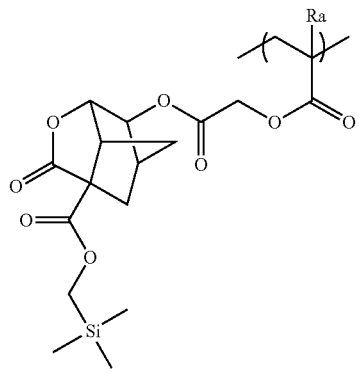
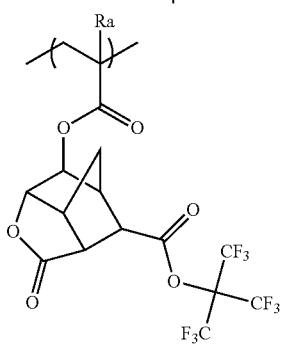
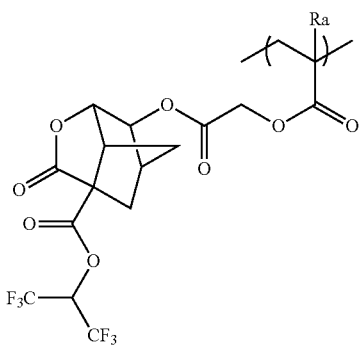

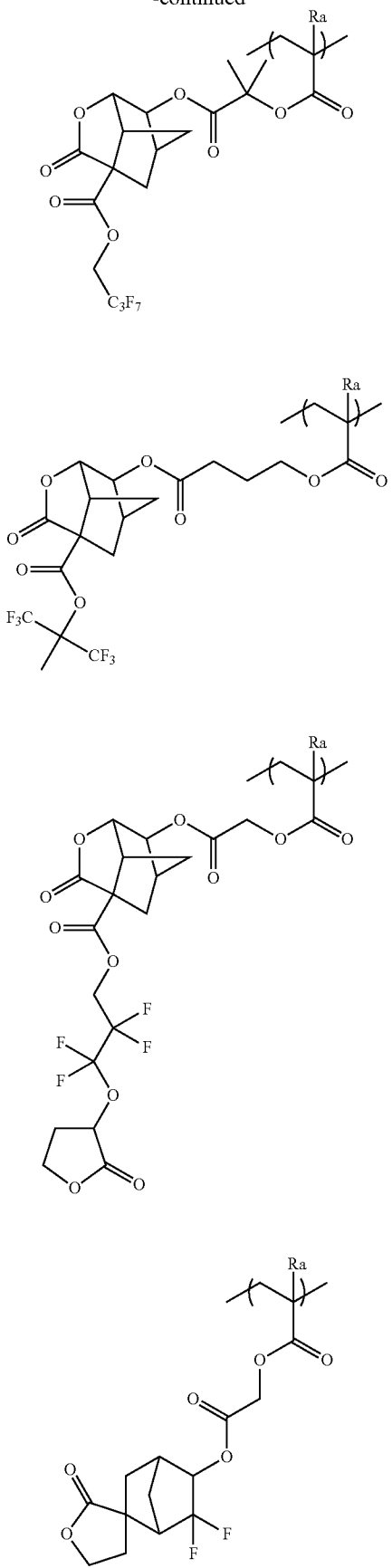
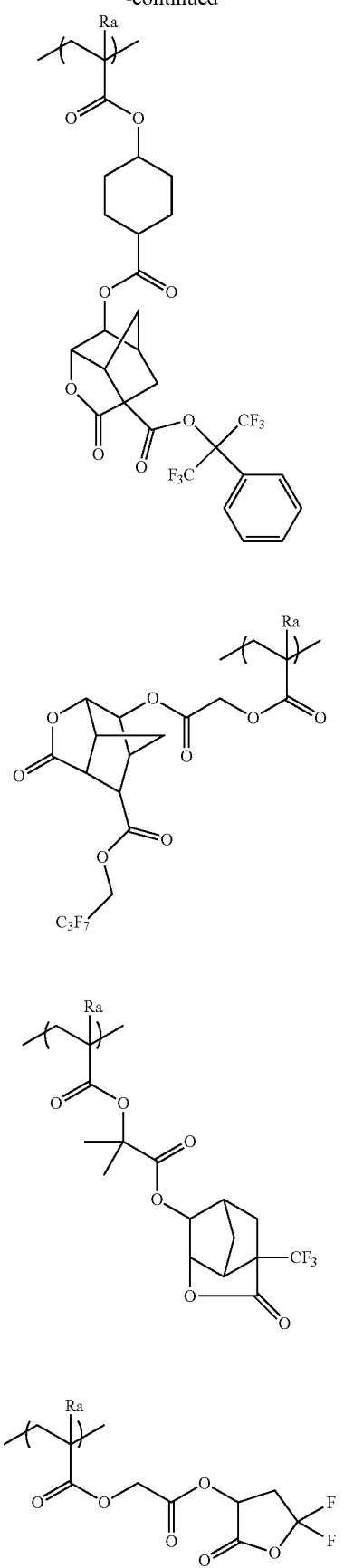

-continued
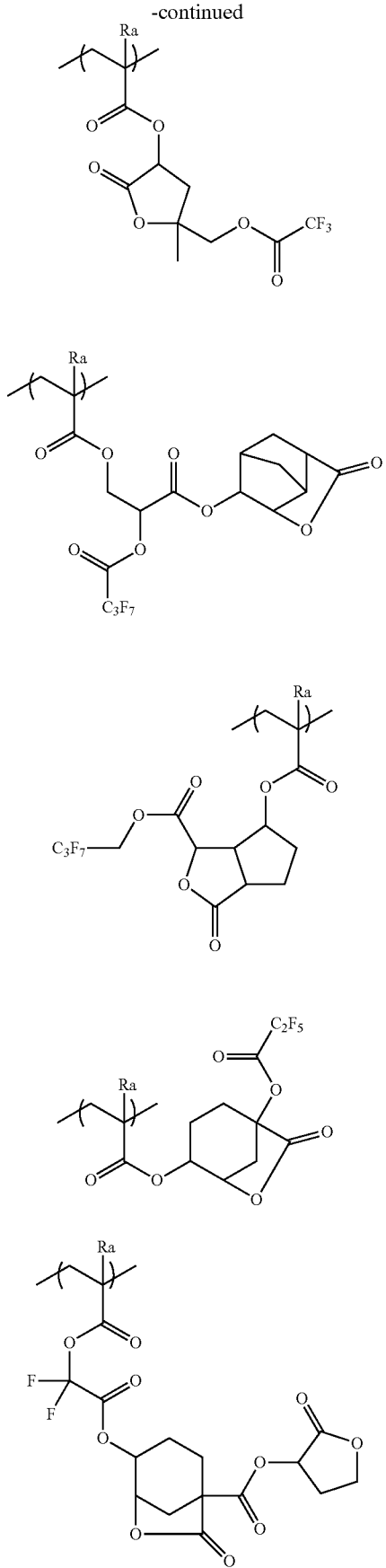
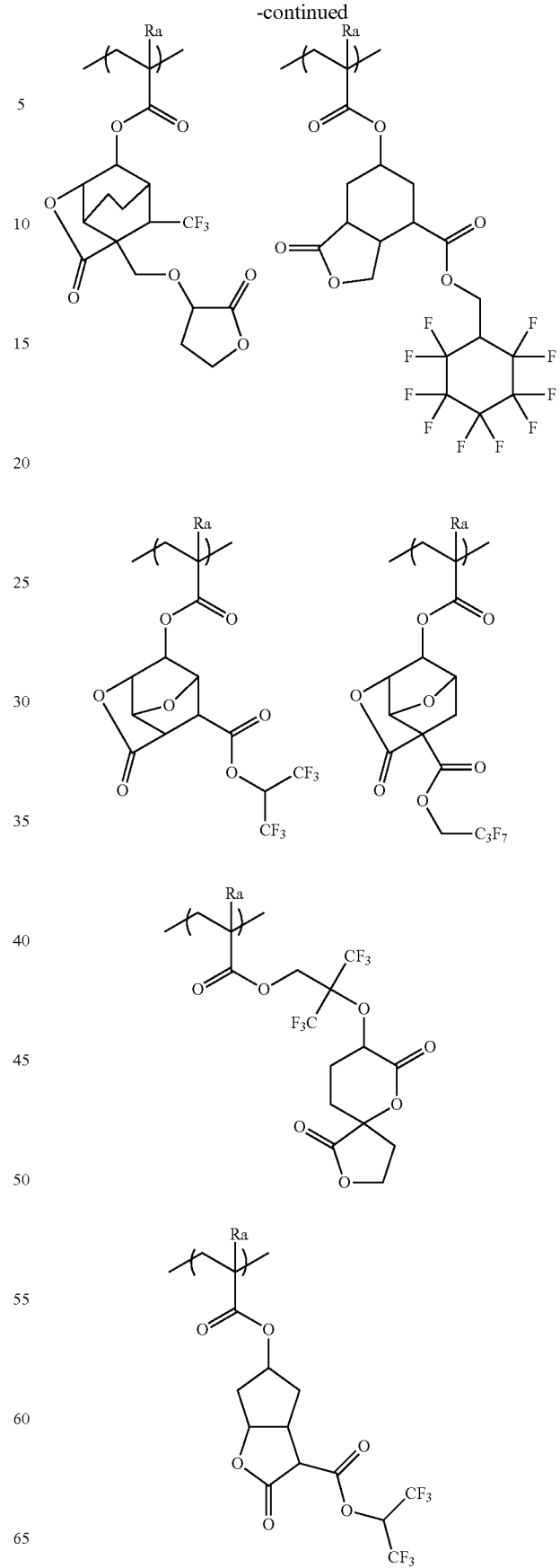

45
-continued
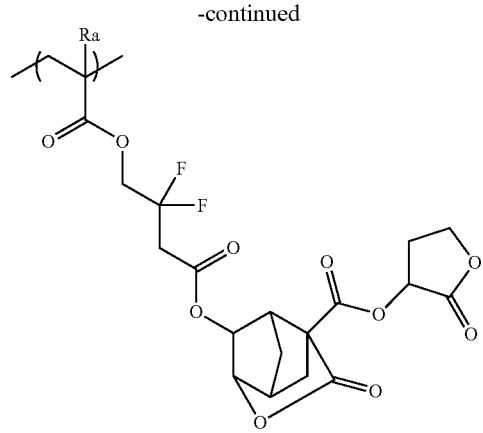
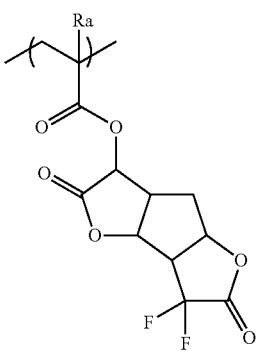
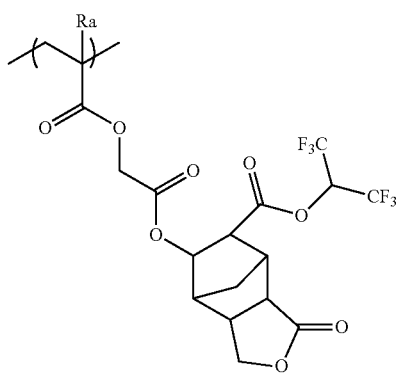
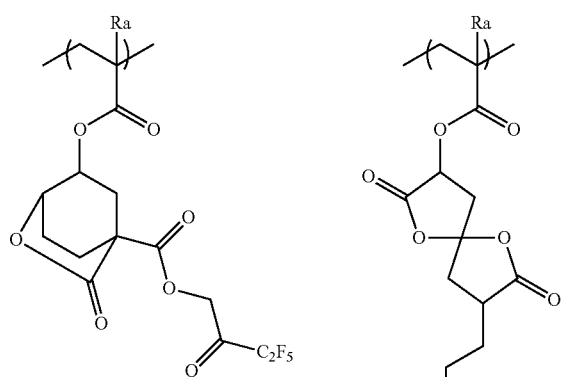
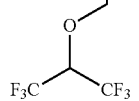
46
-continued
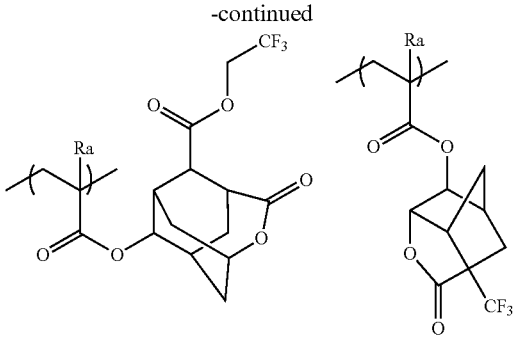
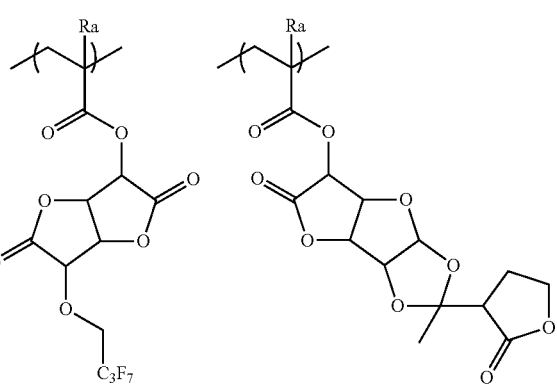
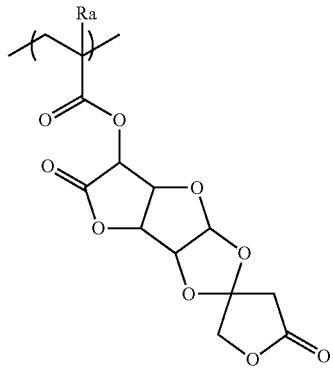
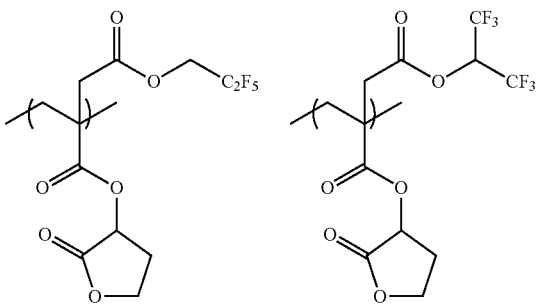
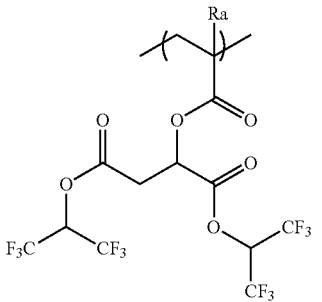

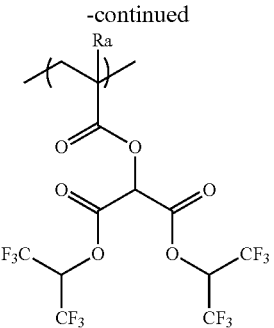
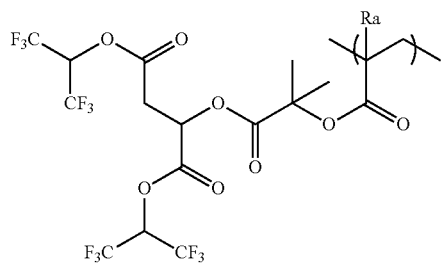
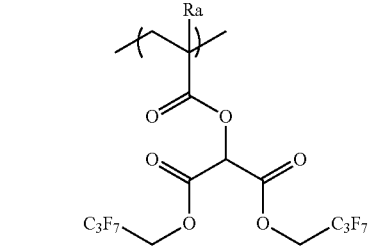
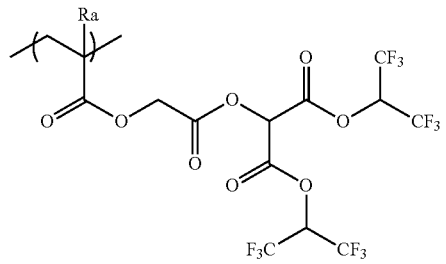
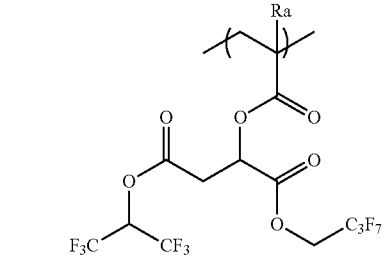
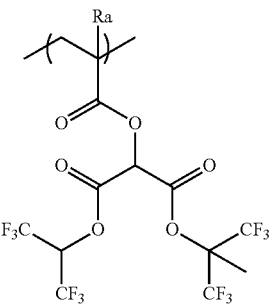
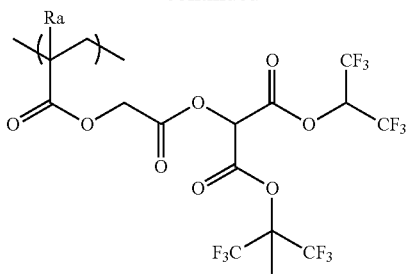
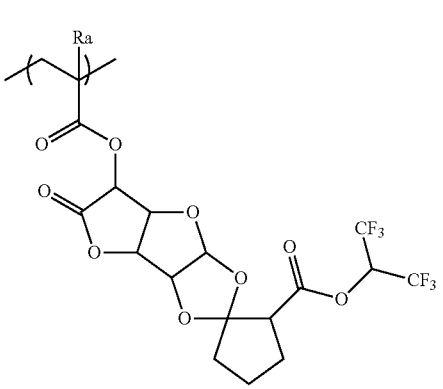
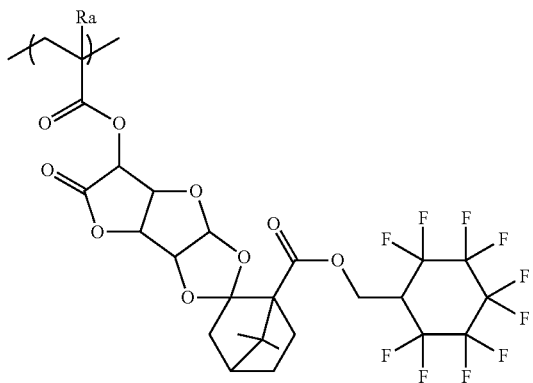
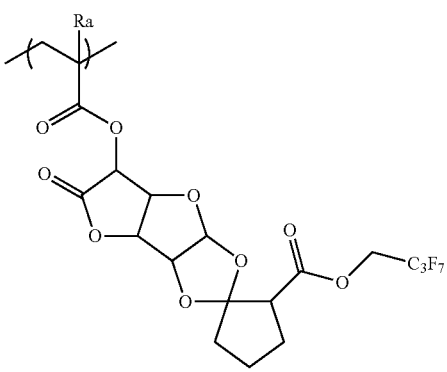

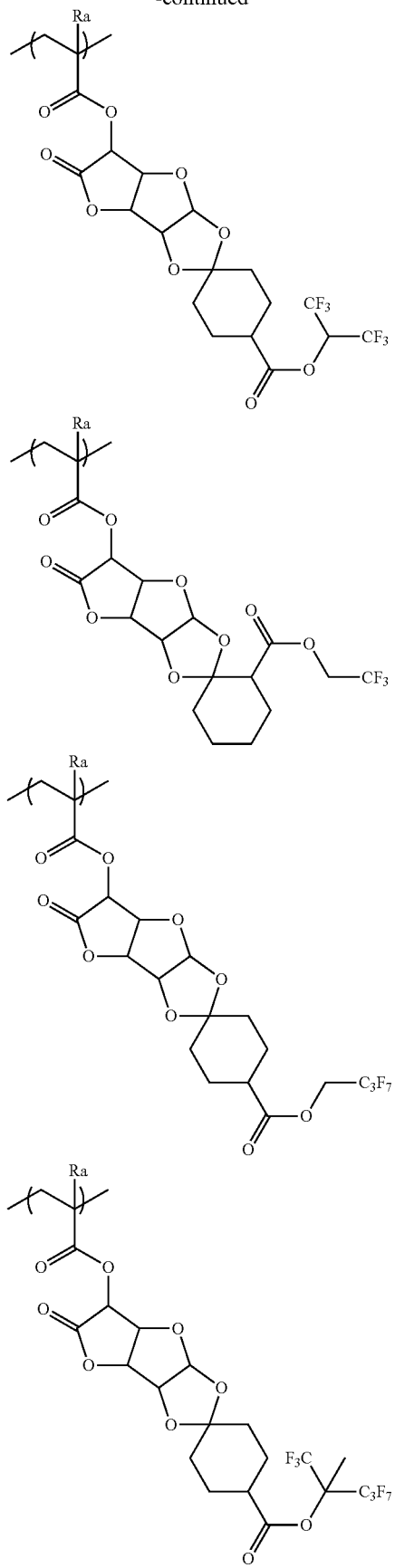
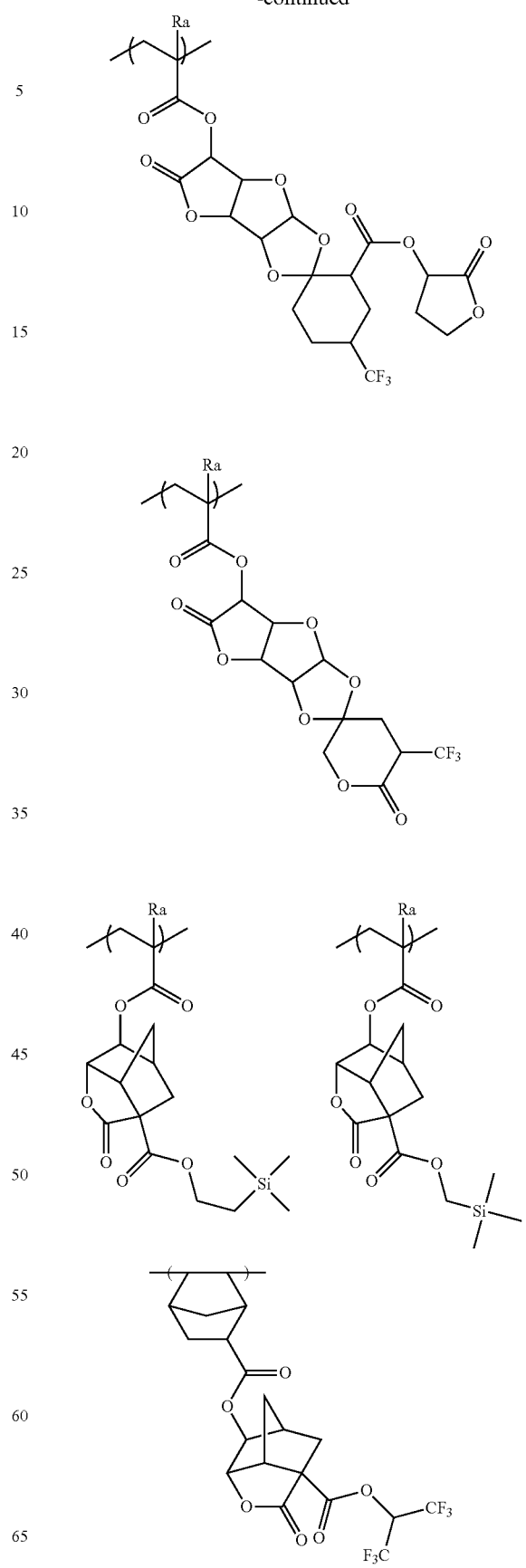

51
-continued
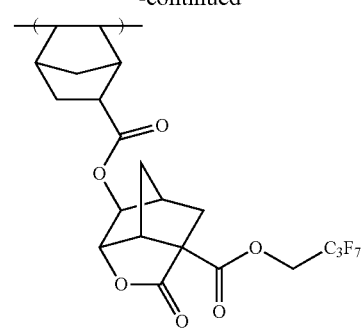
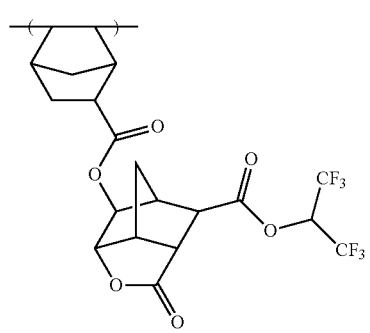
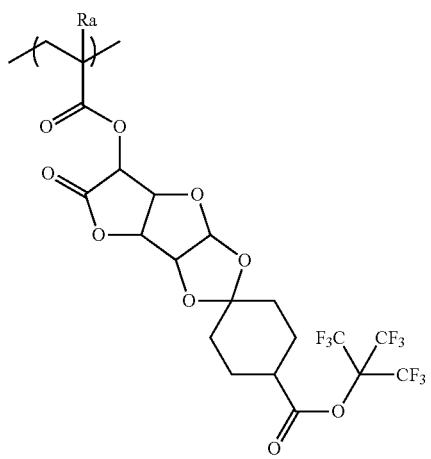
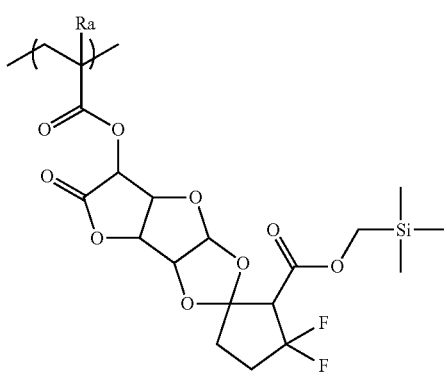
52
-continued
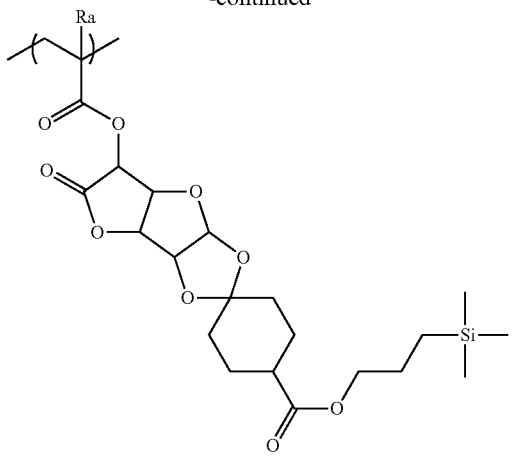
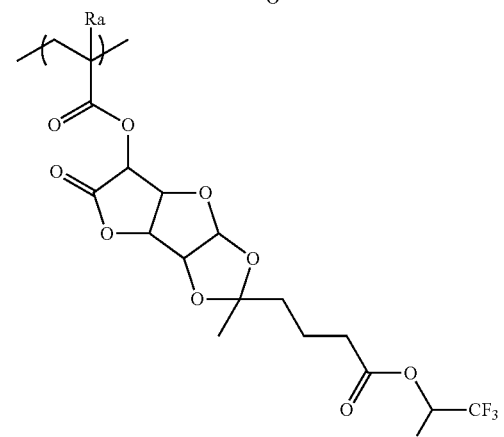
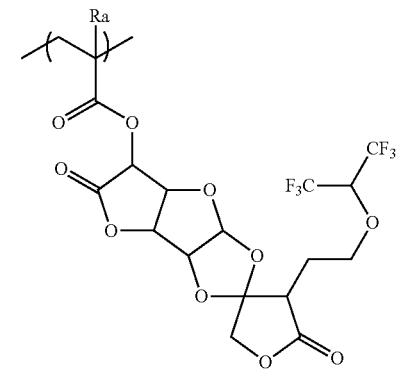
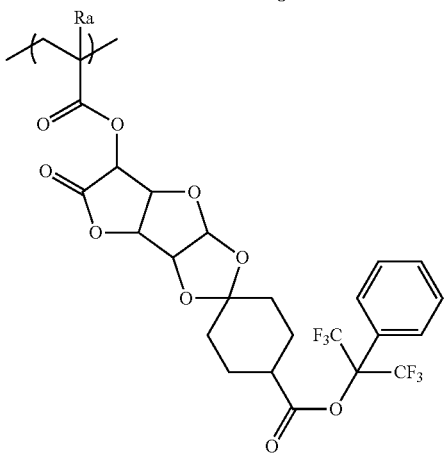

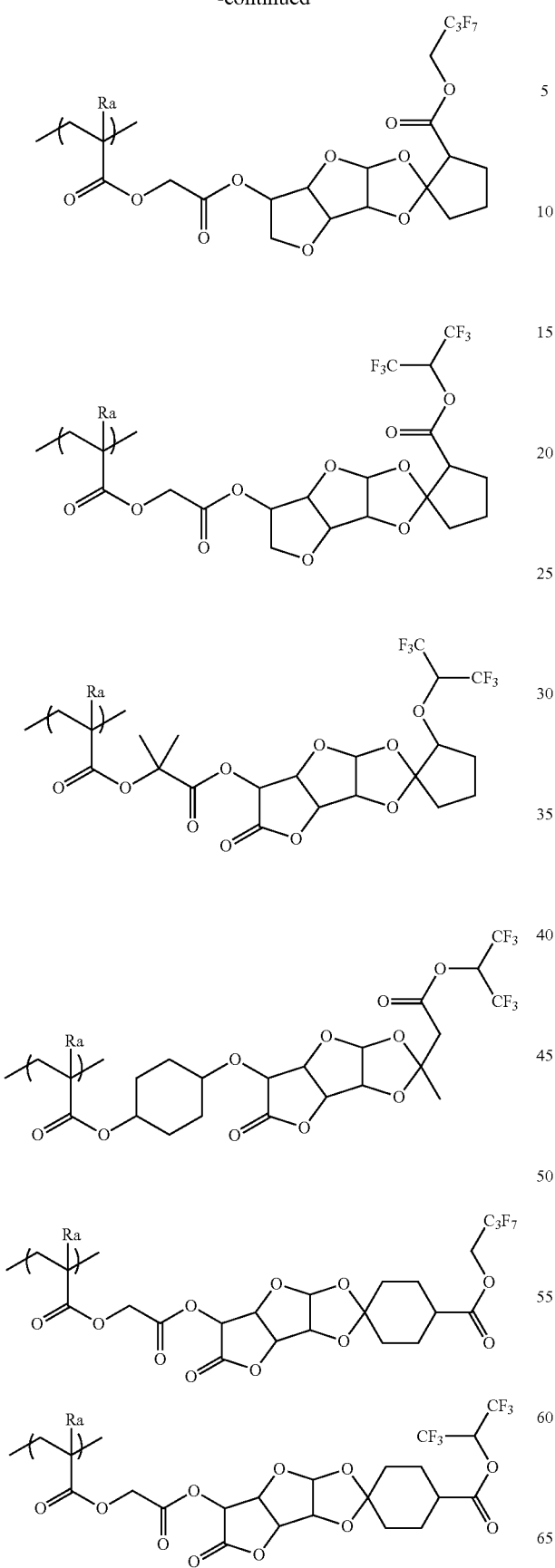
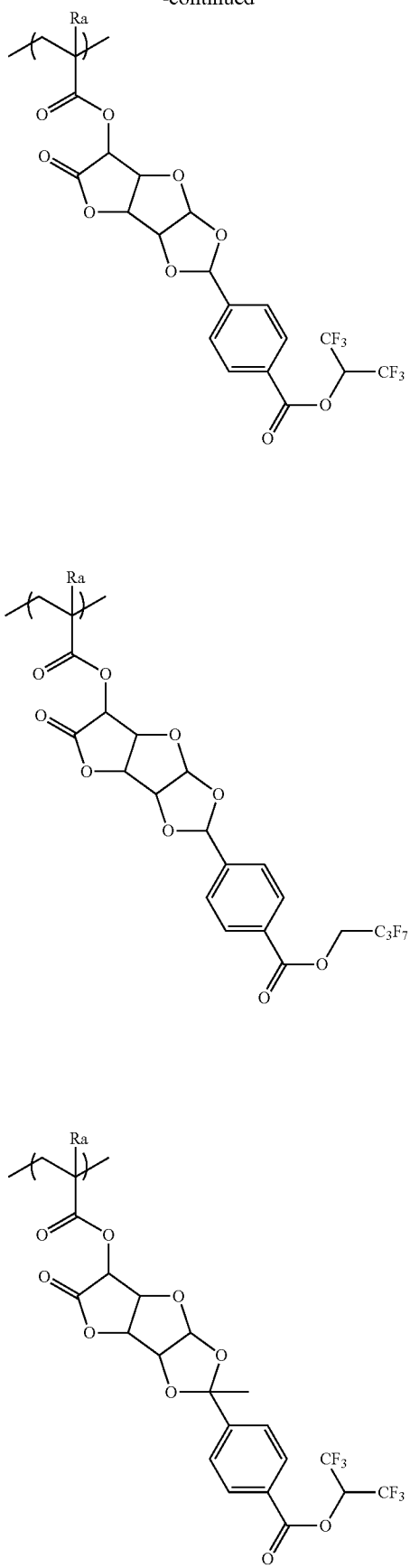

55
-continued
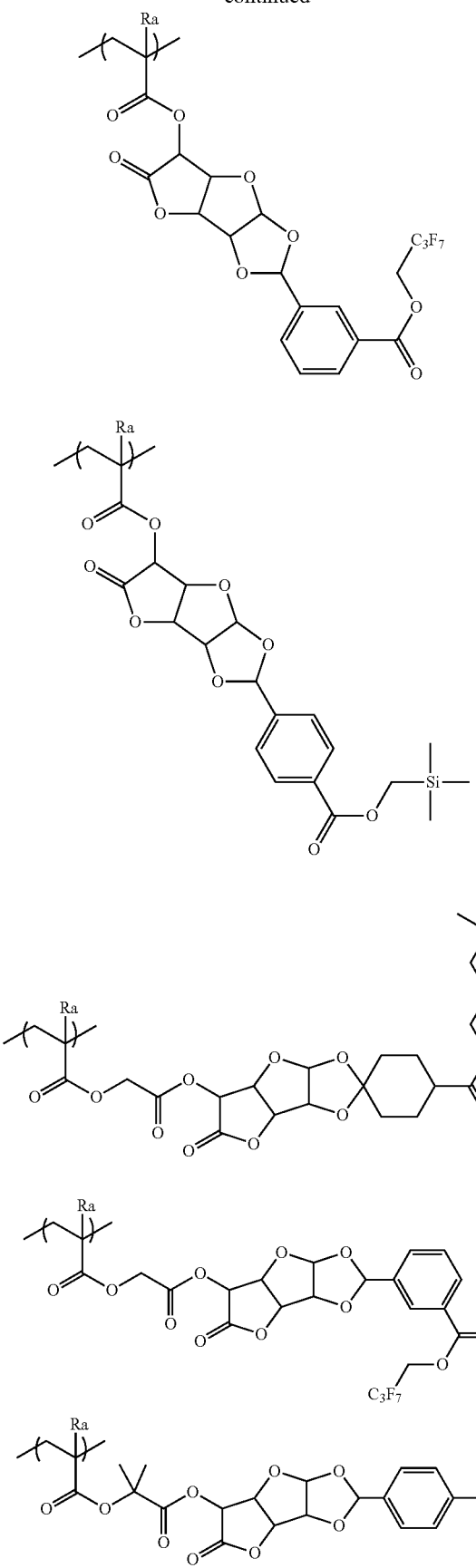
56
-continued
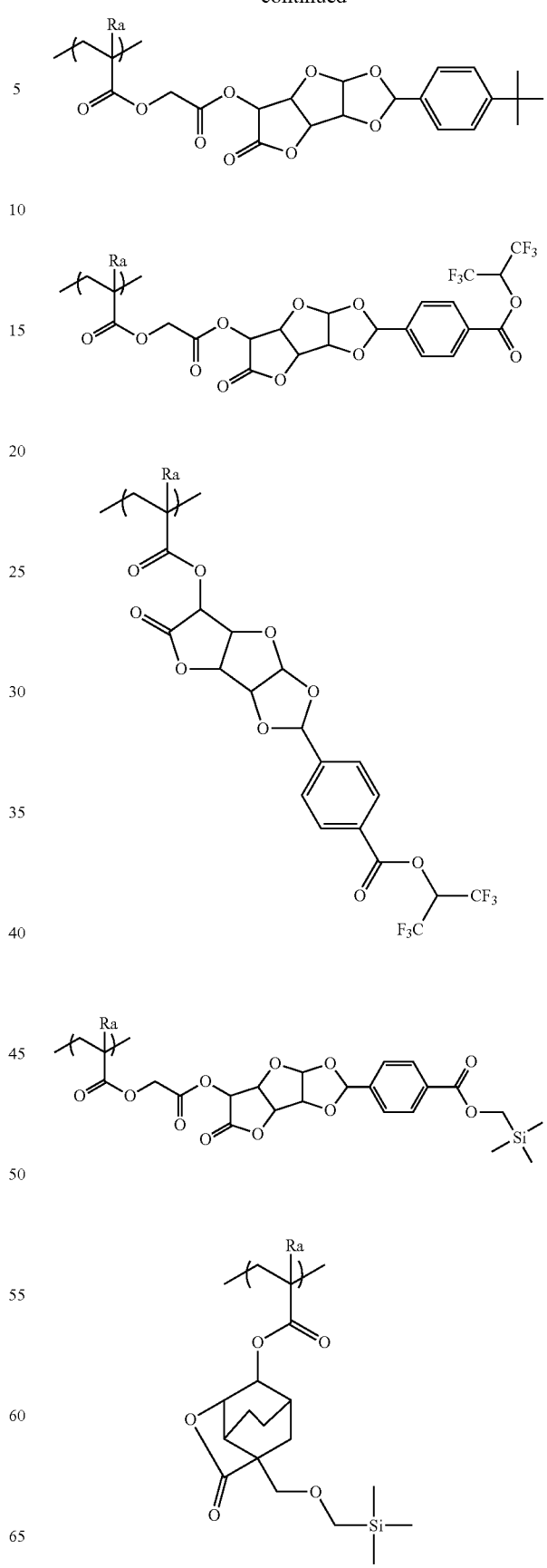

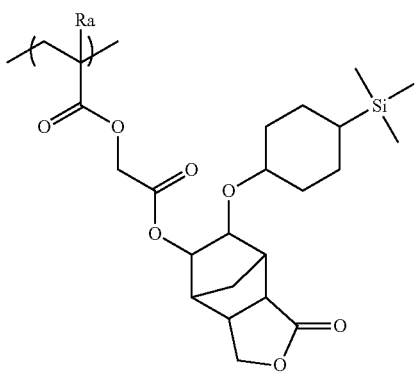
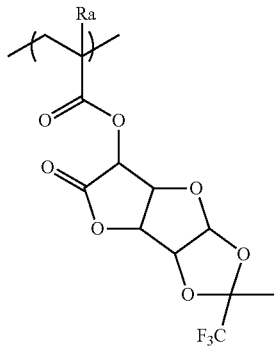
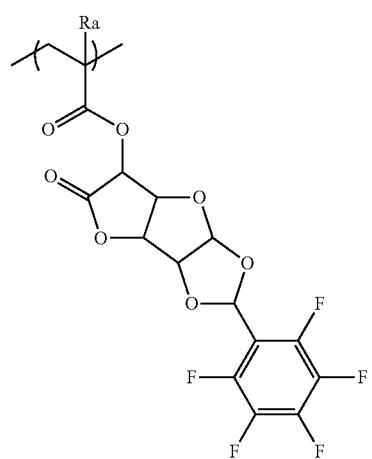
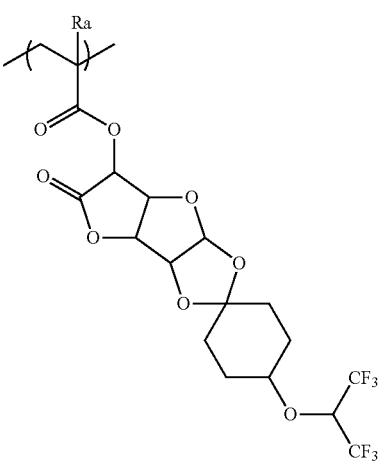
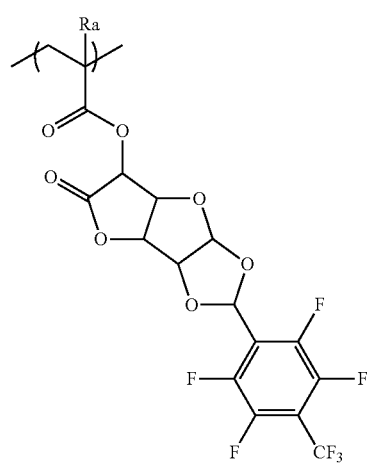
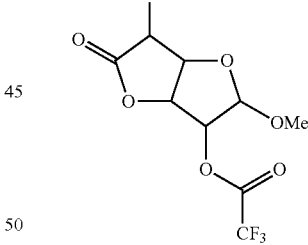
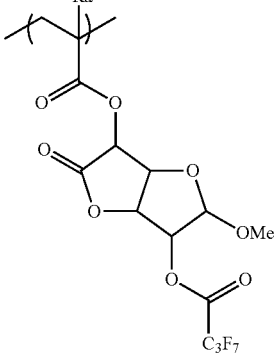
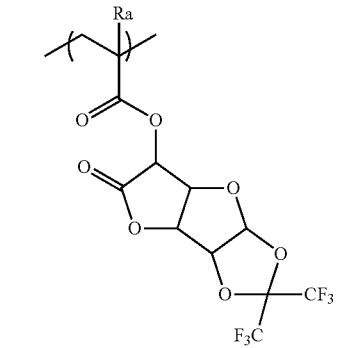
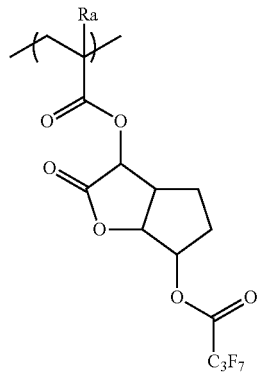

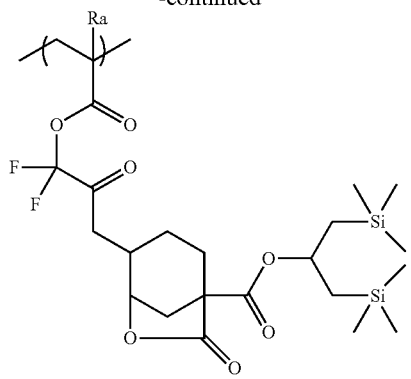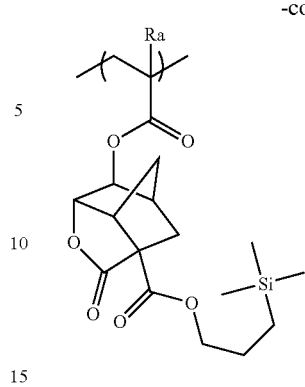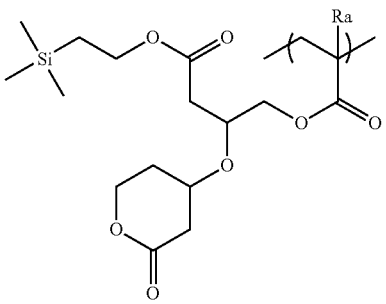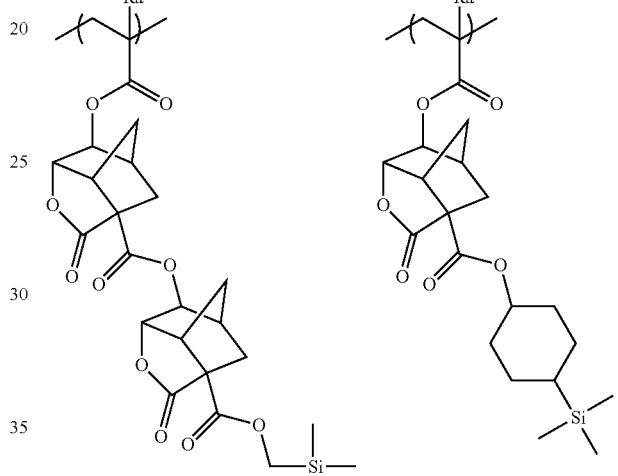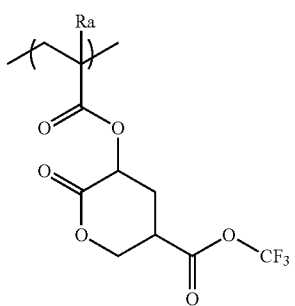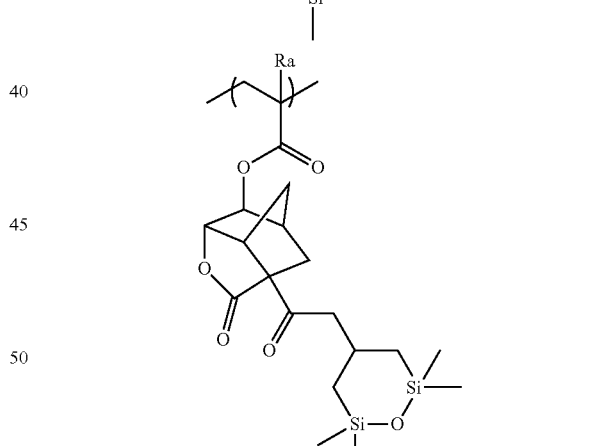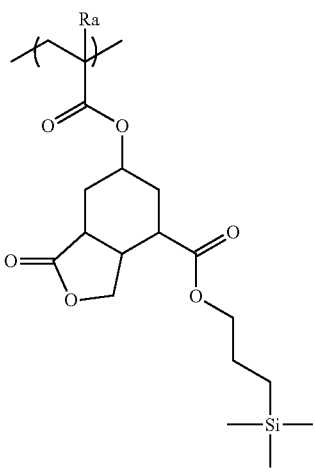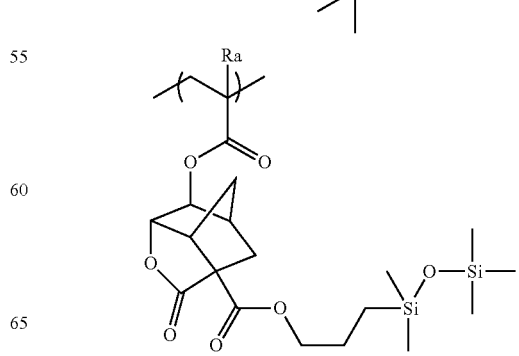

-continued
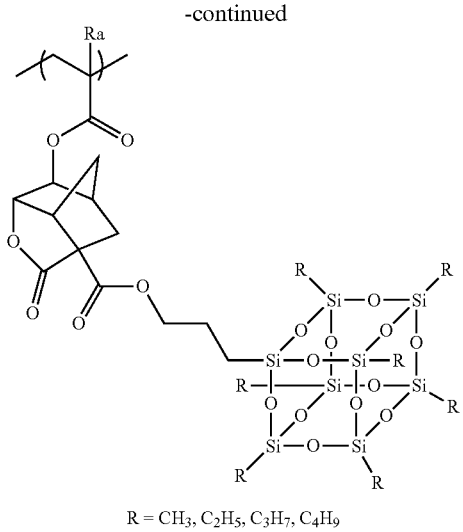
R = CH₃, C₂H₅, C₃H₇, C₄H₉
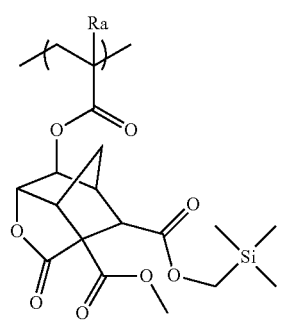
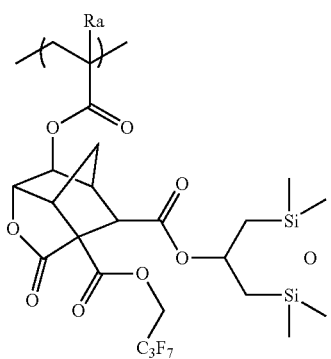
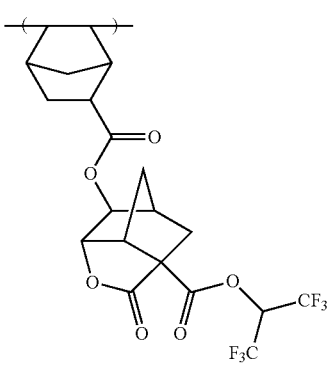
-continued
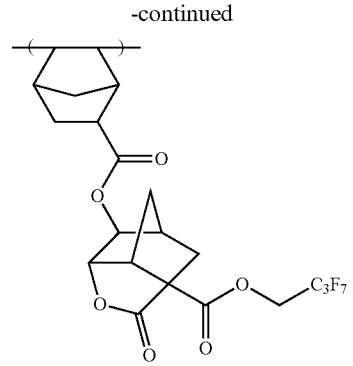
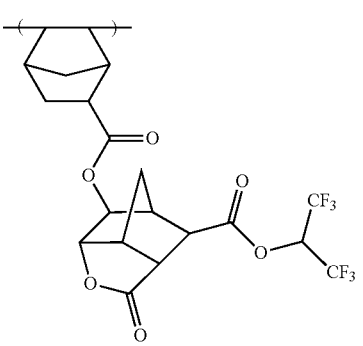
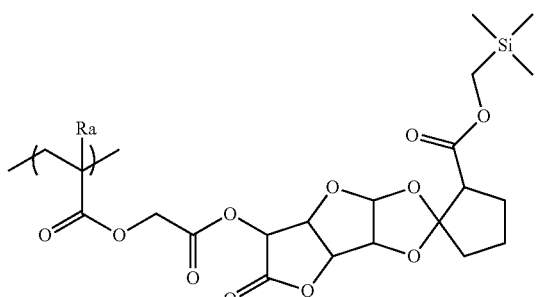
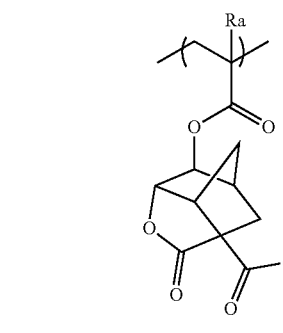
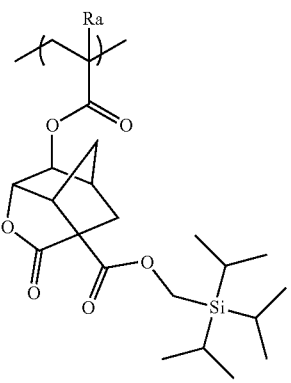

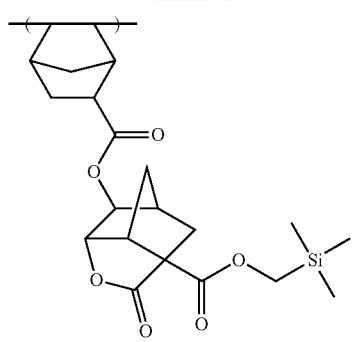
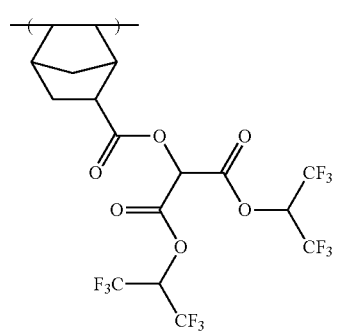
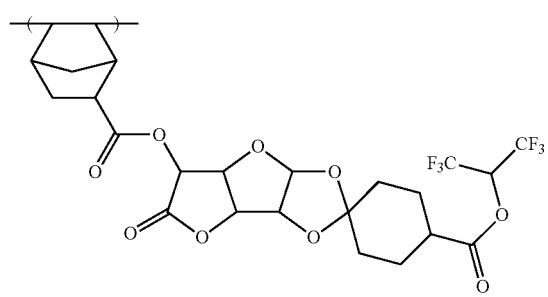
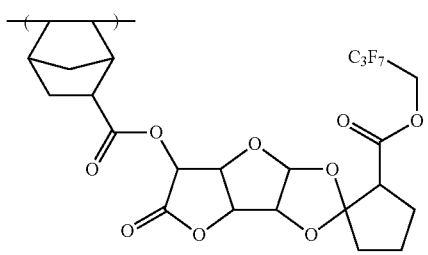
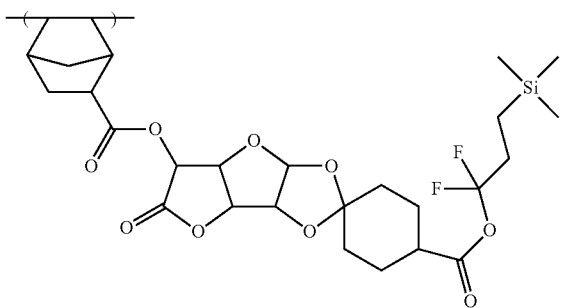
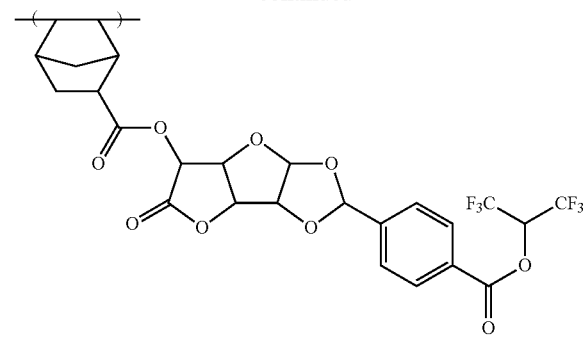
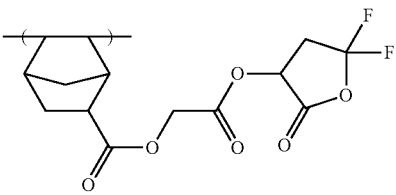
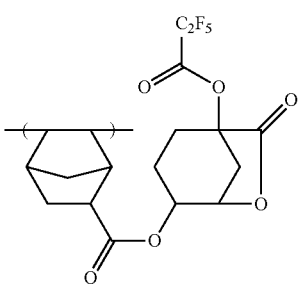
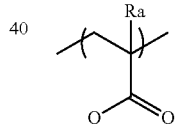
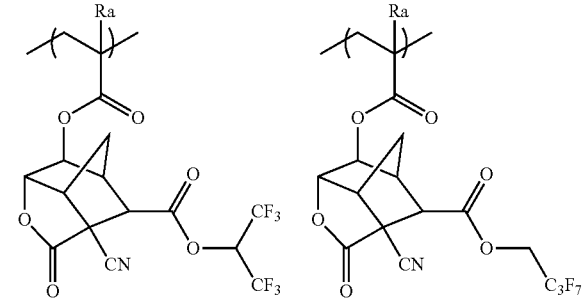
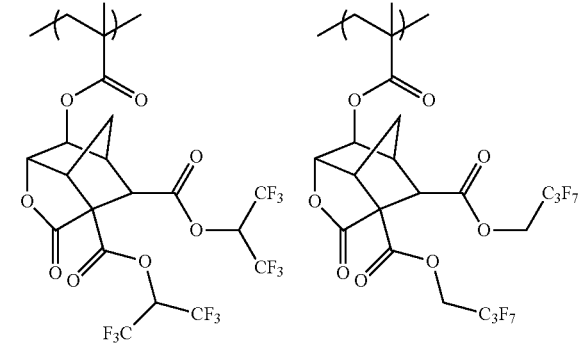

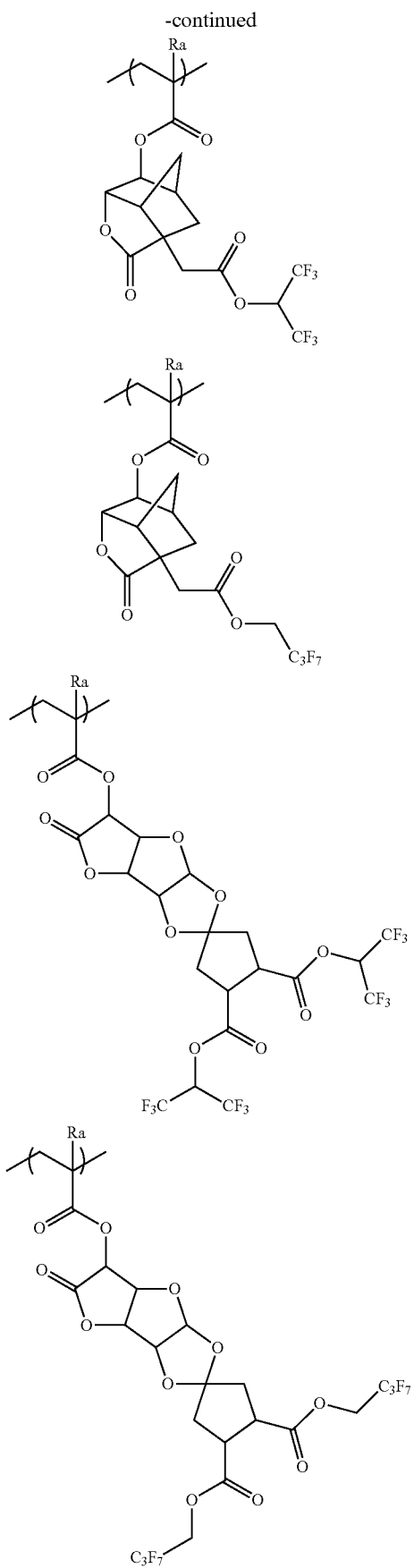
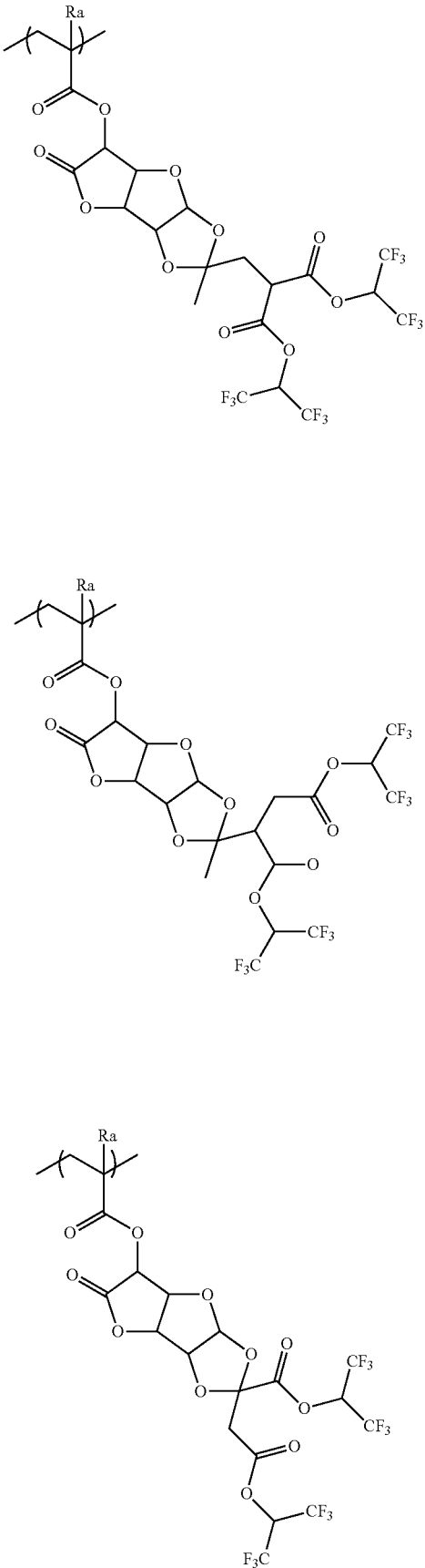

-continued
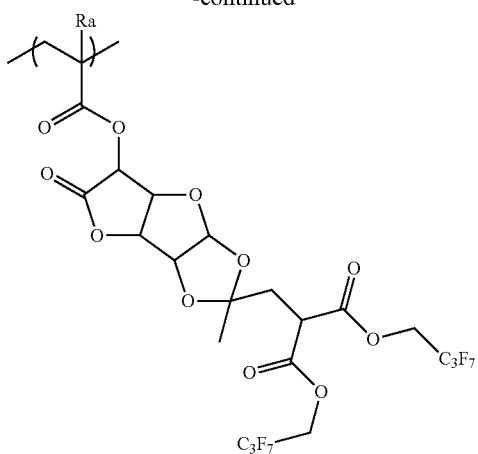
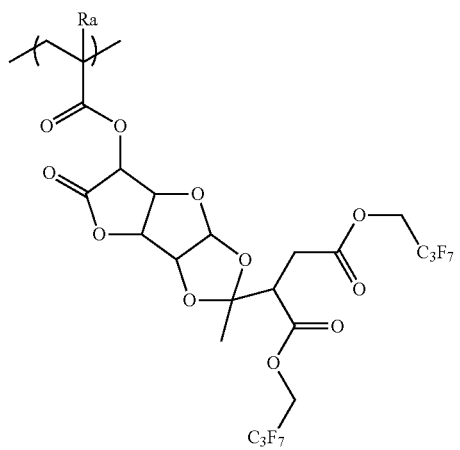
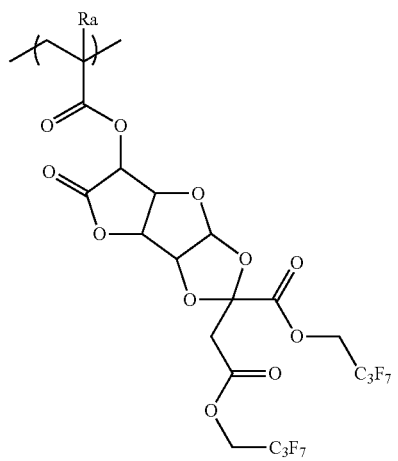
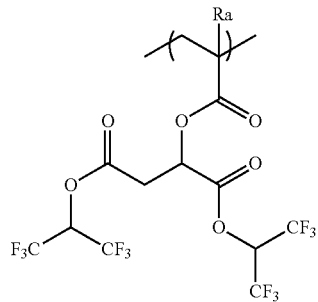
-continued
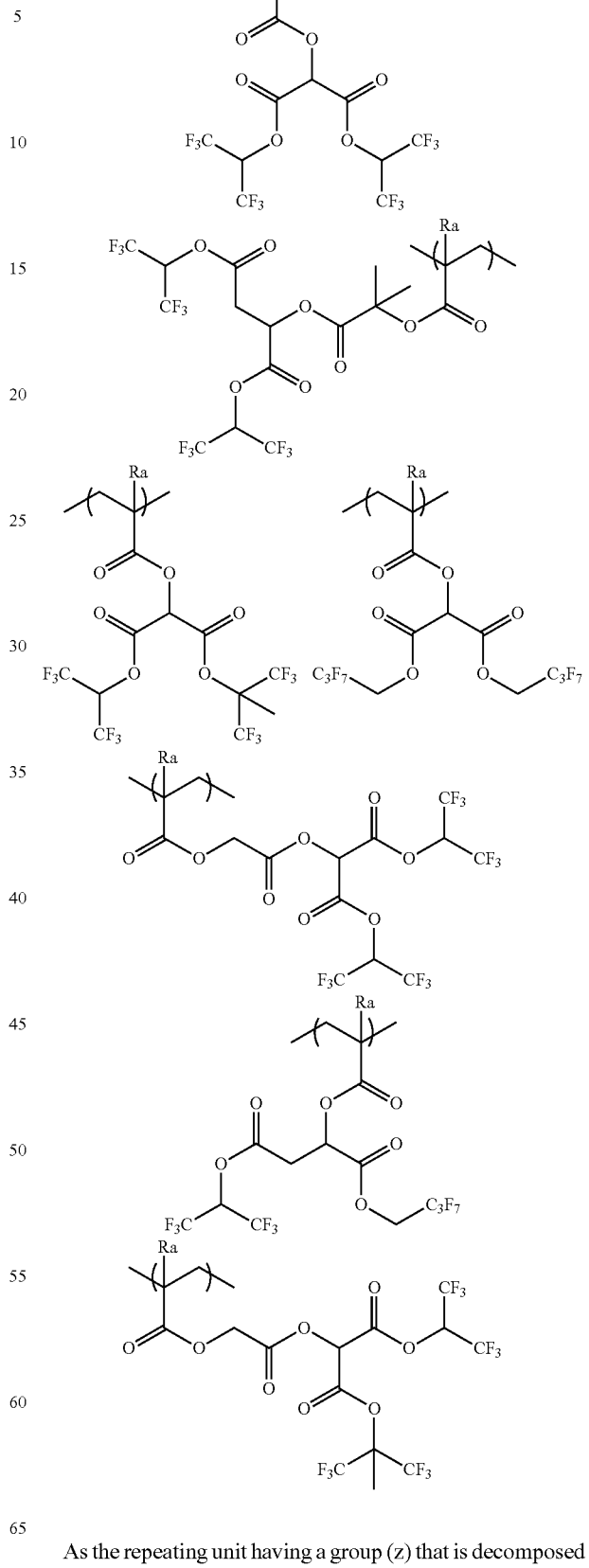
As the repeating unit having a group (z) that is decomposed by the action of an acid in the resin (C), there can be mentioned those similar to the repeating units having an acid decomposable group set forth with respect to after-mentioned resin (A).

The content of the repeating unit having a group (z) that is decomposed by the action of an acid in the resin (C), based on all the repeating units of the resin (C), is preferably in the range of 1 to 80 mol %, more preferably 10 to 80 mol % and further more preferably 20 to 60 mol %.

The resin (C) may further contain any of the repeating units of the general formula (III), below.

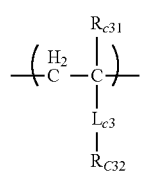

In general formula (III), $R_{c31}$ represents a hydrogen atom, an alkyl group, an alkyl group substituted with a fluorine atom, a cyano group or —$CH_2$—O-$Rac_2$ group, wherein $Rac_2$ represents a hydrogen atom, an alkyl group or an acyl group. $R_{c31}$ is preferably a hydrogen atom, a methyl group, a hydroxymethyl group or a trifluoromethyl group, especially preferably a hydrogen atom or a methyl group.

$R_{c32}$ represents a group having any of an alkyl group, a cycloalkyl group, an alkenyl group, a cycloalkenyl group and an aryl group. These groups may optionally be substituted with a fluorine atom or a silicon atom.

$L_{c3}$ represents a single bond or a bivalent connecting group.

In general formula (III), the alkyl group represented by $R_{c32}$ is preferably a linear or branched alkyl group having 3 to 20 carbon atoms.

The cycloalkyl group is preferably a cycloalkyl group having 3 to 20 carbon atoms.

The alkenyl group is preferably an alkenyl group having 3 to 20 carbon atoms.

The cycloalkenyl group is preferably a cycloalkenyl group having 3 to 20 carbon atoms.

The aryl group is preferably an aryl group having 6 to 20 carbon atoms. As such, there can be mentioned a phenyl group or a naphthyl group. The aryl group may have a substituent.

Preferably, $R_{c32}$ represents an unsubstituted alkyl group or an alkyl group substituted with a fluorine atom.

The bivalent connecting group represented by $L_{c3}$ is preferably an alkylene group (preferably having 1 to 5 carbon atoms), an oxy group, a phenylene group or an ester bond (group of the formula —COO—).

Further, the resin (C) may preferably have any of the repeating units of general formula (CII-AB), below.

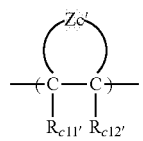

In general formula (CII-AB), each of $R_{c11'}$ and $R_{c12'}$ independently represents a hydrogen atom, a cyano group, a halogen atom or an alkyl group.

$Zc'$ represents an atomic group for forming an alicyclic structure which contains two bonded carbon atoms (C—C).

Specific examples of the repeating units of general formulae (III) and (CII-AB) will be shown below, which however in no way limit the scope of the present invention. In the formulae, Ra represents H, $CH_3$, $CH_2OH$, $CF_3$ or CN.

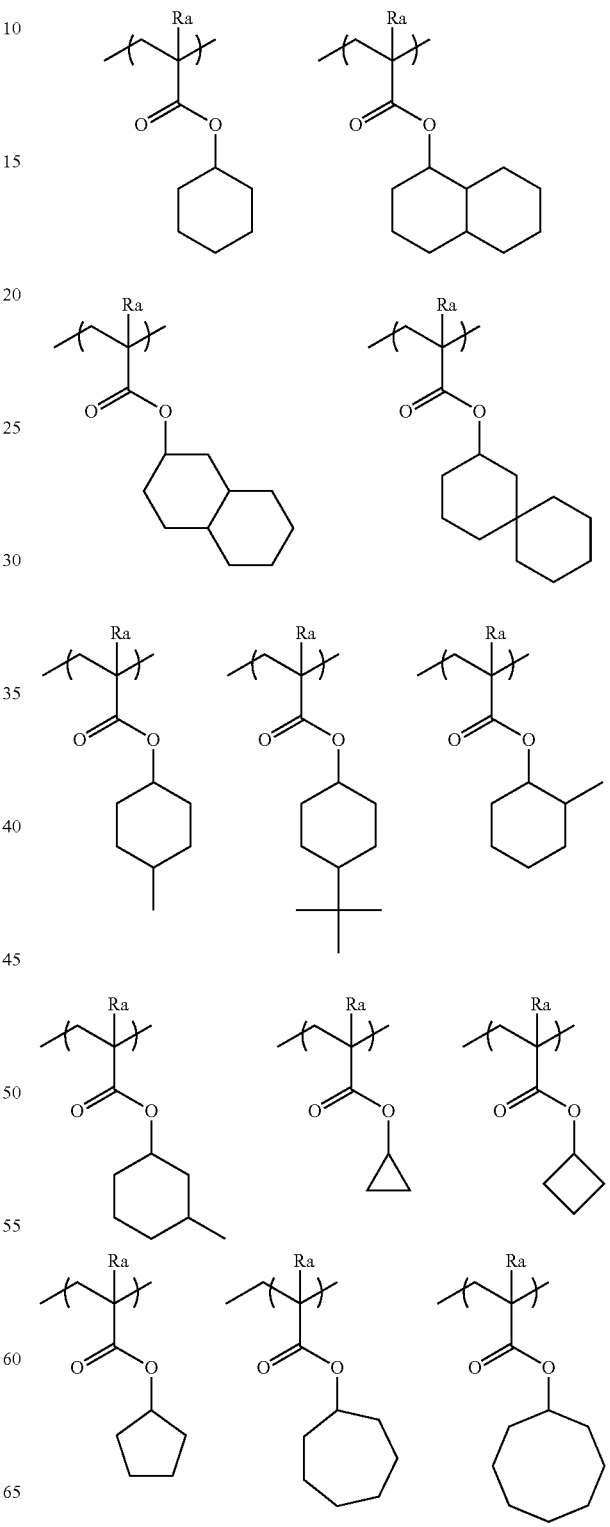

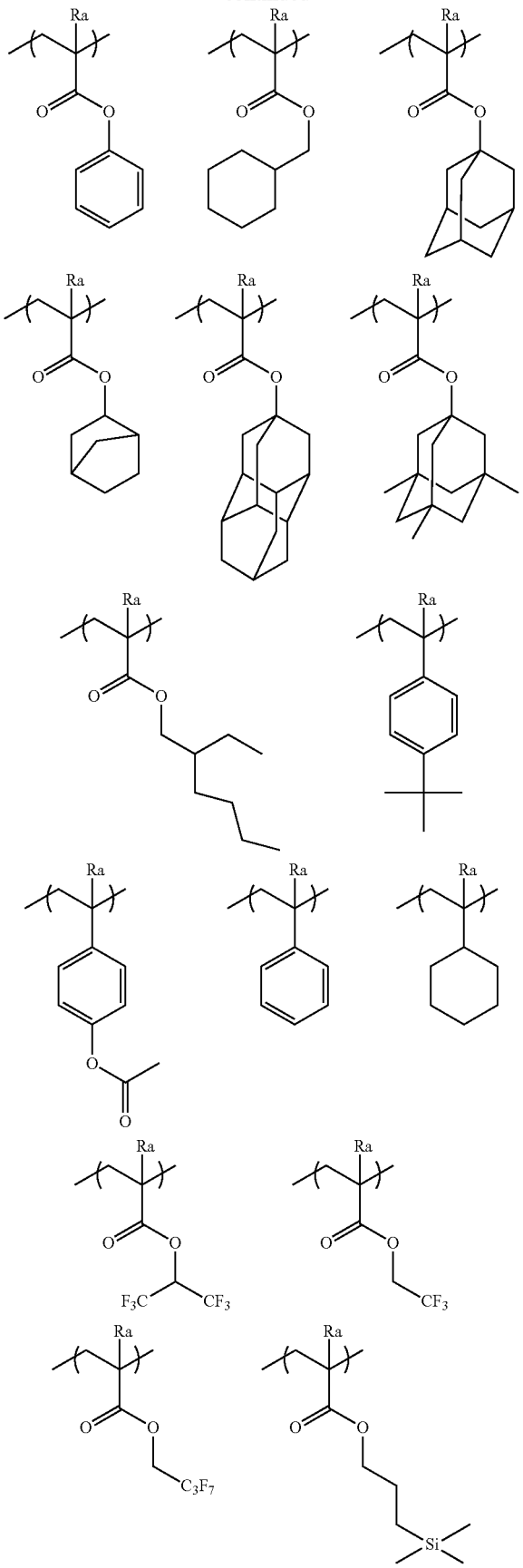
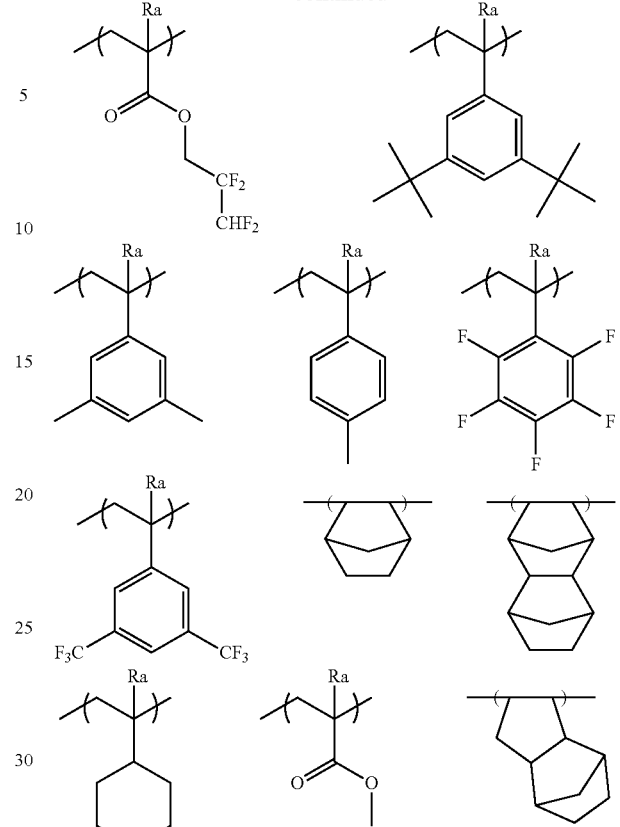

The resin (C) is a polymer comprising three or more polymer chains combined together through at least one branch point, namely, a branched polymer. Herein, the polymer chain refers to one comprising a plurality of repeating units.

The resin (C) being a branched polymer is different in the structure from conventional linear polymers each consisting only of a single polymer chain. With respect to the branched polymer, reference can be made to "Nanotechnology of branched polymer" edited and written by Koji Ishizu, Chapters 1, 6 and 7 (IPC Publishing) and "Graduate course: polymer chemistry" edited by Takuhei Nose, Seiichi Nakahama and Seizo Miyata, p. 39 (Kodansha Ltd.). It is known that as branched polymers generally have properties attributed to a branch (axis division) structure, they are markedly different in the solution and solid properties from ordinary linear polymers.

As the branched polymer employed as resin (C), there can be mentioned, for example, a comb polymer, a star polymer or a hyperbranched polymer. The resin (C) is preferably a comb polymer or a star polymer, more preferably a star polymer.

The comb polymer refers to a branched polymer comprising a stem with a multiplicity of branches arranged at equal intervals. Among the comb polymers, one in which the configuration or arrangement of the side chain (branch) is different from that of the main chain (stem) is called a graft polymer. The star polymer refers to a branched polymer comprising a nucleus of atom or atomic group and, radially extending therefrom, three or more branch chains.

As the method for ascertaining whether or not there is a branch chain of the above branched polymer, there can be mentioned the method by gel permeation chromatography (GPC)-light scattering measurement. Namely, first, the GPC/

MALLS (multiangle light scattering) measurement of a subject polymer is carried out. At each of the elution positions, $<R^2>^{1/2}$ (square root of square mean of radius R) is determined from the slope of scattered light intensity. The weight average molecular weight Mw thereof is determined from the intercept of scattered light intensity. The logarithms of Mw and $<R^2>^{1/2}$ are plotted, and the slope α of the plot is calculated by the method of least squares. For example, the slope $α_X$ of a certain polymer X is compared with the slope $α_l$ of a linear polymer whose monomer species are the same as those of the polymer X and whose copolymerization composition is similar to that of the polymer X (for example, the error of copolymerization composition is within 10%, namely, the difference between the contents (mol %) of identical repeating units contained in the greatest amount in two types of polymers is within 10 mol %). The following evaluation is made on the basis of the ratio of $α_l/α_X$. When $α_l/α_X>1$, a branch chain is present in the polymer X. The greater than 1 the value of the ratio of $α_l/α_X$, the greater the proportion of branch in the molecule of the polymer X. When $α_l/α_X≤1$, the polymer X does not contain any branch chain. When $α_b$ refers to the slope obtained by the above plot with respect to the branched polymer according to the present invention, the ratio of $α_l/α_b$ is preferably 1.02 or higher, more preferably 1.03 or higher, further more preferably 1.04 or higher and most preferably 1.05 or higher.

The polymer chains as constituents of the above branched polymers (not limited to the stem portion or branch portion) can be polymerized by conventional techniques (chain polymerization, such as radical polymerization, cation polymerization, anion polymerization, living radical polymerization, living cation polymerization or living anion polymerization, or condensation polymerization). Chain polymerization is preferred. Namely, it is preferred for the polymer chains as constituents of the above branched polymers to be composed of vinyl repeating units. Among the chain polymerizations, radical polymerization and living radical polymerization provide especially preferred polymerization methods.

The methods of synthesizing branched polymers will be described below.

The method of synthesizing a comb polymer (C1) is not limited as long as the polymer with the structure conforming to the above definition of the comb polymer can be synthesized. For example, there can be mentioned a method in which polymerization initiation points are generated on a stem polymer by some means and a stem monomer is polymerized therefrom to thereby form branches, or a method in which an active polymer, such as a living polymer, is caused to react with a stem polymer, or a method in which a polymer (macromonomer) having a polymerizable functional group at its terminal is polymerized. Among these synthetic methods, the macromonomer method is preferred. With respect to the synthesis of a macromonomer and the synthesis of a polymer therefrom, reference can be made to "Chemistry of macromonomer and its industry" edited and written by Yuya Yamashita, Chapters 2 and 3 (IPC Publishing).

The synthesis of a star polymer (C2) can be accomplished by various methods. For example, it is appropriate to employ a method in which a monomer for the formation of a structural unit of star-shaped branched polymer, preferably a monomer containing (meth)acrylic ester to be described hereinbelow, is polymerized in the presence of a polyfunctional chain transfer agent of tri- or higher-functionality, preferably a mercaptan compound of tri- or higher-functionality. Namely, a method in which the radical polymerization of a mixture of monomers as mentioned above is performed using a polymerization initiator in the presence of a mercaptan compound of tri- or higher-functionality is preferred from the viewpoint of favorable chain transfer.

When the resin (C) is a star polymer (C2), it is preferred for the mercaptan compound for use in the production thereof to be any of the compounds with the structures of general formula (Ia) below.

In general formula (Ia),

J represents an n-valent hydrocarbon group optionally containing a substituent and/or a heteroatom.

X represents a single bond or a bivalent connecting group, and n is an integer of 3 or greater.

As the n-valent hydrocarbon group optionally containing a substituent and/or a heteroatom, represented by J, there can be mentioned a linear or branched alkyl group, a cycloalkyl group, an aryl group, an aralkyl group, an alkoxyalkyl group or the like.

The linear or branched alkyl group is preferably a linear or branched alkyl group having 1 to 20 carbon atoms. As such, there can be mentioned, for example, a methyl group, an ethyl group, an n-propyl group, an i-propyl group, an n-butyl group, an i-butyl group, a t-butyl group, a pentyl group, a hexyl group, a heptyl group, an octyl group, a nonyl group, a decyl group, an undecyl group, a dodecyl group, a tridecyl group, a tetradecyl group, a 3-ethylpentyl group, a 4-propylheptyl group, a 3,3-diethylpentyl group, a 4,4-dipropylheptyl group or the like.

The cycloalkyl group is preferably a cycloalkyl group having 3 to 20 carbon atoms. As such, there can be mentioned, for example, any of cyclopropyl, cyclobutyl, cyclopentyl, cyclohexyl, cycloheptyl, cyclooctyl, cyclononyl, norbornyl, adamantyl, diadamantyl, tricyclodecanyl and tetracyclododecanyl structures.

As the aryl group, there can be mentioned a phenyl group, a naphthyl group, a thiophene group, a furan group, a pyrrole group, an indole group or the like.

As the aralkyl group, there can be mentioned a group resulting from the linkage of the above aryl group to an alkyl group having 1 to 4 carbon atoms.

The alkoxyalkyl group is preferably a linear, branched or cyclic alkoxyalkyl group having 1 to 20 carbon atoms. For example, there can be mentioned a linear, branched or cyclic alkoxyalkyl group, such as a methoxymethyl group, an ethoxymethyl group, an n-propoxymethyl group, an i-propoxymethyl group, an n-butoxymethyl group, a 2-methylpropoxyethyl group, a 1-methylpropoxymethyl group, a tetrahydrofuranyl group, a tetrahydropyranyl group or the like.

The n-valent hydrocarbon group optionally containing a substituent and/or a heteroatom, represented by J, is preferably a linear or branched alkyl group or a cycloalkyl group, more preferably a linear or branched alkyl group having 3 to 15 carbon atoms or a cycloalkyl group having 3 to 15 carbon atoms.

In general formula (Ia), n is preferably an integer of 3 to 10, more preferably an integer of 3 to 6.

As particular examples of the mercaptan compounds, there can be mentioned those of the following structures, which however in no way limit the scope of useful mercaptan compounds. The particular examples include tris[(3-mercaptopropionyloxy)ethyl]isocyanurate, trimethylolmethane tris(2- mercaptoacetate), trimethylolethane tris(2-mercaptoacetato) trimethylol, trimethylolmethane tris(3-mercaptopropionate), trimethylolpropane tris(3-mercaptopropionate), pentaerythritol tetrakis(2-mercaptoacetate), pentaerythritol tetrakis(3-mercaptopropionate), tetraethylene glycol bis(3-mercaptopropionate), dipentaerythritol hexakis(3-mercaptopropionate) and the like. Of these, pentaerythritol tetrakis(2-mercaptoacetate) and pentaerythritol tetrakis(3-mercaptopropionate) being tetrafunctional compounds are especially preferred. When any of these mercaptan compounds is present in a polymerization system, growing radicals can easily abstract hydrogen from the mercaptan compound, and the radicals produced by this chain transfer reaction are added to a monomer, thereby re-initiating polymerization. Therefore, a tri- or tetra-branched polymer can be produced by using the polyfunctional chain transfer agent of tri- or higher-functionality.

Any mercaptan compound may be used alone, or two or more types of mercaptan compounds may be used in combination.

With respect to polymerization methods, the resins can be synthesized by radical polymerization using an initiator and a chain transfer agent. For example, there can be mentioned a batch polymerization method in which monomer species, an initiator and a chain transfer agent are dissolved in a solvent and heated so as to accomplish polymerization, and a dropping polymerization method in which a solution of monomer species and initiator is dropped into a heated solvent over a period of 1 to 10 hours. The dropping polymerization method is preferred. As a reaction solvent, there can be mentioned, for example, an ether, such as tetrahydrofuran, 1,4-dioxane or diisopropyl ether; a ketone, such as methyl ethyl ketone or methyl isobutyl ketone; an ester solvent, such as ethyl acetate; an amide solvent, such as dimethylformamide or dimethylacetamide; or a solvent capable of dissolving the composition of the present invention, such as propylene glycol monomethyl ether acetate, propylene glycol monomethyl ether or cyclohexanone, to be hereinafter described. It is preferred to perform the polymerization with the use of the same solvent as employed in the resist composition of the present invention. This inhibits any particle generation during storage.

The polymerization reaction is preferably carried out in an atmosphere of inert gas, such as nitrogen or argon. The polymerization is initiated using a commercially available radical initiator (azo initiator, peroxide, etc.) as a polymerization initiator. Among the radical initiators, an azo initiator is preferred. An azo initiator having an ester group, a cyano group or a carboxyl group is preferred. As preferred initiators, there can be mentioned azobisisobutyronitrile, azobisdimethylvaleronitrile, dimethyl 2,2'-azobis(2-methylpropionate) and the like. The amount of polymerization initiator to be added depends on the type and amount of raw monomer and chain transfer agent for use in polymerization reaction and polymerization conditions, such as polymerization temperature and polymerization solvent, and cannot be flatly specified. However, the amount of polymerization initiator is generally selected so as to fall within the range of 0.01 to 10 mol, preferably 0.05 to 5 mol and further more preferably 0.1 to 2 mol per mol of chain transfer agent.

The concentration of monomers in the whole reaction liquid is in the range of 5 to 50 mass %, preferably 10 to 40 mass % and more preferably 15 to 30 mass %.

The reaction temperature is generally in the range of 10° to 150° C., preferably 30° to 120° C. and more preferably 60° to 100° C.

The amount of chain transfer agent added is selected so as to fall within the range of 0.001 to mol, preferably 0.002 to 1 mol, more preferably 0.005 to 0.5 mol, further more preferably 0.01 to 0.2 mol and most preferably 0.02 to 0.1 mol per mol of monomer.

The resins obtained by polymerization are preferably purified before use. In the purification, use can be made of routine methods, such as a liquid-liquid extraction method in which residual monomers and oligomer components are removed by water washing or by the use of a combination of appropriate solvents, a method of purification in solution form such as ultrafiltration capable of extraction removal of only components of a given molecular weight or below, a re-precipitation method in which a resin solution is dropped into a poor solvent to thereby coagulate the resin in the poor solvent and thus remove residual monomers, etc., and a method of purification in solid form such as washing of a resin slurry obtained by filtration with the use of a poor solvent.

Particular examples of repeating units as constituents of resins (C) are shown below. The table following them lists, with respect to each of the resins, the molar ratios of individual repeating units (corresponding to shown individual repeating units in order from the left), the weight average molecular weight, the dispersity and the initiator and chain transfer agent employed in polymerization reaction.

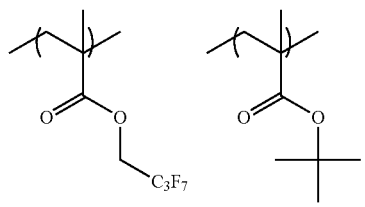

(C-1)

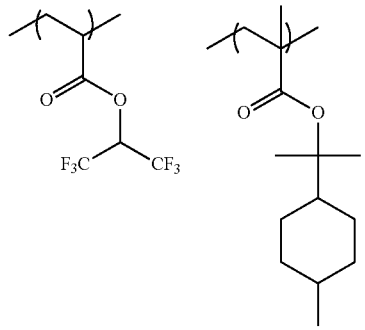

(C-2)

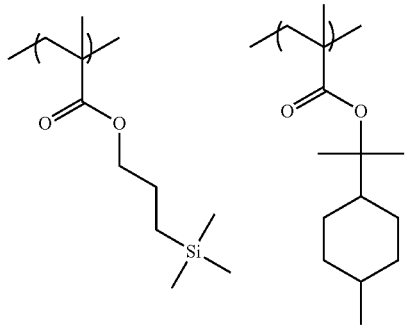

(C-3)

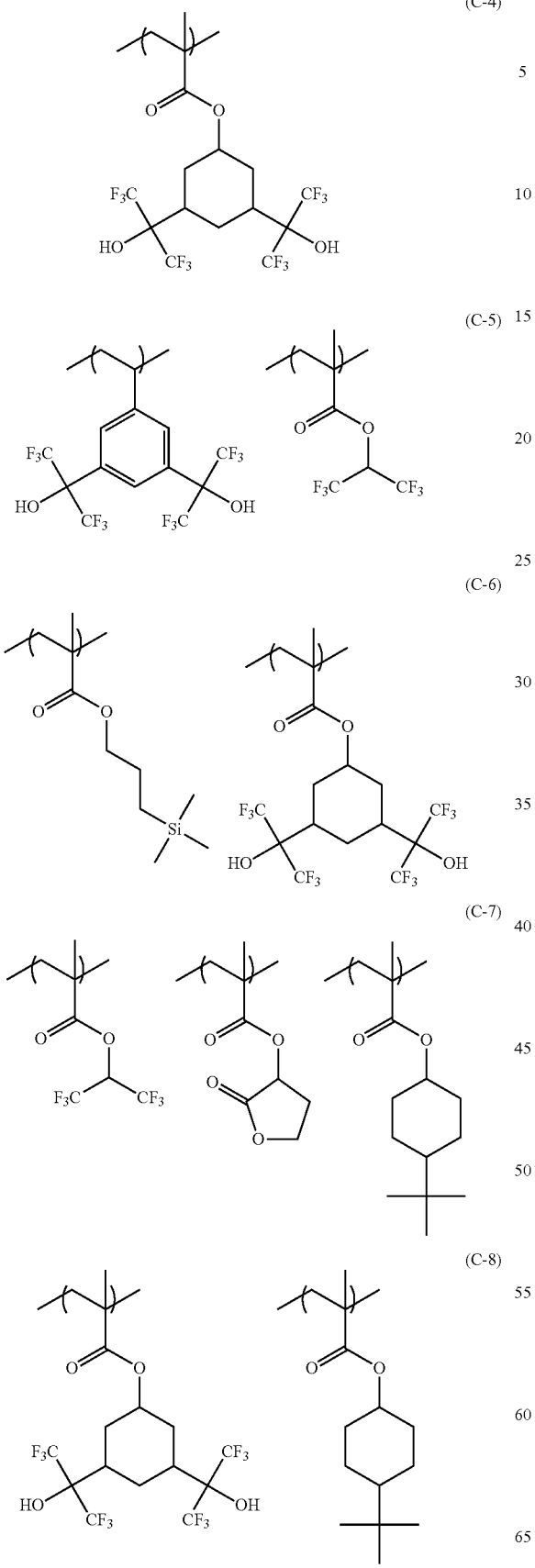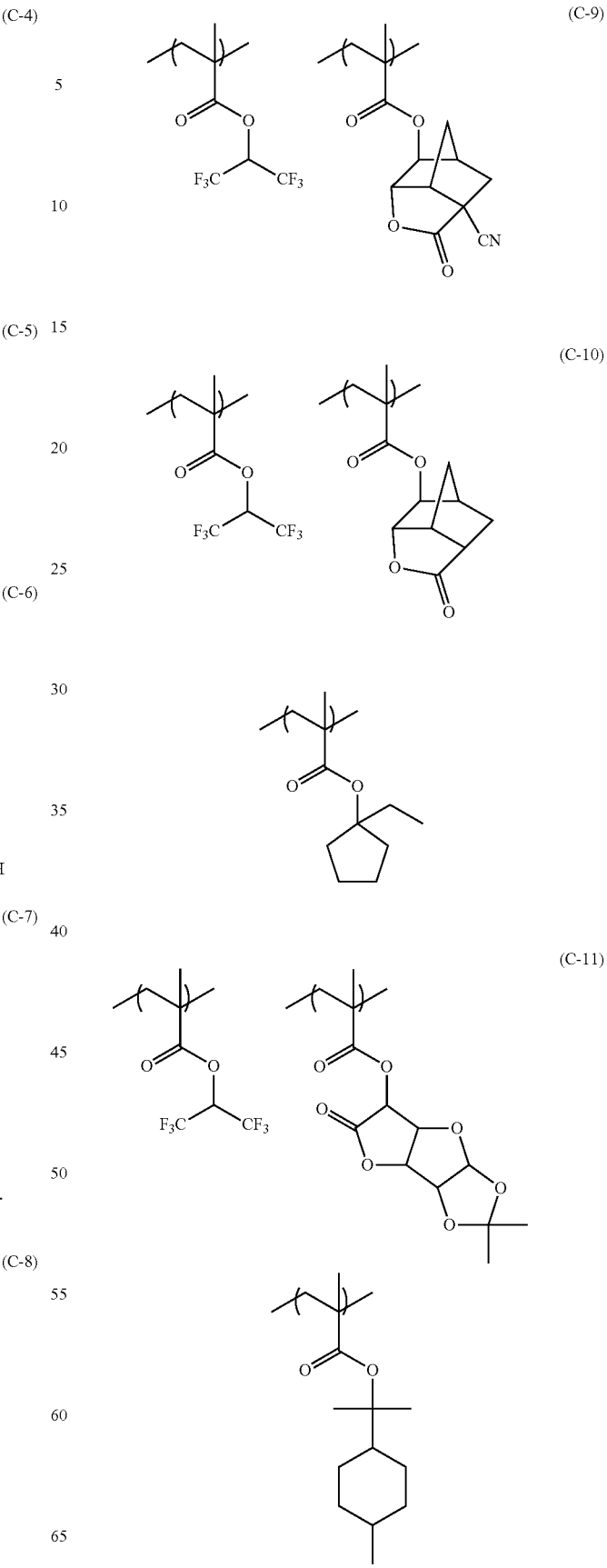

(C-12)
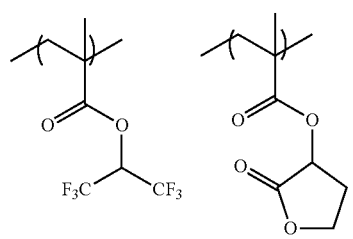
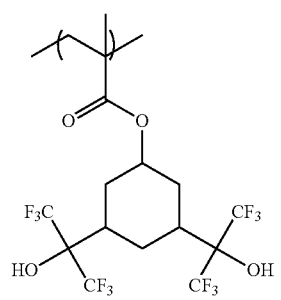
(C-13)
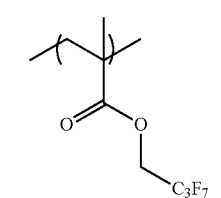
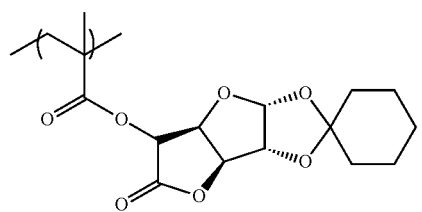
(C-14)
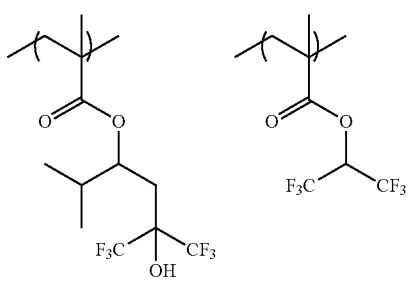
(C-15)
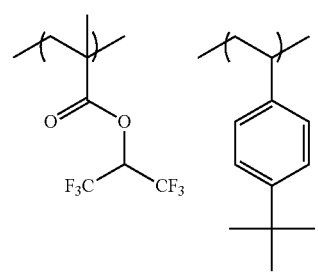
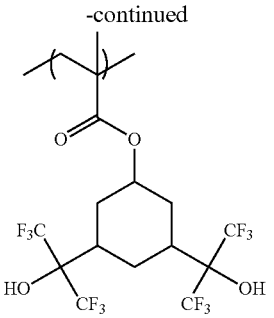
(C-16)
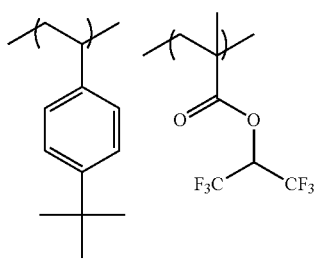
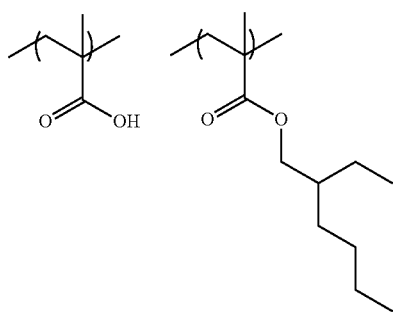
(C-17)
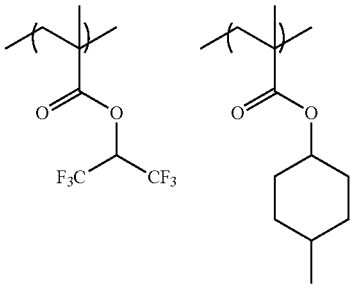
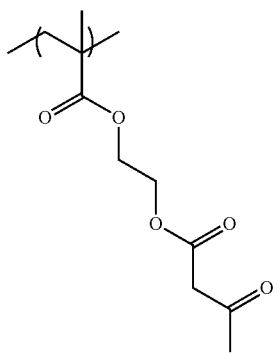

(C-18)
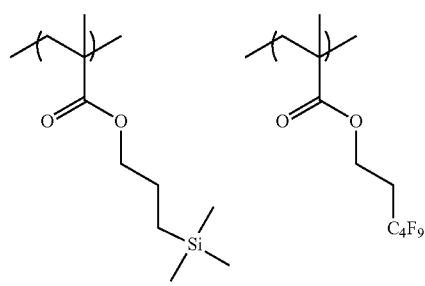
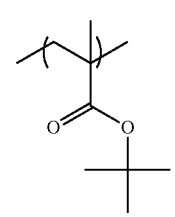
(C-19)
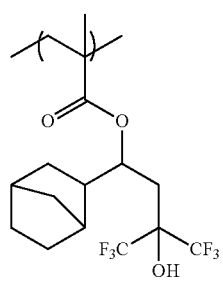
(C-20)
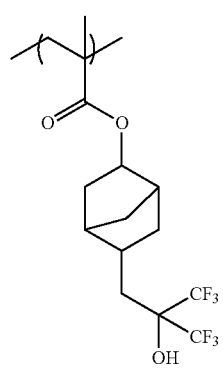
(C-21)
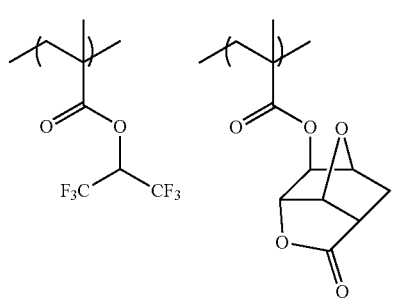
(C-22)
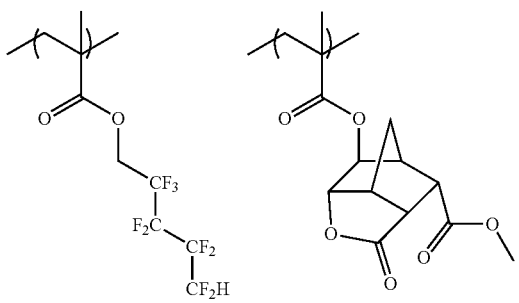
(C-23)
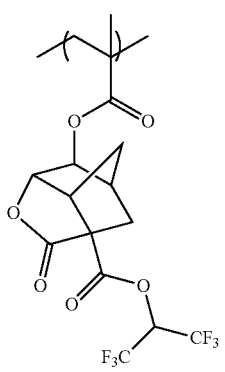
(C-24)
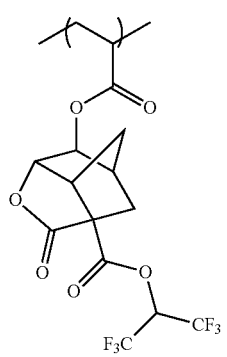
(C-25)
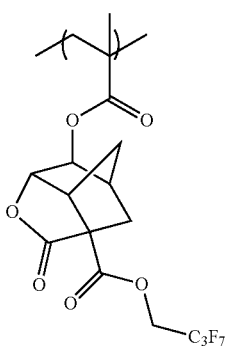

-continued
(C-26)
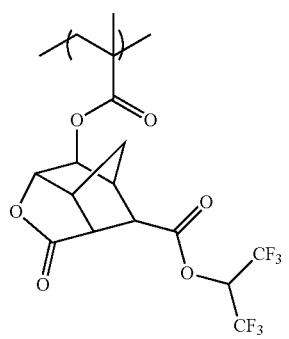
(C-27)
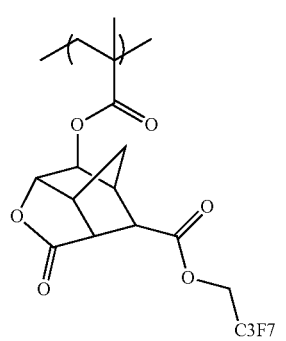
(C-28)
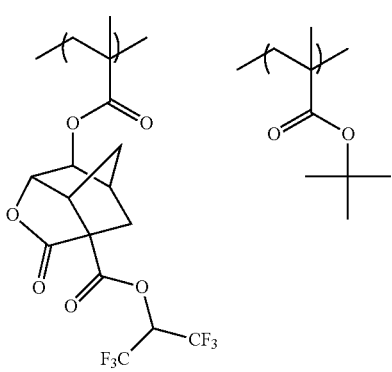
(C-29)
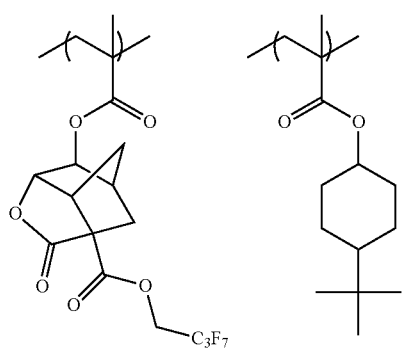
-continued
(C-30)
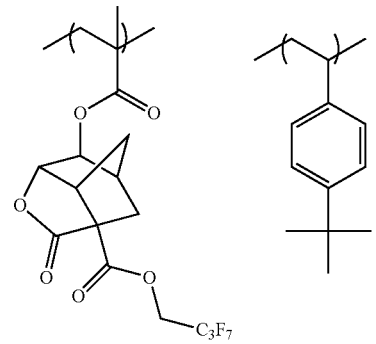
(C-31)
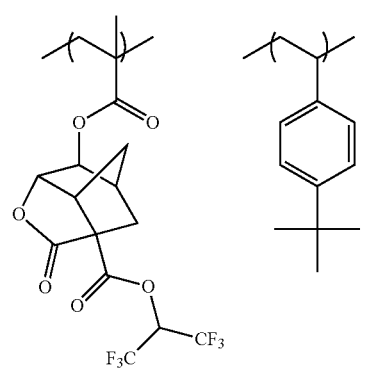
(C-32)
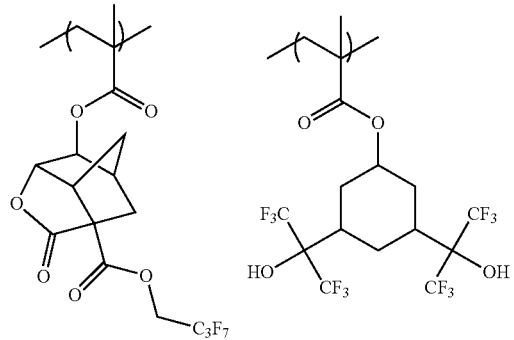

(C-33)
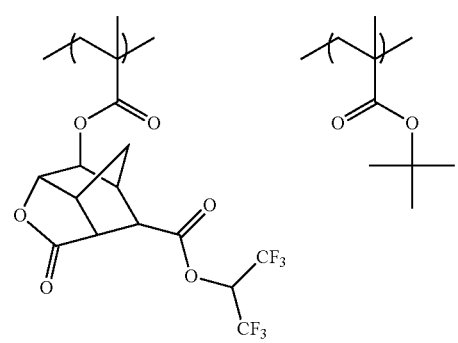
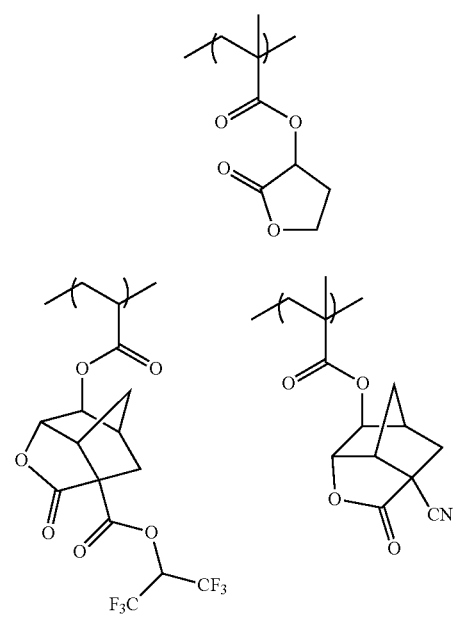
(C-34)
(C-35)
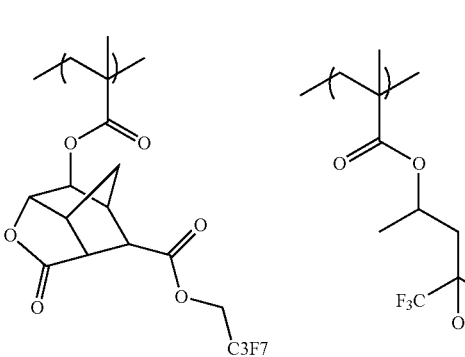
(C-36)
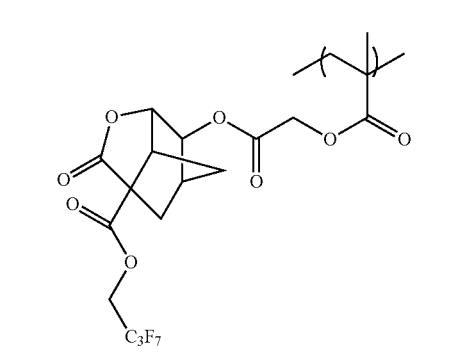
(C-37)
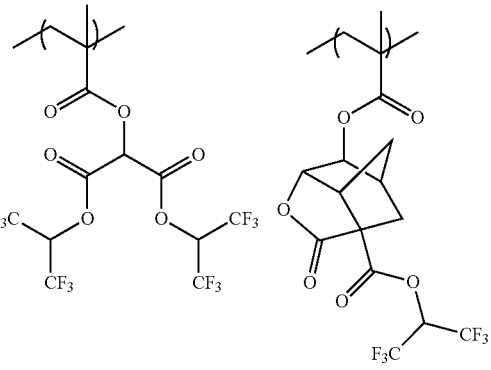
(C-38)
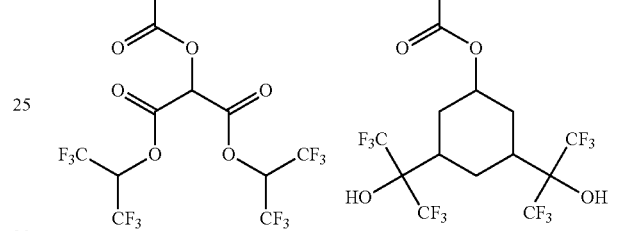
(C-39)
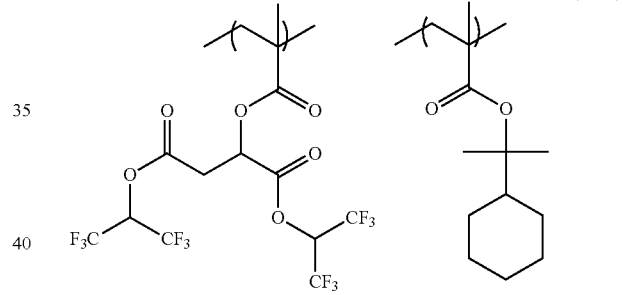
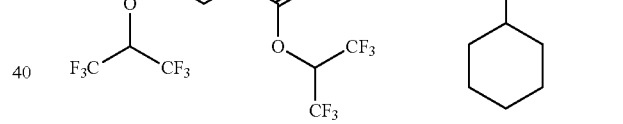
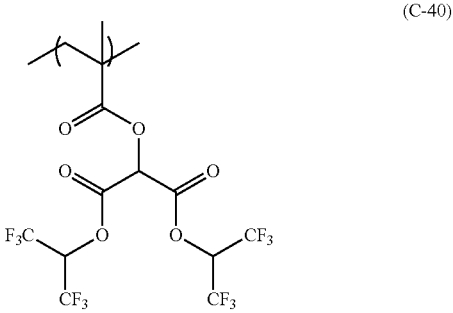
(C-40)
(C-41)
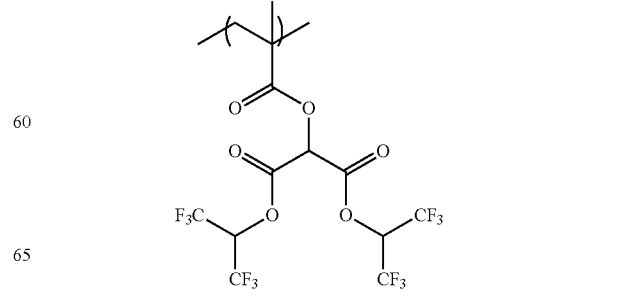

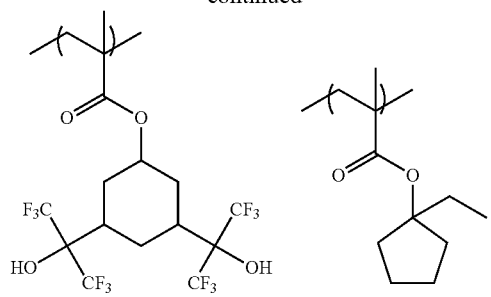
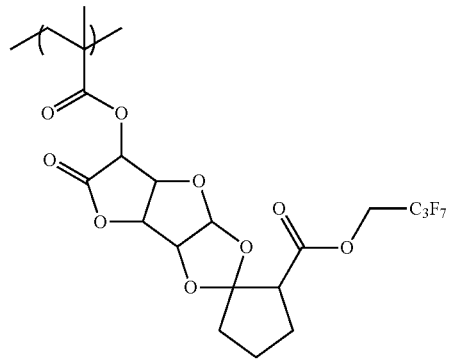
(C-44)
(C-42)
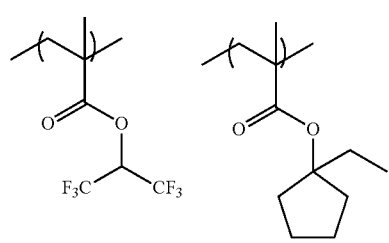
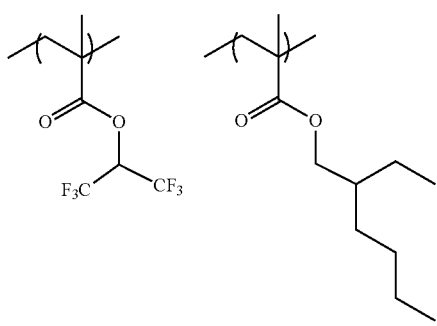
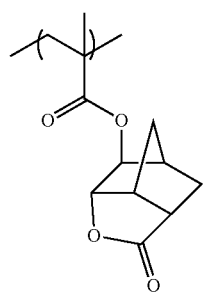
(C-43)
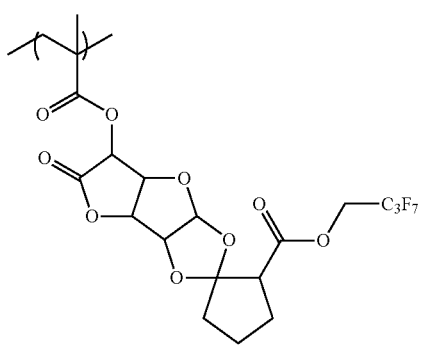
(C-45)
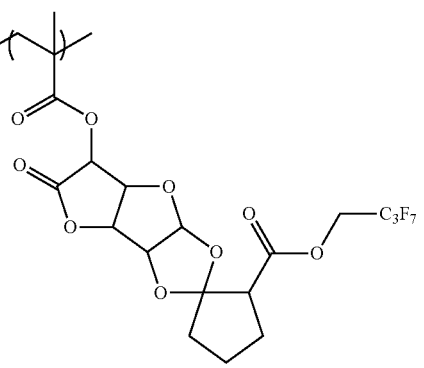
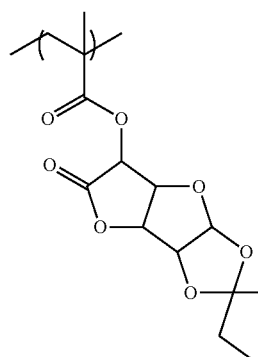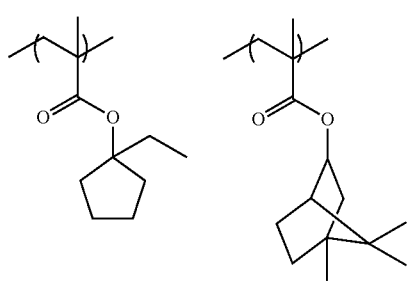
(C-46)
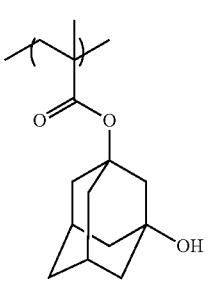

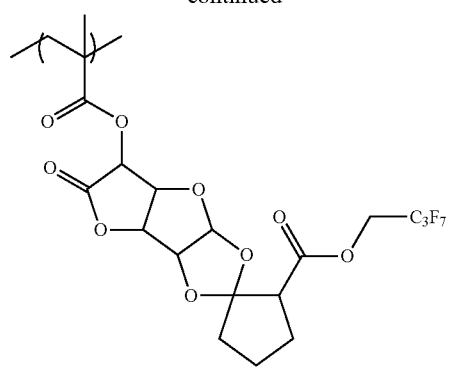
(C-47)
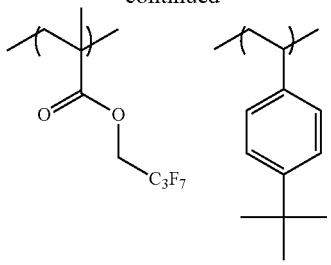
(C-49)
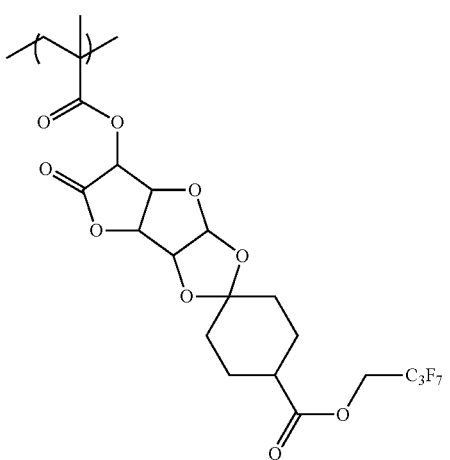
(C-48)
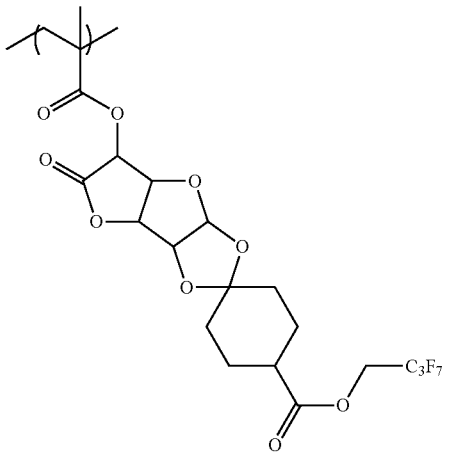
(C-50)
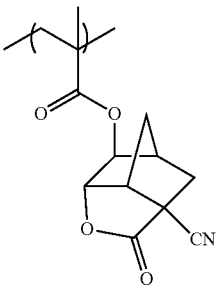

-continued
(C-51)
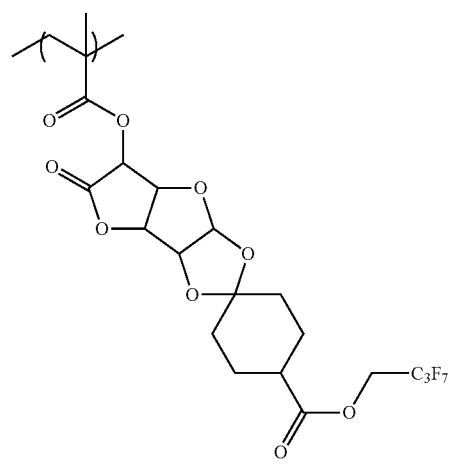
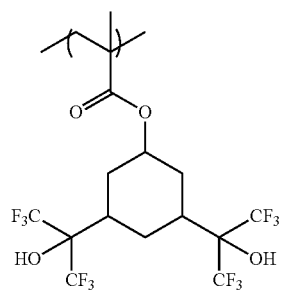
(C-52)
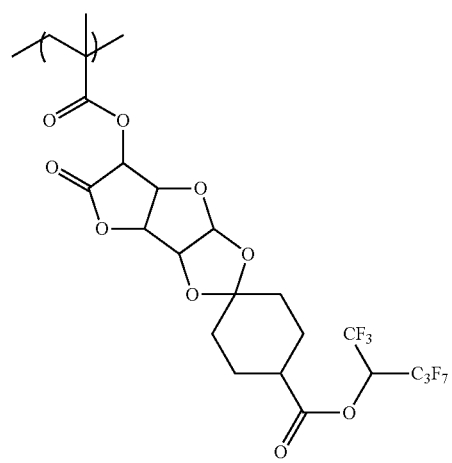
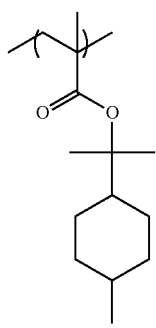
(C-53)
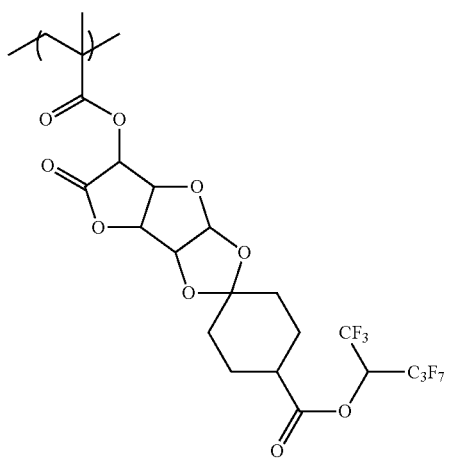
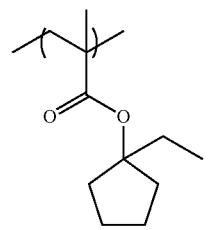
(C-54)
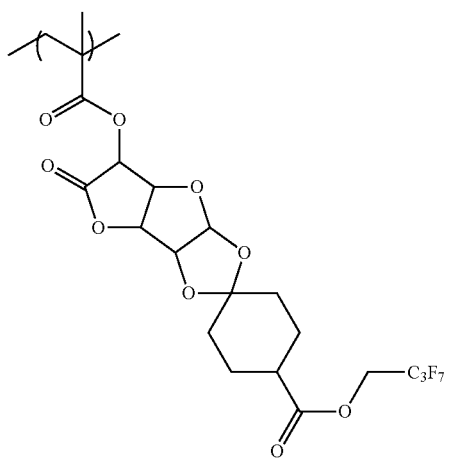
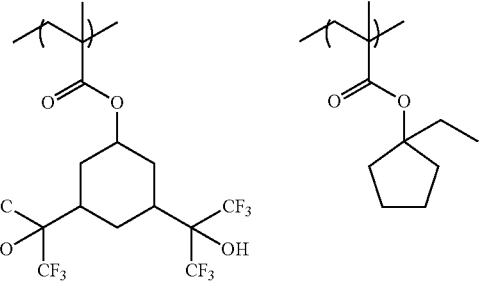

-continued

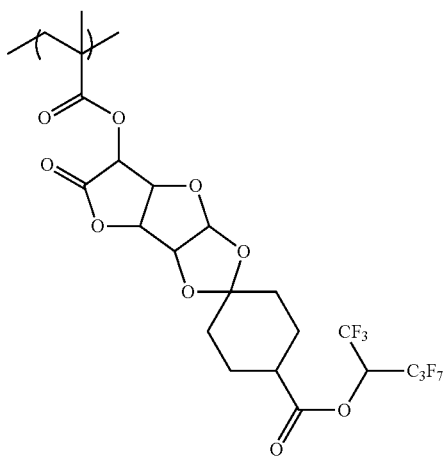
(C-55)

TABLE 1

| Resin | Composition ratio | Mw | Mw/Mn | Chain transfer agent | Initiator |
|---|---|---|---|---|---|
| C-1 | 50/50 | 6000 | 1.5 | A | V-65 |
| C-2 | 30/70 | 6500 | 1.4 | E | V-601 |
| C-3 | 45/55 | 8000 | 1.4 | B | V-601 |
| C-4 | 100 | 15000 | 1.7 | A | V-60 |
| C-5 | 60/40 | 6000 | 1.4 | C | V-601 |
| C-6 | 40/60 | 8000 | 1.4 | D | V-601 |
| C-7 | 30/40/60 | 8000 | 1.4 | C | V-601 |
| C-8 | 60/40 | 8000 | 1.3 | E | V-601 |
| C-9 | 50/50 | 6000 | 1.4 | C | V-601 |
| C-10 | 40/40/20 | 7000 | 1.4 | D | V-601 |
| C-11 | 40/30/30 | 9000 | 1.6 | C | V-601 |
| C-12 | 30/30/40 | 6000 | 1.4 | A | V-601 |
| C-13 | 60/40 | 9500 | 1.4 | B | V-601 |
| C-14 | 60/40 | 8000 | 1.4 | A | V-60 |
| C-15 | 35/35/30 | 7000 | 1.4 | E | V-601 |
| C-16 | 50/40/5/5 | 6800 | 1.3 | D | V-601 |
| C-17 | 20/30/50 | 8000 | 1.4 | E | V-65 |
| C-18 | 25/25/50 | 6000 | 1.4 | D | V-601 |
| C-19 | 100 | 9500 | 1.5 | E | V-601 |
| C-20 | 100 | 7000 | 1.4 | C | V-601 |
| C-21 | 50/50 | 6000 | 1.4 | B | V-601 |
| C-22 | 40/60 | 9600 | 1.4 | A | V-60 |
| C-23 | 100 | 20000 | 1.8 | C | V-601 |
| C-24 | 100 | 25000 | 2.0 | E | V-601 |
| C-25 | 100 | 15000 | 1.6 | B | V-601 |
| C-26 | 100 | 12000 | 1.8 | E | V-601 |
| C-27 | 100 | 18000 | 1.7 | A | V-601 |
| C-28 | 70/30 | 15000 | 1.8 | E | V-601 |
| C-29 | 80/15/5 | 18000 | 1.8 | D | V-601 |
| C-30 | 60/40 | 25000 | 1.8 | C | V-601 |
| C-31 | 90/10 | 19000 | 1.6 | D | V-601 |
| C-32 | 60/40 | 20000 | 1.8 | B | V-60 |
| C-33 | 50/30/20 | 11000 | 1.6 | A | V-601 |
| C-34 | 60/40 | 12000 | 1.8 | D | V-601 |
| C-35 | 60/40 | 15000 | 1.6 | A | V-60 |
| C-36 | 100 | 22000 | 1.8 | B | V-601 |
| C-37 | 20/80 | 35000 | 2.0 | D | V-60 |
| C-38 | 30/70 | 12000 | 1.8 | C | V-601 |
| C-39 | 30/70 | 9000 | 1.7 | E | V-601 |
| C-40 | 100 | 9000 | 1.6 | D | V-601 |
| C-41 | 40/15/45 | 12000 | 1.7 | A | V-601 |
| C-42 | 30/30/40 | 13000 | 1.7 | B | V-601 |
| C-43 | 40/40/20 | 23000 | 2.0 | B | V-601 |
| C-44 | 65/30/5 | 25000 | 1.9 | E | V-60 |
| C-45 | 100 | 15000 | 1.8 | A | V-601 |
| C-46 | 20/80 | 9000 | 1.7 | A | V-601 |
| C-47 | 70/30 | 18000 | 1.8 | E | V-601 |
| C-48 | 60/20/20 | 18000 | 1.9 | B | V-601 |
| C-49 | 100 | 12000 | 1.6 | D | V-60 |

TABLE 1-continued

| Resin | Composition ratio | Mw | Mw/Mn | Chain transfer agent | Initiator |
|---|---|---|---|---|---|
| C-50 | 60/40 | 20000 | 1.7 | C | V-601 |
| C-51 | 70/30 | 33000 | 1.9 | A | V-601 |
| C-52 | 60/40 | 19000 | 1.8 | C | V-601 |
| C-53 | 50/50 | 15000 | 1.6 | B | V-601 |
| C-54 | 40/20/40 | 35000 | 1.8 | C | V-60 |
| C-55 | 100 | 16000 | 1.7 | D | V-601 |

The chain transfer agents and initiators employed in the synthesis of resins C-1 to C-55 are listed below.

[Chain Transfer Agent]

A: trimethylolethane tris(2-mercaptoacetato)trimethylol,

B: trimethylolpropane tris(3-mercaptopropionate),

C: pentaerythritol tetrakis(2-mercaptoacetate),

D: pentaerythritol tetrakis(3-mercaptopropionate), and

E: dipentaerythritol hexakis(3-mercaptopropionate).

[Initiator]

V-60: 2,2'-azobis(2-methylpropionitrile),

V-65: 2,2'-azobis(2,4-dimethylvaleronitrile), and

V-601: dimethyl 2,2'-azobis(2-methylpropionate).

When the hydrophobic resin (C) containing at least either a fluorine atom or a silicon atom is contained, the resin (C) is localized in a surface layer of the film formed from the actinic-ray- or radiation-sensitive resin composition, so that in the use of water as a liquid-immersion medium, the receding contact angle of the film surface with water can be increased to thereby enhance the liquid-immersion water tracking property.

The receding contact angle of the film of the composition of the present invention that has been baked but is not yet exposed, as measured at exposure temperature, generally room temperature 23±3° C. in a humidity of 45±5%, is preferably in the range of 60° to 90°, more preferably 65° or greater, further more preferably 70° or greater and most preferably 75° or greater.

Although the resin (C) is localized in an interface as mentioned above, as different from surfactants, the resin (C) does not necessarily have to have a hydrophilic group in its molecule and does not need to contribute toward uniform mixing of polar/nonpolar substances.

In the operation of liquid-immersion exposure, it is needed for the immersion liquid to move on a wafer while tracking the movement of an exposure head conducting high-speed scanning on the wafer and thus forming an exposure pattern. Therefore, the contact angle of the immersion liquid with respect to the resist film in a dynamic condition is important, and it is required for the resist to be capable of tracking the high-speed scanning of the exposure head without leaving any droplets.

As the resin (C) is hydrophobic, the problems of development residue (scum) and blob defect after alkali development are likely to become serious. However, improvement with respect to the development residue (scum) and blob defect can be attained by an increase of alkali dissolution rate attributed to containing three or more polymer chains combined together through at least one branch point, as compared with linear chain resins.

When the resin (C) contains a fluorine atom, the content of fluorine atom based on the molecular weight of the resin (C) is preferably in the range of 5 to 80 mass %, more preferably 10 to 80 mass %. The repeating unit containing a fluorine atom is preferably contained in an amount of 10 to 100 mass %, more preferably 30 to 100 mass %, based on all the repeating units of the resin (C).

When the resin (C) contains a silicon atom, the content of silicon atom based on the molecular weight of the resin (C) is preferably in the range of 2 to 50 mass %, more preferably 2 to 30 mass %. The repeating unit containing a silicon atom is preferably contained in an amount of 10 to 90 mass %, more preferably 20 to 80 mass %, based on all the repeating units of the resin (C).

The standard-polystyrene-equivalent weight average molecular weight of the resin (C) is preferably in the range of 1000 to 10,000, more preferably 2000 to 50,000 and further more preferably 3000 to 30,000.

The content of resin (C) in the actinic-ray- or radiation-sensitive resin composition can be regulated so that the receding contact angle of the film from the actinic-ray- or radiation-sensitive resin composition falls within the above-mentioned range before the use of the composition. Based on the total solids of the actinic-ray- or radiation-sensitive resin composition, the content is preferably in the range of 0.01 to 20 mass %, more preferably 0.1 to 15 mass %, further more preferably 0.1 to 10 mass % and most preferably 0.5 to 8 mass %.

A single type of resin (C) may be used alone, or two or more types of resins (C) may be used in combination.

[2] Resin (A) whose Solubility in an Alkali Developer is Increased by the Action of an Acid The composition of the present invention contains a resin (A) that when acted on by an acid, increases its solubility in an alkali developer. The resin (A) has a group that is decomposed by the action of an acid to thereby produce an alkali-soluble group (hereinafter also referred to as "acid-decomposable group") in the principal chain and/or side chain of the resin.

As preferred alkali soluble groups, there can be mentioned a carboxyl group, a fluoroalcohol group (preferably hexafluoroisopropanol) and a sulfonate group, which however in no way limit the scope of the present invention.

The acid-decomposable group is preferably a group as obtained by substituting the hydrogen atom of any of these alkali soluble groups with an acid eliminable group.

As the acid eliminable group, there can be mentioned, for example, —C($R_{36}$)($R_{37}$)($R_{38}$), —C($R_{01}$)($R_{02}$)(O$R_{39}$) or the like.

In the formulae, each of $R_{36}$ to $R_{39}$ independently represents an alkyl group, a cycloalkyl group, an aryl group, an aralkyl group or an alkenyl group. $R_{36}$ and $R_{37}$ may be bonded with each other to thereby form a ring structure.

Each of $R_{01}$ and $R_{02}$ independently represents a hydrogen atom, an alkyl group, a cycloalkyl group, an aryl group, an aralkyl group or an alkenyl group.

Preferably, the acid-decomposable group is a cumyl ester group, an enol ester group, an acetal ester group, a tertiary alkyl ester group or the like. A tertiary alkyl ester group is more preferred.

The resin (A) preferably contains the repeating unit with an acid-decomposable group. The repeating unit with an acid-decomposable group is preferably any of those of the following general formula (AI).

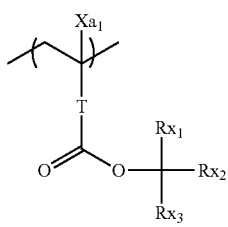

(AI)

In general formula (AI), $Xa_1$ represents a hydrogen atom, an optionally substituted methyl group or any of the groups of the formula —$CH_2$—$R_9$. $R_9$ represents a hydroxyl group or a monovalent organic group. The monovalent organic group is, for example, an alkyl group having 5 or less carbon atoms or an acyl group. Preferably, the monovalent organic group is an alkyl group having 3 or less carbon atoms, more preferably a methyl group. $Xa_1$ preferably represents a hydrogen atom, a methyl group, a trifluoromethyl group or a hydroxymethyl group.

T represents a single bond or a bivalent connecting group.

Each of $Rx_1$ to $Rx_3$ independently represents an alkyl group (linear or branched) or a cycloalkyl group (monocyclic or polycyclic).

At least two of $Rx_1$ to $Rx_3$ may be bonded with each other to thereby form a cycloalkyl group (monocyclic or polycyclic).

As the bivalent connecting group represented by T, there can be mentioned an alkylene group, a group of the formula —COO-Rt-, a group of the formula —O-Rt- or the like. In the formulae, Rt represents an alkylene group or a cycloalkylene group.

T is preferably a single bond or a group of the formula —COO-Rt-. Rt is preferably an alkylene group having 1 to 5 carbon atoms, more preferably a —$CH_2$— group or —$(CH_2)_3$— group.

The alkyl group represented by each of $Rx_1$ to $Rx_3$ is preferably one having 1 to 4 carbon atoms, such as a methyl group, an ethyl group, an n-propyl group, an isopropyl group, an n-butyl group, an isobutyl group or a t-butyl group.

The cycloalkyl group represented by each of $Rx_1$ to $Rx_3$ is preferably a cycloalkyl group of one ring, such as a cyclopentyl group or a cyclohexyl group, or a cycloalkyl group of multiple rings, such as a norbornyl group, a tetracyclodecanyl group, a tetracyclododecanyl group or an adamantyl group.

The cycloalkyl group formed by bonding of at least two of $Rx_1$ to $Rx_3$ is preferably a cycloalkyl group of one ring, such as a cyclopentyl group or a cyclohexyl group, or a cycloalkyl group of multiple rings, such as a norbornyl group, a tetracyclodecanyl group, a tetracyclododecanyl group or an adamantyl group.

In a preferred embodiment, $Rx_1$ is a methyl group or an ethyl group, and $Rx_2$ and $Rx_3$ are bonded with each other to thereby form any of the above-mentioned cycloalkyl groups.

Each of these groups may have a substituent. As the substituent, there can be mentioned, for example, an alkyl group (1 to 4 carbon atoms), a halogen atom, a hydroxyl group, an alkoxy group (1 to 4 carbon atoms), a carboxyl group, an alkoxycarbonyl group (2 to 6 carbon atoms) or the like. The number of carbon atoms of the substituent is preferably 8 or less.

The content ratio of repeating units having an acid-decomposable group is preferably in the range of 20 to 50 mol %, more preferably 25 to 45 mol %, based on all the repeating units of the resin (A).

Specific examples of the preferred repeating units with acid-decomposable groups will be shown below, which however in no way limit the scope of the present invention.

In the following formulae, each of Rx and $Xa_1$ represents a hydrogen atom, $CH_3$, $CF_3$ or $CH_2OH$. Each of Rxa and Rxb represents an alkyl group having 1 to 4 carbon atoms. Z, each independently in the presence of two or more groups, represents a substituent containing a polar group. p represents 0 or a positive integer.

1

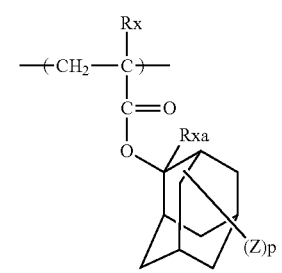

2

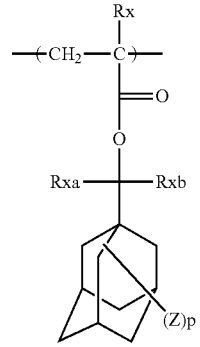

3

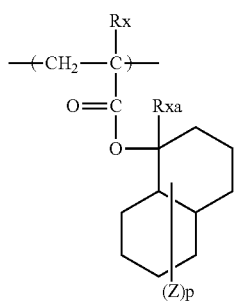

4

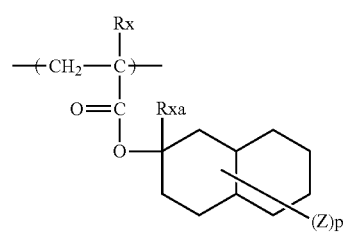

5

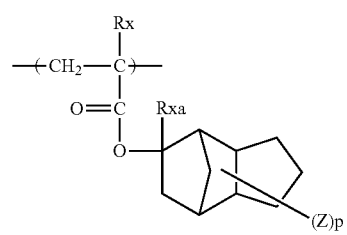

-continued

6

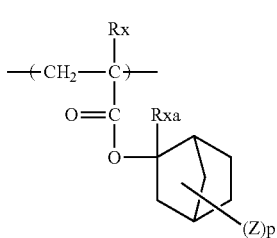

7

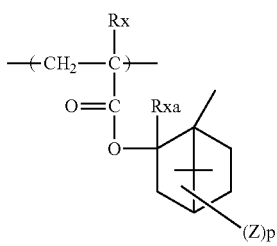

8

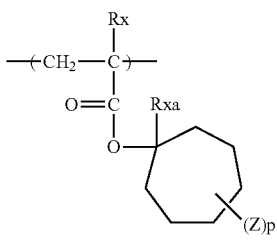

9

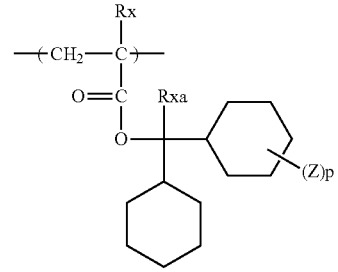

10

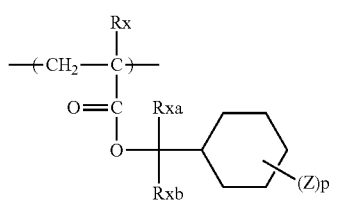

11

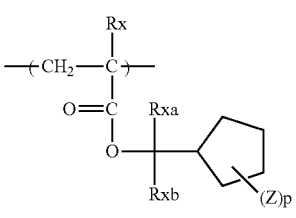

12

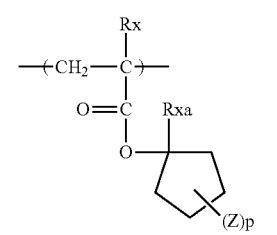

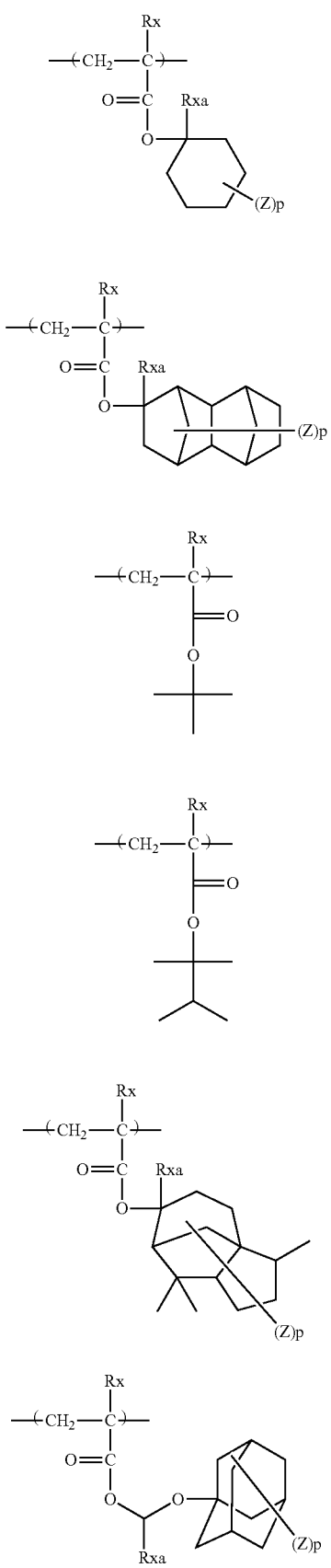
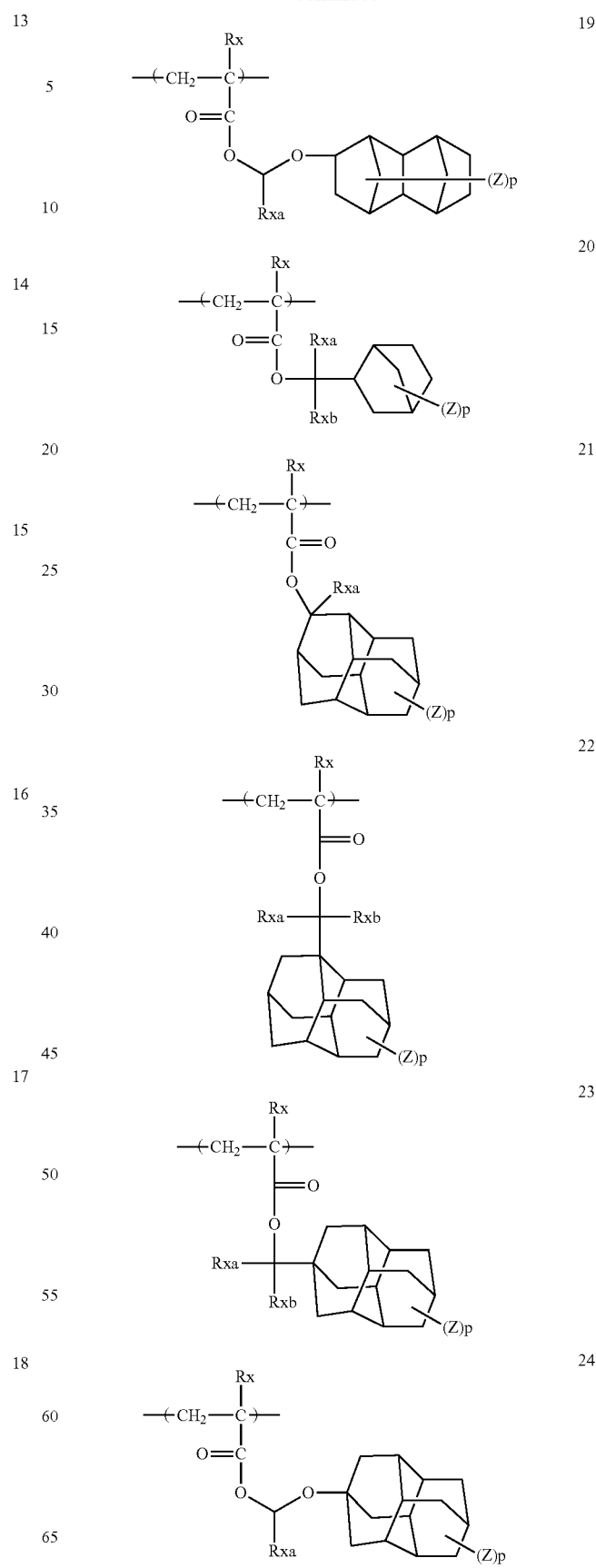

101
-continued
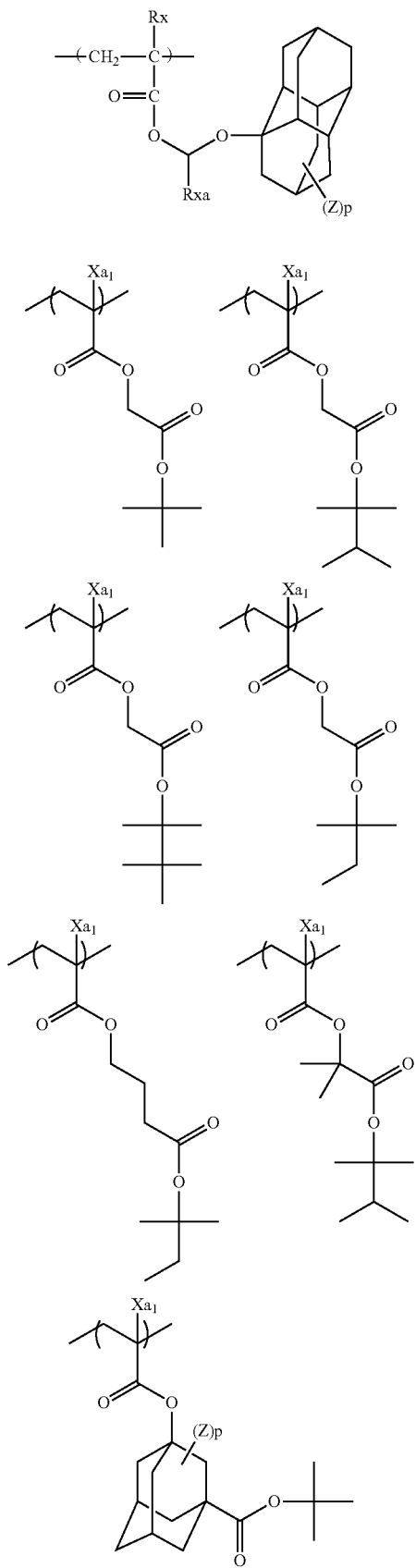
102
-continued
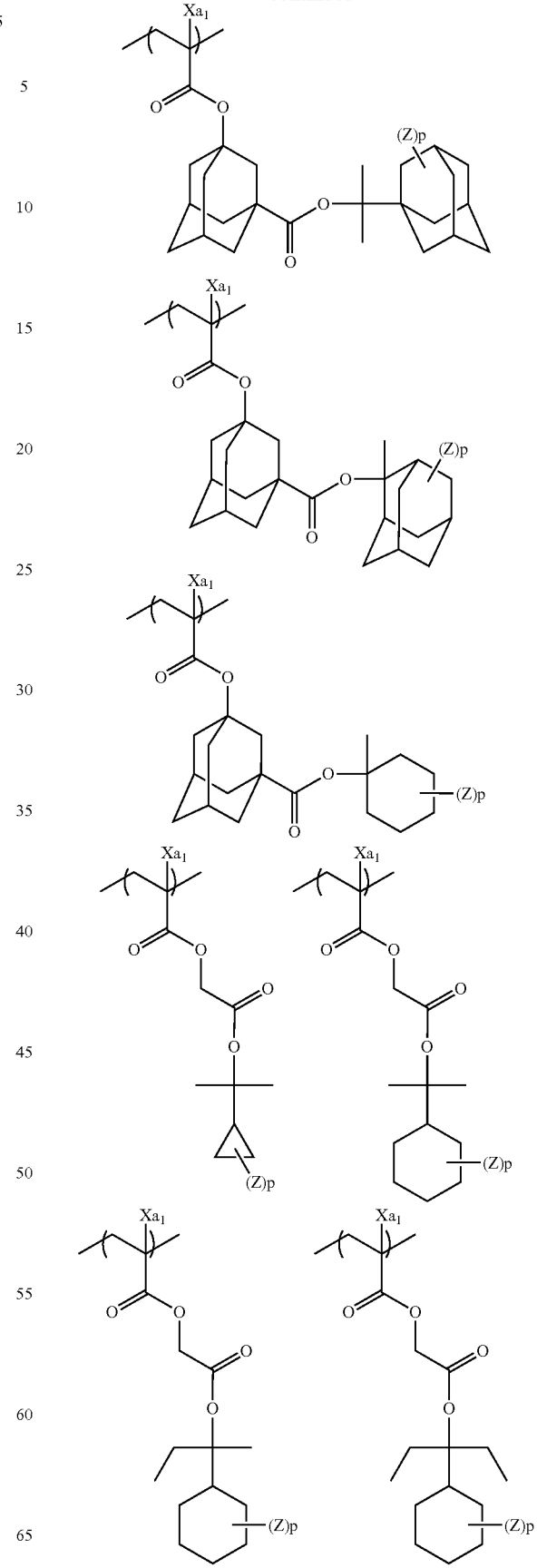

103
-continued
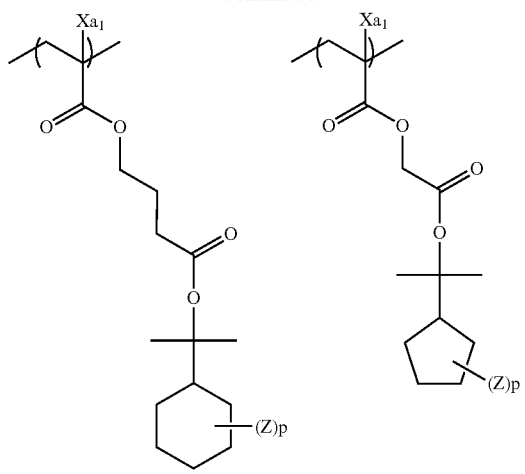
104
-continued
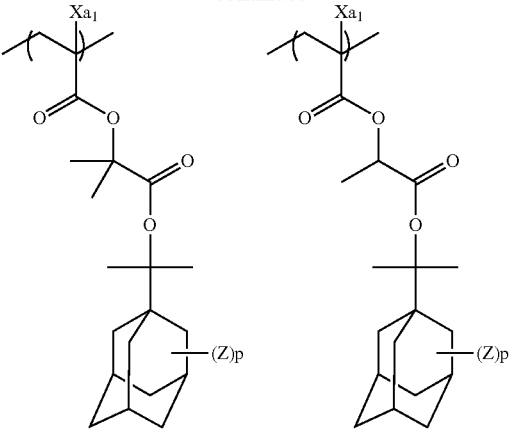
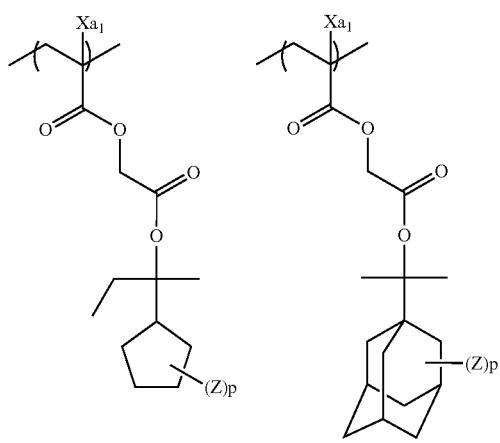
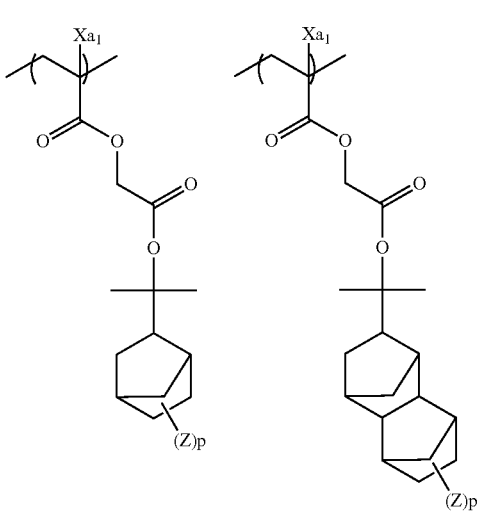
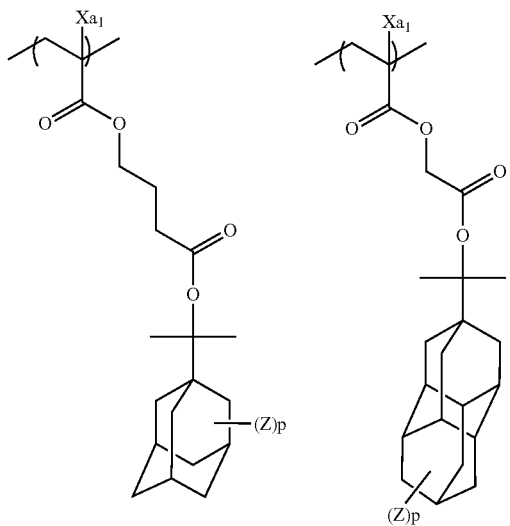
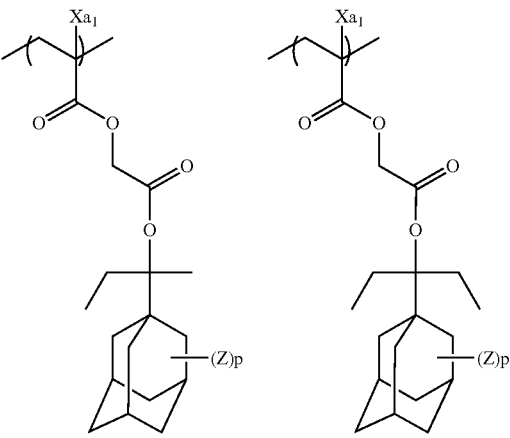

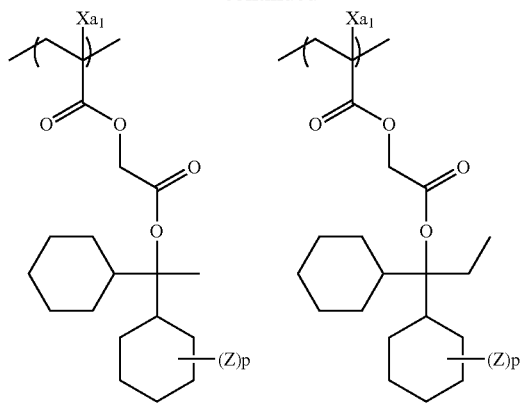
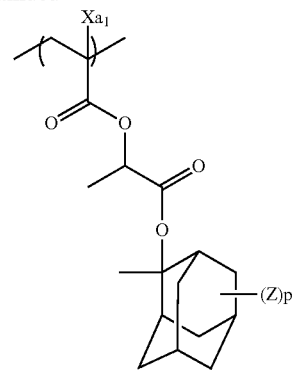
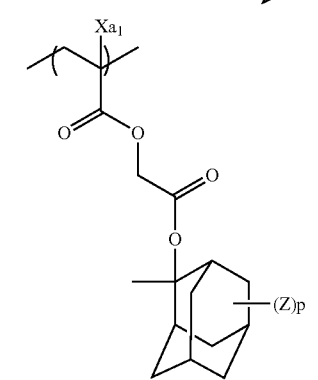
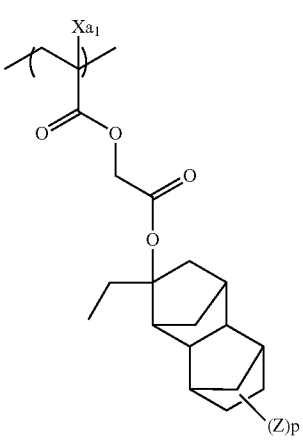
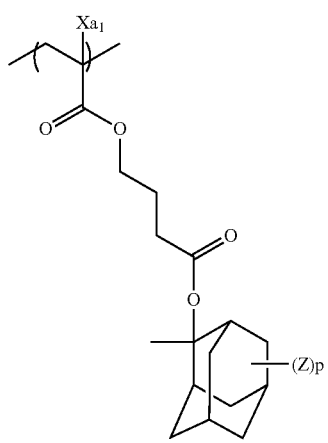
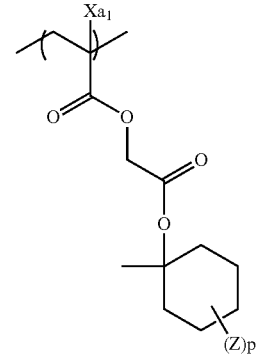
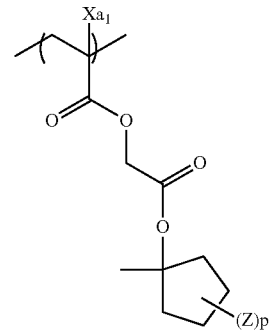

-continued

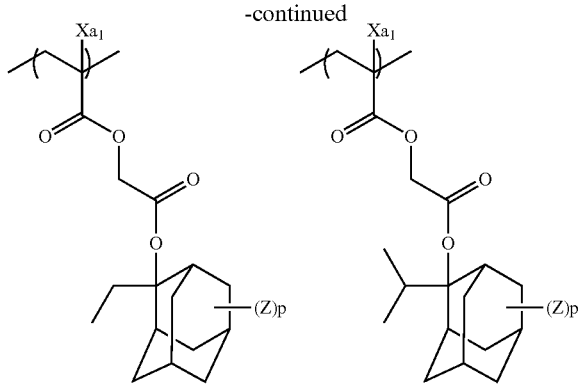

It is more preferred for the resin (A) to be a resin having, as the repeating units of general formula (AI), at least either any of the repeating units of general formula (AI-1) below or any of the repeating units of general formula (AI-2) below.

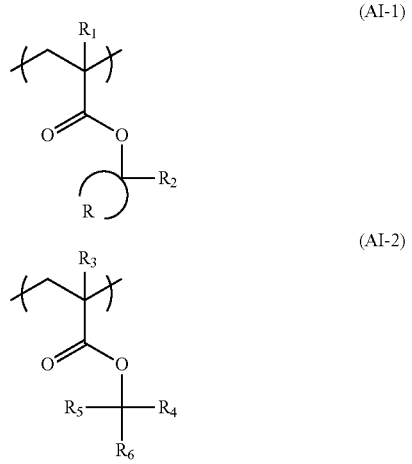

In general formulae (AI-1) and (AI-2), each of $R_1$ and $R_3$ independently represents a hydrogen atom, an optionally substituted methyl group or any of the groups of the formula —$CH_2$—$R_9$. $R_9$ represents a monovalent organic group.

Each of $R_2$, $R_4$, $R_5$ and $R_6$ independently represents an alkyl group or a cycloalkyl group.

R represents an atomic group required for forming an alicyclic structure in cooperation with a carbon atom.

General formulae (AI-1) and (AI-2) will be described in greater detail below.

$R_1$ preferably represents a hydrogen atom, a methyl group, a trifluoromethyl group or a hydroxymethyl group.

The alkyl group represented by $R_2$ may be linear or branched, and may have a substituent.

The cycloalkyl group represented by $R_2$ may be monocyclic or polycyclic, and may have a substituent.

$R_2$ preferably represents an alkyl group, more preferably an alkyl group having 1 to 10 carbon atoms, especially 1 to 5 carbon atoms. As examples thereof, there can be mentioned a methyl group and an ethyl group.

R represents an atomic group required for forming an alicyclic structure in cooperation with a carbon atom. The thus formed alicyclic structure is preferably an alicyclic structure of a single ring, and preferably has 3 to 7 carbon atoms, more preferably 5 or 6 carbon atoms.

$R_3$ preferably represents a hydrogen atom or a methyl group, more preferably a methyl group.

Each of the alkyl groups represented by $R_4$, $R_5$ and $R_6$ may be linear or branched, and may have a substituent. The alkyl groups preferably are those each having 1 to 4 carbon atoms, such as a methyl group, an ethyl group, an n-propyl group, an isopropyl group, an n-butyl group, an isobutyl group and a t-butyl group.

Each of the cycloalkyl groups represented by $R_4$, $R_5$ and $R_6$ may be monocyclic or polycyclic, and may have a substituent. The cycloalkyl groups are preferably a cycloalkyl group with a single ring, such as a cyclopentyl group or a cyclohexyl group, and a cycloalkyl group with multiple rings, such as a norbornyl group, a tetracyclodecanyl group, a tetracyclododecanyl group or an adamantyl group.

In one embodiment, the repeating units of general formula (AI-1) are those of general formula (1-a) below.

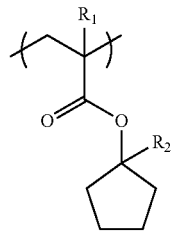

In the formula, $R_1$ and $R_2$ have the same meaning as those of general formulae (AI-1).

The repeating units of general formula (AI-2) are preferably those of general formula (II-1) below.

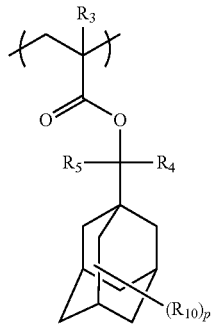

In general formula (II-1), $R_3$ to $R_5$ have the same meaning as in general formula (AI-2).

$R_{10}$ represents a substituent containing a polar group. When a plurality of $R_{10}$s exist, they may be identical to or different from each other. As the substituent containing a polar group, there can be mentioned, for example, a linear or branched alkyl group, or cycloalkyl group, having a hydroxyl group, a cyano group, an amino group, an alkylamido group or a sulfonamido group. An alkyl group having a hydroxyl group is preferred. As a branched alkyl group, an isopropyl group is especially preferred.

In the formula, p is an integer of 0 to 15, preferably in the range of 0 to 2, and more preferably 0 or 1.

As mentioned above, it is preferred for the resin (A) to be a resin containing, as the repeating units of general formula (AI), at least either any of the repeating units of general formula (AI-1) or any of the repeating units of general formula (AI-2). In another form, it is preferred for the resin (A) to be a resin containing, as the repeating units of general formula (AI), at least two of the repeating units of general formula (AI-1), or both any of the repeating units of general formula (AI-1) and any of the repeating units of general formula (AI-2).

When a plurality of acid-decomposable repeating units are simultaneously used in the resin (A), preferred combinations thereof are shown below. In the formulae, each of Rs independently represents a hydrogen atom or a methyl group.

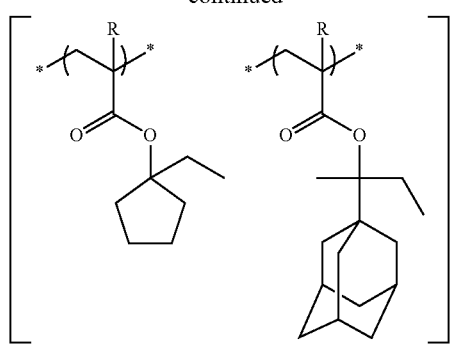

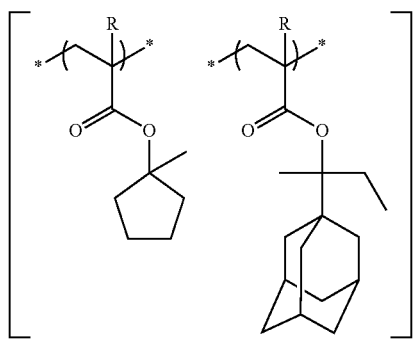

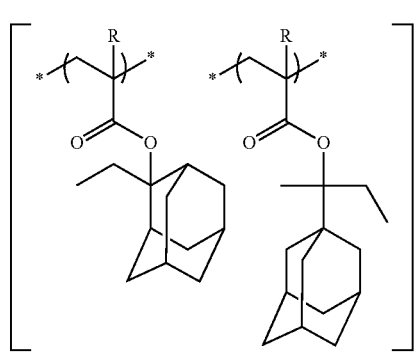

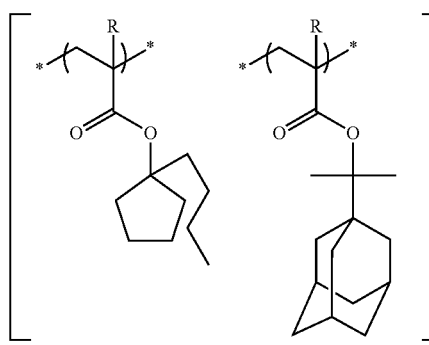

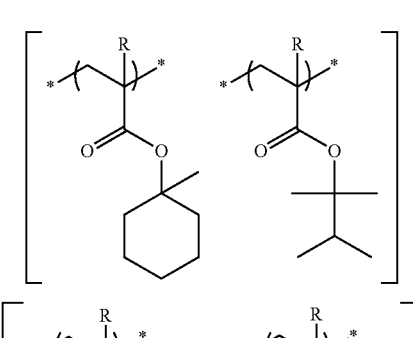

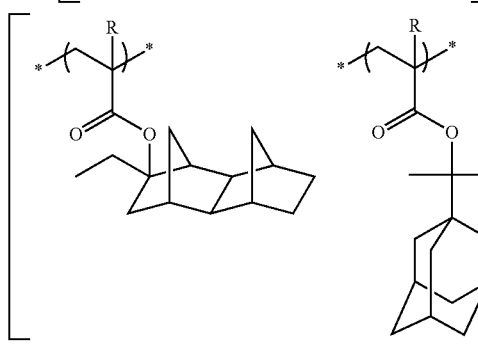

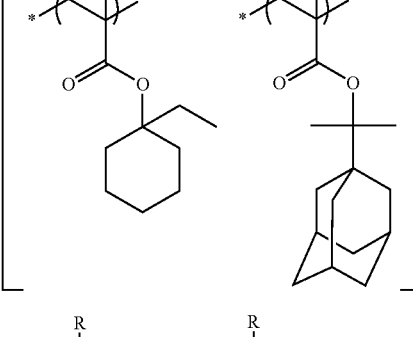

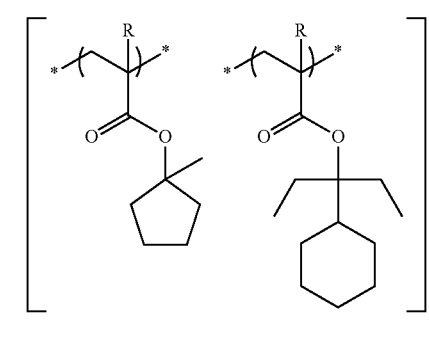

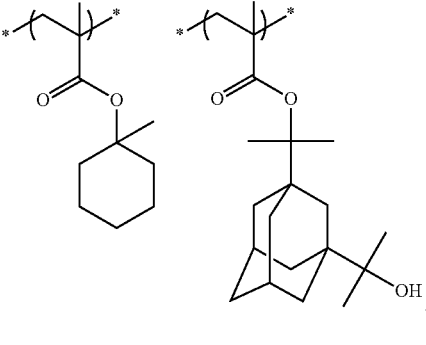

111
-continued
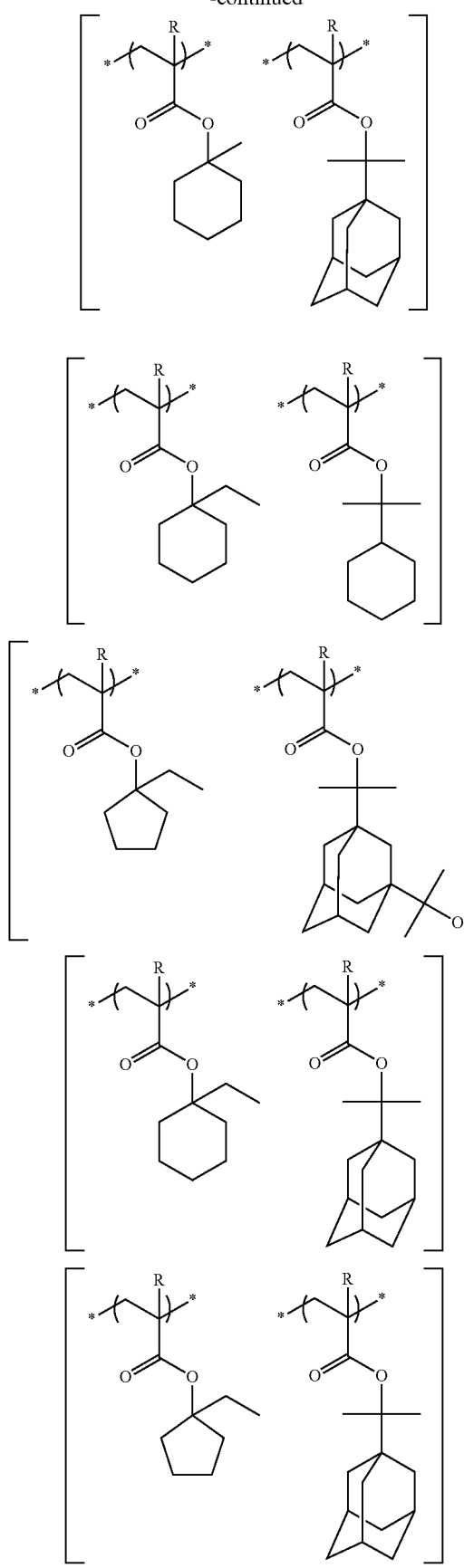
112
-continued
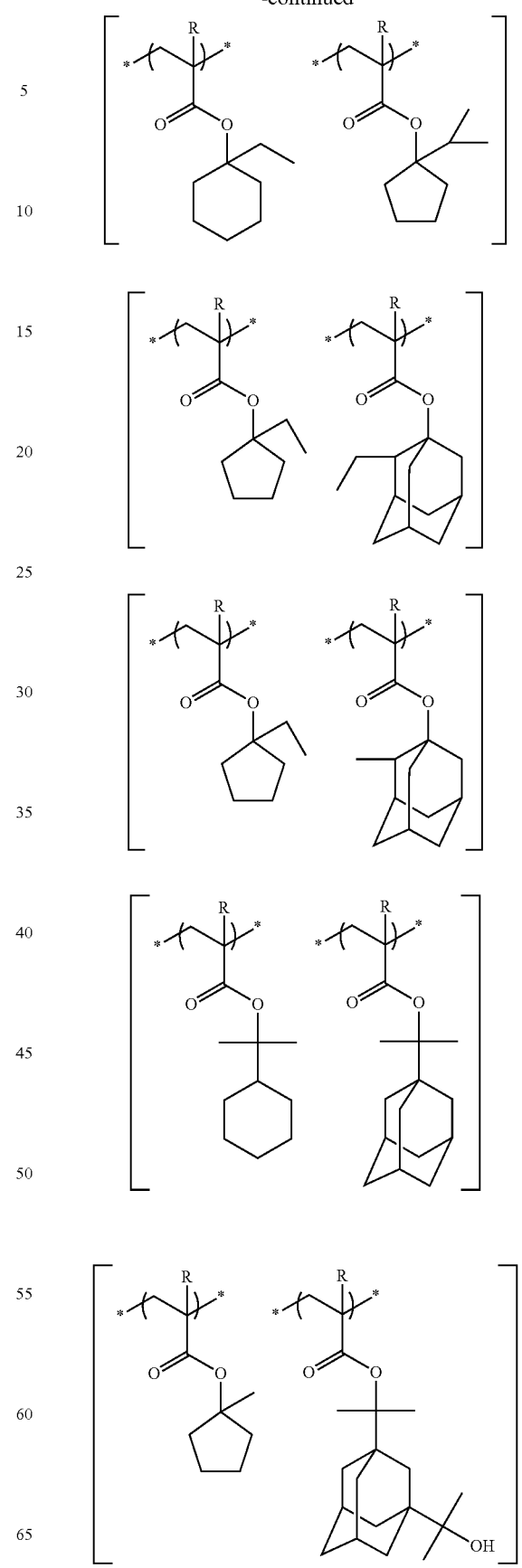

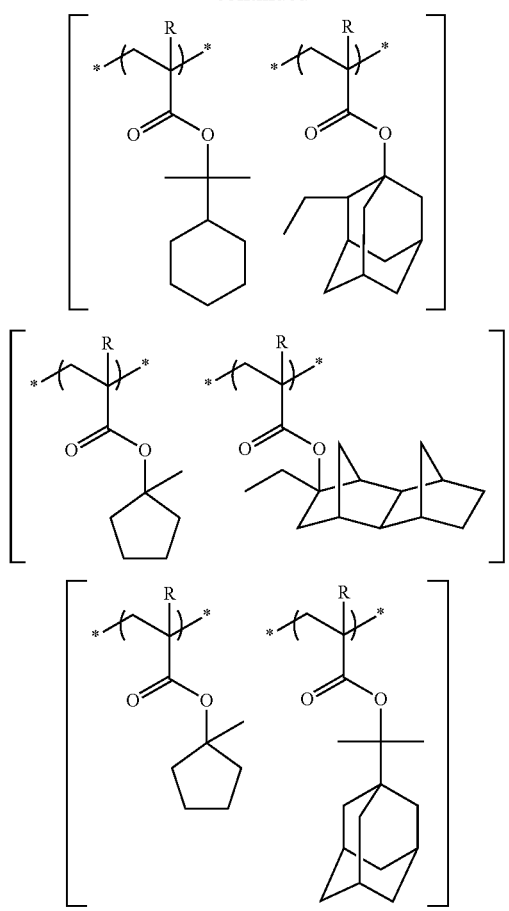

The resin (A) preferably contains a repeating unit having at least one group selected from among a lactone group, a hydroxyl group, a cyano group and an alkali soluble group.

The repeating unit having a lactone group that may be contained in the resin (A) will be described below.

Any lactone groups can be employed as long as a lactone structure is possessed therein. However, lactone structures of a 5 to 7-membered ring are preferred, and in particular, those resulting from condensation of lactone structures of a 5 to 7-membered ring with other cyclic structures effected in a fashion to form a bicyclo structure or spiro structure are preferred. The possession of repeating units having a lactone structure represented by any of the following general formulae (LC1-1) to (LC1-17) is more preferred. The lactone structures may be directly bonded to the principal chain of the resin. Preferred lactone structures are those of formulae (LC1-1), (LC1-4), (LC1-5), (LC1-6), (LC1-13), (LC1-14) and (LC1-17). The use of these specified lactone structures would ensure improvement in the line edge roughness and development defect.

LC1-1

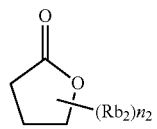

LC1-2

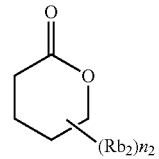

LC1-3

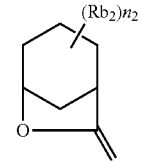

LC1-4

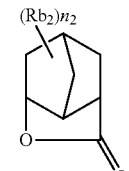

LC1-5

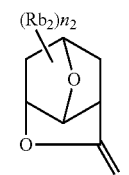

LC1-6

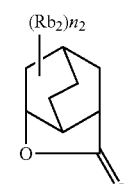

LC1-7

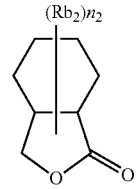

LC1-8

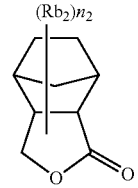

LC1-9

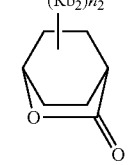

LC1-10
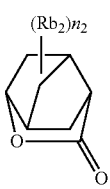

LC1-11
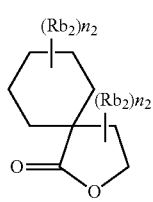

LC1-12
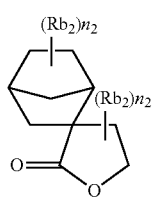

LC1-13
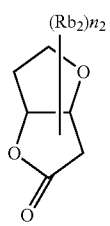

LC1-14
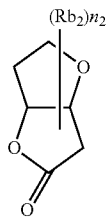

LC1-15
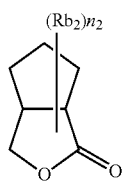

LC1-16
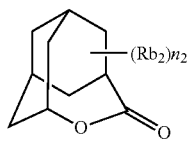

LC1-17
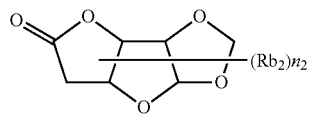

The presence of a substituent ($Rb_2$) on the portion of the lactone structure is optional. As a preferred substituent ($Rb_2$), there can be mentioned an alkyl group having 1 to 8 carbon atoms, a cycloalkyl group having 4 to 7 carbon atoms, an alkoxy group having 1 to 8 carbon atoms, an alkoxycarbonyl group having 1 to 8 carbon atoms, a carboxyl group, a halogen atom, a hydroxyl group, a cyano group, an acid-decomposable group or the like. Of these, an alkyl group having 1 to 4 carbon atoms, a cyano group and an acid-decomposable group are more preferred. In the formulae, $n_2$ is an integer of 0 to 4. When $n_2$ is 2 or greater, the plurality of present substituents ($Rb_2$) may be identical to or different from each other. Further, the plurality of present substituents ($Rb_2$) may be bonded to each other to thereby form a ring.

As the repeating units having any of the lactone structures of general formulae (LC1-1) to (LC1-17), there can be mentioned those of general formula (AII) below.

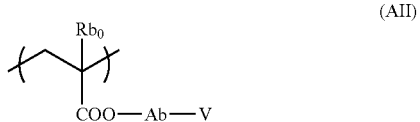

(AII)

In general formula (AII), $Ab_0$ represents a hydrogen atom, a halogen atom or an optionally substituted alkyl group having 1 to 4 carbon atoms. As a preferred substituent optionally contained in the alkyl group represented by $Ab_0$, there can be mentioned a hydroxyl group, a halogen atom, an acetoxy group or the like. As the halogen atom represented by $Ab_0$, there can be mentioned a fluorine atom, a chlorine atom, a bromine atom or an iodine atom. The $Ab_0$ is preferably a hydrogen atom, a methyl group, a hydroxymethyl group or a trifluoromethyl group. A hydrogen atom and a methyl group are especially preferred.

Ab represents a single bond, an alkylene group, a bivalent connecting group with an alicyclic hydrocarbon structure of a single ring or multiple rings, an ether group, an ester group, a carbonyl group, or a bivalent connecting group resulting from combination thereof. A single bond and a bivalent connecting group of the formula -$Ab_1$-$CO_2$— are preferred.

$Ab_1$ is a linear or branched alkylene group or a cycloalkylene group of a single ring or multiple rings, being preferably a methylene group, an ethylene group, a cyclohexylene group, an adamantylene group or a norbornylene group.

V represents a group with a lactone structure, and there can be mentioned groups with the structure represented by any of general formulae (LC1-1) to (LC1-17).

The repeating unit having a lactone group is generally present in the form of optical isomers. Any of the optical isomers may be used. It is both appropriate to use a single type of optical isomer alone and to use a plurality of optical isomers in the form of a mixture. When a single type of optical isomer is mainly used, the optical purity (ee) thereof is preferably 90% or higher, more preferably 95% or higher.

When Ab is a single bond, as the repeating units with most preferred lactone groups among the units of general formula (AII), there can be mentioned the following repeating units. An improvement in pattern profile and iso-dense bias can be attained by selection of the most appropriate lactone group.

In the following formulae, Rx represents a hydrogen atom, an optionally substituted alkyl group or a halogen atom. Preferably, Rx represents a hydrogen atom, a methyl group, a hydroxymethyl group or an acetoxymethyl group.

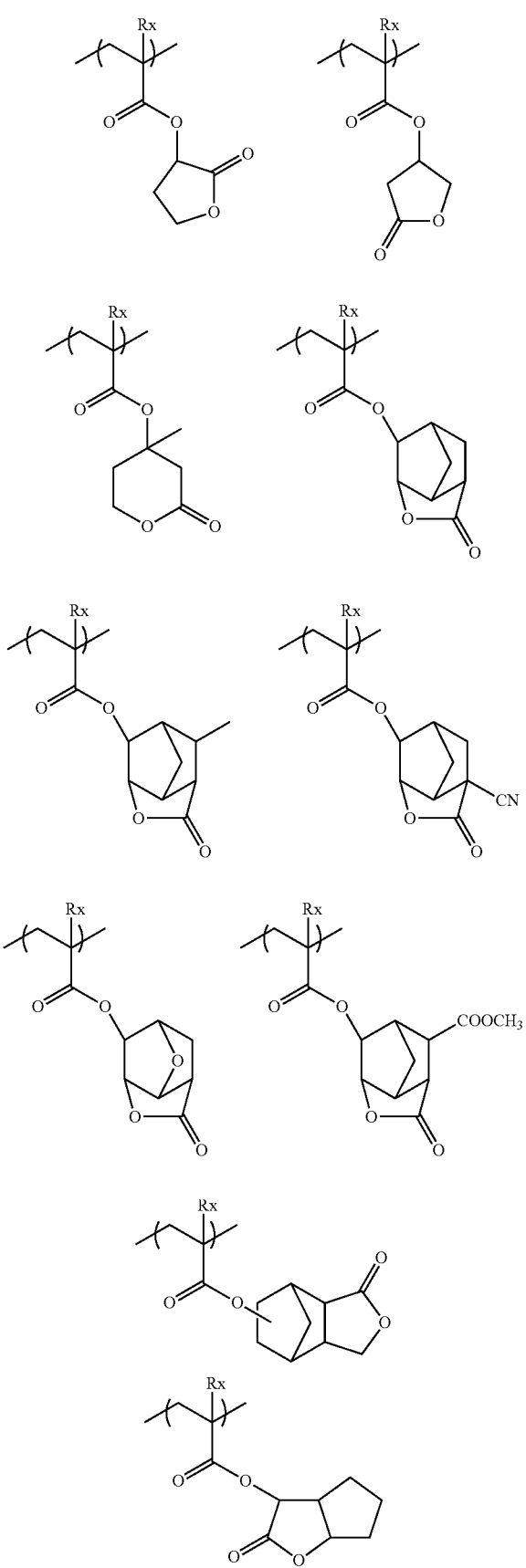

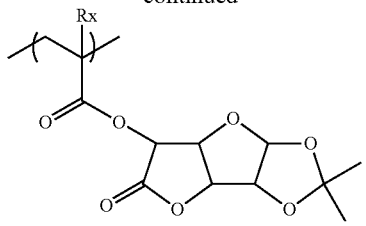

It is preferred for resin (A) to contain any of the repeating units having a lactone group represented by general formula (1), below.

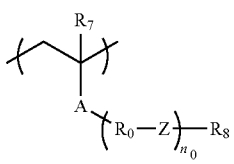
(1)

In general formula (1),

A represents an ester bond (—COO—) or an amido bond (—CONH—).

Ro, each independently in the presence of two or more groups, represents an alkylene group, a cycloalkylene group or a combination thereof.

Z, each independently in the presence of two or more groups, represents an ether bond, an ester bond, a carbonyl group, an amido bond, a urethane bond (a group represented by —O—C(=O)—N(R)— or —N(R)—C(=O)—O—), or a urea bond (a group represented by —N(R)—C(=O)—N(R)—).

Each of Rs independently represents a hydrogen atom, an alkyl group, cycloalkyl group or an aryl group.

$R_8$ represents a monovalent organic group with a lactone structure.

$n_0$ represents the number of repetitions of the structure of the formula —$R_0$—Z— and is an integer of 1 to 5.

$R_7$ represents a hydrogen atom, a halogen atom or an alkyl group.

Each of the alkylene group and cycloalkylene group represented by $R_0$ may have a substituent.

Z preferably represents an ether bond or an ester bond, most preferably an ester bond.

The alkyl group represented by $R_7$ is preferably an alkyl group having 1 to 4 carbon atoms, more preferably a methyl group or an ethyl group and most preferably a methyl group.

The alkyl group represented by $R_7$ may be substituted. As substituents on $R_7$, there can be mentioned, for example, a halogen atom such as a fluorine atom, a chlorine atom or a bromine atom, a mercapto group, a hydroxyl group, an alkoxy group such as a methoxy group, an ethoxy group, an isopropoxy group, a t-butoxy group or a benzyloxy group, an acyl group such as an acetyl group or a propionyl group, an acetoxy group and the like. $R_7$ preferably represents a hydrogen atom, a methyl group, a trifluoromethyl group or a hydroxymethyl group.

The alkylene group represented by $R_0$ is preferably a chain alkylene group having 1 to 10 carbon atoms, more preferably 1 to 5 carbon atoms, for example, a methylene group, an ethylene group, a propylene group or the like. The cycloalkylene group is preferably a cycloalkylene group having 3 to 20 carbon atoms. As such, there can be mentioned, for example, cyclohexylene, cyclopentylene, norbornylene, adamantylene or the like. The chain alkylene groups are preferred from the viewpoint of the exertion of the effect of the present invention. A methylene group is most preferred.

The substituent with a lactone structure represented by $R_8$ is not limited as long as the lactone structure is contained. As particular examples thereof, there can be mentioned the lactone structures of the above general formulae (LC1-1) to (LC1-17). Of these, the structures of general formula (LC1-4) are most preferred. In general formulae (LC1-1) to (LC1-17), $n_2$ is more preferably 2 or less.

$R_8$ preferably represents a monovalent organic group with an unsubstituted lactone structure or a monovalent organic group with a lactone structure substituted with a methyl group, a cyano group or an alkoxycarbonyl group. More preferably, $R_8$ represents a monovalent organic group with a lactone structure substituted with a cyano group (cyanolactone).

Specific examples of the repeating units having groups with a lactone structure of general formula (1) will be shown below, which however in no way limit the scope of the present invention.

In the following specific examples, R represents a hydrogen atom, an optionally substituted alkyl group or a halogen atom. Preferably, R represents a hydrogen atom, a methyl group, a hydroxymethyl group or an acetoxymethyl group.

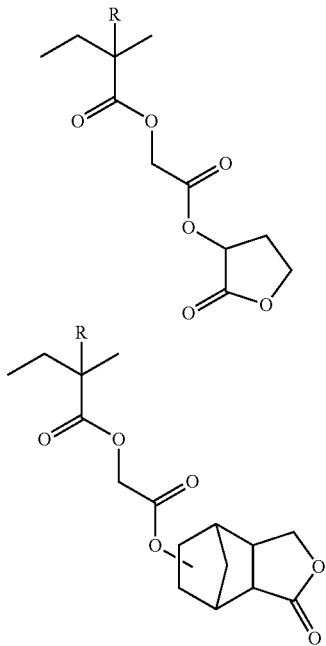

-continued

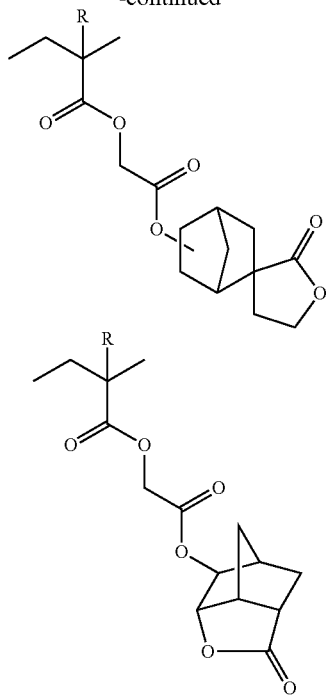

As more preferred repeating units with a lactone structure, there can be mentioned the repeating units of general formula (1-1), below.

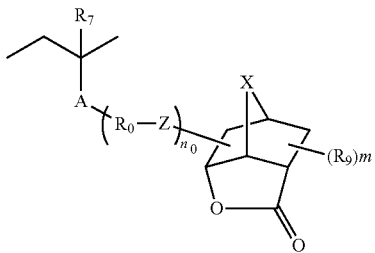

(1-1)

In general formula (1-1), $R_7$, A, $R_0$, Z and $n_0$ are as defined above with respect to general formula (1).

$R_9$, each independently in the presence of two or more groups, represents an alkyl group, a cycloalkyl group, an alkoxycarbonyl group, a cyano group, a hydroxyl group or an alkoxy group. In the presence of two or more groups, two $R_9$s may be bonded to each other to thereby form a ring.

X represents an alkylene group, an oxygen atom or a sulfur atom, and m is the number of substituents and is an integer of 0 to 5. Preferably, m is 0 or 1.

The alkyl group represented by $R_9$ is preferably an alkyl group having 1 to 4 carbon atoms, more preferably a methyl group or an ethyl group and most preferably a methyl group. As the cycloalkyl group, there can be mentioned a cyclopropyl group, a cyclobutyl group, a cyclopentyl group or a cyclohexyl group. As the alkoxycarbonyl group, there can be mentioned a methoxycarbonyl group, an ethoxycarbonyl group, an n-butoxycarbonyl group, a t-butoxycarbonyl group or the like. As the substituent therefor, there can be mentioned a hydroxyl group, an alkoxy group such as a methoxy group or an ethoxy group, a cyano group, or a halogen atom such as a fluorine atom. More preferably, $R_9$ represents a methyl group, a cyano group or an alkoxycarbonyl group, still more preferably a cyano group.

As the alkylene group represented by X, there can be mentioned a methylene group, an ethylene group or the like. Preferably, X represents an oxygen atom or a methylene group, more preferably a methylene group.

When m is 1 or greater, the substitution site of at least one $R_9$ is preferably the α-position or β-position of the carbonyl group of the lactone. The substitution at the α-position is especially preferred.

Specific examples of the repeating units having groups with a lactone structure expressed by general formula (VII-1) will be shown below, which however in no way limit the scope of the present invention. In the following specific examples, R represents a hydrogen atom, an optionally substituted alkyl group or a halogen atom. Preferably, R represents a hydrogen atom, a methyl group, a hydroxymethyl group or an acetoxymethyl group.

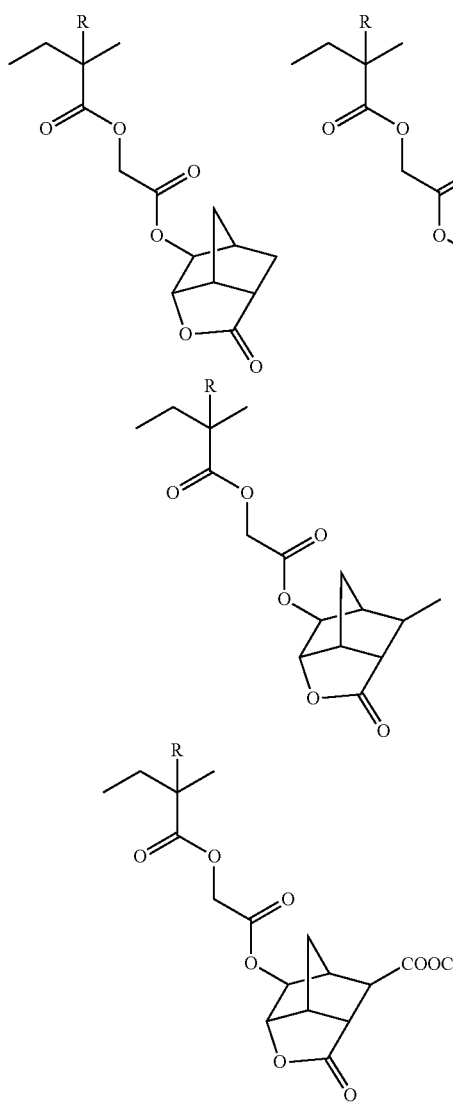

-continued

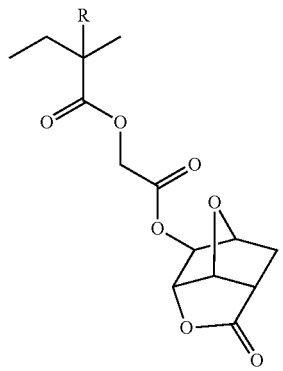

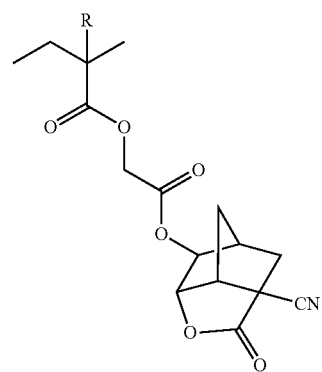

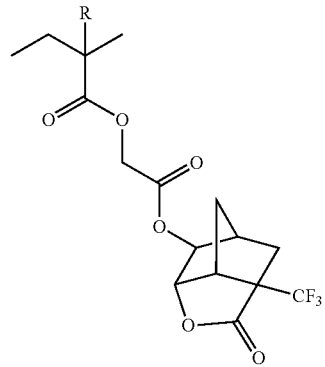

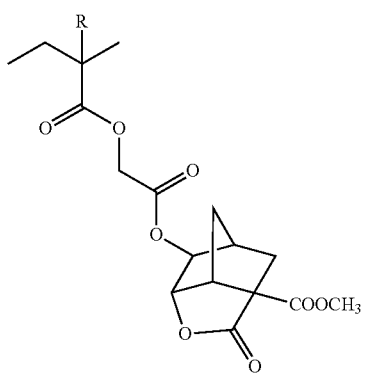

123
-continued
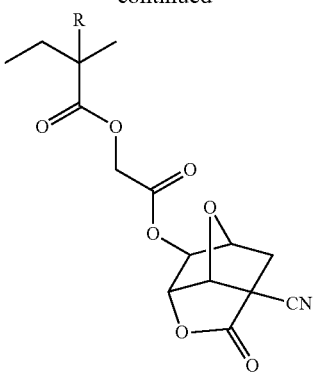
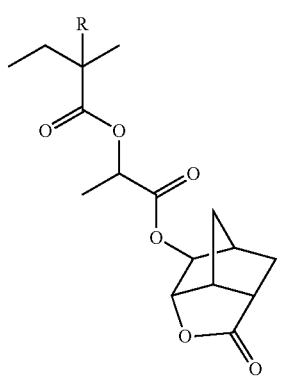
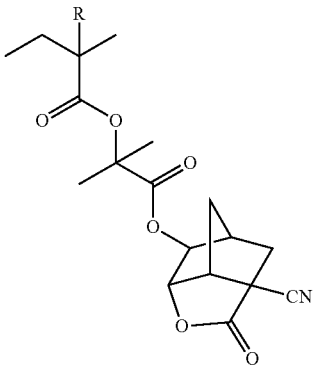
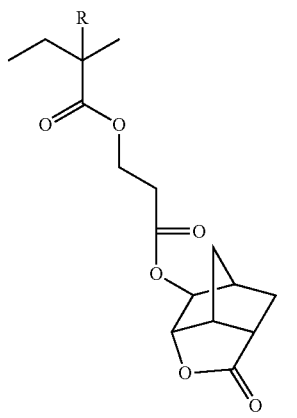
124
-continued
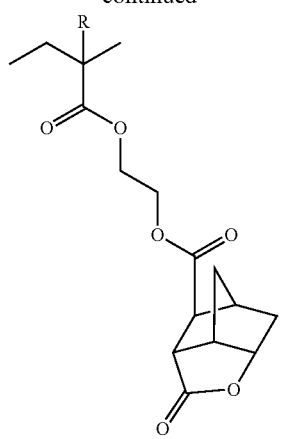
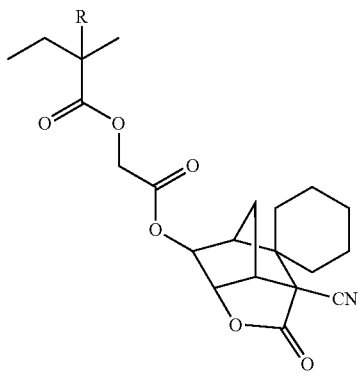
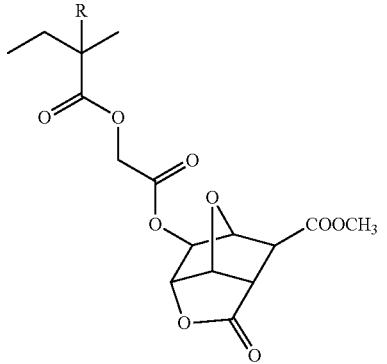
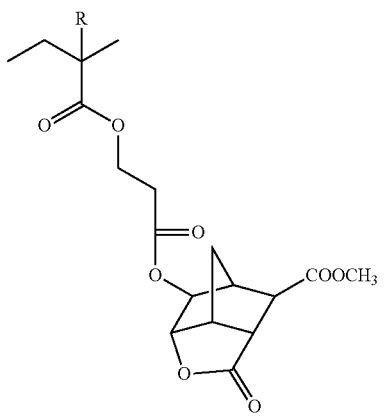

125 -continued
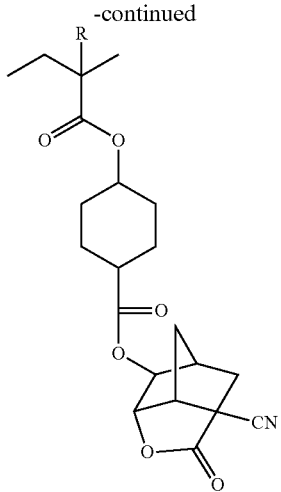
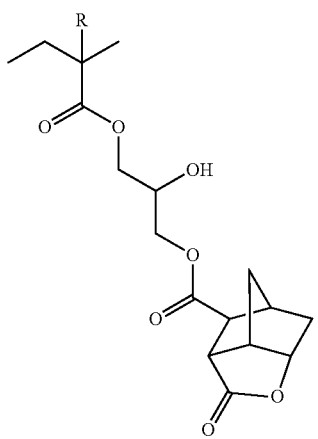
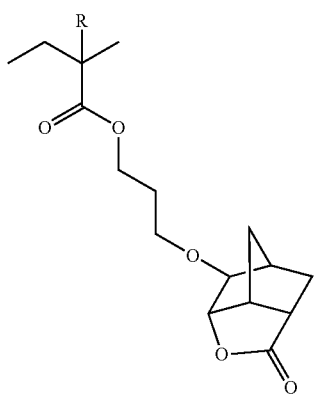
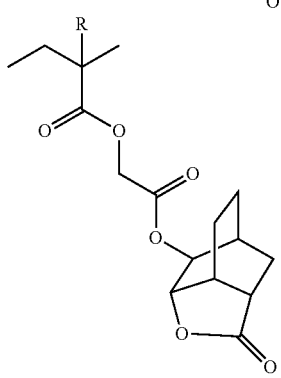
126 -continued
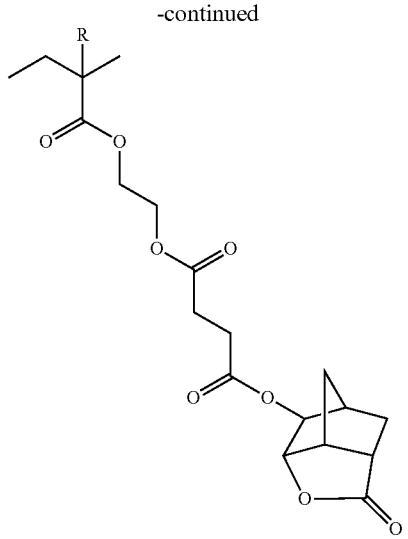
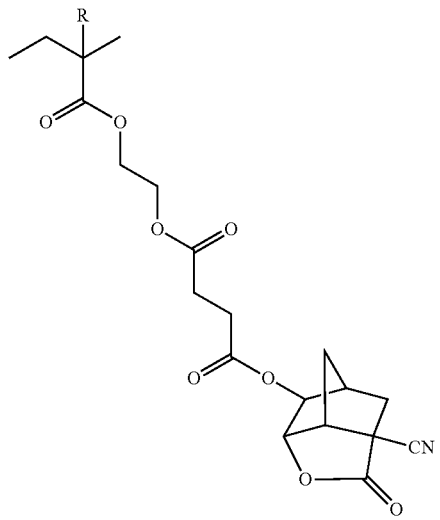
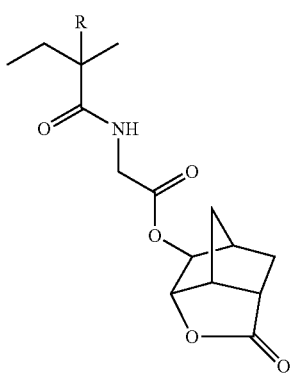

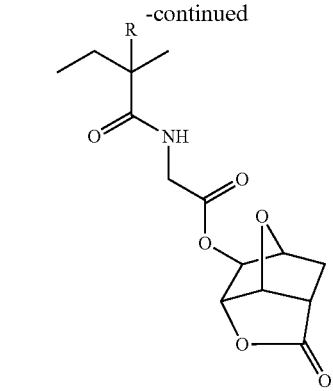

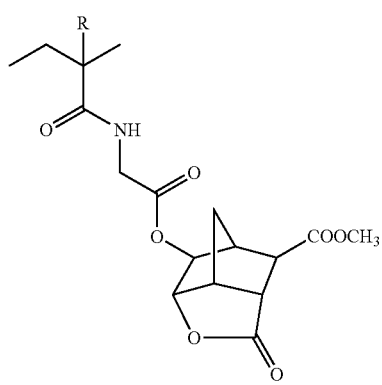

The repeating unit having a lactone group is generally present in the form of optical isomers. Any of the optical isomers may be used.

Two or more types of lactone repeating units selected from among those of general formula (1) can be simultaneously employed in order to enhance the effects of the present invention. In the simultaneous employment, it is preferred to select the two or more types from the lactone repeating units of general formula (1) in which $n_0$ is 1.

The content of repeating units with a lactone structure of general formula (1), the total content thereof when two or more types thereof are contained, is preferably in the range of 15 to 60 mol %, more preferably 20 to 50 mol % and further more preferably 30 to 50 mol % based on all the repeating units of resin (A).

The content of repeating units with a lactone other than those of general formula (1), the total content thereof when two or more types thereof are contained, is preferably in the range of 15 to 60 mol %, more preferably 20 to 50 mol % and further more preferably 30 to 50 mol % based on all the repeating units of resin (A).

It is preferred for the resin (A) to have a repeating unit other than the repeating units of general formulae (AI) and (1), having a hydroxyl group or a cyano group. The containment of this repeating unit would realize enhancements of adhesion to substrate and developer affinity. The repeating unit having a hydroxyl group or a cyano group is preferably a repeating unit with a structure of alicyclic hydrocarbon substituted with a hydroxyl group or a cyano group, and preferably has no acid-decomposable group. In the alicyclic hydrocarbon structure substituted with a hydroxyl group or a cyano group, the alicyclic hydrocarbon structure preferably consists of an adamantyl group, a diamantyl group or a norbornane group. As preferred alicyclic hydrocarbon structures substituted with a hydroxyl group or a cyano group, there can be mentioned the partial structures of general formulae (VIIa) to (VIId), below.

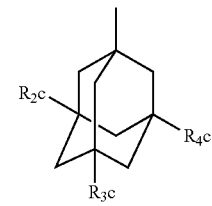
(VIIa)

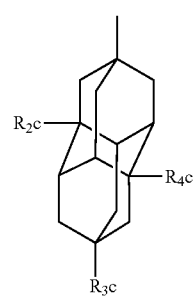
(VIIb)

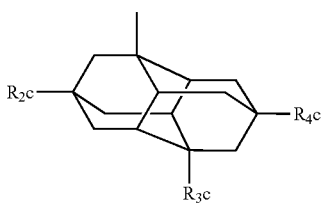
(VIIc)

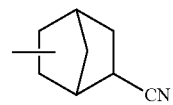
(VIId)

In general formulae (VIIa) to (VIIc), each of $R_{2c}$ to $R_{4c}$ independently represents a hydrogen atom, a hydroxyl group or a cyano group, providing that at least one of the $R_{2c}$ to $R_{4c}$ represents a hydroxyl group or a cyano group. Preferably, one or two of the $R_{2c}$ to $R_{4c}$ are hydroxyl groups and the remainder is a hydrogen atom. In the general formula (VIIa), more preferably, two of the $R_{2c}$ to $R_{4c}$ are hydroxyl groups and the remainder is a hydrogen atom.

As the repeating units having any of the partial structures of general formulae (VIIa) to (VIId), there can be mentioned those of general formulae (AIIa) to (AIId) below.

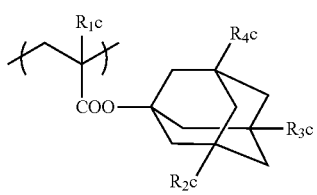
(AIIa)

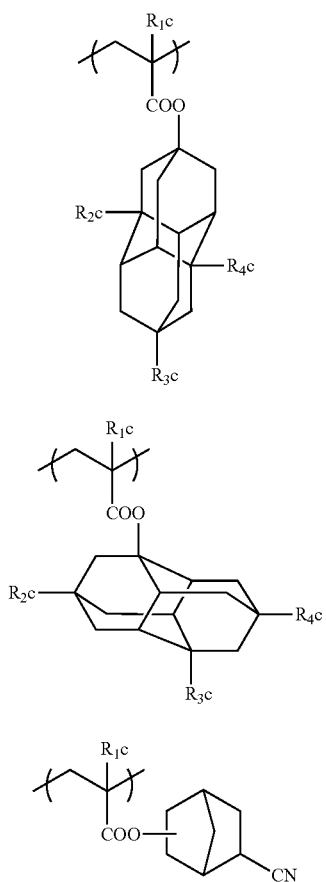

In the general formulae (AIIa) to (AIId),

R₁c represents a hydrogen atom, a methyl group, a trifluoromethyl group or a hydroxymethyl group.

R₂c to R₄c have the same meaning as those of general formulae (VIIa) to (VIIc).

The content ratio of the repeating unit having a hydroxyl group or a cyano group, based on all the repeating units of the resin (A), is preferably in the range of 5 to 40 mol %, more preferably 5 to 30 mol % and still more preferably 10 to 25 mol %.

Specific examples of the repeating units having a hydroxyl group or a cyano group will be shown below, which however in no way limit the scope of the present invention.

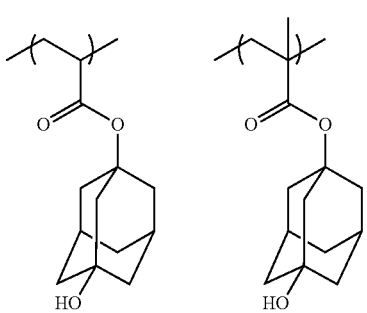

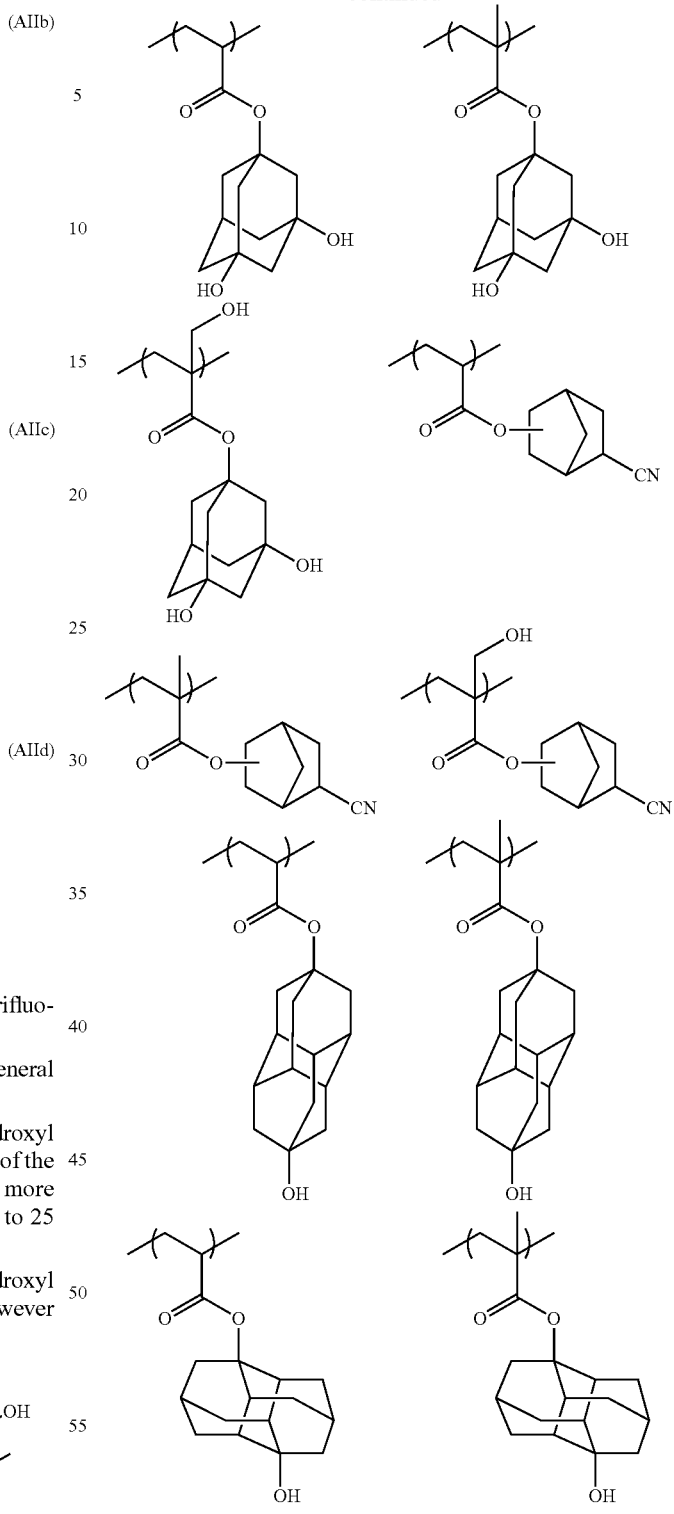

It is preferred for the resin (A) to contain a repeating unit having an alkali-soluble group. As the alkali-soluble group, there can be mentioned a carboxyl group, a sulfonamido group, a sulfonylimido group, a bisulfonylimido group or an aliphatic alcohol substituted at its α-position with an electron-withdrawing group (for example, a hexafluoroisopropanol group). The possession of a repeating unit having a carboxyl group is more preferred. The incorporation of the repeating unit having an alkali-soluble group would increase the resolving power in contact hole usage. The repeating unit having an alkali-soluble group is preferably any of a repeating unit wherein the alkali-soluble group is directly bonded to the principal chain of a resin such as a repeating unit of acrylic acid or methacrylic acid, a repeating unit wherein the alkali-soluble group is bonded via a connecting group to the principal chain of a resin and a repeating unit wherein the alkali-soluble group is introduced in a terminal of a polymer chain by the use of a chain transfer agent or polymerization initiator having the alkali-soluble group in the stage of polymerization. The connecting group may have a cyclohydrocarbon structure of a single ring or multiple rings. The repeating unit of acrylic acid or methacrylic acid is especially preferred.

The content ratio of the repeating unit having an alkali-soluble group based on all the repeating units of the resin (A) is preferably in the range of 0 to 20 mol %, more preferably 3 to 15 mol % and still more preferably 5 to 10 mol %.

Specific examples of the repeating units having an alkali-soluble group will be shown below, which however in no way limit the scope of the present invention.

In the formulae, Rx represents H, CH$_3$, CF$_3$ or CH$_2$OH.

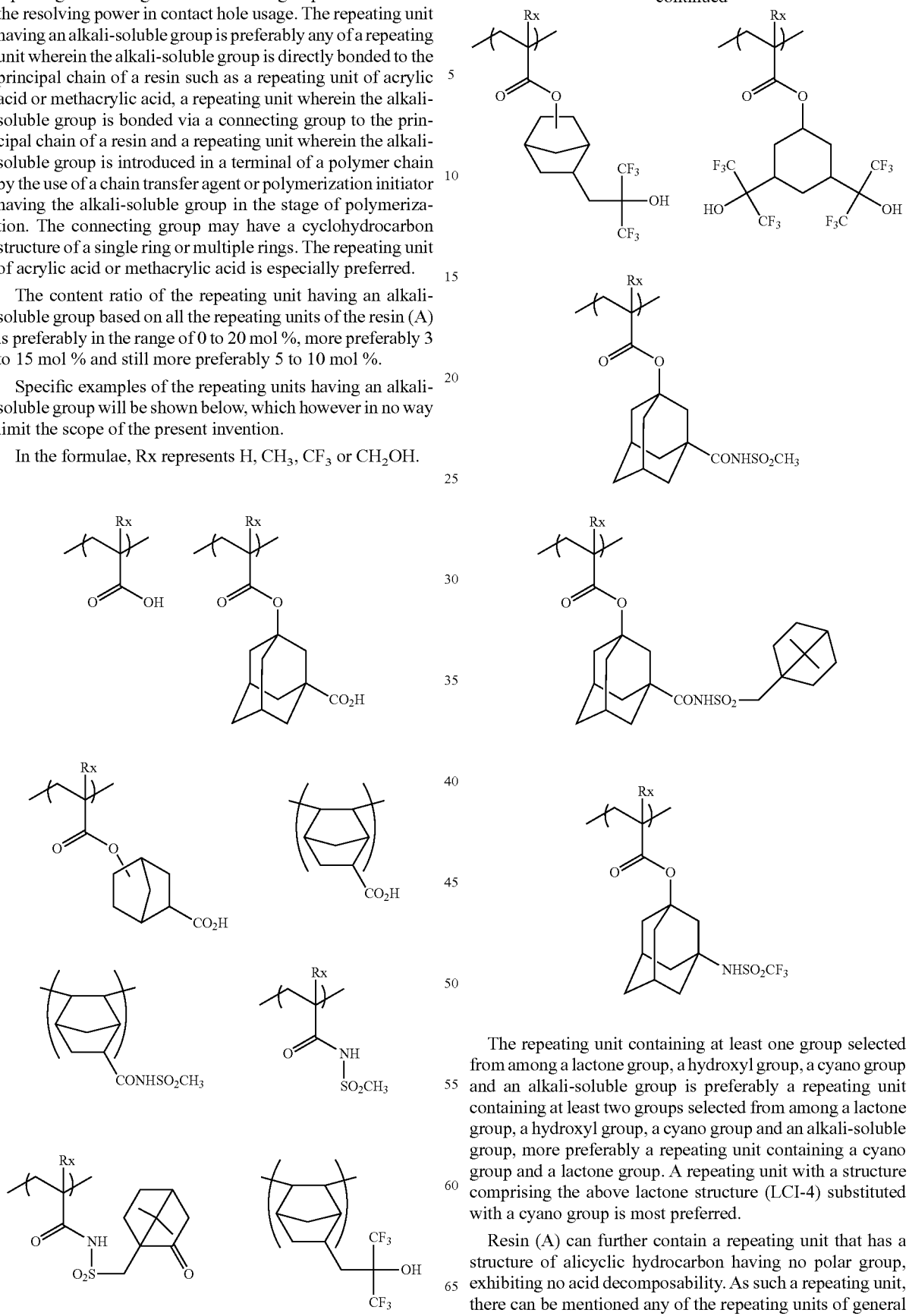

The repeating unit containing at least one group selected from among a lactone group, a hydroxyl group, a cyano group and an alkali-soluble group is preferably a repeating unit containing at least two groups selected from among a lactone group, a hydroxyl group, a cyano group and an alkali-soluble group, more preferably a repeating unit containing a cyano group and a lactone group. A repeating unit with a structure comprising the above lactone structure (LCI-4) substituted with a cyano group is most preferred.

Resin (A) can further contain a repeating unit that has a structure of alicyclic hydrocarbon having no polar group, exhibiting no acid decomposability. As such a repeating unit, there can be mentioned any of the repeating units of general formula (I) below.

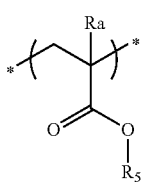

(I)

In general formula (I), $R_5$ represents a hydrocarbon group having at least one cyclic structure in which neither a hydroxyl group nor a cyano group is contained.

Ra represents a hydrogen atom, an alkyl group or a group of the formula —$CH_2$—O—$Ra_2$ in which $Ra_2$ represents a hydrogen atom, an alkyl group or an acyl group. As Ra, there can be mentioned, for example, a hydrogen atom, a methyl group, a trifluoromethyl group, a hydroxymethyl group or the like, The cyclic structures contained in $R_5$ include a monocyclic hydrocarbon group and a polycyclic hydrocarbon group. As the monocyclic hydrocarbon group, there can be mentioned, for example, a cycloalkyl group having 3 to 12 carbon atoms, such as a cyclopentyl group, a cyclohexyl group, a cycloheptyl group or a cyclooctyl group, or a cycloalkenyl group having 3 to 12 carbon atoms, such as a cyclohexenyl group. Preferably, the monocyclic hydrocarbon group is a monocyclic hydrocarbon group having 3 to 7 carbon atoms. A cyclopentyl group and a cyclohexyl group are more preferred.

The polycyclic hydrocarbon groups include ring-assembly hydrocarbon groups and crosslinked-ring hydrocarbon groups. Examples of the ring-assembly hydrocarbon groups include a bicyclohexyl group, a perhydronaphthalene group and the like. As the crosslinked-ring hydrocarbon rings, there can be mentioned, for example, bicyclic hydrocarbon rings, such as pinane, bornane, norpinane, norbornane and bicyclooctane rings (e.g., bicyclo[2.2.2]octane ring or bicyclo[3.2.1]octane ring); tricyclic hydrocarbon rings, such as homobledane, adamantane, tricyclo[5.2.1.0$^{2,6}$]decane and tricyclo[4.3.1.1$^{2,5}$]undecane rings; and tetracyclic hydrocarbon rings, such as tetracyclo[4.4.0.1$^{2,5}$.1$^{7,10}$]dodecane and perhydro-1,4-methano-5,8-methanonaphthalene rings. Further, the crosslinked-ring hydrocarbon rings include condensed-ring hydrocarbon rings, for example, condensed rings resulting from condensation of multiple 5- to 8-membered cycloalkane rings, such as perhydronaphthalene (decalin), perhydroanthracene, perhydrophenanthrene, perhydroacenaphthene, perhydrofluorene, perhydroindene and perhydrophenarene rings.

As preferred crosslinked-ring hydrocarbon rings, there can be mentioned, for example, a norbornyl group, an adamantyl group, a bicyclooctanyl group and a tricyclo[5,2,1,0$^{2,6}$]decanyl group. As more preferred crosslinked-ring hydrocarbon rings, there can be mentioned a norbornyl group and an adamantyl group.

These alicyclic hydrocarbon groups may have substituents. As preferred substituents, there can be mentioned, for example, a halogen atom, an alkyl group, a hydroxyl group protected by a protective group and an amino group protected by a protective group. The halogen atom is preferably a bromine, chlorine or fluorine atom, and the alkyl group is preferably a methyl, ethyl, butyl or t-butyl group. The alkyl group may further have a substituent. As the optional further substituent, there can be mentioned a halogen atom, an alkyl group, a hydroxyl group protected by a protective group or an amino group protected by a protective group.

As the protective group, there can be mentioned, for example, an alkyl group, a cycloalkyl group, an aralkyl group, a substituted methyl group, a substituted ethyl group, an alkoxycarbonyl group or an aralkyloxycarbonyl group. The alkyl group is preferably an alkyl group having 1 to 4 carbon atoms. The substituted methyl group is preferably a methoxymethyl, methoxythiomethyl, benzyloxymethyl, t-butoxymethyl or 2-methoxyethoxymethyl group. The substituted ethyl group is preferably a 1-ethoxyethyl or 1-methyl-1-methoxyethyl group. The acyl group is preferably an aliphatic acyl group having 1 to 6 carbon atoms, such as a formyl, acetyl, propionyl, butyryl, isobutyryl, valeryl or pivaloyl group. The alkoxycarbonyl group is, for example, an alkoxycarbonyl group having 1 to 4 carbon atoms.

The content ratio of any of the repeating units that have a structure of alicyclic hydrocarbon having no polar group, exhibiting no acid decomposability, based on all the repeating units of resin (A), is preferably in the range of 0 to 40 mol %, more preferably 0 to 20 mol %.

Specific examples of the repeating units of general formula (I) will be shown below, which however in no way limit the scope of the present invention. In the formulae, Ra represents H, $CH_3$, $CH_2OH$ or $CF_3$.

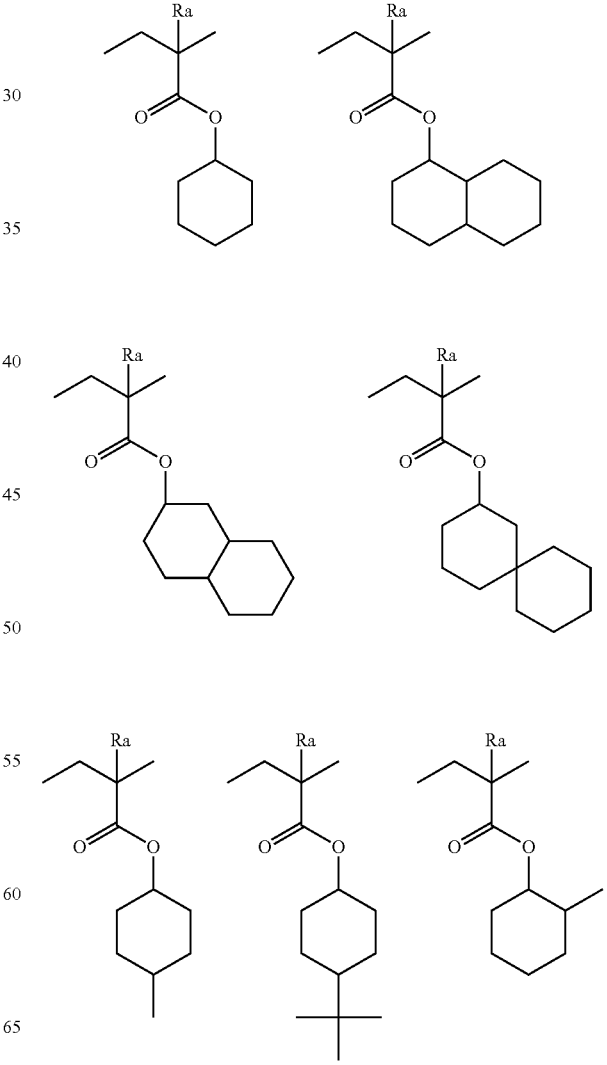

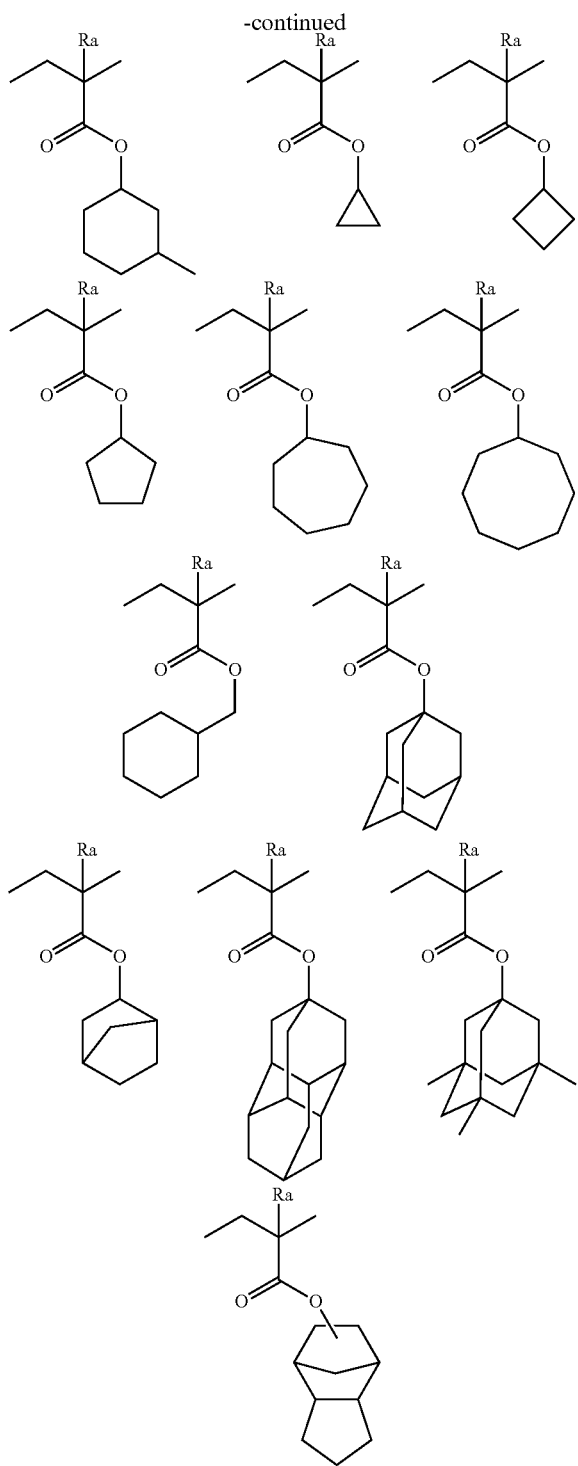

Resin (A) may have, in addition to the foregoing repeating structural units, various repeating structural units for the purpose of regulating the dry etching resistance, standard developer adaptability, substrate adhesion, resist profile and generally required properties of the resist such as resolving power, heat resistance and sensitivity.

As such repeating structural units, there can be mentioned those corresponding to the following monomers, which however are nonlimiting.

The use of such repeating structural units would enable fine regulation of the required properties of resin (A), especially:

(1) solubility in applied solvents,
(2) film forming easiness (glass transition point),
(3) alkali developability,
(4) film thinning (selections of hydrophilicity/hydrophobicity and alkali-soluble group),
(5) adhesion of unexposed area to substrate,
(6) dry etching resistance, etc.

As appropriate monomers, there can be mentioned, for example, a compound having an unsaturated bond capable of addition polymerization, selected from among acrylic esters, methacrylic esters, acrylamides, methacrylamides, allyl compounds, vinyl ethers, vinyl esters and the like.

In addition, any unsaturated compound capable of addition polymerization that is copolymerizable with monomers corresponding to the above various repeating structural units may be copolymerized therewith.

The molar ratios of individual repeating structural units contained in resin (A) are appropriately determined from the viewpoint of regulation of not only the dry etching resistance of the resist but also the standard developer adaptability, substrate adhesion, resist profile and generally required properties of the resist such as the resolving power, heat resistance and sensitivity.

When the composition of the present invention is one for ArF exposure, it is preferred for resin (A) to have no aromatic group and to have an alicyclic hydrocarbon structure of a single ring or multiple rings from the viewpoint of transparency to ArF beams.

From the viewpoint of the compatibility with the resin (C), it is preferred for resin (A) to contain neither a fluorine atom nor a silicon atom.

In resin (A), preferably, all the repeating units consist of (meth)acrylate repeating units. In that instance, use can be made of any of a resin wherein all the repeating units consist of methacrylate repeating units, a resin wherein all the repeating units consist of acrylate repeating units and a resin wherein all the repeating units consist of methacrylate repeating units and acrylate repeating units. However, it is preferred for the acrylate repeating units to account for 50 mol % or less of all the repeating units. It is more preferred to employ a copolymer containing 20 to 50 mol % of (meth)acrylate repeating units having an acid-decomposable group of general formula (AI), 20 to 50 mol % of (meth)acrylate repeating units having a lactone group, 5 to 30 mol % of (meth)acrylate repeating units having an alicyclic hydrocarbon structure substituted with a hydroxyl group or a cyano group and 0 to 20 mol % of other (meth)acrylate repeating units.

In the event of exposing the actinic-ray- or radiation-sensitive resin composition of the present invention to KrF excimer laser beams, electron beams, X-rays or high-energy light rays of wavelength 50 nm or less (EUV, etc.), it is preferred for resin (A) to further have hydroxystyrene repeating units. More preferably, resin (A) has hydroxystyrene repeating units, hydroxystyrene repeating units protected by an acid-decomposable group and acid-decomposable repeating units of a (meth)acrylic acid tertiary alkyl ester, etc.

As preferred repeating units having an acid-decomposable group, there can be mentioned, for example, repeating units derived from t-butoxycarbonyloxystyrene, a 1-alkoxyethoxystyrene and a (meth)acrylic acid tertiary alkyl ester. Repeating units derived from a 2-alkyl-2-adamantyl (meth)acrylate and a dialkyl(1-adamantyl)methyl (meth)acrylate are more preferred.

Resin (A) can be synthesized by conventional techniques (for example, radical polymerization). As general synthetic methods, there can be mentioned, for example, a batch polymerization method in which a monomer species and an initiator are dissolved in a solvent and heated so as to accomplish polymerization and a dropping polymerization method in which a solution of monomer species and initiator is added by dropping to a heated solvent over a period of 1 to 10 hours. The dropping polymerization method is preferred. As a reaction solvent, there can be mentioned, for example, an ether, such as tetrahydrofuran, 1,4-dioxane or diisopropyl ether; a ketone, such as methyl ethyl ketone or methyl isobutyl ketone; an ester solvent, such as ethyl acetate; an amide solvent, such as dimethylformamide or dimethylacetamide; or the solvent capable of dissolving the composition of the present invention, such as propylene glycol monomethyl ether acetate, propylene glycol monomethyl ether or cyclohexanone, to be described hereinafter. It is preferred to perform the polymerization with the use of the same solvent as employed in the actinic-ray- or radiation-sensitive resin composition of the present invention. This would inhibit any particle generation during storage.

The polymerization reaction is preferably carried out in an atmosphere of inert gas, such as nitrogen or argon. The polymerization is initiated by the use of a commercially available radical initiator (azo initiator, peroxide, etc.) as a polymerization initiator. Among the radical initiators, an azo initiator is preferred. An azo initiator having an ester group, a cyano group or a carboxyl group is especially preferred. As preferred initiators, there can be mentioned azobisisobutyronitrile, azobisdimethylvaleronitrile, dimethyl 2,2'-azobis(2-methylpropionate) and the like. According to necessity, a supplementation of initiator or divided addition thereof may be effected. After the completion of the reaction, the reaction mixture is poured into a solvent. The desired polymer is recovered by a method for powder or solid recovery, etc. The concentration during the reaction is in the range of 5 to 50 mass %, preferably 10 to 30 mass %. The reaction temperature is generally in the range of 10° to 150° C., preferably 30° to 120° C. and more preferably 60° to 100° C.

The weight average molecular weight of resin (A) in terms of polystyrene molecular weight as measured by GPC is preferably in the range of 1,000 to 200,000, more preferably 2,000 to 20,000, still more preferably 3,000 to 15,000 and further preferably 5,000 to 13,000. The regulation of the weight average molecular weight to 1000 to 200,000 would prevent deteriorations of heat resistance and dry etching resistance and also prevent deterioration of developability and increase of viscosity leading to poor film forming property.

Use is made of the resin whose dispersity (molecular weight distribution) is generally in the range of 1 to 3, preferably 1 to 2.6, more preferably 1 to 2 and most preferably 1.4 to 2.0. The lower the molecular weight distribution, the more excellent the resolving power and pattern profile and the smoother the side wall of the resist pattern to thereby attain an excellence in roughness.

In the present invention, the content ratio of resin (A) based on the total solid content of the whole composition is generally in the range of 50 to 99 mass %, more preferably 60 to 95 mass %.

The above resin (A) according to the present invention may be used in combination with other resins in such a ratio that the effect of the present invention is not deteriorated. As the resins other than the resin (A) according to the present invention, there can be mentioned acid-decomposable resins optionally containing any of the above repeating units that can be introduced in resin (A) and other heretofore known acid-decomposable resins.

[3] Compound (B) that when Exposed to Actinic Rays or Radiation, Generates an Acid The composition of the present invention contains a compound (B) that when exposed to actinic rays or radiation, generates an acid (hereinafter also referred to as "acid generator").

As the acid generators, use can be made of a member appropriately selected from among a photoinitiator for photocationic polymerization, a photoinitiator for photoradical polymerization, a photo-achromatic agent and photo-discoloring agent for dyes, any of publicly known compounds that when exposed to actinic rays or radiation, generate an acid, employed in microresists, etc., and mixtures thereof.

For example, as the acid generator, there can be mentioned a diazonium salt, a phosphonium salt, a sulfonium salt, an iodonium salt, an imide sulfonate, an oxime sulfonate, diazosulfone, disulfone or o-nitrobenzyl sulfonate.

As preferred compounds among the acid generators, there can be mentioned those of general formulae (ZI), (ZII) and (ZIII), below.

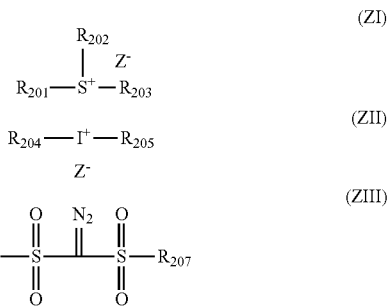

In general formula (ZI),
each of $R_{201}$, $R_{202}$ and $R_{203}$ independently represents an organic group.

The number of carbon atoms of the organic group represented by $R_{201}$, $R_{202}$ and $R_{203}$ is generally in the range of 1 to 30, preferably 1 to 20.

Two of $R_{201}$ to $R_{203}$ may be bonded with each other to thereby form a ring structure, and the ring within the same may contain an oxygen atom, a sulfur atom, an ester bond, an amido bond or a carbonyl group. As the group formed by bonding of two of $R_{201}$ to $R_{203}$, there can be mentioned an alkylene group (for example, a butylene group or a pentylene group).

$Z^-$ represents a nonnucleophilic anion.

As the nonnucleophilic anion represented by $Z^-$, there can be mentioned, for example, a sulfonate anion, a carboxylate anion, a sulfonylimido anion, a bis(alkylsulfonyl)imido anion, a tris(alkylsulfonyl)methyl anion or the like.

The nonnucleophilic anion means an anion whose capability of inducing a nucleophilic reaction is extremely low and is an anion capable of inhibiting any temporal decomposition by intramolecular nucleophilic reaction. This would realize an enhancement of the temporal stability of the actinic-ray- or radiation-sensitive resin composition.

As the sulfonate anion, there can be mentioned, for example, an aliphatic sulfonate anion, an aromatic sulfonate anion, a camphor sulfonate anion or the like.

As the carboxylate anion, there can be mentioned, for example, an aliphatic carboxylate anion, an aromatic carboxylate anion, an aralkyl carboxylate anion or the like.

The aliphatic moiety of the aliphatic sulfonate anion and the aliphatic carboxylate anion may be an alkyl group or a cycloalkyl group, being preferably an alkyl group having 1 to 30 carbon atoms or a cycloalkyl group having 3 to 30 carbon atoms. As such, there can be mentioned, for example, a methyl group, an ethyl group, a propyl group, an isopropyl group, an n-butyl group, an isobutyl group, a sec-butyl group, a pentyl group, a neopentyl group, a hexyl group, a heptyl group, an octyl group, a nonyl group, a decyl group, an undecyl group, a dodecyl group, a tridecyl group, a tetradecyl group, a pentadecyl group, a hexadecyl group, a heptadecyl group, an octadecyl group, a nonadecyl group, an eicosyl group, a cyclopropyl group, a cyclopentyl group, a cyclohexyl group, an adamantyl group, a norbornyl group, a boronyl group or the like.

As a preferred aromatic group of the aromatic sulfonate anion and the aromatic carboxylate anion, there can be mentioned an aryl group having 6 to 14 carbon atoms, for example, a phenyl group, a tolyl group, a naphthyl group or the like.

The alkyl group, cycloalkyl group and aryl group of the aliphatic sulfonate anion and aromatic sulfonate anion may have a substituent. As the substituent of the alkyl group, cycloalkyl group and aryl group of the aliphatic sulfonate anion and aromatic sulfonate anion, there can be mentioned, for example, a nitro group, a halogen atom (fluorine atom, chlorine atom, bromine atom or iodine atom), a carboxyl group, a hydroxyl group, an amino group, a cyano group, an alkoxy group (preferably having 1 to 15 carbon atoms), a cycloalkyl group (preferably having 3 to 15 carbon atoms), an aryl group (preferably having 6 to 14 carbon atoms), an alkoxycarbonyl group (preferably having 2 to 7 carbon atoms), an acyl group (preferably having 2 to 12 carbon atoms), an alkoxycarbonyloxy group (preferably having 2 to 7 carbon atoms), an alkylthio group (preferably having 1 to 15 carbon atoms), an alkylsulfonyl group (preferably having 1 to 15 carbon atoms), an alkyliminosulfonyl group (preferably having 2 to 15 carbon atoms), an aryloxysulfonyl group (preferably having 6 to 20 carbon atoms), an alkylaryloxysulfonyl group (preferably having 7 to 20 carbon atoms), a cycloalkylaryloxysulfonyl group (preferably having 10 to 20 carbon atoms), an alkyloxyalkyloxy group (preferably having 5 to 20 carbon atoms), a cycloalkylalkyloxyalkyloxy group (preferably having 8 to 20 carbon atoms) or the like. The aryl group or ring structure of these groups may further have an alkyl group (preferably having 1 to 15 carbon atoms) as its substituent.

As a preferred aralkyl group of the aralkyl carboxylate anion, there can be mentioned an aralkyl group having 6 to 12 carbon atoms, for example, a benzyl group, a phenethyl group, a naphthylmethyl group, a naphthylethyl group, a naphthylbutyl group or the like.

The alkyl group, cycloalkyl group, aryl group and aralkyl group of the aliphatic carboxylate anion, aromatic carboxylate anion and aralkyl carboxylate anion may have a substituent. As the substituent, there can be mentioned, for example, the same halogen atom, alkyl group, cycloalkyl group, alkoxy group, alkylthio group, etc. as mentioned with respect to the aromatic sulfonate anion.

As the sulfonylimido anion, there can be mentioned, for example, a saccharin anion.

The alkyl group of the bis(alkylsulfonyl)imido anion and tris(alkylsulfonyl)methyl anion is preferably an alkyl group having 1 to 5 carbon atoms. As such, there can be mentioned, for example, a methyl group, an ethyl group, a propyl group, an isopropyl group, an n-butyl group, an isobutyl group, a sec-butyl group, a pentyl group, a neopentyl group or the like.

As a substituent of these alkyl groups, there can be mentioned a halogen atom, an alkyl group substituted with a halogen atom, an alkoxy group, an alkylthio group, an alkyloxysulfonyl group, an aryloxysulfonyl group, a cycloalkylaryloxysulfonyl group or the like. An alkyl group substituted with a fluorine atom is preferred.

As the other nonnucleophilic anions, there can be mentioned, for example, phosphorus fluoride, boron fluoride, antimony fluoride and the like.

The nonnucleophilic anion represented by $Z^-$ is preferably selected from among an aliphatic sulfonate anion substituted at its α-position of sulfonic acid with a fluorine atom, an aromatic sulfonate anion substituted with a fluorine atom or a group having a fluorine atom, a bis(alkylsulfonyl)imido anion whose alkyl group is substituted with a fluorine atom and a tris(alkylsulfonyl)methide anion whose alkyl group is substituted with a fluorine atom. More preferably, the nonnucleophilic anion is a perfluorinated aliphatic sulfonate anion having 4 to 8 carbon atoms or a benzene sulfonate anion having a fluorine atom. Still more preferably, the nonnucleophilic anion is a nonafluorobutane sulfonate anion, a perfluorooctane sulfonate anion, a pentafluorobenzene sulfonate anion or a 3,5-bis(trifluoromethyl)benzene sulfonate anion.

As the organic groups represented by $R_{201}$, $R_{202}$ and $R_{203}$, there can be mentioned, for example, groups corresponding to the following compounds (ZI-1), (ZI-2), (ZI-3) and (ZI-4).

Appropriate use may be made of compounds with two or more of the structures of general formula (ZI). For example, use may be made of compounds having a structure wherein at least one of $R_{201}$ to $R_{203}$ of a compound of general formula (ZI) is bonded with at least one of $R_{201}$ to $R_{203}$ of another compound of general formula (ZI) through a single bond or a connecting group.

As more preferred (ZI) components, there can be mentioned the following compounds (ZI-1), (ZI-2), (ZI-3) and (ZI-4).

The compounds (ZI-1) are arylsulfonium compounds of general formula (ZI) wherein at least one of $R_{201}$ to $R_{203}$ is an aryl group, namely, compounds containing an arylsulfonium as a cation.

In the arylsulfonium compounds, all of the $R_{201}$ to $R_{203}$ may be aryl groups. It is also appropriate that the $R_{201}$ to $R_{203}$ are partially an aryl group and the remainder is an alkyl group or a cycloalkyl group.

As the arylsulfonium compounds, there can be mentioned, for example, a triarylsulfonium compound, a diarylalkylsulfonium compound, an aryldialkylsulfonium compound, a diarylcycloalkylsulfonium compound and an aryldicycloalkylsulfonium compound.

The aryl group of the arylsulfonium compounds is preferably a phenyl group or a naphthyl group, more preferably a phenyl group. The aryl group may be one having a heterocyclic structure containing an oxygen atom, nitrogen atom, sulfur atom or the like. As the aryl group having a heterocyclic structure, there can be mentioned, for example, a pyrrole residue, a furan residue, a thiophene residue, an indole residue, a benzofuran residue, a benzothiophene residue or the like. When the arylsulfonium compound has two or more aryl groups, the two or more aryl groups may be identical to or different from each other.

The alkyl group or cycloalkyl group contained in the arylsulfonium compound according to necessity is preferably a linear or branched alkyl group having 1 to 15 carbon atoms or a cycloalkyl group having 3 to 15 carbon atoms. As such, there can be mentioned, for example, a methyl group, an ethyl group, a propyl group, an n-butyl group, a sec-butyl group, a t-butyl group, a cyclopropyl group, a cyclobutyl group, a cyclohexyl group or the like.

The aryl group, alkyl group or cycloalkyl group represented by $R_{201}$ to $R_{203}$ may have as its substituent an alkyl group (for example, 1 to 15 carbon atoms), a cycloalkyl group (for example, 3 to 15 carbon atoms), an aryl group (for example, 6 to 14 carbon atoms), an alkoxy group (for example, 1 to 15 carbon atoms), a halogen atom, a hydroxyl group or a phenylthio group. Preferred substituents are a linear or branched alkyl group having 1 to 12 carbon atoms, a cycloalkyl group having 3 to 12 carbon atoms and a linear, branched or cyclic alkoxy group having 1 to 12 carbon atoms. More preferred substituents are an alkyl group having 1 to 4 carbon atoms and an alkoxy group having 1 to 4 carbon atoms. The substituents may be contained in any one of the three $R_{201}$ to $R_{203}$, or alternatively may be contained in all three of $R_{201}$ to $R_{203}$. When $R_{201}$ to $R_{203}$ represent an aryl group, the substituent preferably lies at the p-position of the aryl group.

Now, the compounds (ZI-2) will be described.

The compounds (ZI-2) are compounds of formula (ZI) wherein each of $R_{201}$ to $R_{203}$ independently represents an organic group having no aromatic ring. The aromatic rings include an aromatic ring having a heteroatom.

The organic group having no aromatic ring represented by $R_{201}$ to $R_{203}$ generally has 1 to 30 carbon atoms, preferably 1 to 20 carbon atoms.

Preferably, each of $R_{201}$ to $R_{203}$ independently represents an alkyl group, a cycloalkyl group, an allyl group or a vinyl group. More preferred groups are a linear or branched 2-oxoalkyl group, a 2-oxocycloalkyl group and an alkoxycarbonylmethyl group. Especially preferred is a linear or branched 2-oxoalkyl group.

As preferred alkyl groups and cycloalkyl groups represented by $R_{201}$ to $R_{203}$, there can be mentioned a linear or branched alkyl group having 1 to 10 carbon atoms (for example, a methyl group, an ethyl group, a propyl group, a butyl group or a pentyl group) and a cycloalkyl group having 3 to 10 carbon atoms (a cyclopentyl group, a cyclohexyl group or a norbornyl group). As more preferred alkyl groups, there can be mentioned a 2-oxoalkyl group and an alkoxycarbonylmethyl group. As more preferred cycloalkyl group, there can be mentioned a 2-oxocycloalkyl group.

The 2-oxoalkyl group may be linear or branched. A group having >C=O at the 2-position of the alkyl group is preferred.

The 2-oxocycloalkyl group is preferably a group having >C=O at the 2-position of the cycloalkyl group.

As preferred alkoxy groups of the alkoxycarbonylmethyl group, there can be mentioned alkoxy groups having 1 to 5 carbon atoms (a methoxy group, an ethoxy group, a propoxy group, a butoxy group and a pentoxy group).

The $R_{201}$ to $R_{203}$ may be further substituted with a halogen atom, an alkoxy group (for example, 1 to 5 carbon atoms), a hydroxyl group, a cyano group or a nitro group.

Specific examples of the cations of the compounds represented by general formula (ZI-2) of the present invention will be shown below.

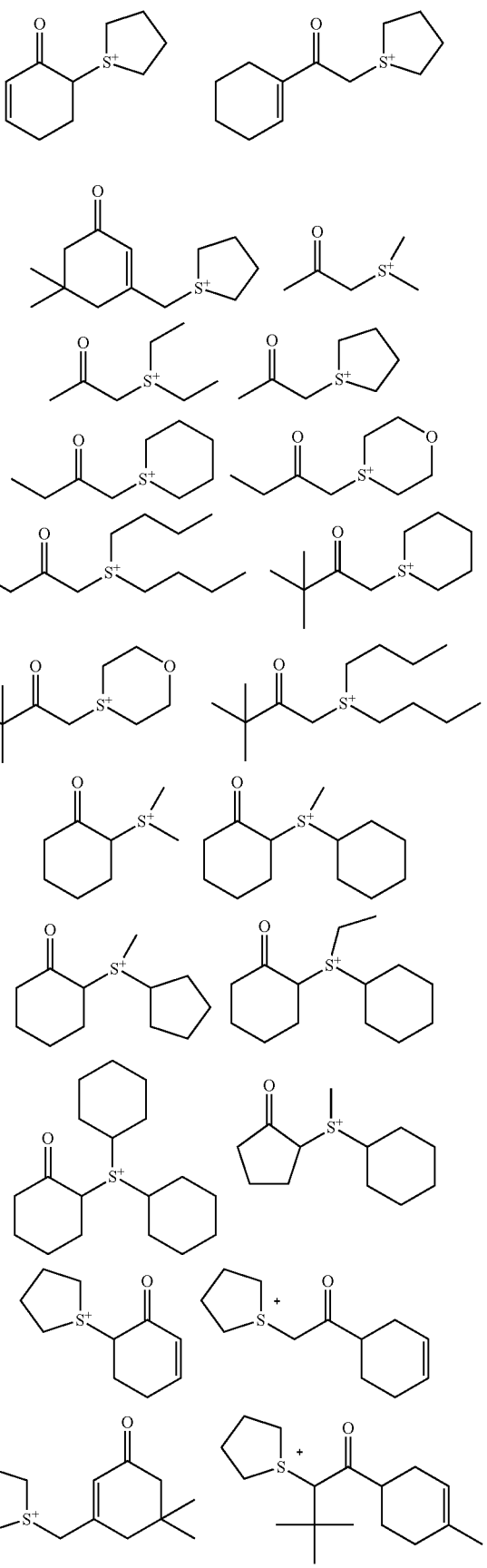

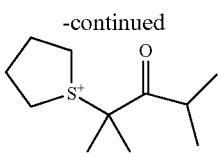

Now, the compounds (ZI-3) will be described.

The compounds (ZI-3) are those represented by the following general formula (ZI-3) which have a phenacylsulfonium salt structure.

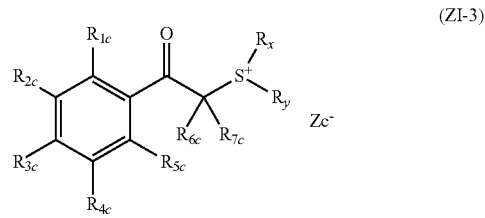

In general formula (ZI-3), each of $R_{1c}$ to $R_{5c}$ independently represents a hydrogen atom, an alkyl group, a cycloalkyl group, an alkoxy group, a halogen atom or a phenylthio group.

Each of $R_{6c}$ and $R_{7c}$ independently represents a hydrogen atom, an alkyl group, a cycloalkyl group, halogen atom, a cyano group or an aryl group.

Each of $R_x$ and $R_y$ independently represents an alkyl group, a cycloalkyl group, a 2-oxoalkyl group, a 2-oxocycloalkyl group, an alkoxycarbonylalkyl group, an allyl group or a vinyl group.

Any two or more of $R_{1c}$ to $R_{5c}$, and $R_{6c}$ and $R_{7c}$, and $R_x$ and $R_y$, may be bonded with each other to thereby form a ring structure. This ring structure may contain an oxygen atom, a sulfur atom, an ester bond or an amido bond. As the group formed by bonding of any two or more of $R_{1c}$ to $R_{5c}$, and $R_{6c}$ and $R_{7c}$, and $R_x$ and $R_y$, there can be mentioned a butylene group, a pentylene group or the like.

$Zc^-$ represents a nonnucleophilic anion. There can be mentioned the same nonnucleophilic anions as mentioned with respect to the $Z^-$ of the general formula (ZI).

The alkyl group represented by $R_{1c}$ to $R_{7c}$ may be linear or branched. As such, there can be mentioned, for example, an alkyl group having 1 to 20 carbon atoms, preferably a linear or branched alkyl group having 1 to 12 carbon atoms (for example, a methyl group, an ethyl group, a linear or branched propyl group, a linear or branched butyl group or a linear or branched pentyl group). As the cycloalkyl group, there can be mentioned, for example, a cycloalkyl group having 3 to 8 carbon atoms (for example, a cyclopentyl group or a cyclohexyl group).

The alkoxy group represented by $R_{1c}$ to $R_{5c}$ may be linear, or branched, or cyclic. As such, there can be mentioned, for example, an alkoxy group having 1 to 10 carbon atoms, preferably a linear or branched alkoxy group having 1 to 5 carbon atoms (for example, a methoxy group, an ethoxy group, a linear or branched propoxy group, a linear or branched butoxy group or a linear or branched pentoxy group) and a cycloalkoxy group having 3 to 8 carbon atoms (for example, a cyclopentyloxy group or a cyclohexyloxy group).

Preferably, any one of $R_{1c}$ to $R_{5c}$ is a linear or branched alkyl group, a cycloalkyl group or a linear, branched or cyclic alkoxy group. More preferably, the sum of carbon atoms of $R_{1c}$ to $R_{5c}$ is in the range of 2 to 15. Accordingly, there can be attained an enhancement of solvent solubility and inhibition of particle generation during storage.

Each of the aryl groups represented by $R_{6c}$ and $R_{7c}$ preferably has 5 to 15 carbon atoms. As such, there can be mentioned, for example, a phenyl group or a naphthyl group.

When $R_{6c}$ and $R_{7c}$ are bonded to each other to thereby form a ring, the group formed by the bonding of $R_{6c}$ and $R_{7c}$ is preferably an alkylene group having 2 to 10 carbon atoms. As such, there can be mentioned, for example, an ethylene group, a propylene group, a butylene group, a pentylene group, a hexylene group or the like. Further, the ring formed by the bonding of $R_{6c}$ and $R_{7c}$ may have a heteroatom, such as an oxygen atom, in the ring.

As the alkyl groups and cycloalkyl groups represented by $R_x$ and $R_y$, there can be mentioned the same alkyl groups and cycloalkyl groups as set forth above with respect to $R_{1c}$ to $R_{7c}$.

As the 2-oxoalkyl group and 2-oxocycloalkyl group, there can be mentioned the alkyl group and cycloalkyl group represented by $R_{1c}$ to $R_{7c}$ having >O=O at the 2-position thereof.

With respect to the alkoxy group of the alkoxycarbonylalkyl group, there can be mentioned the same alkoxy groups as mentioned above with respect to $R_{1c}$ to $R_{5c}$. As the alkyl group thereof, there can be mentioned, for example, an alkyl group having 1 to 12 carbon atoms, preferably a linear alkyl group having 1 to 5 carbon atoms (e.g., a methyl group or an ethyl group).

The allyl groups are not particularly limited. However, preferred use is made of an unsubstituted allyl group or an allyl group substituted with a cycloalkyl group of a single ring or multiple rings.

The vinyl groups are not particularly limited. However, preferred use is made of an unsubstituted vinyl group or a vinyl group substituted with a cycloalkyl group of a single ring or multiple rings.

As the ring structure that may be formed by the mutual bonding of $R_x$ and $R_y$, there can be mentioned a 5-membered or 6-membered ring, especially preferably a 5-membered ring (namely, a tetrahydrothiophene ring), formed by bivalent $R_x$ and $R_y$ (for example, a methylene group, an ethylene group, a propylene group or the like) in cooperation with the sulfur atom of general formula (ZI-3).

Each of $R_x$ and $R_y$ is preferably an alkyl group or cycloalkyl group having preferably 4 or more carbon atoms. The alkyl group or cycloalkyl group has more preferably 6 or more carbon atoms and still more preferably 8 or more carbon atoms.

Specific examples of the cations of the compounds represented by general formula (ZI-3) of the present invention will be shown below.

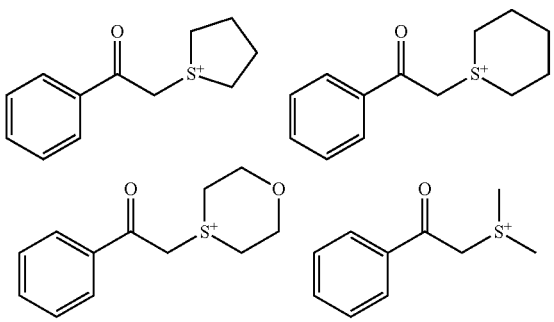

145
-continued
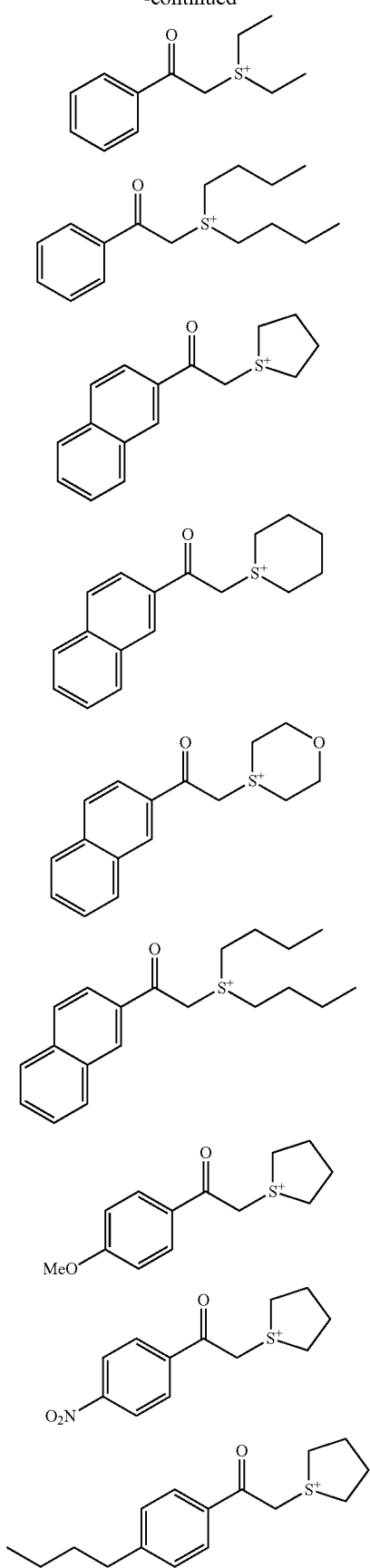
146
-continued
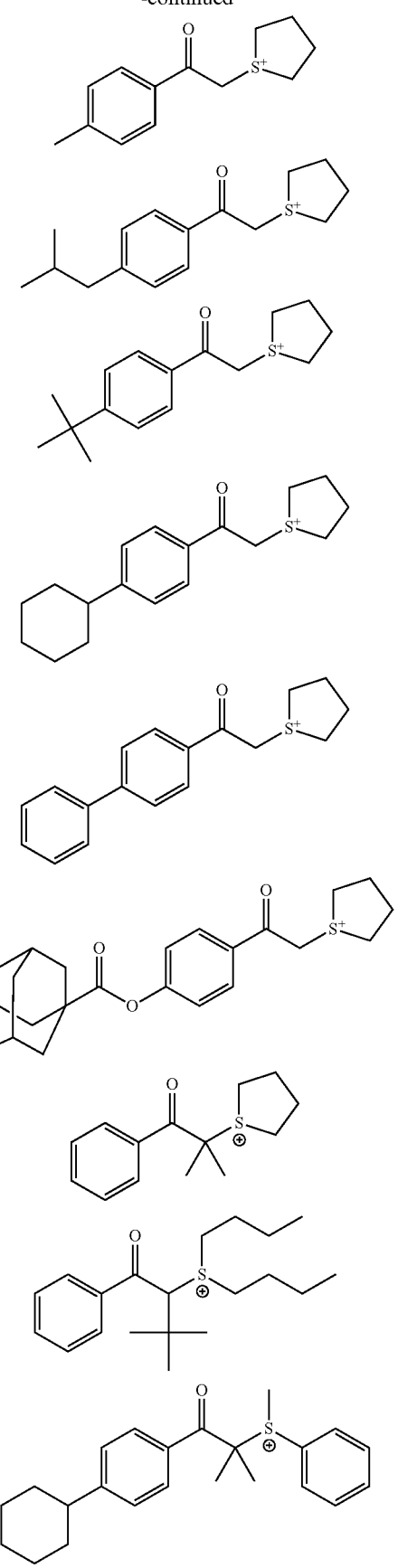

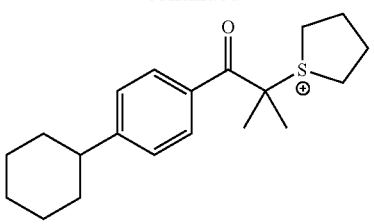
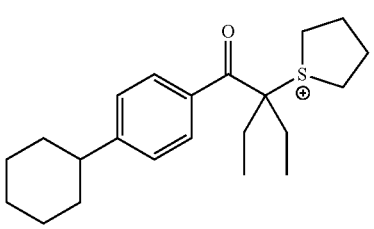
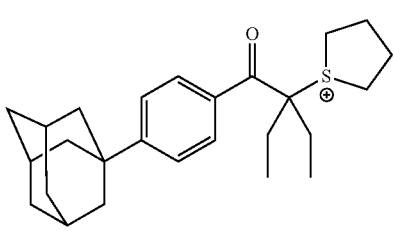
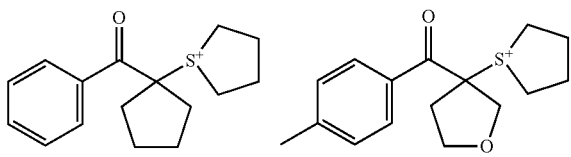
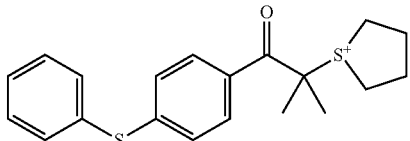
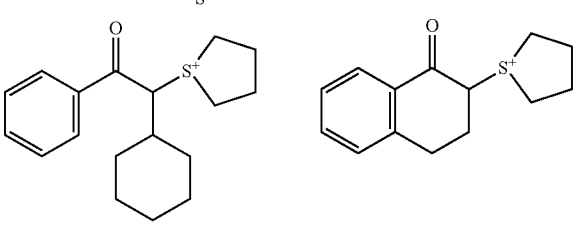
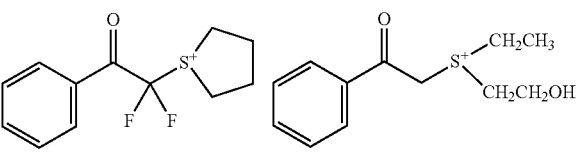
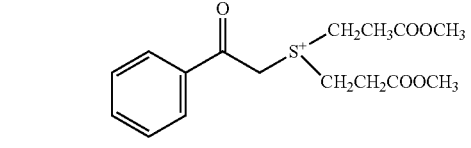
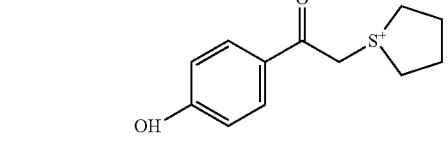
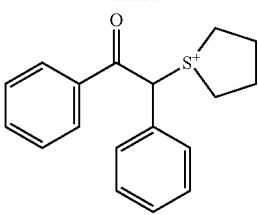
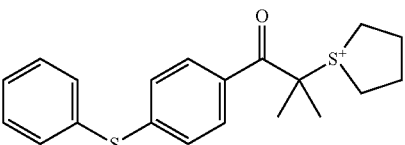
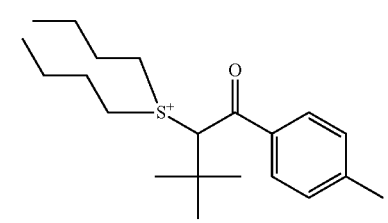
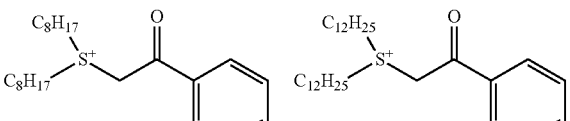
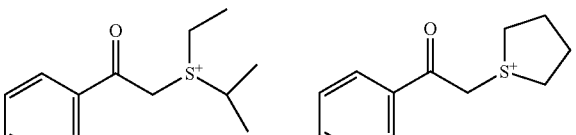
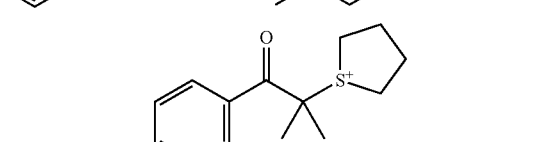
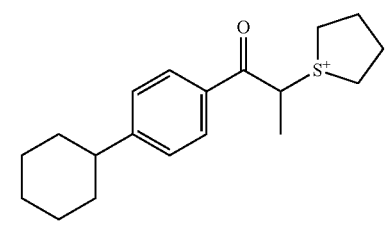
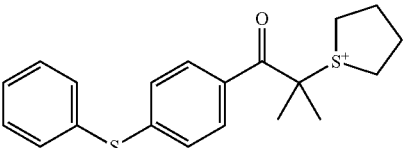
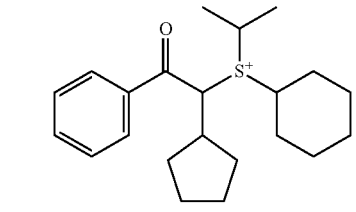

-continued

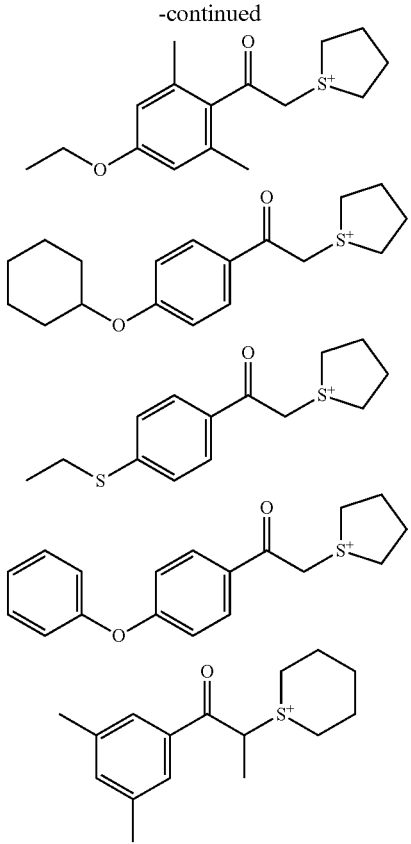

Now, the compounds (ZI-4) will be described.
The compounds (ZI-4) are those of general formula (ZI-4) below.

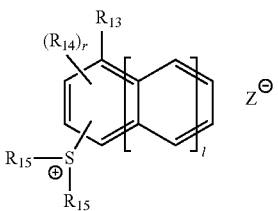

(ZI-4)

In general formula (ZI-4), $R_{13}$ represents any of a hydrogen atom, a fluorine atom, a hydroxyl group, an alkyl group, a cycloalkyl group, an alkoxy group, an alkoxycarbonyl group and a group with a cycloalkyl skeleton of a single ring or multiple rings. These groups may have substituents.

$R_{14}$, each independently in the instance of $R_{14}$s, represents any of an alkyl group, a cycloalkyl group, an alkoxy group, an alkoxycarbonyl group, an alkylcarbonyl group, an alkylsulfonyl group, a cycloalkylsulfonyl group and a group with a cycloalkyl skeleton of a single ring or multiple rings. These groups may have substituents.

Each of $R_{15s}$ independently represents an alkyl group, a cycloalkyl group or a naphthyl group, provided that the two $R_{15s}$ may be bonded to each other to thereby form a ring. These groups may have substituents.

In the formula, 1 is an integer of 0 to 2, and r is an integer of 0 to 8.

$Z^-$ represents a nonnucleophilic anion. As such, there can be mentioned any of the same nonnucleophilic anions as mentioned with respect to the $Z^-$ of the general formula (ZI).

In general formula (ZI-4), the alkyl groups represented by $R_{13}$, $R_{14}$ and $R_{15}$ may be linear or branched and preferably each have 1 to 10 carbon atoms. As such, there can be mentioned a methyl group, an ethyl group, an n-propyl group, an i-propyl group, an n-butyl group, a 2-methylpropyl group, a 1-methylpropyl group, a t-butyl group, an n-pentyl group, a neopentyl group, an n-hexyl group, an n-heptyl group, an n-octyl group, a 2-ethylhexyl group, an n-nonyl group, an n-decyl group and the like. Of these alkyl groups, a methyl group, an ethyl group, an n-butyl group, a t-butyl group and the like are preferred.

As the cycloalkyl groups represented by $R_{13}$, $R_{14}$ and $R_{15}$, there can be mentioned cyclopropyl, cyclobutyl, cyclopentyl, cyclohexyl, cycloheptyl, cyclooctyl, cyclododecanyl, cyclopentenyl, cyclohexenyl, cyclooctadienyl, norbornyl, tricyclodecanyl, tetracyclodecanyl, adamantyl and the like. Cyclopropyl, cyclopentyl, cyclohexyl and cyclooctyl are especially preferred.

The alkoxy groups represented by $R_{13}$ and $R_{14}$ may be linear or branched and preferably each have 1 to 10 carbon atoms. As such, there can be mentioned, for example, a methoxy group, an ethoxy group, an n-propoxy group, an i-propoxy group, an n-butoxy group, a 2-methylpropoxy group, a 1-methylpropoxy group, a t-butoxy group, an n-pentyloxy group, a neopentyloxy group, an n-hexyloxy group, an n-heptyloxy group, an n-octyloxy group, a 2-ethylhexyloxy group, an n-nonyloxy group, an n-decyloxy group and the like. Of these alkoxy groups, a methoxy group, an ethoxy group, an n-propoxy group, an n-butoxy group and the like are preferred.

The alkoxycarbonyl group represented by $R_{13}$ and $R_{14}$ may be linear or branched and preferably has 2 to 11 carbon atoms. As such, there can be mentioned, for example, a methoxycarbonyl group, an ethoxycarbonyl group, an n-propoxycarbonyl group, an i-propoxycarbonyl group, an n-butoxycarbonyl group, a 2-methylpropoxycarbonyl group, a 1-methylpropoxycarbonyl group, a t-butoxycarbonyl group, an n-pentyloxycarbonyl group, a neopentyloxycarbonyl group, an n-hexyloxycarbonyl group, an n-heptyloxycarbonyl group, an n-octyloxycarbonyl group, a 2-ethylhexyloxycarbonyl group, an n-nonyloxycarbonyl group, an n-decyloxycarbonyl group and the like. Of these alkoxycarbonyl groups, a methoxycarbonyl group, an ethoxycarbonyl group, an n-butoxycarbonyl group and the like are preferred.

As the groups with a cycloalkyl skeleton of a single ring or multiple rings represented by $R_{13}$ and $R_{14}$, there can be mentioned, for example, a cycloalkyloxy group of a single ring or multiple rings and an alkoxy group with a cycloalkyl group of a single ring or multiple rings. These groups may further have substituents.

With respect to each of the cycloalkyloxy groups of a single ring or multiple rings represented by $R_{13}$ and $R_{14}$, the sum of carbon atoms thereof is preferably 7 or greater, more preferably in the range of 7 to 15. Further, having a cycloalkyl skeleton of a single ring is preferred. The cycloalkyloxy group of a single ring of which the sum of carbon atoms is 7 or greater is one composed of a cycloalkyloxy group, such as a cyclopropyloxy group, a cyclobutyloxy group, a cyclopentyloxy group, a cyclohexyloxy group, a cycloheptyloxy group, a cyclooctyloxy group or a cyclododecanyloxy group, optionally having a substituent selected from among an alkyl group such as methyl, ethyl, propyl, butyl, pentyl, hexyl, heptyl, octyl, dodecyl, 2-ethylhexyl, isopropyl, sec-butyl, t-butyl or isoamyl, a hydroxyl group, a halogen atom (fluorine, chlorine, bromine or iodine), a nitro group, a cyano group, an amido group, a sulfonamido group, an alkoxy group such as methoxy, ethoxy, hydroxyethoxy, propoxy, hydroxypropoxy or butoxy, an alkoxycarbonyl group such as methoxycarbonyl or ethoxycarbonyl, an acyl group such as formyl, acetyl or benzoyl, an acyloxy group such as acetoxy or butyryloxy, a carboxyl group and the like, provided that the sum of carbon atoms thereof, including those of any optional substituent introduced in the cycloalkyl group, is 7 or greater.

As the cycloalkyloxy group of multiple rings of which the sum of carbon atoms is 7 or greater, there can be mentioned a norbornyloxy group, a tricyclodecanyloxy group, a tetracyclodecanyloxy group, an adamantyloxy group or the like.

With respect to each of the alkyloxy groups having a cycloalkyl skeleton of a single ring or multiple rings represented by $R_{13}$ and $R_{14}$, the sum of carbon atoms thereof is preferably 7 or greater, more preferably in the range of 7 to 15. Further, the alkoxy group having a cycloalkyl skeleton of a single ring is preferred. The alkoxy group having a cycloalkyl skeleton of a single ring of which the sum of carbon atoms is 7 or greater is one composed of an alkoxy group, such as methoxy, ethoxy, propoxy, butoxy, pentyloxy, hexyloxy, heptoxy, octyloxy, dodecyloxy, 2-ethylhexyloxy, isopropoxy, sec-butoxy, t-butoxy or isoamyloxy, substituted with the above optionally substituted cycloalkyl group of a single ring, provided that the sum of carbon atoms thereof, including those of the substituents, is 7 or greater. For example, there can be mentioned a cyclohexylmethoxy group, a cyclopentylethoxy group, a cyclohexylethoxy group or the like. A cyclohexylmethoxy group is preferred.

As the alkoxy group having a cycloalkyl skeleton of multiple rings of which the sum of carbon atoms is 7 or greater, there can be mentioned a norbornylmethoxy group, a norbornylethoxy group, a tricyclodecanylmethoxy group, a tricyclodecanylethoxy group, a tetracyclodecanylmethoxy group, a tetracyclodecanylethoxy group, an adamantylmethoxy group, an adamantylethoxy group and the like. Of these, a norbornylmethoxy group, a norbornylethoxy group and the like are preferred.

With respect to the alkyl group of the alkylcarbonyl group represented by $R_{14}$, there can be mentioned the same specific examples as mentioned above with respect to the alkyl groups represented by $R_{13}$ to $R_{15}$.

The alkylsulfonyl and cycloalkylsulfonyl groups represented by $R_{14}$ may be linear, branched or cyclic and preferably each have 1 to 10 carbon atoms. As such, there can be mentioned, for example, a methanesulfonyl group, an ethanesulfonyl group, an n-propanesulfonyl group, an n-butanesulfonyl group, a tert-butanesulfonyl group, an n-pentanesulfonyl group, a neopentanesulfonyl group, an n-hexanesulfonyl group, an n-heptanesulfonyl group, an n-octanesulfonyl group, a 2-ethylhexanesulfonyl group, an n-nonanesulfonyl group, an n-decanesulfonyl group, a cyclopentanesulfonyl group, a cyclohexanesulfonyl group and the like. Of these alkylsulfonyl and cycloalkylsulfonyl groups, a methanesulfonyl group, an ethanesulfonyl group, an n-propanesulfonyl group, an n-butanesulfonyl group, a cyclopentanesulfonyl group, a cyclohexanesulfonyl group and the like are preferred.

Each of the groups may have a substituent. As such a substituent, there can be mentioned, for example, a halogen atom (e.g., a fluorine atom), a hydroxyl group, a carboxyl group, a cyano group, a nitro group, an alkoxy group, an alkoxyalkyl group, an alkoxycarbonyl group, an alkoxycarbonyloxy group or the like.

As the alkoxy group, there can be mentioned, for example, a linear, branched or cyclic alkoxy group having 1 to 20 carbon atoms, such as a methoxy group, an ethoxy group, an n-propoxy group, an i-propoxy group, an n-butoxy group, a 2-methylpropoxy group, a 1-methylpropoxy group, a t-butoxy group, a cyclopentyloxy group or a cyclohexyloxy group.

As the alkoxyalkyl group, there can be mentioned, for example, a linear, branched or cyclic alkoxyalkyl group having 2 to 21 carbon atoms, such as a methoxymethyl group, an ethoxymethyl group, a 1-methoxyethyl group, a 2-methoxyethyl group, a 1-ethoxyethyl group or a 2-ethoxyethyl group.

As the alkoxycarbonyl group, there can be mentioned, for example, a linear, branched or cyclic alkoxycarbonyl group having 2 to 21 carbon atoms, such as a methoxycarbonyl group, an ethoxycarbonyl group, an n-propoxycarbonyl group, an i-propoxycarbonyl group, an n-butoxycarbonyl group, a 2-methylpropoxycarbonyl group, a 1-methylpropoxycarbonyl group, a t-butoxycarbonyl group, a cyclopentyloxycarbonyl group or a cyclohexyloxycarbonyl group.

As the alkoxycarbonyloxy group, there can be mentioned, for example, a linear, branched or cyclic alkoxycarbonyloxy group having 2 to 21 carbon atoms, such as a methoxycarbonyloxy group, an ethoxycarbonyloxy group, an n-propoxycarbonyloxy group, an i-propoxycarbonyloxy group, an n-butoxycarbonyloxy group, a t-butoxycarbonyloxy group, a cyclopentyloxycarbonyloxy group or a cyclohexyloxycarbonyloxy group.

The cyclic structure that may be formed by the bonding of the two $R_{15s}$ to each other is preferably a 5- or 6-membered ring, especially a 5-membered ring (namely, a tetrahydrothiophene ring) formed by two bivalent $R_{15}$s in cooperation with the sulfur atom of general formula (ZI-4). The cyclic structure may condense with an aryl group or a cycloalkyl group. The bivalent $R_{15}$s may have substituents. As such substituents, there can be mentioned, for example, a hydroxyl group, a carboxyl group, a cyano group, a nitro group, an alkoxy group, an alkoxyalkyl group, an alkoxycarbonyl group, an alkoxycarbonyloxy group and the like as mentioned above. It is especially preferred for the $R_{15}$ of general formula (ZI-4) to be a methyl group, an ethyl group, a naphthyl group, the above-mentioned bivalent group allowing two $R_{15s}$ to be bonded to each other so as to form a tetrahydrothiophene ring structure in cooperation with the sulfur atom of the general formula (ZI-4), or the like.

Each of $R_{13}$ and $R_{14}$ may have a substituent. As such a substituent, there can be mentioned, for example, a hydroxyl group, an alkoxy group, an alkoxycarbonyl group, a halogen atom (especially, a fluorine atom) or the like.

In the formula, l is preferably 0 or 1, more preferably 1, and r is preferably 0 to 2.

Specific examples of the cations of the compounds represented by general formula (ZI-4) of the present invention will be shown below.

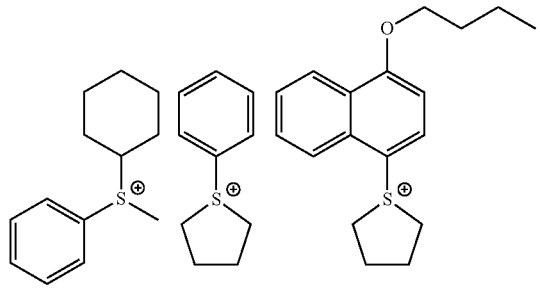

153
-continued
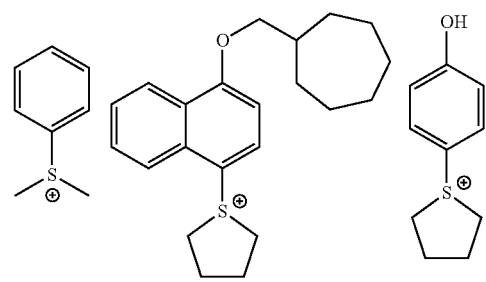
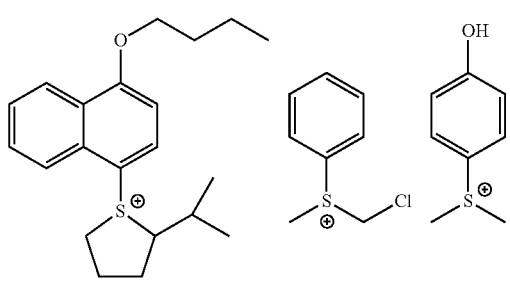
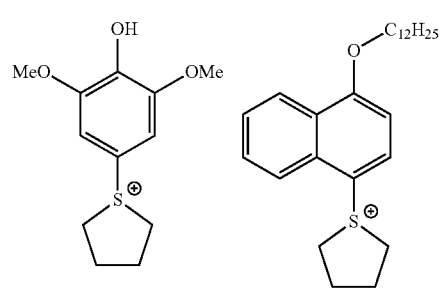
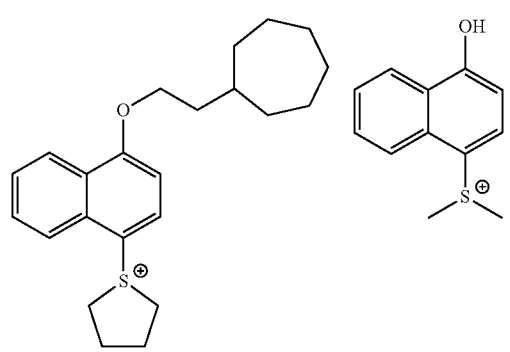
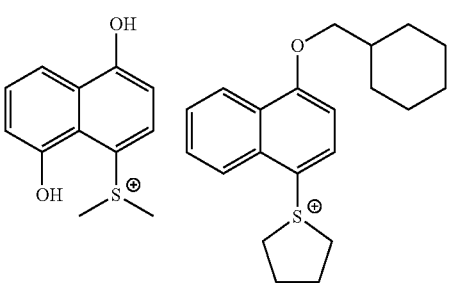
154
-continued
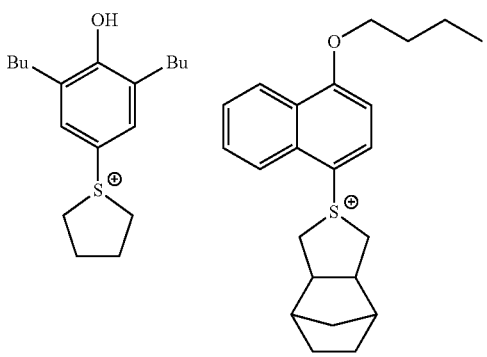
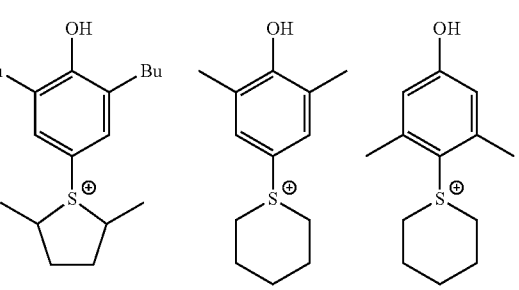
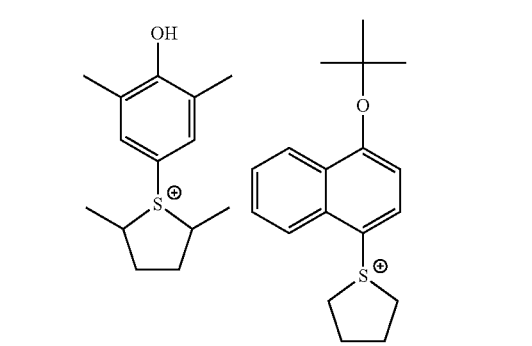
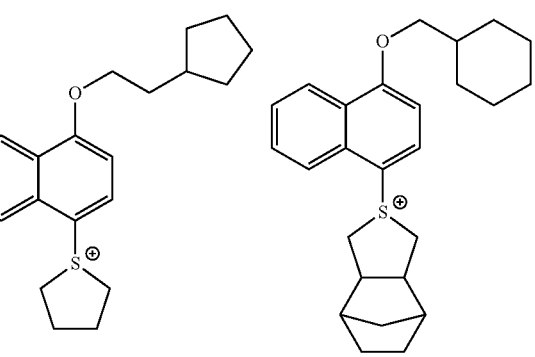
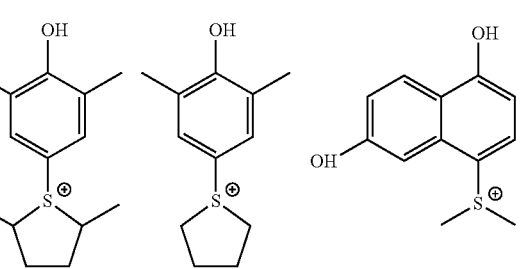

155
-continued
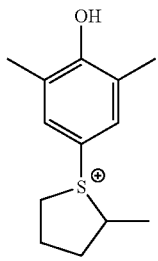
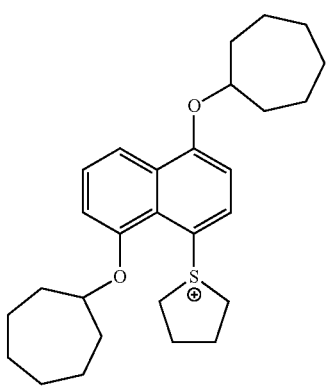
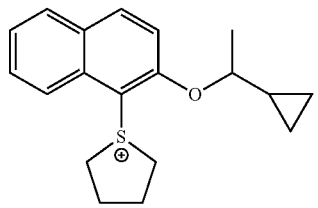
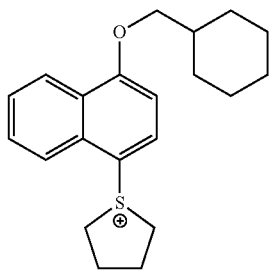
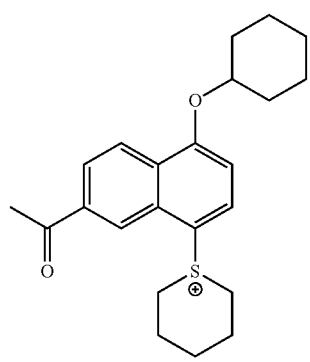
156
-continued
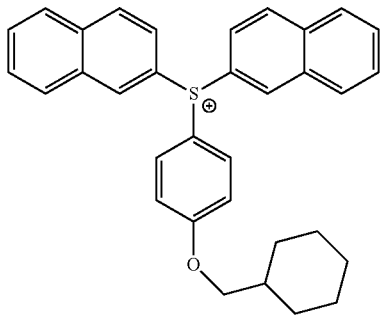
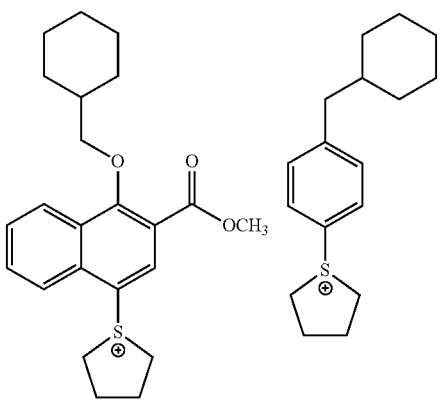
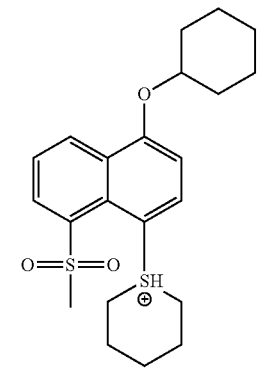
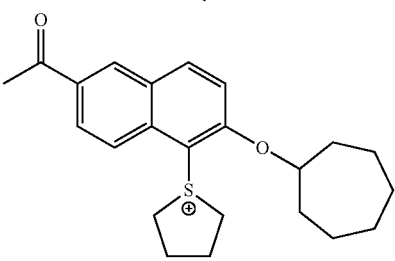
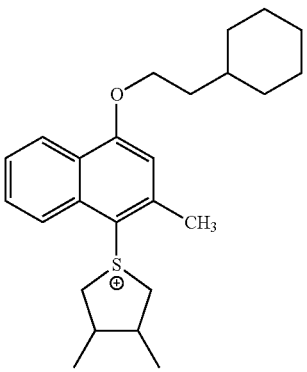

-continued

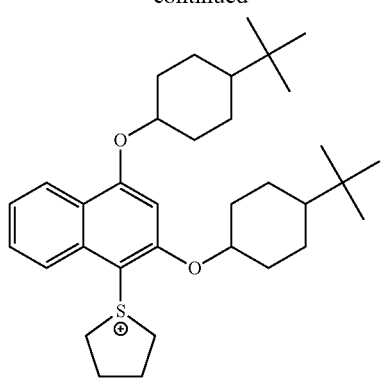

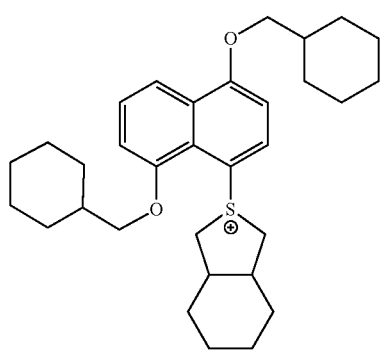

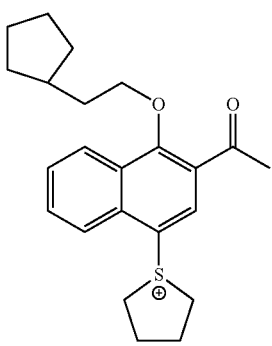

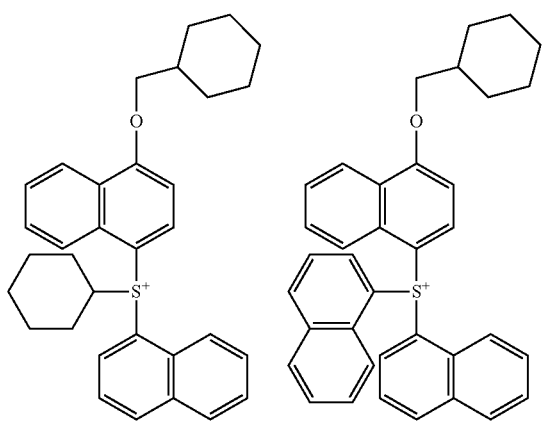

-continued

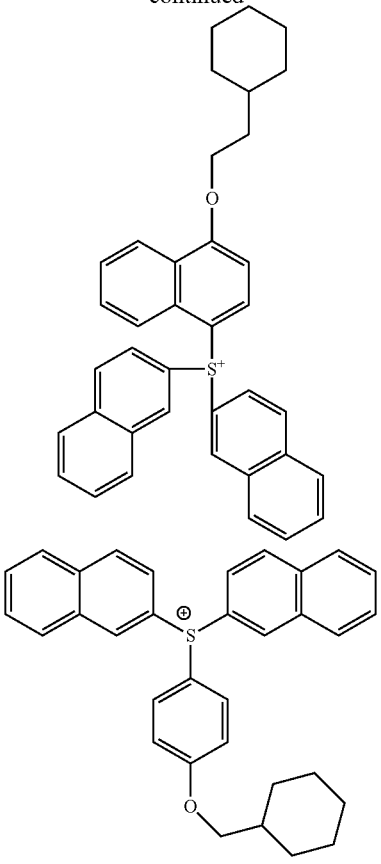

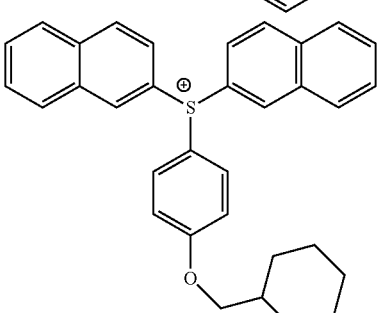

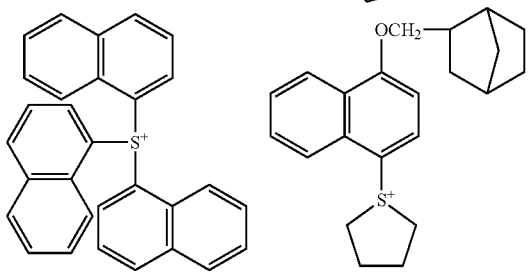

Now, general formulae (ZII) and (ZIII) will be described.
In general formulae (ZII) and (ZIII),
each of $R_{204}$ to $R_{207}$ independently represents an aryl group, an alkyl group or a cycloalkyl group.

The aryl group represented by each of $R_{204}$ to $R_{207}$ is preferably a phenyl group or a naphthyl group, more preferably a phenyl group. The aryl group represented by $R_{204}$ to $R_{207}$ may be one having a heterocyclic structure containing an oxygen atom, nitrogen atom, sulfur atom or the like. As the aryl group having a heterocyclic structure, there can be mentioned, for example, a pyrrole residue (a group formed by loss of one hydrogen atom from pyrrole), a furan residue (a group formed by loss of one hydrogen atom from furan), a thiophene residue (a group formed by loss of one hydrogen atom from thiophene), an indole residue (a group formed by loss of one hydrogen atom from indole), a benzofuran residue (a group formed by loss of one hydrogen atom from benzofuran), a benzothiophene residue (a group formed by loss of one hydrogen atom from benzothiophene) or the like.

As preferred alkyl groups and cycloalkyl groups represented by $R_{204}$ to $R_{207}$, there can be mentioned a linear or branched alkyl group having 1 to 10 carbon atoms (for example, a methyl group, an ethyl group, a propyl group, a butyl group or a pentyl group) and a cycloalkyl group having 3 to 10 carbon atoms (a cyclopentyl group, a cyclohexyl group or a norbornyl group).

The aryl group, alkyl group and cycloalkyl group represented by $R_{204}$ to $R_{207}$ may have a substituent. As a possible substituent on the aryl group, alkyl group and cycloalkyl group represented by $R_{204}$ to $R_{207}$, there can be mentioned, for example, an alkyl group (for example, 1 to 15 carbon atoms), a cycloalkyl group (for example, 3 to 15 carbon atoms), an aryl group (for example, 6 to 15 carbon atoms), an alkoxy group (for example, 1 to 15 carbon atoms), a halogen atom, a hydroxyl group, a phenylthio group or the like.

$Z^-$ represents a nonnucleophilic anion. As such, there can be mentioned the same nonnucleophilic anions as mentioned with respect to the $Z^-$ of the general formula (ZI).

As the acid generators, there can be further mentioned the compounds of the following general formulae (ZIV), (ZV) and (ZVI).

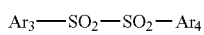

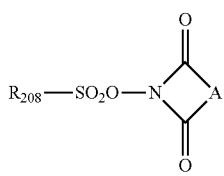

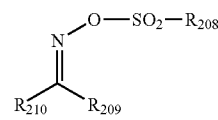

In the general formulae (ZIV) to (ZVI),
each of $Ar_3$ and $Ar_4$ independently represents an aryl group.
Each of $R_{208}$, $R_{209}$ and $R_{210}$ independently represents an alkyl group, a cycloalkyl group or an aryl group.
A represents an alkylene group, an alkenylene group or an arylene group.

Among the acid generators, the compounds of the general formulae (ZI) to (ZIII) are more preferred.

As a preferred acid generator, there can be mentioned a compound that generates an acid having one sulfonate group or imido group. As a more preferred acid generator, there can be mentioned a compound that generates a monovalent perfluoroalkanesulfonic acid, a compound that generates a monovalent aromatic sulfonic acid substituted with a fluorine atom or fluorine-atom-containing group, or a compound that generates a monovalent imidic acid substituted with a fluorine atom or fluorine-atom-containing group. As a still more preferred acid generator, there can be mentioned any of sulfonium salts of fluorinated alkanesulfonic acid, fluorinated benzenesulfonic acid, fluorinated imidic acid and fluorinated methide acid. With respect to practicable acid generators, it is especially preferred for the generated acid to be a fluorinated alkanesulfonic acid, fluorinated benzenesulfonic acid or fluorinated imidic acid of −1 or below pKa. By the use thereof, an enhancement of sensitivity can be attained.

Especially preferred examples of the acid generators are as follows.

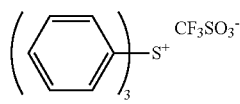

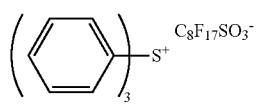

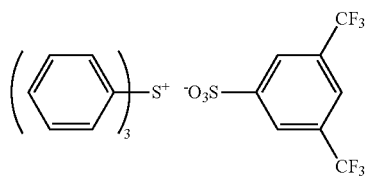

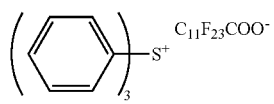

-continued
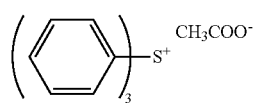 (z9)
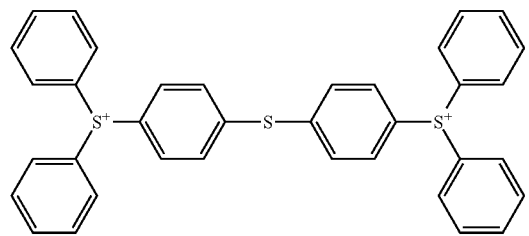 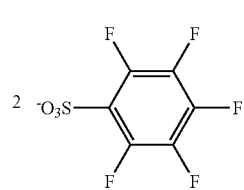 (z10)
(z11) (z12)
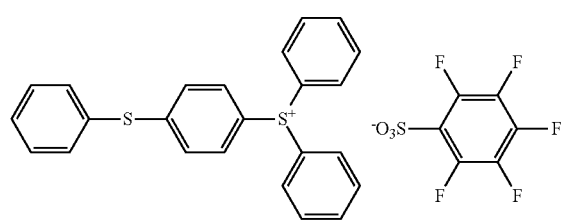 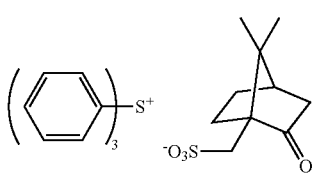
(z13) (z14)
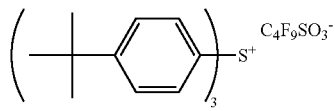 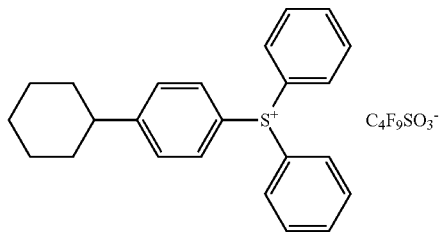
(z15) (z16)
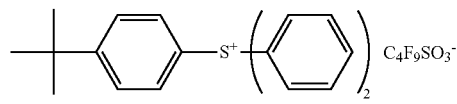 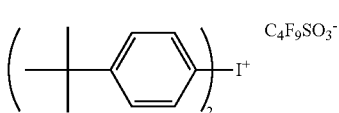
(z17) (z18)
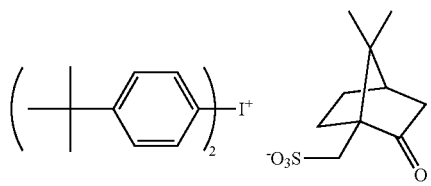 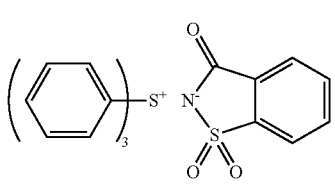
(z19) (z20)
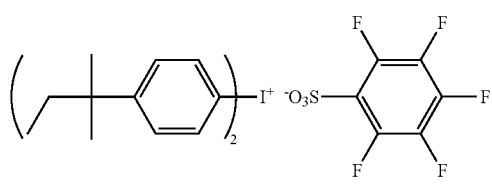 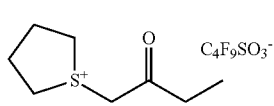
(z21) (z22)
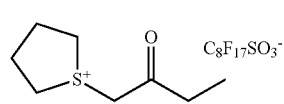 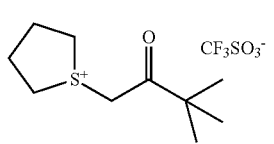
(z23) (z24)

-continued
(z25)
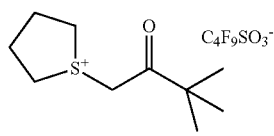
(z26)
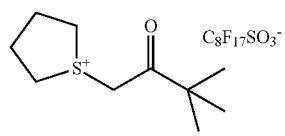
(z27)
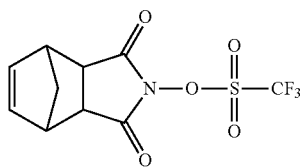
(z28)
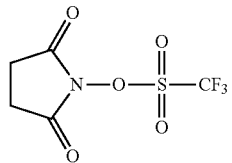
(z29)
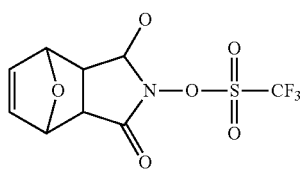
(z30)
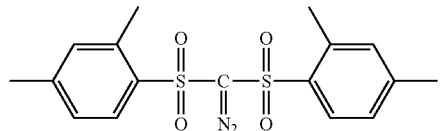
(z31)
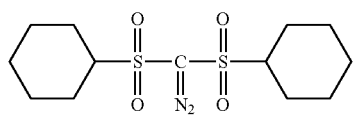
(z32)
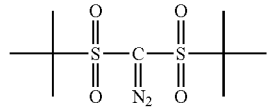
(z33)
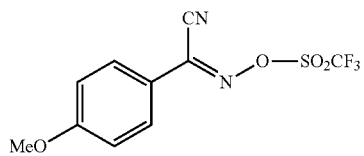
(z34)
(z35)
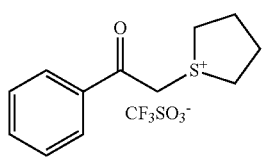
(z36)
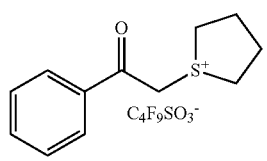
(z37)
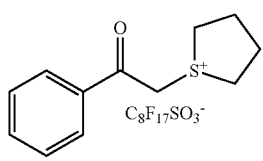
(z38)
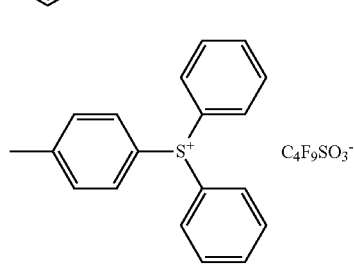
(z39)
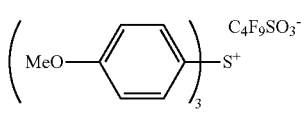
(z40)
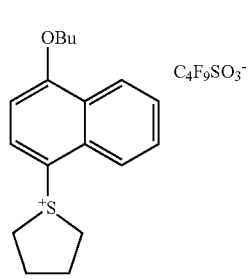

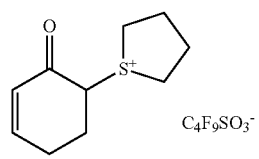
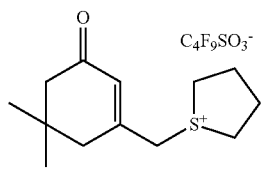
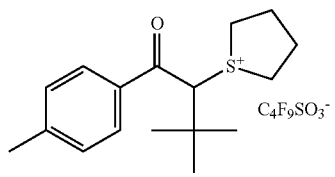
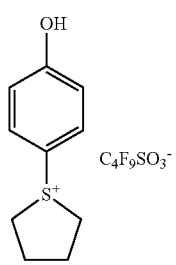
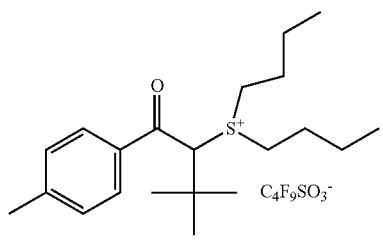
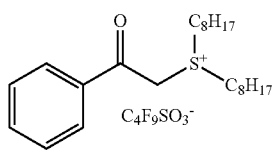
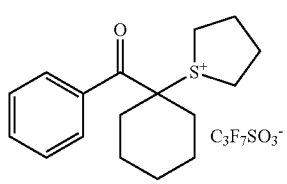
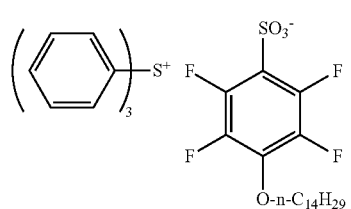
-continued
(z41)
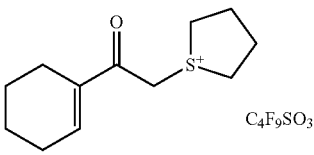
(z42)
(z43)
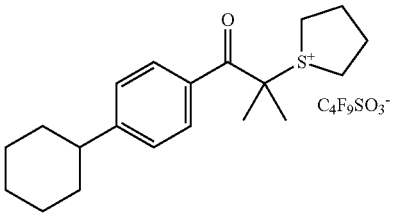
(z44)
(z45)
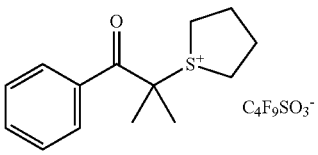
(z46)
(z47)
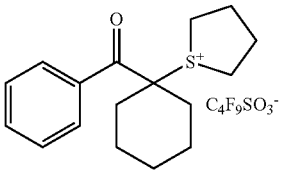
(z48)
(z49)
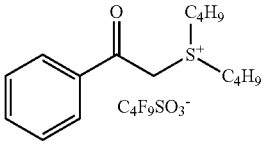
(z50)
(z51)
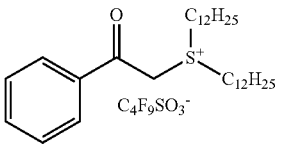
(z52)
(z53)
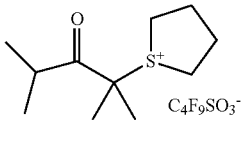
(z54)
(z55)
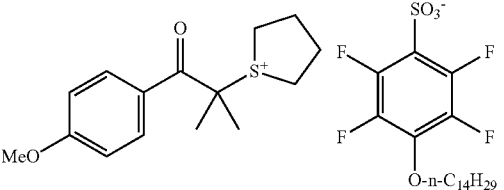
(z56)

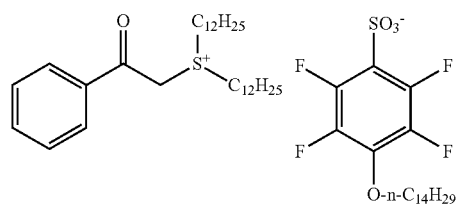
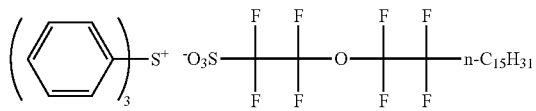 (z57)
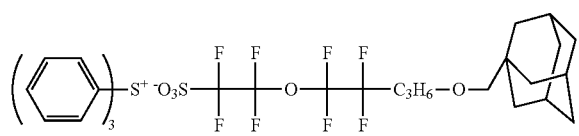 (z58)
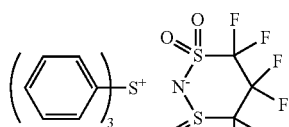 (z59)
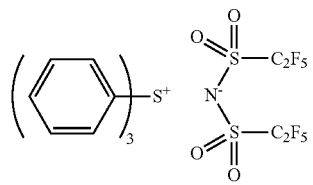 (z60)
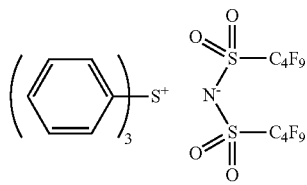 (z61)
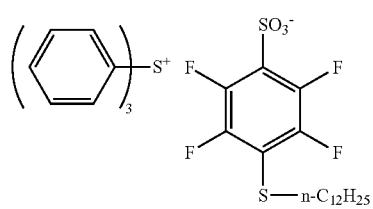 (z62)
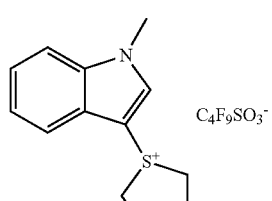 (z63)
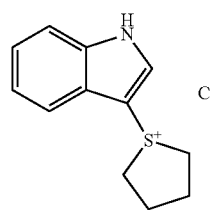 (z64)
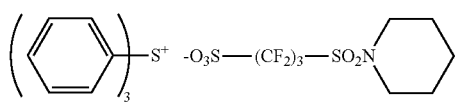 (z65)
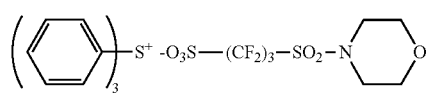 (z66)
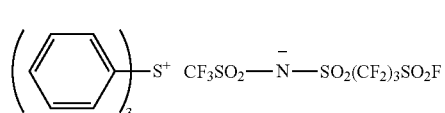 (z67)
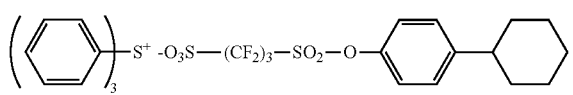 (z68)
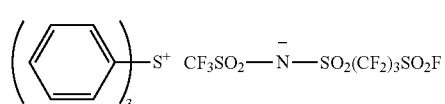 (z69)
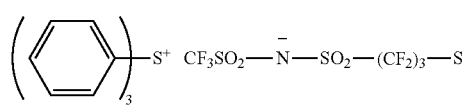 (z70)
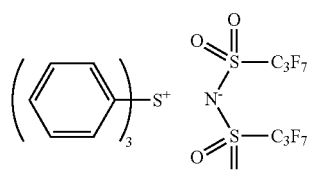 (z71)
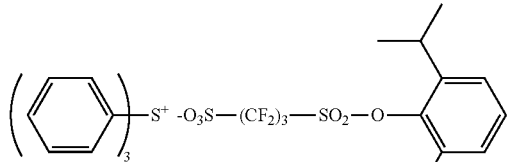 (z72)

-continued
(z73) 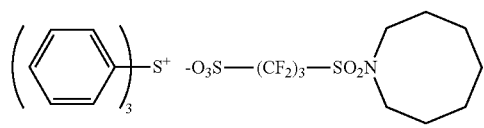
(z74) 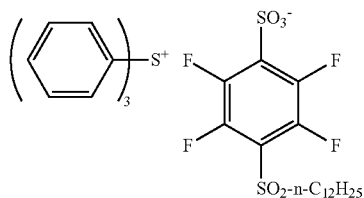
(z75) 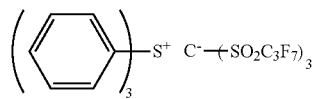
(z76) 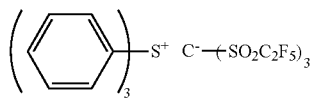
(z77) 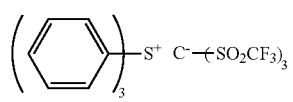
(z78) 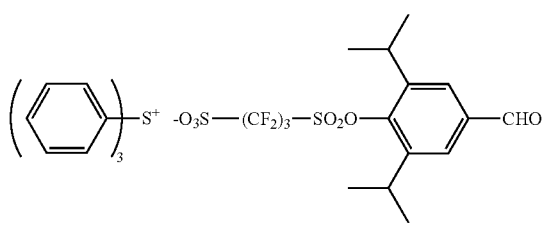
(z79) 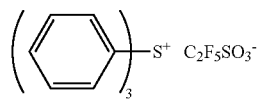
(z80) 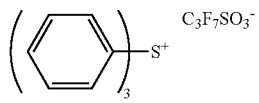
(z81) 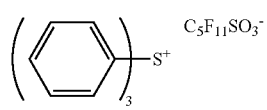
(z82) 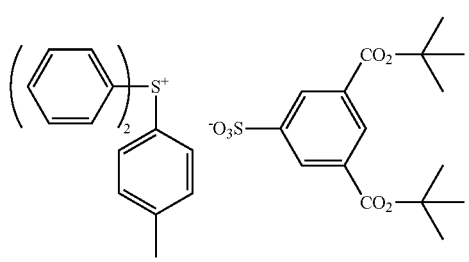
(z83) 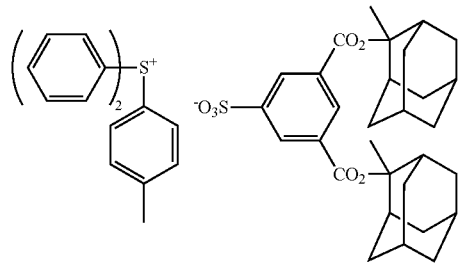
(z84) 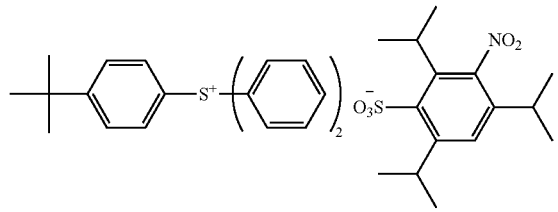
(z85) 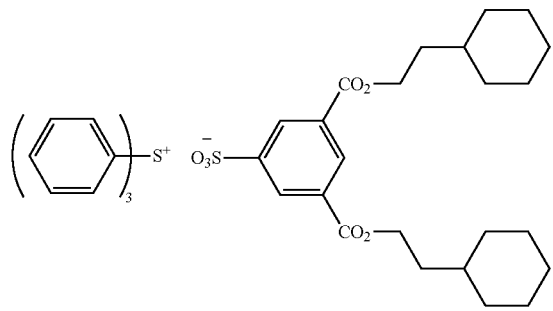
(z86) 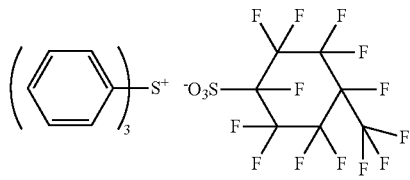

-continued

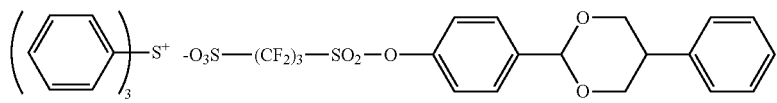
(z87)

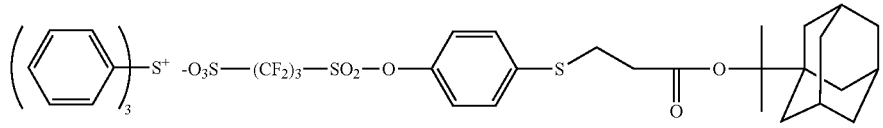
(z88)

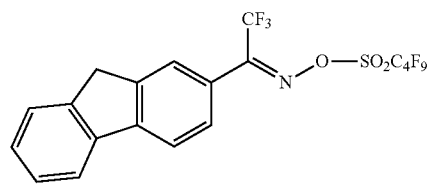
(z89)

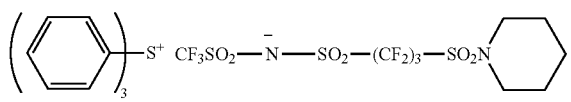
(z90)

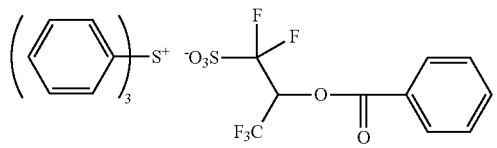
(z91)

Also, the compounds of general formula (I), below, may be contained in the composition of the present invention as compound (B).

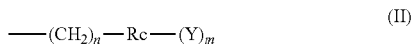
(I)

In general formula (I), $X^+$ represents an organic counter ion.

R represents a hydrogen atom or an organic group. R is preferably an organic group having 1 to 40 carbon atoms, more preferably an organic group having 3 to 20 carbon atoms and most preferably any of the organic groups of formula (II) below.

The organic group represented by R essentially has one or more carbon atoms. Preferably, the atom bonded to the oxygen atom of the ester bond appearing in general formula (Xa) is a carbon atom. As the organic groups, there can be mentioned, for example, an alkyl group, a cycloalkyl group, an aryl group, an aralkyl group and a group with a lactone structure. These groups in the chain thereof may have a heteroatom, such as an oxygen atom or a sulfur atom. These groups may be introduced in each other as substituents, and they may further have a substituent, such as a hydroxyl group, an acyl group, an acyloxy group, an oxy group (=O) or a halogen atom. R is more preferably represented by general formula (II), below.

$$—(CH_2)_n—Rc—(Y)_m \quad (II)$$

In general formula (II), Rc represents a cyclic organic group of a single ring or multiple rings having 3 to 30 carbon atoms that may contain a cyclic ether, cyclic thioether, cyclic ketone, cyclic carbonic ester, lactone or lactam structure.

Y represents a hydroxyl group, a halogen atom, a cyano group, a carboxyl group, a hydrocarbon group having 1 to 10 carbon atoms, a hydroxyalkyl group having 1 to 10 carbon atoms, an alkoxy group having 1 to 10 carbon atoms, an acyl group having 2 to 10 carbon atoms, an alkoxycarbonyl group having 2 to 10 carbon atoms, an acyloxy group having 2 to 10 carbon atoms, an alkoxyalkyl group having 2 to 10 carbon atoms, or a halogenated alkyl group having 1 to 8 carbon atoms.

In the formula, m is an integer of 0 to 6. In the instance of multiple Ys, they may be identical to or different from each other. Further, n is an integer of 0 to 10.

The sum of carbon atoms constructing each of the R-groups of the formula (II) is preferably 40 or less.

Preferably, n is an integer of 0 to 3, and it is preferred for Rc to be a monocyclic or polycyclic organic group having 7 to 16 carbon atoms.

The molecular weight of the compounds of general formulae (I) is generally in the range of 300 to 1000, preferably 400 to 800 and more preferably 500 to 700.

As the organic counter ion represented by $X^+$, there can be mentioned, for example, a sulfonium cation or an iodonium cation.

As preferred forms of the compounds of general formula (I), there can be mentioned the compounds of general formulae $(Z_{SC1})$ and $(Z_{IC1})$ below.

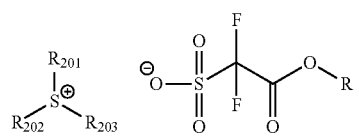
$Z_{SC1}$

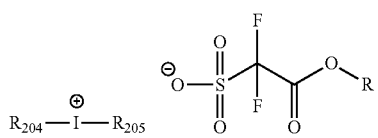

In general formula ($Z_{SC1}$), the definition of R and preferred scope thereof are the same as mentioned above in connection with general formula (I).

The definitions, particular examples, preferred forms, etc. of $R_{201}$, $R_{202}$ and $R_{203}$ are the same as mentioned above in connection with the $R_{201}$, $R_{202}$ and $R_{203}$ of general formula (ZI).

In general formula ($Z_{IC1}$), the definition of R and preferred scope thereof are the same as mentioned above in connection with general formula (I).

The definitions, particular examples, preferred forms, etc. of $R_{204}$ and $R_{205}$ are the same as mentioned above in connection with the $R_{204}$ and $R_{205}$ of general formula (ZII).

Particular examples of the compounds of general formula (I) are shown below, which should be construed as not limiting the scope of useful compounds. In the formulae, the molecular weight of each of the anions of the compounds is indicated.

(Y-1)

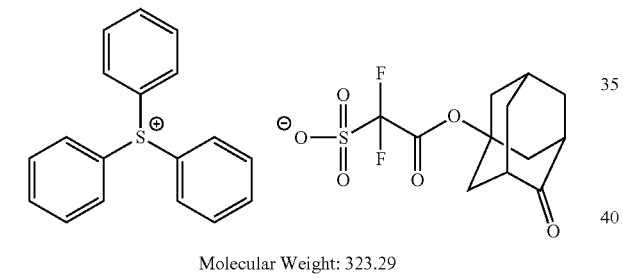

Molecular Weight: 323.29

(Y-2)

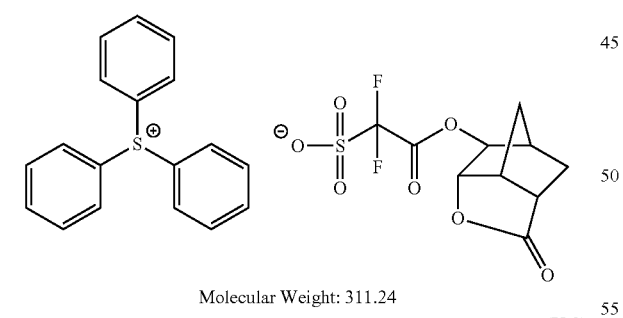

Molecular Weight: 311.24

(Y-3)

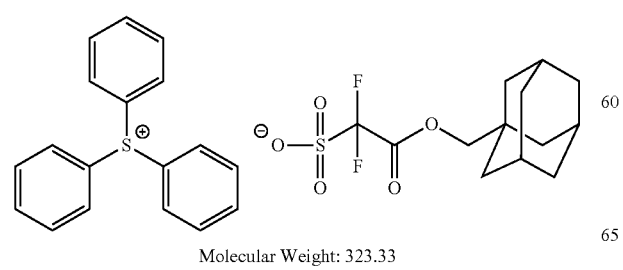

Molecular Weight: 323.33

(Y-4)

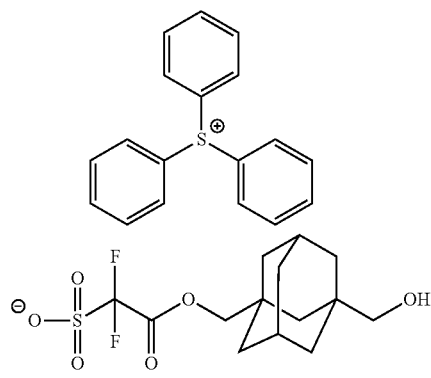

Molecular Weight: 353.36

(Y-5)

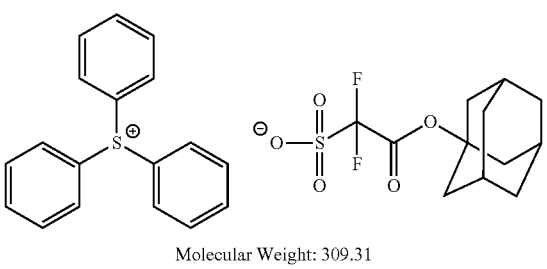

Molecular Weight: 309.31

(Y-6)

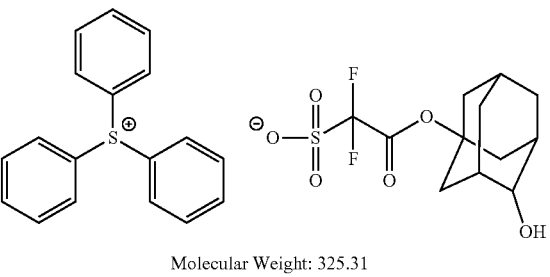

Molecular Weight: 325.31

(Y-7)

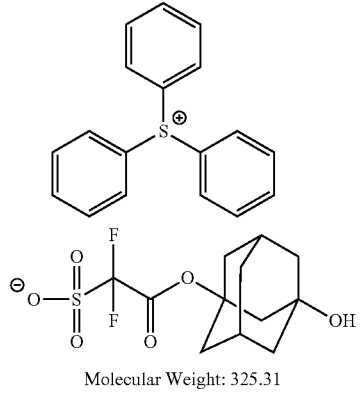

Molecular Weight: 325.31

(Y-8)

-continued
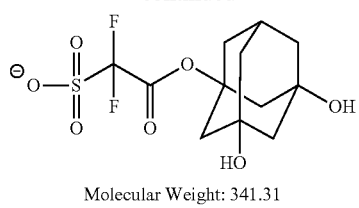
Molecular Weight: 341.31
(Y-9)
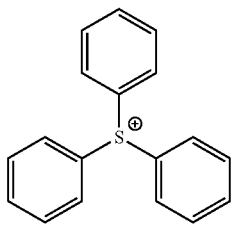
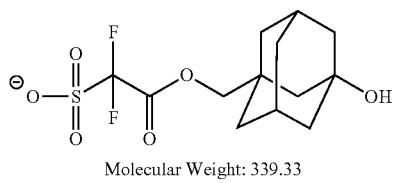
Molecular Weight: 339.33
(Y-10)
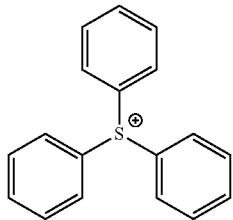
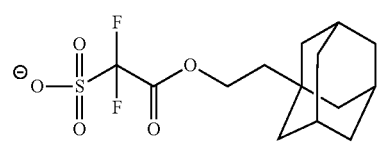
Molecular Weight: 337.36
(Y-11)
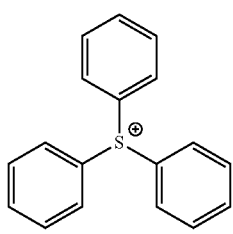
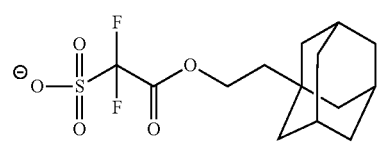
Molecular Weight: 351.34
-continued
(Y-12)
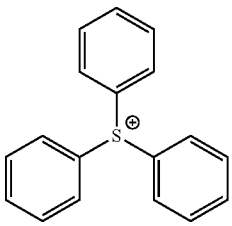
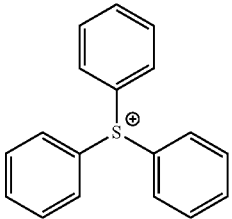
Molecular Weight: 369.27
(Y-13)
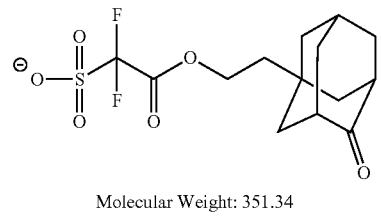
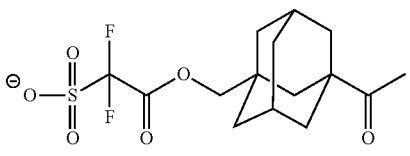
Molecular Weight: 375.41
(Y-14)
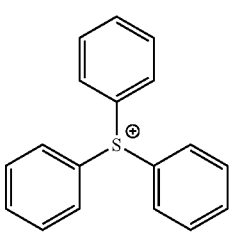
Molecular Weight: 365.37
(Y-15)

-continued
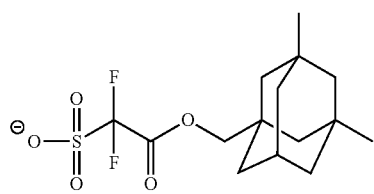
Molecular Weight: 351.39
(Y-16)
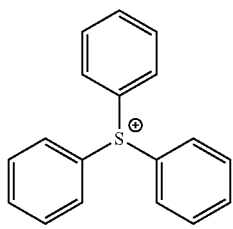
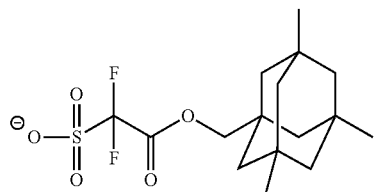
Molecular Weight: 365.41
(Y-17)
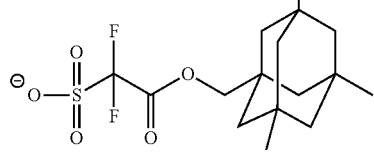
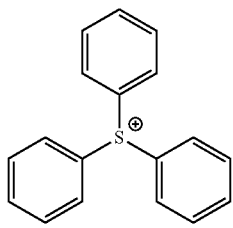
Molecular Weight: 351.39
(Y-18)
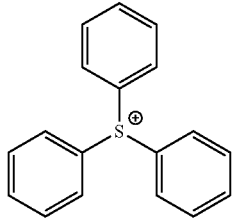
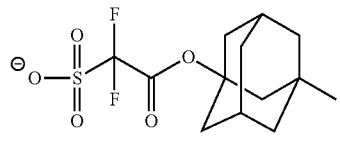
Molecular Weight: 323.33
-continued
(Y-19)
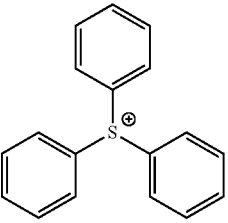
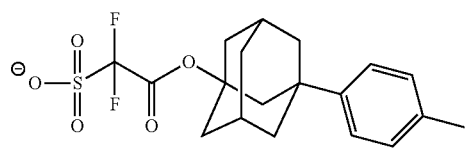
Molecular Weight: 399.43
(Y-20)
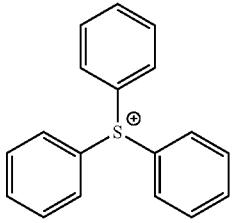
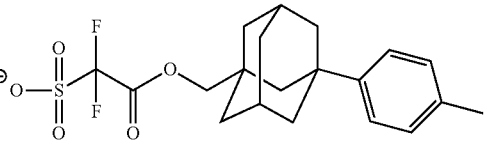
Molecular Weight: 413.46
(Y-21)
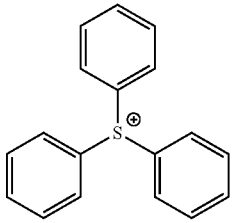
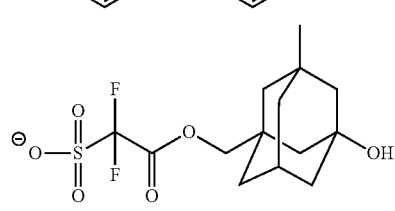
Molecular Weight: 353.36
(Y-22)
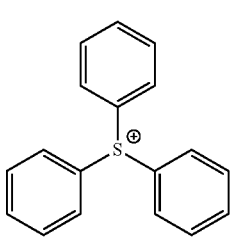

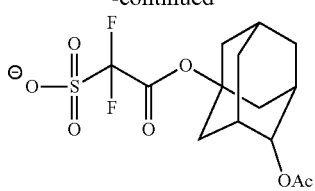
Molecular Weight: 367.34
(Y-23)
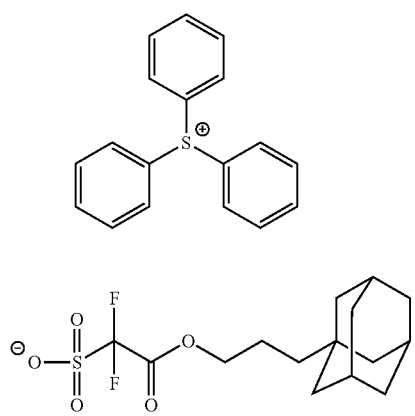
Molecular Weight: 351.39
(Y-24)
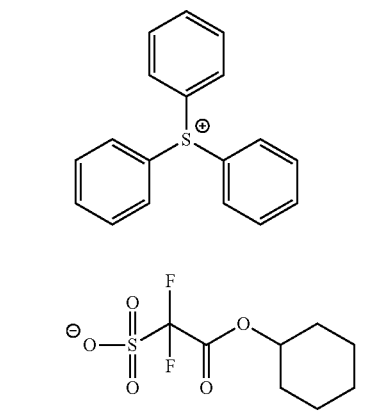
Molecular Weight: 257.23
(Y-25)
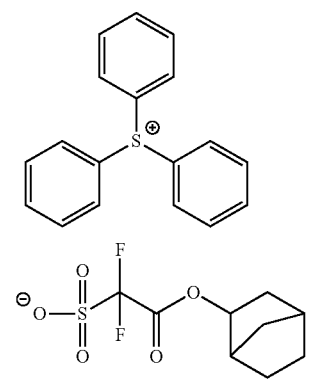
Molecular Weight: 269.24
(Y-26)
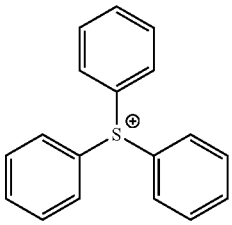
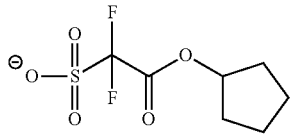
Molecular Weight: 243.21
(Y-27)
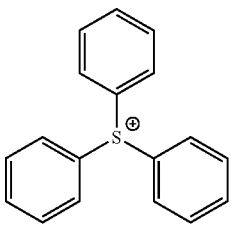
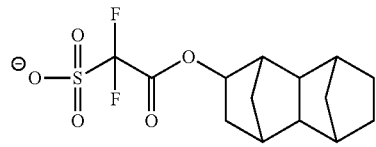
Molecular Weight: 335.34
(Y-28)
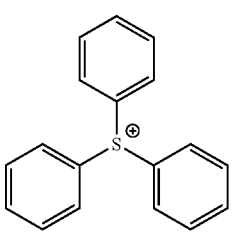
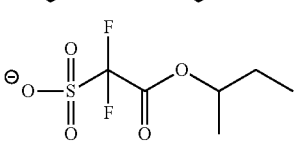
Molecular Weight: 231.20
(Y-29)
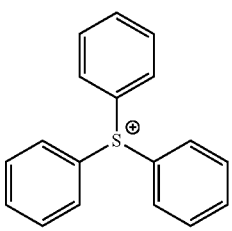
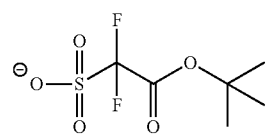
Molecular Weight: 231.20

-continued
(Y-30)
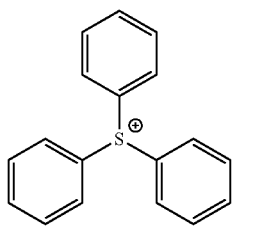
Molecular Weight: 189.12
(Y-31)
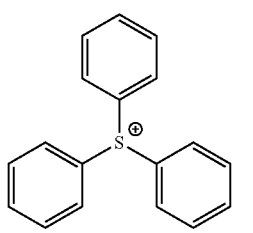
Molecular Weight: 175.09
(Y-32)
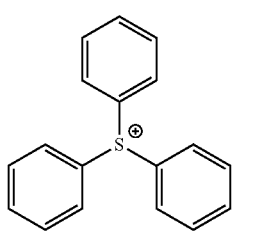
Molecular Weight: 299.31
(Y-33)
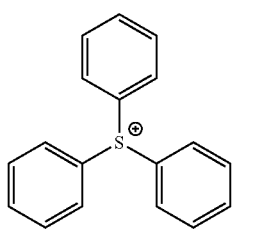
Molecular Weight: 259.25
-continued
(Y-34)
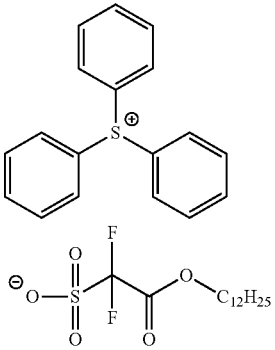
Molecular Weight: 343.41
(Y-35)
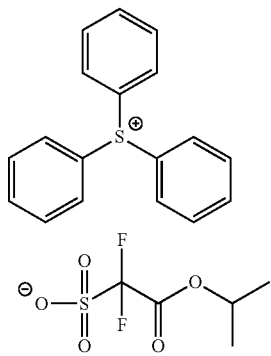
Molecular Weight: 217.17
(Y-36)
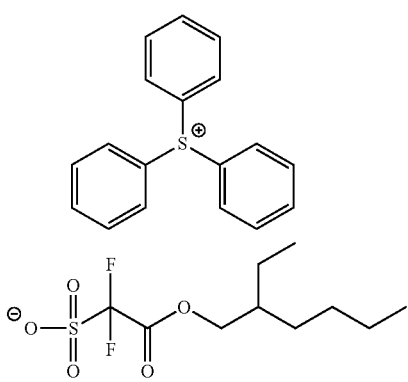
Molecular Weight: 287.30
(Y-37)
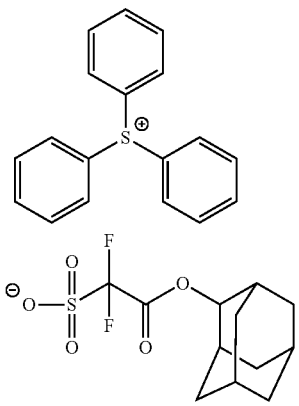
Molecular Weight: 309.31

(Y-38)
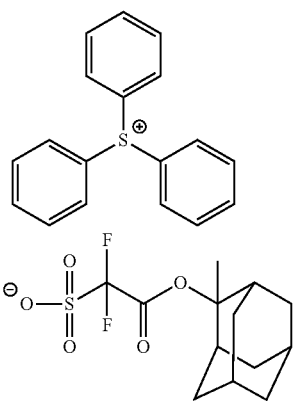
Molecular Weight: 323.33
(Y-39)
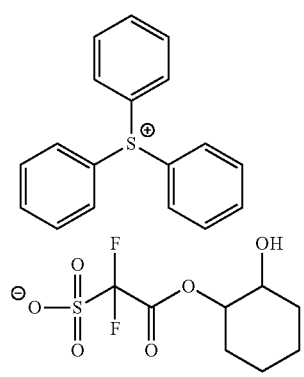
Molecular Weight: 273.23
(Y-40)
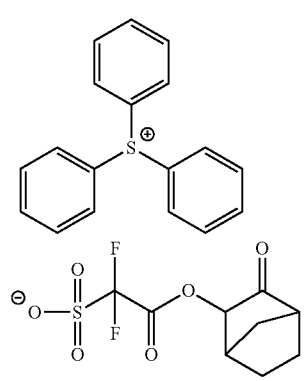
Molecular Weight: 283.23
(Y-41)
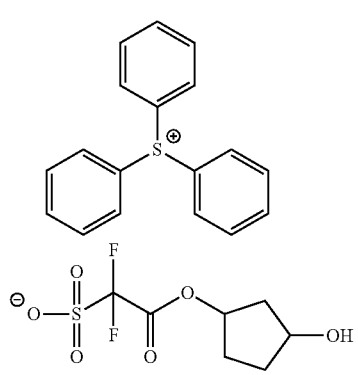
Molecular Weight: 259.21
(Y-42)
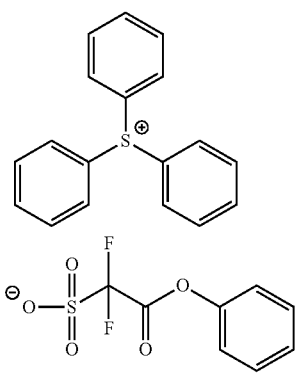
Molecular Weight: 251.18
(Y-43)
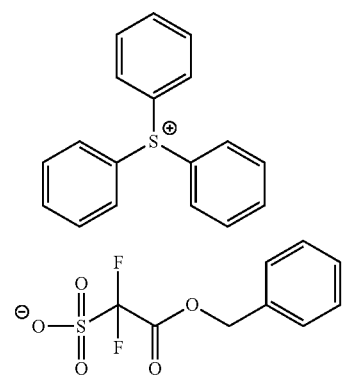
Molecular Weight: 265.21
(Y-44)
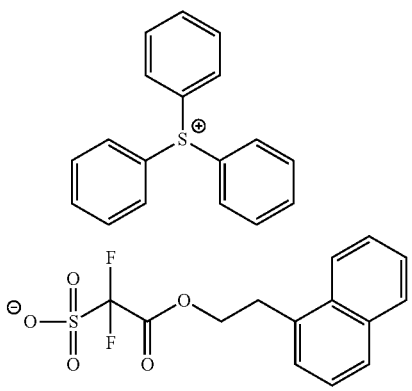
Molecular Weight: 329.30
(Y-45)
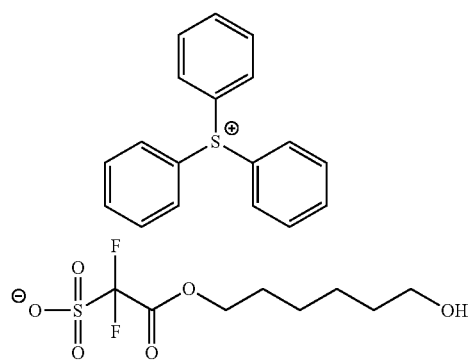
Molecular Weight: 275.25

-continued
(Y-46)
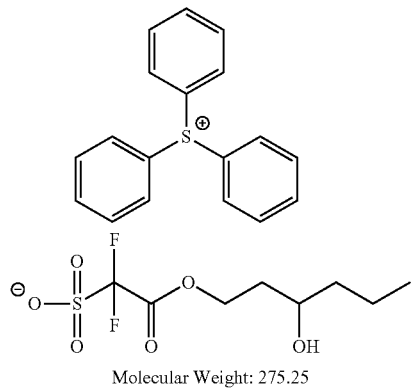
Molecular Weight: 275.25
(Y-47)
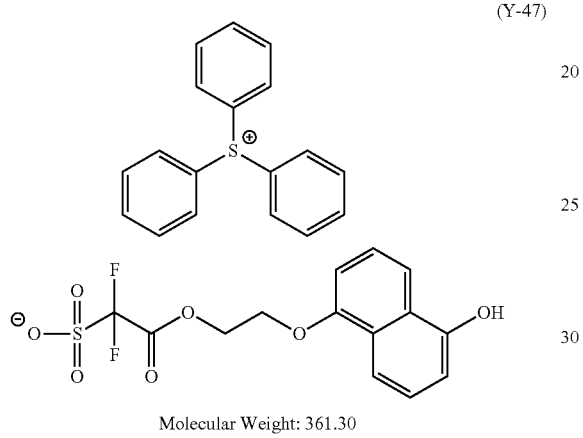
Molecular Weight: 361.30
(Y-48)
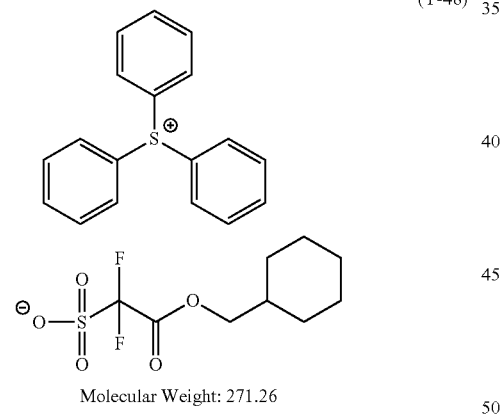
Molecular Weight: 271.26
(Y-49)
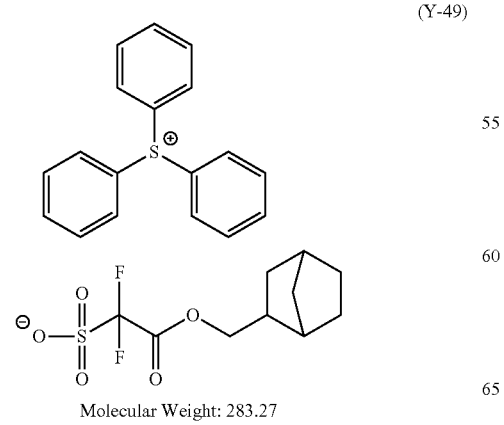
Molecular Weight: 283.27
-continued
(Y-50)
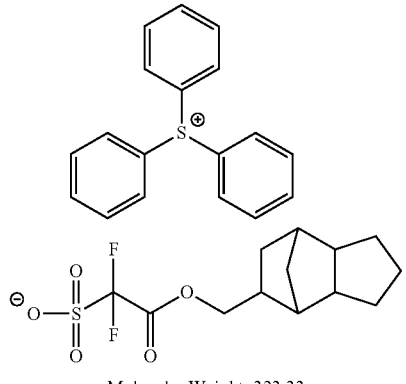
Molecular Weight: 323.33
(Y-51)
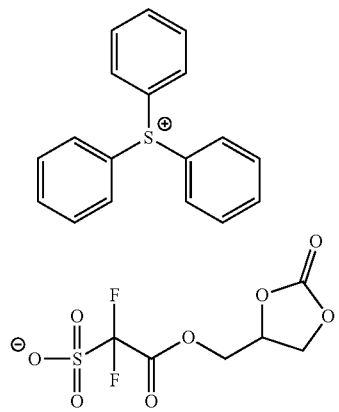
Molecular Weight: 275.16
(Y-52)
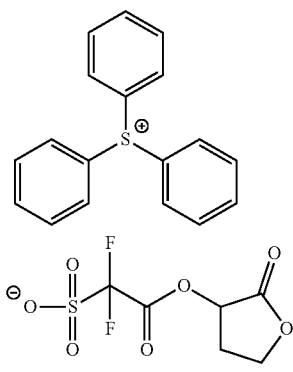
Molecular Weight: 259.16
(Y-53)
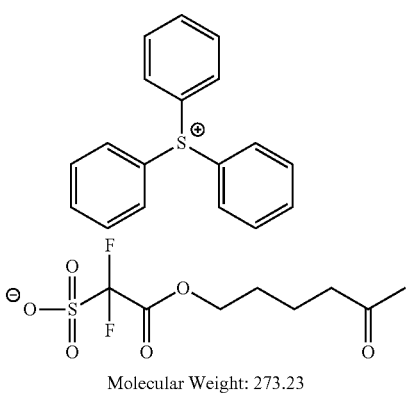
Molecular Weight: 273.23

(Y-54)
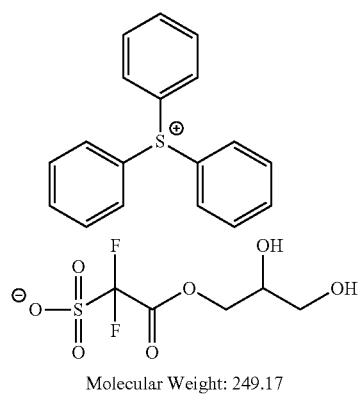
Molecular Weight: 249.17
(Y-55)
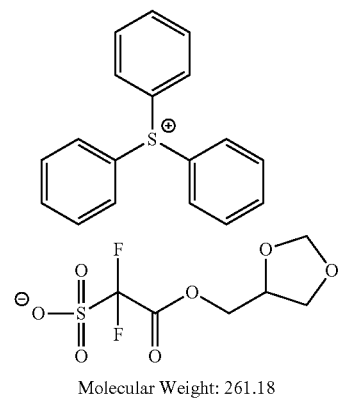
Molecular Weight: 261.18
(Y-56)
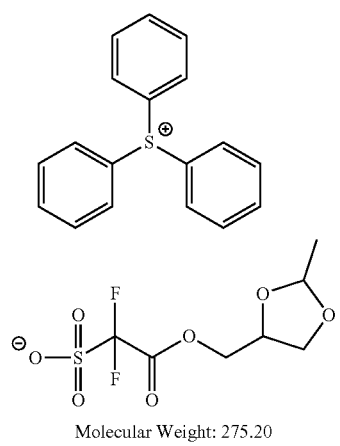
Molecular Weight: 275.20
(Y-57)
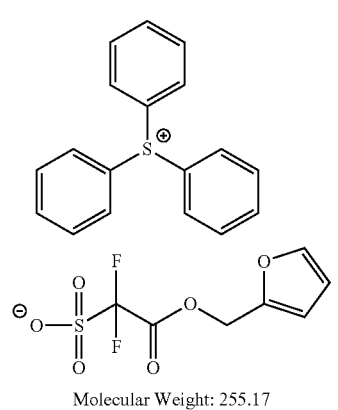
Molecular Weight: 255.17
(Y-58)
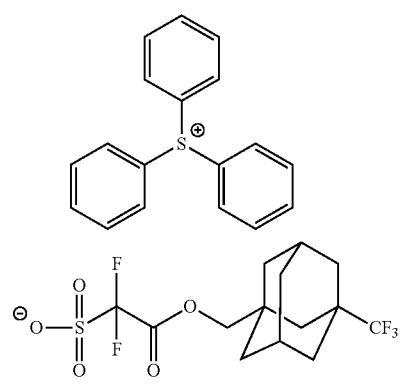
Molecular Weight: 391.33
(Y-59)
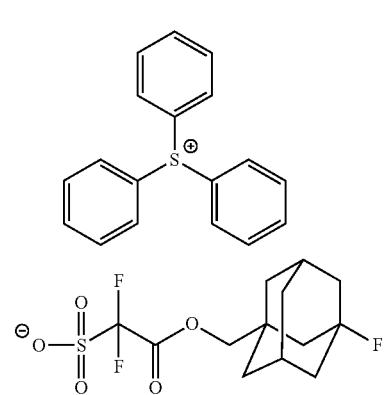
Molecular Weight: 341.32
(Y-60)
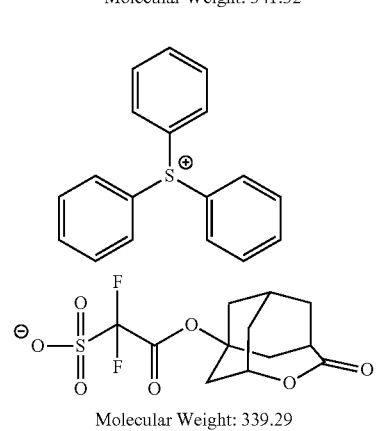
Molecular Weight: 339.29
(Y-61)
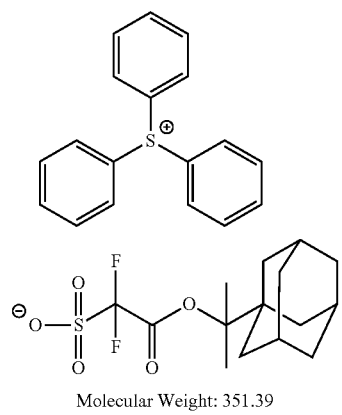
Molecular Weight: 351.39

(Y-62)
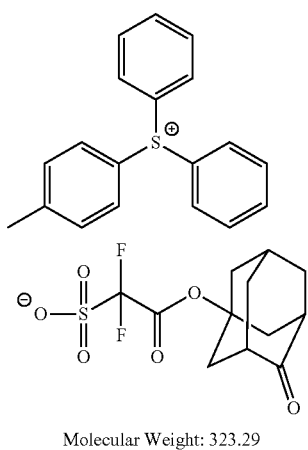
Molecular Weight: 323.29
(Y-63)
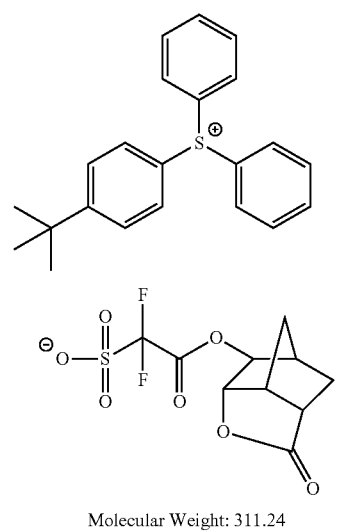
Molecular Weight: 311.24
(Y-64)
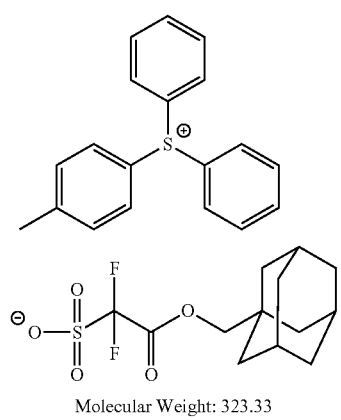
Molecular Weight: 323.33
(Y-65)
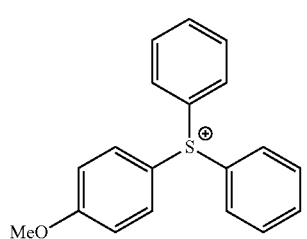
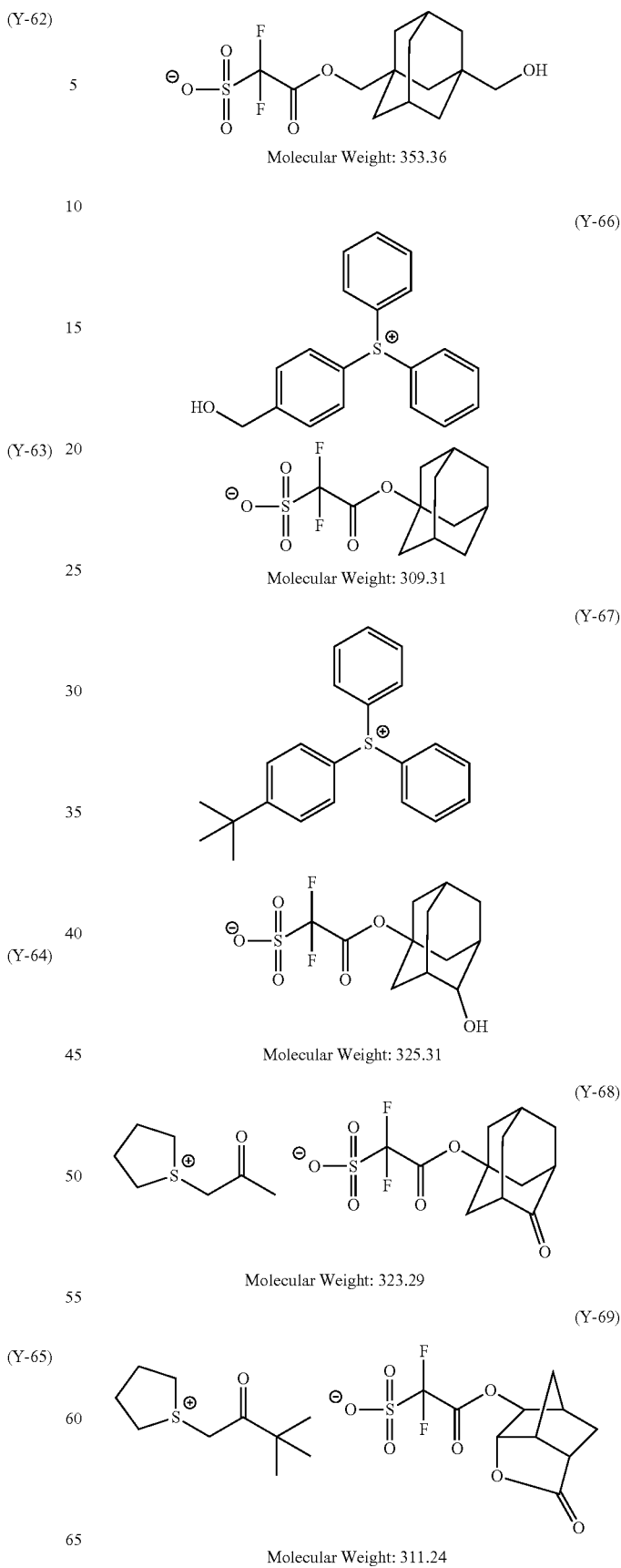

-continued

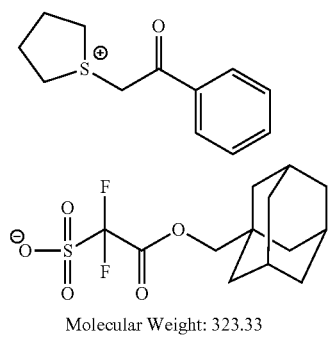
(Y-70)
Molecular Weight: 323.33

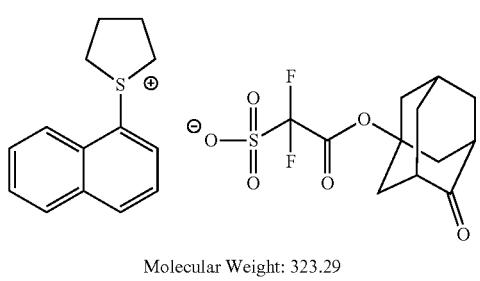
(Y-71)
Molecular Weight: 323.29

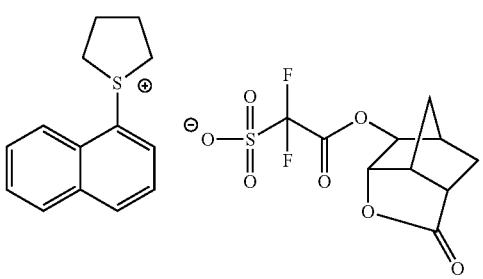
(Y-72)
Molecular Weight: 311.24

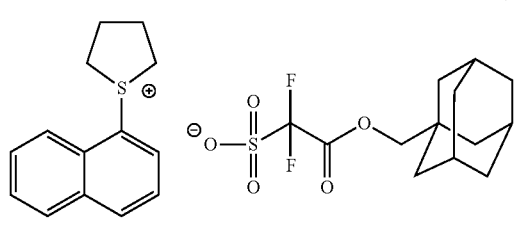
(Y-73)
Molecular Weight: 323.33

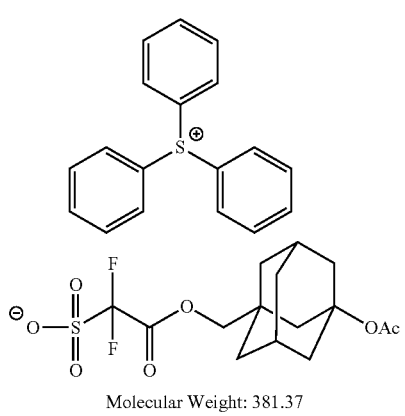
(Y-74)
Molecular Weight: 381.37

-continued

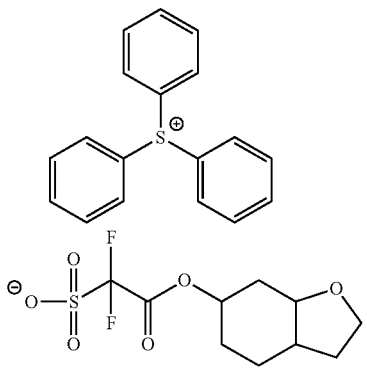
(Y-75)
Molecular Weight: 299.27

The compounds of general formula (I) can be synthesized by heretofore known methods, for example, by the method described in JP-A-2007-161707.

The compounds of general formula (I) may be used individually or in combination.

The content of the compounds that when exposed to actinic rays or radiation, generates an acid, is preferably in the range of 0.1 to 40 mass %, more preferably 1 to 30 mass % and still more preferably 5 to 20 mass % based on the total solids of the composition of the present invention.

[4] Low-Molecular Compound Containing a Group that when Acted on by an Acid, is Cleaved (D)

The composition of the present invention can contain a low-molecular compound containing a group that when acted on by an acid, is cleaved (hereinafter also referred to as a "low-molecular compound (D)" or "compound (D)." The group that when acted on by an acid, is cleaved is not particularly limited. However, an acetal group, a carbonate group, a carbamate group, a tertiary ester group, a tertiary hydroxyl group and a hemiaminal ether group are preferred. A carbamate group and a hemiaminal ether group are most preferred.

The molecular weight of the low-molecular compound (D) containing a group that when acted on by an acid, is cleaved is preferably in the range of 100 to 1000, more preferably 100 to 700 and most preferably 100 to 500.

When the low-molecular compound (D) contains a tertiary ester structure, it is especially preferred for the compound to be any of the carboxylic esters or unsaturated carboxylic esters of general formula (1a) below.

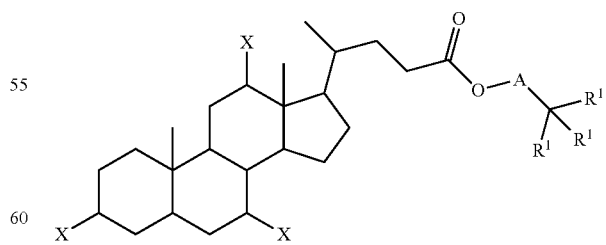
(1a)

In general formula (1a), each of $R^1$s independently represents a monovalent alicyclic hydrocarbon group (preferably having 4 to 20 carbon atoms) or a derivative thereof, or an alkyl group (preferably having 1 to 4 carbon atoms), provided that any two of $R^1$s may be bonded to each other to thereby form, in cooperation with the carbon atom to which the two are bonded, a bivalent alicyclic hydrocarbon group (preferably having 4 to 20 carbon atoms) or a derivative thereof.

Each of X's independently represents a hydrogen atom or a hydroxyl group, provided that at least one thereof is a hydroxyl group.

In general formula (Ia), A represents a single bond or a bivalent connecting group. As the bivalent connecting group, there can be mentioned, for example, a methylene group, a methylenecarbonyl group, a methylenecarbonyloxy group, an ethylene group, an ethylenecarbonyl group, an ethylenecarbonyloxy group, a propylene group, a propylenecarbonyl group, a propylenecarbonyloxy group or the like. A methylenecarbonyloxy group is most preferred.

In general formula (Ia), as the monovalent alicyclic hydrocarbon group (preferably having 4 to 20 carbon atoms) represented by $R^1$ or the bivalent alicyclic hydrocarbon group (preferably having 4 to 20 carbon atoms) formed by the mutual bonding of any two of $R^1$s, there can be mentioned, for example, a group of alicyclic ring derived from norbornane, tricyclodecane, tetracyclododecane, adamantane or a cycloalkane, such as cyclobutane, cyclopentane, cyclohexane, cycloheptane or cyclooctane; a group as obtained by substituting this group of alicyclic ring with at least one or at least one type of alkyl group having 1 to 4 carbon atoms, such as a methyl group, an ethyl group, an n-propyl group, an i-propyl group, an n-butyl group, a 2-methylpropyl group, a 1-methylpropyl group or a t-butyl group, or cycloalkyl group; and the like. Among these alicyclic hydrocarbon groups, for example, groups of alicyclic ring derived from norbornane, tricyclodecane, tetracyclododecane, adamantane, cyclopentane and cyclohexane and groups as obtained by substituting these groups of alicyclic ring with the above alkyl groups are preferred.

Further, as the derivatives of alicyclic hydrocarbon groups, there can be mentioned, for example, those groups in which at least one or at least one type of substituent, such as a hydroxyl group; a carboxyl group; an oxo group (namely, =O group); a hydroxyalkyl group having 1 to 4 carbon atoms, such as a hydroxymethyl group, a 1-hydroxyethyl group, a 2-hydroxyethyl group, a 1-hydroxypropyl group, a 2-hydroxypropyl group, a 3-hydroxypropyl group, a 1-hydroxybutyl group, a 2-hydroxybutyl group, a 3-hydroxybutyl group or a 4-hydroxybutyl group; an alkoxyl group having 1 to 4 carbon atoms, such as a methoxy group, an ethoxy group, an n-propoxy group, an i-propoxy group, an n-butoxy group, a 2-methylpropoxy group, a 1-methylpropoxy group or a t-butoxy group; a cyano group; or a cyanoalkyl group having 2 to 5 carbon atoms, such as a cyanomethyl group, a 2-cyanoethyl group, a 3-cyanopropyl group or a 4-cyanobutyl group, is introduced. Among these substituents, a hydroxyl group, a carboxyl group, a hydroxymethyl group, a cyano group, a cyanomethyl group and the like are preferred.

As the alkyl group represented by $R^1$, there can be mentioned, for example, an alkyl group having 1 to 4 carbon atoms, such as a methyl group, an ethyl group, an n-propyl group, an i-propyl group, an n-butyl group, a 2-methylpropyl group, a 1-methylpropyl group or a t-butyl group. Among these alkyl groups, a methyl group, an ethyl group, an n-propyl group and an i-propyl group are preferred.

As preferred particular examples thereof, there can be mentioned the following compounds.

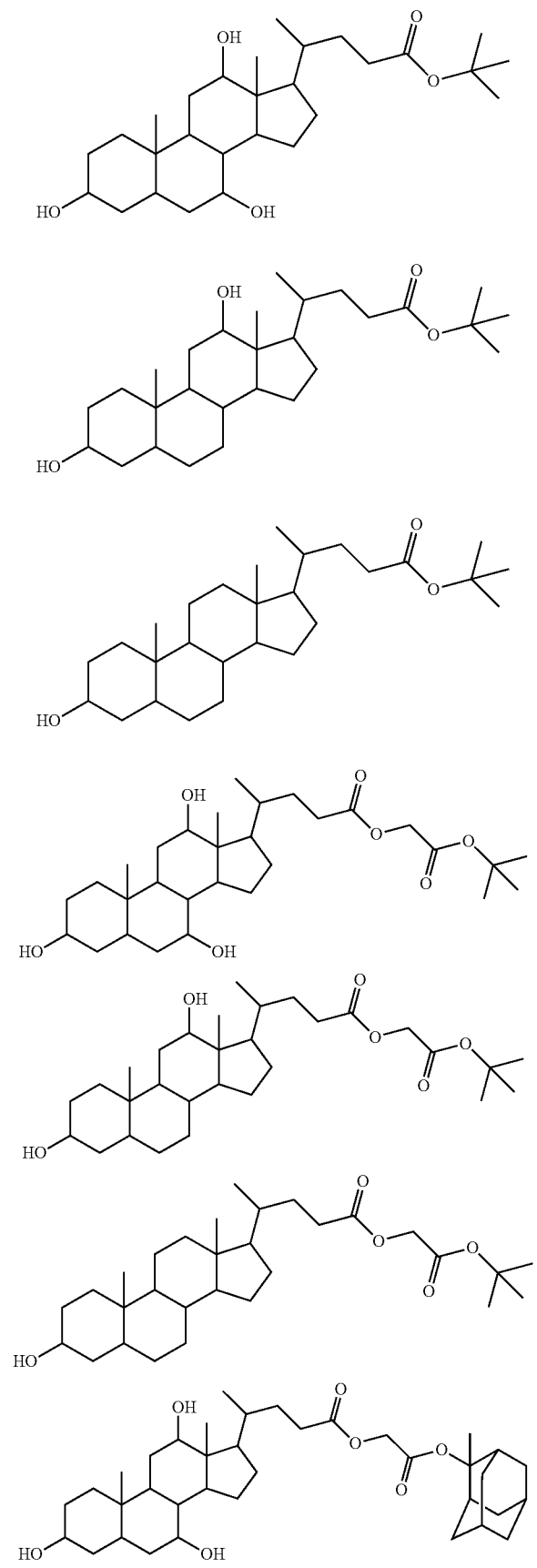

-continued

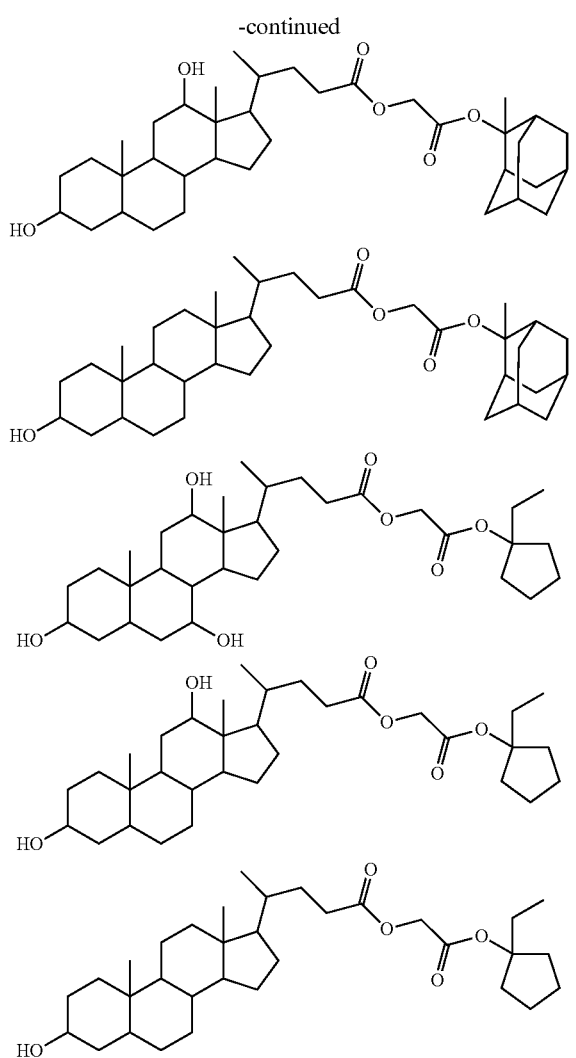

The low-molecular compound (D) to be employed may be one commercially available, or one synthesized by heretofore known methods.

It is preferred for the low-molecular compound (D) to be an amine derivative in which a group that when acted on by an acid, is cleaved is contained on its nitrogen atom.

The low-molecular compound (D) may contain a carbamate group having a protective group on its nitrogen atom. The protective group as a constituent of the carbamate group can be expressed by general formula (d-1) below.

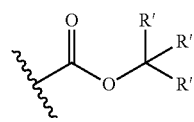

(d-1)

In general formula (d-1), each of R's independently represents a hydrogen atom, a linear or branched alkyl group, a cycloalkyl group, an aryl group, an aralkyl group or an alkoxyalkyl group. R's may be bonded to each other to thereby form a ring.

Preferably, R' is a linear or branched alkyl group, a cycloalkyl group or an aryl group, more preferably a linear or branched alkyl group or a cycloalkyl group.

Particular structures of these groups are shown below.

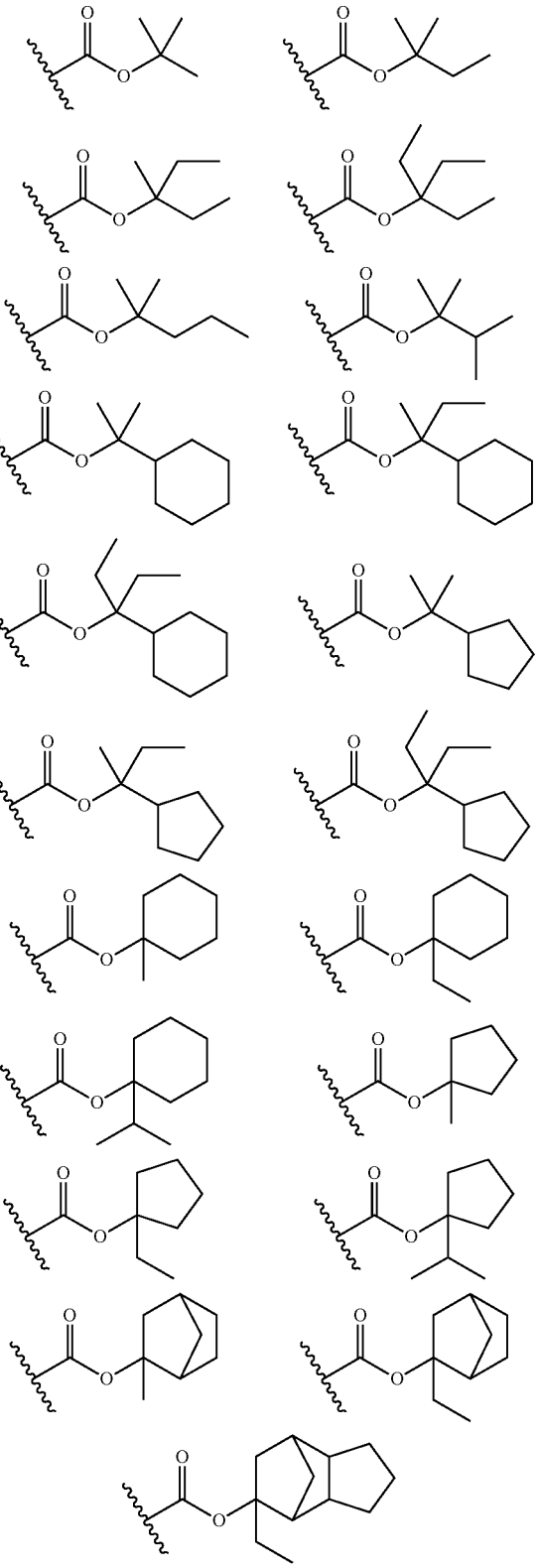

-continued

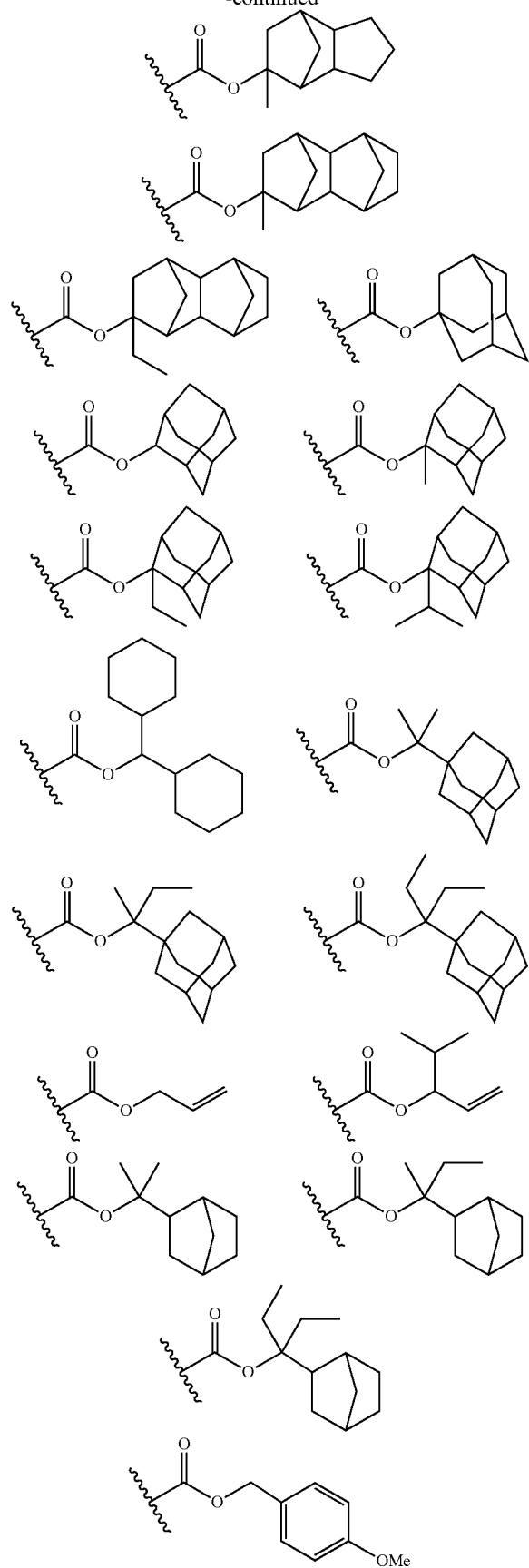

-continued

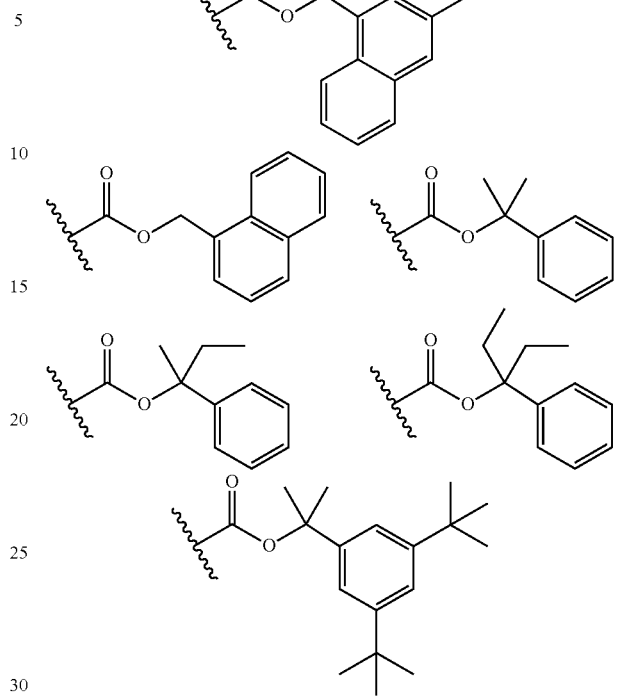

The low-molecular compounds (D) can be formed by an arbitrary combination of basic compounds to be described hereinbelow with the structures of general formula (d-1).

It is especially preferred for the low-molecular compounds (D) to have the structures, of general formula (A) below.

The low-molecular compounds (D) may be compounds corresponding to the above basic compounds as long as they are low-molecular compounds containing a group that when acted on by an acid, is cleaved.

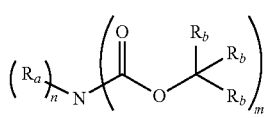

(A)

In general formula (A), Ra represents a hydrogen atom, an alkyl group, a cycloalkyl group, an aryl group or an aralkyl group. When n=2, two Ra's may be identical to or different from each other, and two Ra's may be bonded to each other to thereby form a bivalent heterocyclic hydrocarbon group (preferably up to 20 carbon atoms) or a derivative thereof.

Each of Rb's independently represents a hydrogen atom, an alkyl group, a cycloalkyl group, an aryl group, an aralkyl group or an alkoxyalkyl group, provided that in the formula —C(Rb)(Rb)(Rb), when one or more Rb's are a hydrogen atom, at least one of the remaining Rb's is a cyclopropyl group, a 1-alkoxyalkyl group or an aryl group.

At least two Rb's may be bonded to each other to thereby form an alicyclic hydrocarbon group, an aromatic hydrocarbon group, a heterocyclic hydrocarbon group or a derivative thereof.

In the formula, n is an integer of 0 to 2, and m is an integer of 1 to 3, provided that n+m=3.

In general formula (A), each of the alkyl groups, cycloalkyl groups, aryl groups and aralkyl groups represented by Ra and Rb may be substituted with a functional group, such as a hydroxyl group, a cyano group, an amino group, a pyrrolidino group, a piperidino group, a morpholino group or an oxo group, as well as an alkoxy group or a halogen atom. With respect to the alkoxyalkyl group represented by Rb, the same substitution can be performed.

As the alkyl group, cycloalkyl group, aryl group and aralkyl group represented by Ra and/or Rb (these alkyl group, cycloalkyl group, aryl group and aralkyl group may be substituted with the above functional group, an alkoxy group or a halogen atom), there can be mentioned, for example, a group derived from a linear or branched alkane, such as methane, ethane, propane, butane, pentane, hexane, heptane, octane, nonane, decane, undecane or dodecane; a group as obtained by substituting the above alkane-derived group with at least one or at least one type of cycloalkyl group, such as a cyclobutyl group, a cyclopentyl group or a cyclohexyl group;

a group derived from a cycloalkane, such as cyclobutane, cyclopentane, cyclohexane, cycloheptane, cyclooctane, norbornane, adamantane or noradamantane; a group as obtained by substituting the above cycloalkane-derived group with at least one or at least one type of linear or branched alkyl group, such as a methyl group, an ethyl group, an n-propyl group, an i-propyl group, an n-butyl group, a 2-methylpropyl group, a 1-methylpropyl group or a t-butyl group;

a group derived from an aromatic compound, such as benzene, naphthalene or anthracene; a group as obtained by substituting the above aromatic-compound-derived group with at least one or at least one type of linear or branched alkyl group, such as a methyl group, an ethyl group, an n-propyl group, an i-propyl group, an n-butyl group, a 2-methylpropyl group, a 1-methylpropyl group or a t-butyl group;

a group derived from a heterocyclic compound, such as pyrrolidine, piperidine, morpholine, tetrahydrofuran, tetrahydropyran, indole, indoline, quinoline, perhydroquinoline, indazole or benzimidazole; a group as obtained by substituting the above heterocyclic-compound-derived group with at least one or at least one type of linear or branched alkyl group or aromatic-compound-derived group;

a group as obtained by substituting the above linear or branched-alkane-derived group or cycloalkane-derived group with at least one or at least one type of aromatic-compound-derived group, such as a phenyl group, a naphthyl group or an anthracenyl group; any of groups as obtained by substituting the above substituents with a functional group, such as a hydroxyl group, a cyano group, an amino group, a pyrrolidino group, a piperidino group, a morpholino group or an oxo group; and the like.

As the bivalent heterocyclic hydrocarbon group (preferably 1 to 20 carbon atoms) formed by the mutual bonding of Ra's or derivative thereof, there can be mentioned, for example, a group derived from a heterocyclic compound, such as pyrrolidine, piperidine, morpholine, 1,4,5,6-tetrahydropyrimidine, 1,2,3,4-tetrahydroquinoline, 1,2,3,6-tetrahydropyridine, homopiperazine, 4-azabenzimidazole, benzotriazole, 5-azabenzotriazole, 1H-1,2,3-triazole, 1,4,7-triazacyclononane, tetrazole, 7-azaindole, indazole, benzimidazole, imidazo[1,2-a]pyridine, (1S,4S)-(+)-2,5-diazabicyclo[2.2.1]heptane, 1,5,7-triazabicyclo[4.4.0]dec-5-ene, indole, indoline, 1,2,3,4-tetrahydroquinoxaline, perhydroquinoline or 1,5,9-triazacyclododecane; a group as obtained by substituting the above heterocyclic-compound-derived group with at least one or at least one type of linear or branched-alkane-derived group, cycloalkane-derived group, aromatic-compound-derived group, heterocyclic-compound-derived group or functional group, such as a hydroxyl group, a cyano group, an amino group, a pyrrolidino group, a piperidino group, a morpholino group or an oxo group; or the like.

Particular examples of low-molecular compounds especially preferred in the present invention include N-t-butoxycarbonyldi-n-octylamine, N-t-butoxycarbonyldi-n-nonylamine, N-t-butoxycarbonyldi-n-decylamine, N-t-butoxycarbonyldicyclohexylamine, N-t-butoxycarbonyl-1-adamantylamine, N-t-butoxycarbonyl-2-adamantylamine, N-t-butoxycarbonyl-N-methyl-1-adamantylamine, (S)-(−)-1-(t-butoxycarbonyl)-2-pyrrolidinemethanol, (R)-(+)-1-(t-butoxycarbonyl)-2-pyrrolidinemethanol, N-t-butoxycarbonyl-4-hydroxypiperidine, N-t-butoxycarbonylpyrrolidine, N-t-butoxycarbonylmorpholine, N-t-butoxycarbonylpiperazine, N,N-di-t-butoxycarbonyl-1-adamantylamine, N,N-di-t-butoxycarbonyl-N-methyl-1-adamantylamine, N-t-butoxycarbonyl-4,4'-diaminodiphenylmethane, N,N'-di-t-butoxycarbonylhexamethylenediamine, N,N,N',N'-tetra-t-butoxycarbonylhexamethylenediamine, N,N'-di-t-butoxycarbonyl-1,7-diaminoheptane, N,N'-di-t-butoxycarbonyl-1,8-diaminooctane, N,N'-di-t-butoxycarbonyl-1,9-diaminononane, N,N'-di-t-butoxycarbonyl-1,10-diaminodecane, N,N'-di-t-butoxycarbonyl-1,12-diaminododecane, N,N'-di-t-butoxycarbonyl-4,4'-diaminodiphenylmethane, N-t-butoxycarbonylbenzimidazole, N-t-butoxycarbonyl-2-methylbenzimidazole, N-t-butoxycarbonyl-2-phenylbenzimidazole, and the like.

Specific examples of the low-molecular compounds (D) most preferred in the present invention will be shown below, which should be construed as not limiting the present invention.

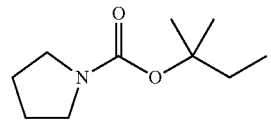

(D-1)

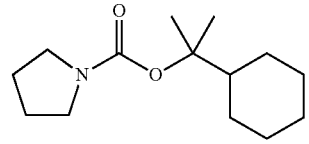

(D-2)

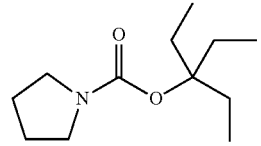

(D-3)

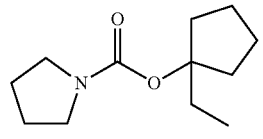

(D-4)

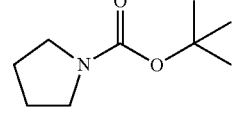

(D-5)

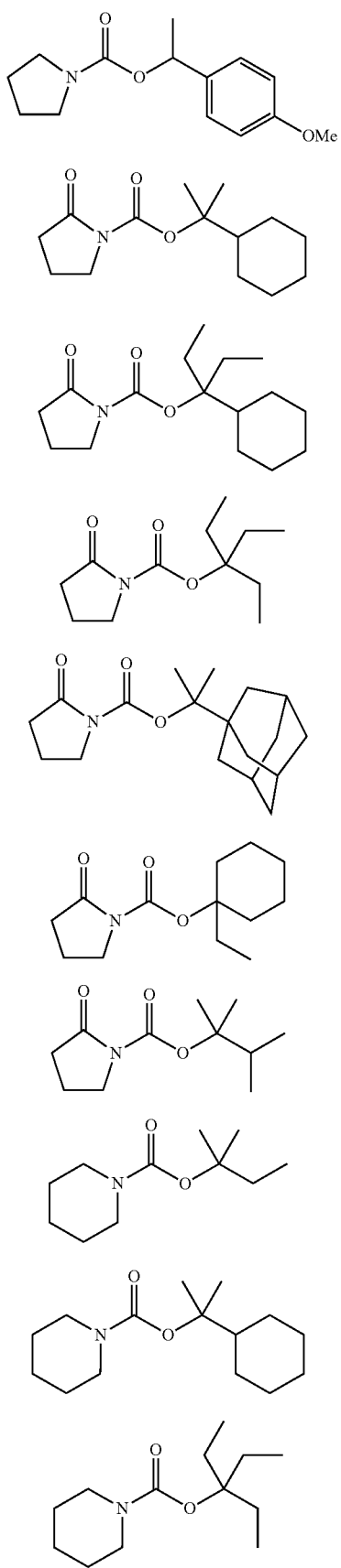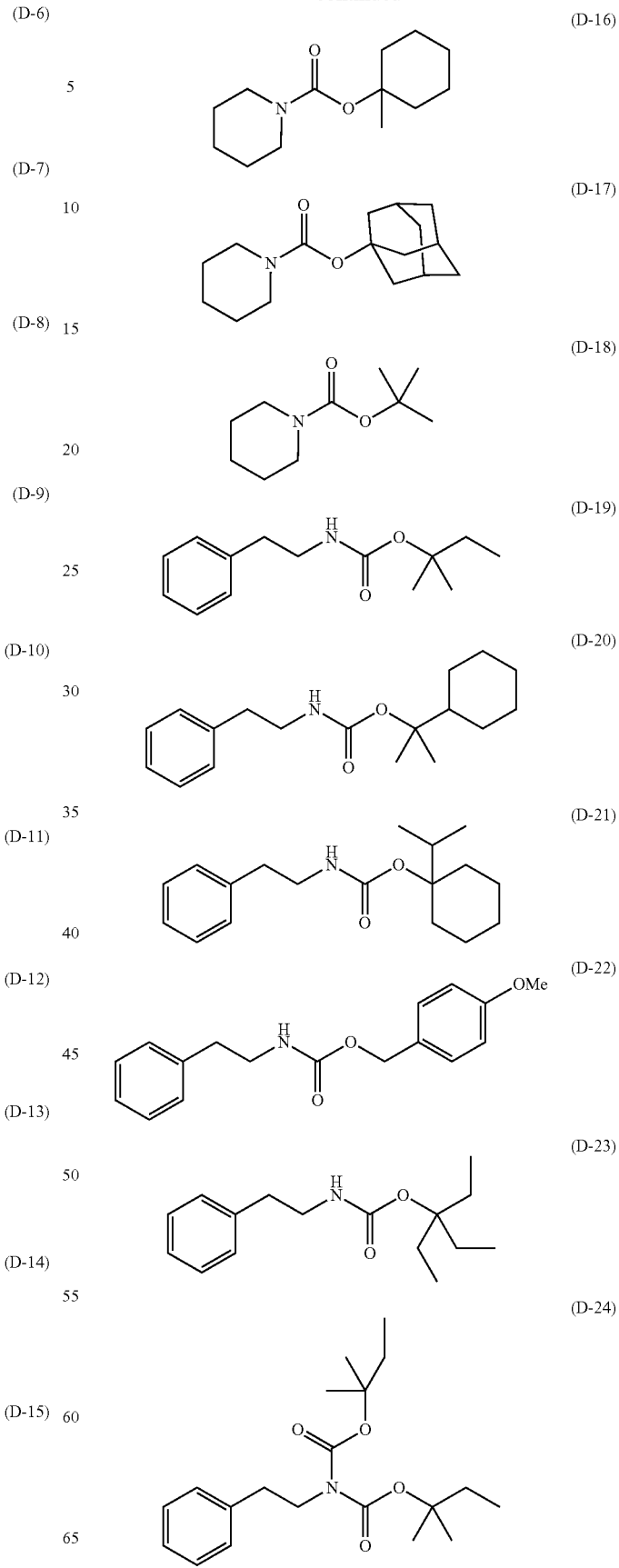

(D-25)
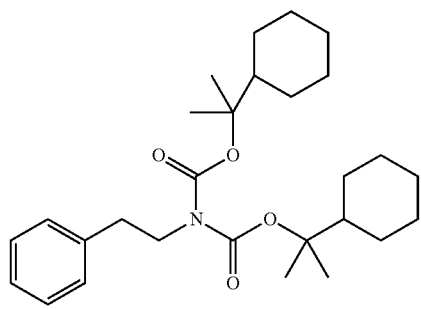
(D-26)
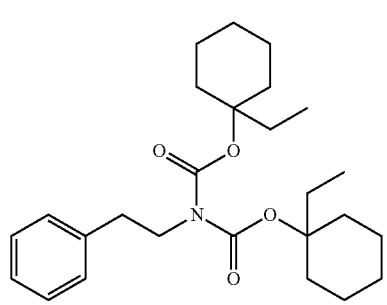
(D-27)
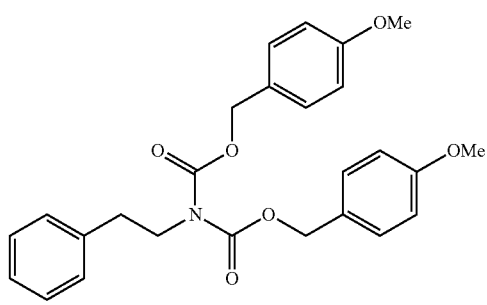
(D-28)
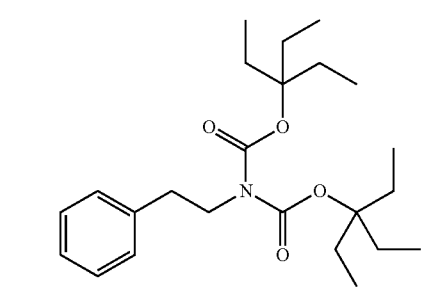
(D-29)
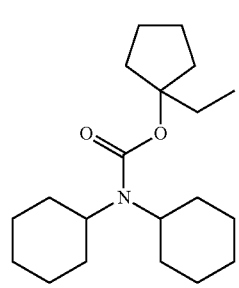
(D-30)
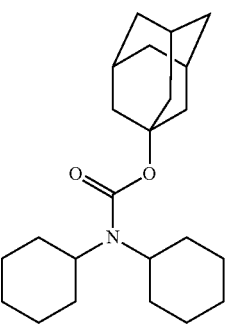
(D-31)
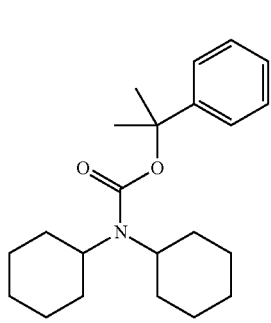
(D-32)
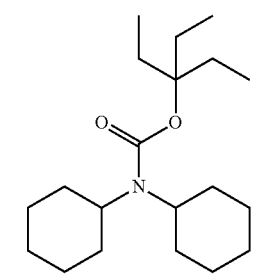
(D-33)
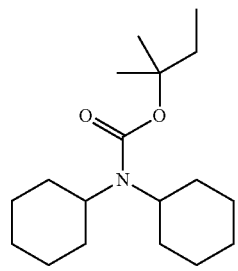
(D-34)
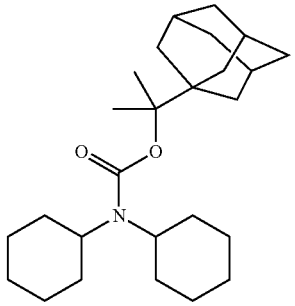

(D-35) 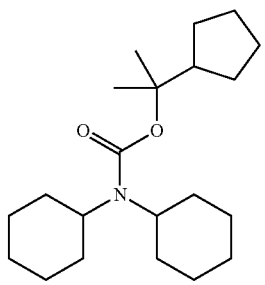
(D-36) 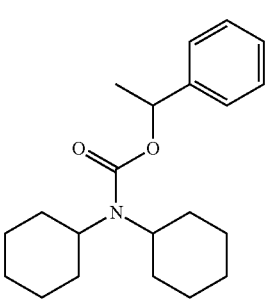
(D-37) 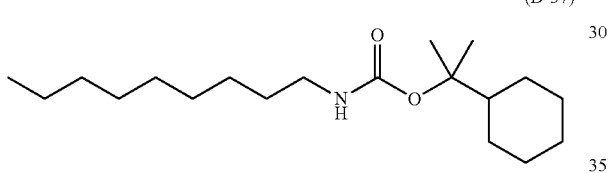
(D-38) 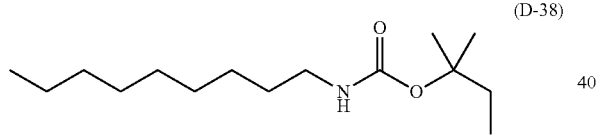
(D-39) 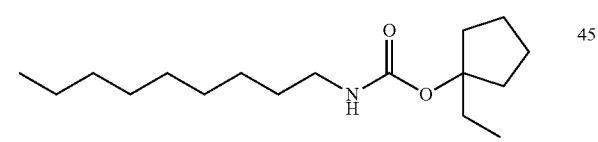
(D-40) 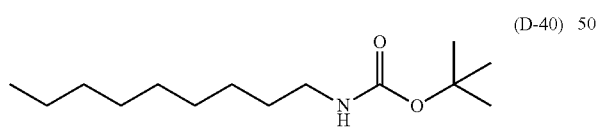
(D-41) 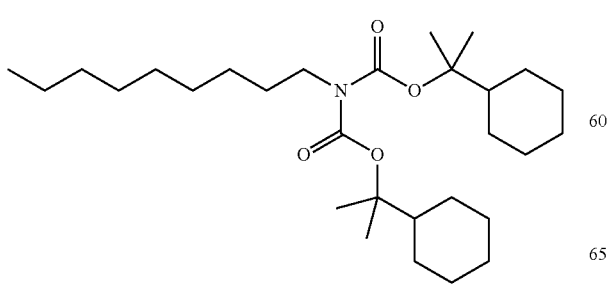
(D-42) 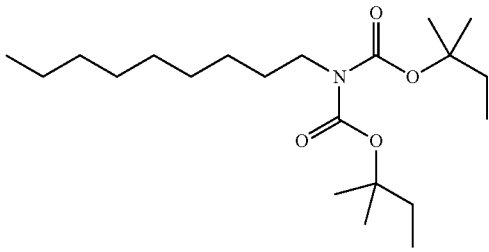
(D-43) 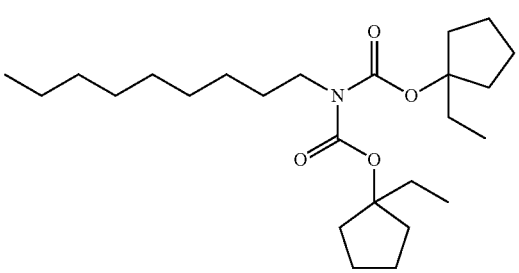
(D-44) 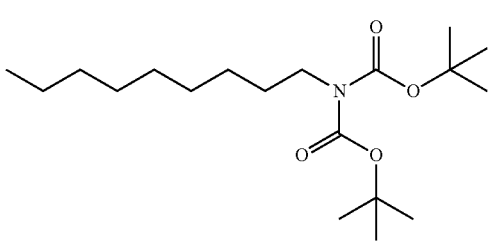
(D-45) 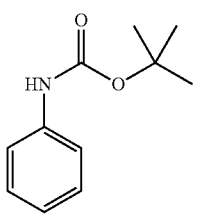
(D-46) 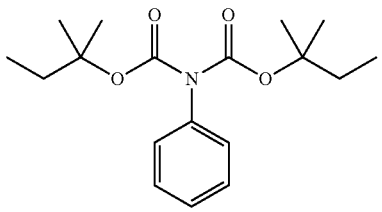
(D-47) 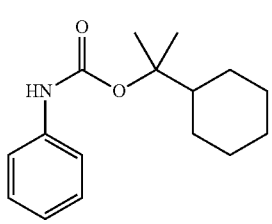

-continued

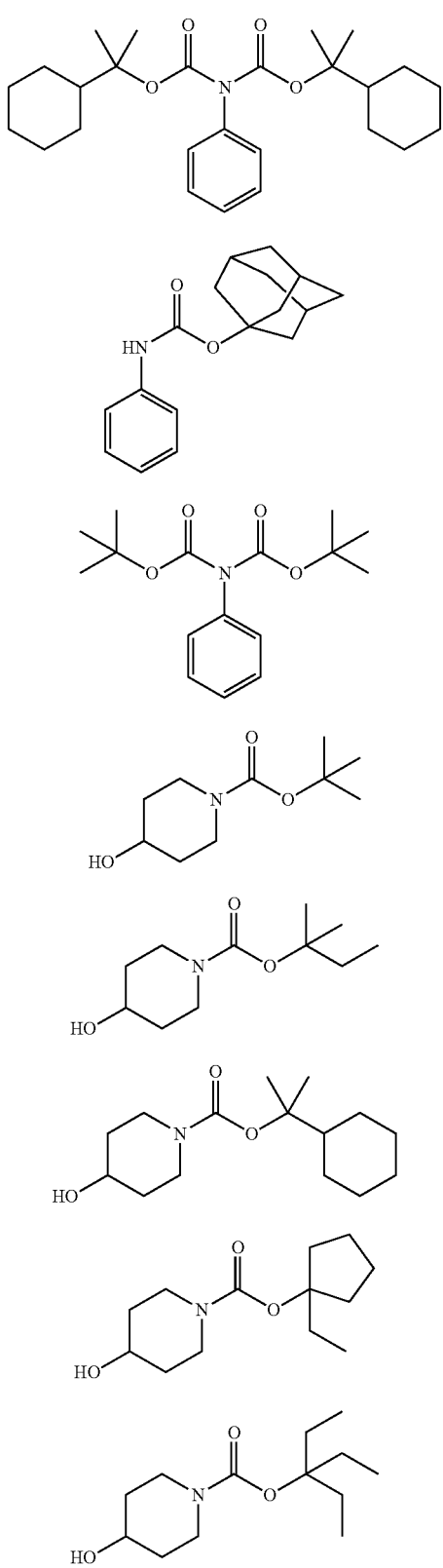

(D-48)

(D-49)

(D-50)

(D-51)

(D-52)

(D-53)

(D-54)

(D-55)

The compounds of general formula (A) can be easily synthesized from commercially available amines by the methods described in, for example, Protective Groups in Organic Synthesis, the fourth edition. The most general method comprises causing a bicarbonic ester or a haloformic ester to act on commercially available amines. In the formulae, X represents a halogen atom.

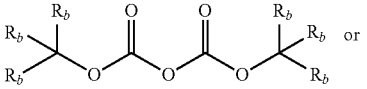

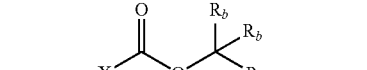

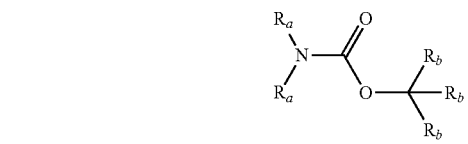

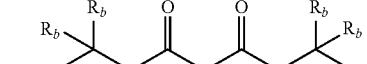

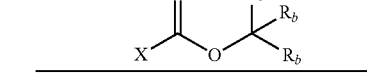

In the present invention, one type of low-molecular compound (D) containing a group that when acted on by an acid, is cleaved can be used alone, or two or more types thereof can be used in combination.

In the present invention, the amount of low-molecular compound (D) containing a group that when acted on by an acid, is cleaved to be added, based on the total solids of the composition mixed with the following basic compound, is generally in the range of 0.001 to 20 mass %, preferably 0.001 to 10 mass % and more preferably 0.01 to 5 mass %.

With respect to the ratio between acid generator and low-molecular compound (D) to be used in the composition, the molar ratio of acid generator/[low-molecular compound (D)+ following basic compound] is preferably in the range of 2.5 to 300. Illustratively, it is preferred for the molar ratio to be 2.5 or higher from the viewpoint of sensitivity and resolution. It is preferred for the molar ratio to be 300 or below from the viewpoint of inhibition of resolution deterioration attributed to resist pattern thickening over time from exposure to bake treatment. The molar ratio of acid generator/[low-molecular compound (D)+following basic compound] is more preferably in the range of 5.0 to 200, further more preferably 7.0 to 150.

<Basic Compound>

The composition of the present invention preferably contains a basic compound so as to suppress any performance alteration over time from exposure to bake.

As preferred basic compounds, there can be mentioned the compounds having the structures of formulae (A) to (E) below.

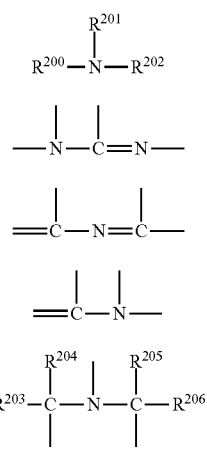

In the general formulae (A) and (E), $R^{200}$, $R^{201}$ and $R^{202}$ may be identical to or different from each other and each represent a hydrogen atom, an alkyl group (preferably having 1 to 20 carbon atoms), a cycloalkyl group (preferably having 3 to 20 carbon atoms) or an aryl group (having 6 to 20 carbon atoms). $R^{201}$ and $R^{202}$ may be bonded with each other to thereby form a ring. $R^{203}$, $R^{204}$, $R^{205}$ and $R^{206}$ may be identical to or different from each other and each represent an alkyl group having 1 to 20 carbon atoms.

With respect to the above alkyl group, as a preferred substituted alkyl group, there can be mentioned an aminoalkyl group having 1 to 20 carbon atoms, a hydroxyalkyl group having 1 to 20 carbon atoms or a cyanoalkyl group having 1 to 20 carbon atoms.

More preferably, in these general formulae (A) and (E) the alkyl group is unsubstituted.

As preferred compounds, there can be mentioned guanidine, aminopyrrolidine, pyrazole, pyrazoline, piperazine, aminomorpholine, aminoalkylmorpholine, piperidine and the like. Further, as preferred compounds, there can be mentioned compounds with an imidazole structure, a diazabicyclo structure, an onium hydroxide structure, an onium carboxylate structure, a trialkylamine structure, an aniline structure or a pyridine structure, alkylamine derivatives having a hydroxyl group and/or an ether bond, aniline derivatives having a hydroxyl group and/or an ether bond and the like.

As the compounds with an imidazole structure, there can be mentioned imidazole, 2,4,5-triphenylimidazole, benzimidazole, 2-phenylbenzoimidazole and the like. As the compounds with a diazabicyclo structure, there can be mentioned 1,4-diazabicyclo[2,2,2]octane, 1,5-diazabicyclo[4,3,0]non-5-ene, 1,8-diazabicyclo[5,4,0]undec-7-ene and the like. As the compounds with an onium hydroxide structure, there can be mentioned tetrabutylammonium hydroxide, triarylsulfonium hydroxide, phenacylsulfonium hydroxide, and sulfonium hydroxides having a 2-oxoalkyl group such as triphenylsulfonium hydroxide, tris(t-butylphenyl)sulfonium hydroxide, bis(t-butylphenyl)iodonium hydroxide, phenacylthiophenium hydroxide, 2-oxopropylthiophenium hydroxide and the like. As the compounds with an onium carboxylate structure, there can be mentioned those having a carboxylate at the anion moiety of the compounds with an onium hydroxide structure, for example, acetate, adamantane-1-carboxylate, perfluoroalkyl carboxylate and the like. As the compounds with a trialkylamine structure, there can be mentioned tri(n-butyl)amine, tri(n-octyl)amine and the like. As the aniline compounds, there can be mentioned 2,6-diisopropylaniline, N,N-dimethylaniline, N,N-dibutylaniline, N,N-dihexylaniline and the like. As the alkylamine derivatives having a hydroxyl group and/or an ether bond, there can be mentioned ethanolamine, diethanolamine, triethanolamine, N-phenyldiethanolamine, tris(methoxyethoxyethyl) amine and the like. As the aniline derivatives having a hydroxyl group and/or an ether bond, there can be mentioned N,N-bis(hydroxyethyl)aniline and the like.

As preferred basic compounds, there can be further mentioned an amine compound having a phenoxy group, an ammonium salt compound having a phenoxy group, an amine compound having a sulfonic ester group and an ammonium salt compound having a sulfonic ester group.

Each of the above amine compound having a phenoxy group, ammonium salt compound having a phenoxy group, amine compound having a sulfonic ester group and ammonium salt compound having a sulfonic ester group preferably has at least one alkyl group bonded to the nitrogen atom thereof. Further preferably, the alkyl group in its chain contains an oxygen atom, thereby forming an oxyalkylene group. The number of oxyalkylene groups in each molecule is one or more, preferably 3 to 9 and more preferably 4 to 6. Oxyalkylene groups having the structure of —$CH_2CH_2O$—, —$CH(CH_3)CH_2O$— or —$CH_2CH_2CH_2O$— are preferred.

As specific examples of the above amine compound having a phenoxy group, ammonium salt compound having a phenoxy group, amine compound having a sulfonic ester group and ammonium salt compound having a sulfonic ester group, there can be mentioned the compounds (C1-1) to (C3-3) shown as examples in Section [0066] of US 2007/0224539 A, which are however nonlimiting.

These basic compounds can be used alone or in combination.

The amount of basic compound used is generally in the range of 0.001 to 10 mass %, preferably 0.01 to 5 mass % based on the solid contents of the composition of the invention.

With respect to the ratio of the acid generator to basic compound in the composition, preferably, the acid generator/basic compound (molar ratio)=2.5 to 300. The reason for this is that the molar ratio is preferred to be 2.5 or higher from the viewpoint of sensitivity and resolving power. The molar ratio is preferred to be 300 or below from the viewpoint of the inhibition of any resolving power deterioration due to thickening of resist pattern over time from exposure to heating treatment. The acid generator/basic compound (molar ratio) is more preferably in the range of 5.0 to 200, still more preferably 7 to 150.

<Solvent>

The photosensitive composition of the present invention may contain a solvent. The solvent is not limited as long as it can be used in the preparation of a positive resist composition through dissolution of the above-mentioned components. As the solvent, there can be mentioned, for example, an organic solvent, such as an alkylene glycol monoalkyl ether carboxylate, an alkylene glycol monoalkyl ether, an alkyl lactate, an alkyl alkoxypropionate, a cyclolactone (preferably having 4 to 10 carbon atoms), an optionally cyclized monoketone compound (preferably having 4 to 10 carbon atoms), an alkylene carbonate, an alkyl alkoxyacetate or an alkyl pyruvate.

As preferred alkylene glycol monoalkyl ether carboxylates, there can be mentioned, for example, propylene glycol monomethyl ether acetate, propylene glycol monoethyl ether acetate, propylene glycol monopropyl ether acetate, propylene glycol monobutyl ether acetate, propylene glycol monomethyl ether propionate, propylene glycol monoethyl ether propionate, ethylene glycol monomethyl ether acetate and ethylene glycol monoethyl ether acetate.

As preferred alkylene glycol monoalkyl ethers, there can be mentioned, for example, propylene glycol monomethyl ether, propylene glycol monoethyl ether, propylene glycol monopropyl ether, propylene glycol monobutyl ether, ethylene glycol monomethyl ether and ethylene glycol monoethyl ether.

As preferred alkyl lactates, there can be mentioned, for example, methyl lactate, ethyl lactate, propyl lactate and butyl lactate.

As preferred alkyl alkoxypropionates, there can be mentioned, for example, ethyl 3-ethoxypropionate, methyl 3-methoxypropionate, methyl 3-ethoxypropionate and ethyl 3-methoxypropionate.

As preferred cyclolactones, there can be mentioned, for example, β-propiolactone, β-butyrolactone, γ-butyrolactone, α-methyl-γ-butyrolactone, β-methyl-γ-butyrolactone, γ-valerolactone, γ-caprolactone, γ-octanoic lactone and α-hydroxy-γ-butyrolactone.

As preferred optionally cyclized monoketone compounds, there can be mentioned, for example, 2-butanone, 3-methylbutanone, pinacolone, 2-pentanone, 3-pentanone, 3-methyl-2-pentanone, 4-methyl-2-pentanone, 2-methyl-3-pentanone, 4,4-dimethyl-2-pentanone, 2,4-dimethyl-3-pentanone, 2,2,4,4-tetramethyl-3-pentanone, 2-hexanone, 3-hexanone, 5-methyl-3-hexanone, 2-heptanone, 3-heptanone, 4-heptanone, 2-methyl-3-heptanone, 5-methyl-3-heptanone, 2,6-dimethyl-4-heptanone, 2-octanone, 3-octanone, 2-nonanone, 3-nonanone, 5-nonanone, 2-decanone, 3-decanone, 4-decanone, 5-hexen-2-one, 3-penten-2-one, cyclopentanone, 2-methylcyclopentanone, 3-methylcyclopentanone, 2,2-dimethylcyclopentanone, 2,4,4-trimethylcyclopentanone, cyclohexanone, 3-methylcyclohexanone, 4-methylcyclohexanone, 4-ethylcyclohexanone, 2,2-dimethylcyclohexanone, 2,6-dimethylcyclohexanone, 2,2,6-trimethylcyclohexanone, cycloheptanone, 2-methylcycloheptanone and 3-methylcycloheptanone.

As preferred alkylene carbonates, there can be mentioned, for example, propylene carbonate, vinylene carbonate, ethylene carbonate and butylene carbonate.

As preferred alkyl alkoxyacetates, there can be mentioned, for example, acetic acid 2-methoxyethyl ester, acetic acid 2-ethoxyethyl ester, acetic acid 2-(2-ethoxyethoxy)ethyl ester, acetic acid 3-methoxy-3-methylbutyl ester and acetic acid 1-methoxy-2-propyl ester.

As preferred alkyl pyruvates, there can be mentioned, for example, methyl pyruvate, ethyl pyruvate and propyl pyruvate.

As a preferably employable solvent, there can be mentioned a solvent having a boiling point of 130° C. or above measured at ordinary temperature under ordinary pressure. For example, there can be mentioned cyclopentanone, γ-butyrolactone, cyclohexanone, ethyl lactate, ethylene glycol monoethyl ether acetate, propylene glycol monomethyl ether acetate, ethyl 3-ethoxypropionate, ethyl pyruvate, acetic acid 2-ethoxyethyl ester, acetic acid 2-(2-ethoxyethoxy)ethyl ester or propylene carbonate.

In the present invention, these solvents may be used either individually or in combination.

In the present invention, a mixed solvent consisting of a mixture of a solvent having a hydroxyl group in its structure and a solvent having no hydroxyl group may be used as an organic solvent.

The solvent having a hydroxyl group and solvent having no hydroxyl group can appropriately be selected from among the compounds set forth above as examples. The solvent having a hydroxyl group is preferably an alkylene group monoalkyl ether, an alkyl lactate or the like, more preferably propylene glycol monomethyl ether or ethyl lactate. The solvent having no hydroxyl group is preferably an alkylene glycol monoalkyl ether acetate, an alkyl alkoxypropionate, an optionally cyclized monoketone compound, a cyclolactone, an alkyl acetate or the like. Of these, propylene glycol monomethyl ether acetate, ethyl ethoxypropionate, 2-heptanone, γ-butyrolactone, cyclohexanone and butyl acetate are especially preferred. Propylene glycol monomethyl ether acetate, ethyl ethoxypropionate and 2-heptanone are most preferred.

The mixing ratio (mass) of a solvent having a hydroxyl group and a solvent having no hydroxyl group is in the range of 1/99 to 99/1, preferably 10/90 to 90/10 and more preferably 20/80 to 60/40. Mixed solvents containing 50 mass % or more of a solvent having no hydroxyl group are especially preferred from the viewpoint of uniform applicability.

It is preferred for the solvent to be a mixed solvent of two or more types of solvents containing propylene glycol monomethyl ether acetate.

<Surfactant>

The composition of the present invention preferably further contains a surfactant, and more preferably contains any one, or two or more members, of fluorinated and/or siliconized surfactants (fluorinated surfactant, siliconized surfactant and surfactant containing both fluorine and silicon atoms).

The composition of the present invention when containing the above surfactant would, in the use of an exposure light source of 250 nm or below, especially 220 nm or below, realize favorable sensitivity and resolving power and produce a resist pattern with less adhesion and development defects.

As the fluorinated and/or siliconized surfactants, there can be mentioned, for example, those described in Section [0276] of US Patent Application Publication No. 2008/0248425. As commercially available surfactants, there can be mentioned, for example, fluorinated surfactants/siliconized surfactants, such as Eftop EF301 and EF303 (produced by Shin-Akita Kasei Co., Ltd.), Florad FC 430, 431 and 4430 (produced by Sumitomo 3M Ltd.), Megafac F171, F173, F176, F189, F113, F110, F177, F120 and R08 (produced by Dainippon Ink & Chemicals, Inc.), Surflon S-382, SC101, 102, 103, 104, 105 and 106 (produced by Asahi Glass Co., Ltd.), Troy Sol S-366 (produced by Troy Chemical Co., Ltd.), GF-300 and GF-150 (produced by TOAGOSEI CO., LTD.), Sarfron S-393 (produced by SEIMI CHEMICAL CO., LTD.), Eftop EF121, EF122A, EF122B, RF122C, EF125M, EF135M, EF351, EF352, EF801, EF802 and EF601 (produced by JEMCO INC.), PF636, PF656, PF6320 and PF6520 (produced by OMNOVA), and FTX-204G, 208G, 218G, 230G, 204D, 208D, 212D, 218D and 222D (produced by NEOS). Further, polysiloxane polymer KP-341 (produced by Shin-Etsu Chemical Co., Ltd.) can be employed as the siliconized surfactant.

As the surfactant, besides the above publicly known surfactants, use can be made of a surfactant based on a polymer having a fluorinated aliphatic group derived from a fluorinated aliphatic compound, produced by a telomerization technique (also called a telomer process) or an oligomerization technique (also called an oligomer process). The fluorinated aliphatic compound can be synthesized by the process described in JP-A-2002-90991.

The polymer having a fluorinated aliphatic group is preferably a copolymer from a monomer having a fluorinated aliphatic group and a poly(oxyalkylene) acrylate and/or poly(oxyalkylene) methacrylate, which copolymer may have an irregular distribution or may result from block copolymerization. As the poly(oxyalkylene) group, there can be mentioned a poly(oxyethylene) group, a poly(oxypropylene) group, a poly(oxybutylene) group or the like. Further, use can be made of a unit having alkylene groups of different chain lengths in a single chain, such as poly(oxyethylene-oxypropylene-oxyethylene block concatenation) or poly(oxyethylene-oxypropylene block concatenation). Moreover, the copolymer from a monomer having a fluorinated aliphatic group and a poly(oxyalkylene) acrylate (or methacrylate) is not limited to two-monomer copolymers and may be a three or more monomer copolymer obtained by simultaneous copolymerization of two or more different monomers having a fluorinated aliphatic group, two or more different poly(oxyalkylene) acrylates (or methacrylates), etc.

For example, as a commercially available surfactant, there can be mentioned Megafac F178, F-470, F-473, F-475, F-476 or F-472 (produced by Dainippon Ink & Chemicals, Inc.). Further, there can be mentioned a copolymer from an acrylate (or methacrylate) having a $C_6F_{13}$ group and a poly(oxyalkylene) acrylate (or methacrylate), a copolymer from an acrylate (or methacrylate) having a $C_3F_7$ group, poly(oxyethylene) acrylate (or methacrylate) and poly(oxypropylene) acrylate (or methacrylate), or the like.

Also, in the present invention, use can be made of the surfactants other than fluorinated and/or siliconized surfactants described in Section [0280] of US Patent Application Publication No. 2008/0248425.

These surfactants may be used either individually or in combination.

The amount of each surfactant used is preferably in the range of 0 to 2 mass %, more preferably 0.0001 to 2 mass % and still more preferably 0.0005 to 1 mass % based on the total mass of the composition of the present invention (excluding the solvent).

<Carboxylic Acid Onium Salt>

The composition of the present invention may contain a carboxylic acid onium salt. The preferred carboxylic acid onium salts are the iodonium salt and the sulfonium salt. The preferred anion moiety thereof is a linear, branched, monocyclic or polycyclic alkylcarboxylate anion having 1 to 30 carbon atoms. A more preferred anion moiety is an anion of carboxylic acid wherein the alkyl group is partially or wholly fluorinated. The alkyl chain may contain an oxygen atom. Accordingly, there would be achieved securement of the transparency in 220 nm or shorter light, enhancement of the sensitivity and resolving power and improvement of the isodense bias and exposure margin.

As the fluorinated carboxylic acid anion, there can be mentioned any of the anions of fluoroacetic acid, difluoroacetic acid, trifluoroacetic acid, pentafluoropropionic acid, heptafluorobutyric acid, nonafluoropentanoic acid, perfluorododecanoic acid, perfluorotridecanoic acid, perfluorocyclohexanecarboxylic acid and 2,2-bistrifluoromethylpropionic acid, or the like.

The content ratio of each carboxylic acid onium salt in the composition is generally in the range of 0.1 to 20 mass %, preferably 0.5 to 10 mass % and still more preferably 1 to 7 mass % based on the total solids of the composition.

<Dissolution Inhibiting Compound>

The composition of the present invention may contain a dissolution inhibiting compound of 3000 or less molecular weight that is decomposed by the action of an acid to thereby increase the solubility in an alkali developer (hereinafter referred to as "dissolution inhibiting compound").

From the viewpoint of preventing any lowering of 220 nm or shorter transmission, the dissolution inhibiting compound is preferably an alicyclic or aliphatic compound having an acid-decomposable group, such as any of cholic acid derivatives having an acid-decomposable group described in Proceeding of SPIE, 2724, 355 (1996). The acid-decomposable group and alicyclic structure are the same as described with respect to the resin (A).

When the composition of the present invention is exposed to a KrF excimer laser or irradiated with electron beams, preferred use is made of one having a structure resulting from substitution of the phenolic hydroxyl group of a phenol compound with an acid-decomposable group. The phenol compound preferably contains 1 to 9 phenol skeletons, more preferably 2 to 6 phenol skeletons.

The amount of dissolution inhibiting compound added is preferably in the range of 3 to 50 mass %, more preferably 5 to 40 mass % based on the total solids of the composition of the present invention.

Specific examples of the dissolution inhibiting compounds will be shown below, which however in no way limit the scope of the present invention.

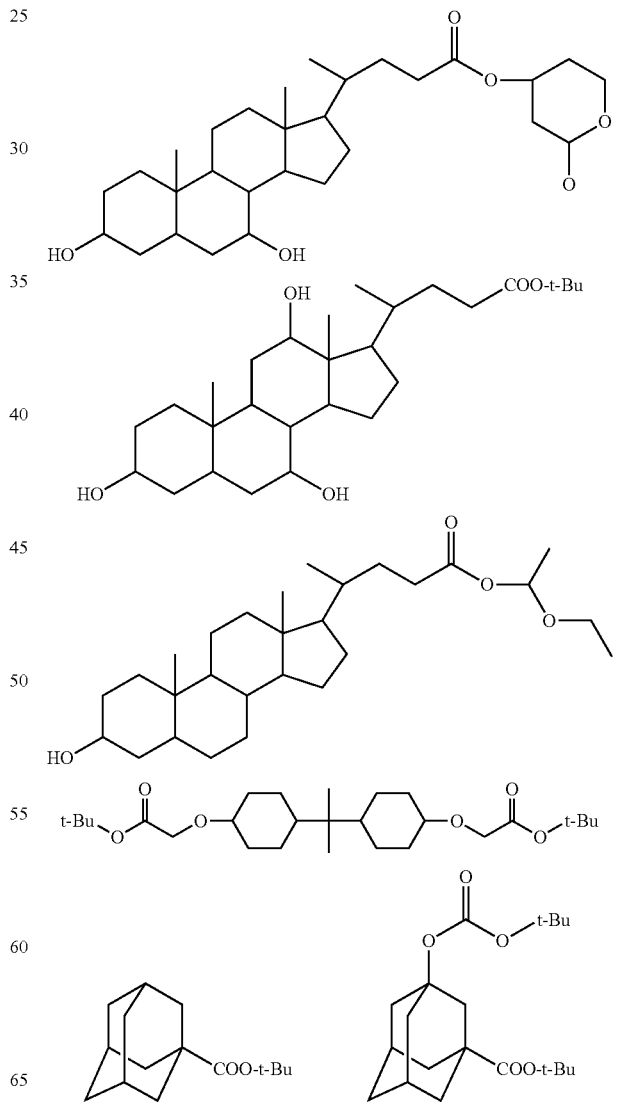

-continued

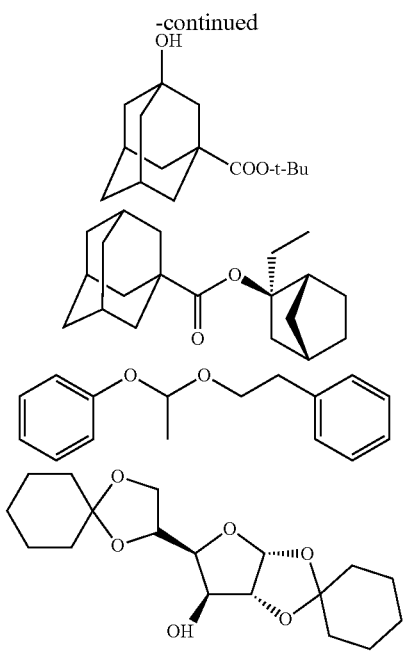

<Other Additives>

The composition of the present invention may further according to necessity contain a dye, a plasticizer, a photosensitizer, a light absorber, a compound capable of increasing the solubility in a developer (for example, a phenolic compound of 1000 or less molecular weight or a carboxylated alicyclic or aliphatic compound), etc.

The above phenolic compound of 1000 or less molecular weight can be easily synthesized by persons of ordinary skill in the art to which the present invention pertains while consulting the processes described in, for example, JP-As 4-122938 and 2-28531, U.S. Pat. No. 4,916,210 and EP 219294.

As the carboxylated alicyclic or aliphatic compound, there can be mentioned, for example, a carboxylic acid derivative of steroid structure such as cholic acid, deoxycholic acid or lithocholic acid, an adamantanecarboxylic acid derivative, adamantanedicarboxylic acid, cyclohexanecarboxylic acid, cyclohexanedicarboxylic acid or the like. These are however nonlimiting.

<Method of Forming Pattern>

From the viewpoint of enhancement of resolving power, it is preferred for the composition of the present invention to be used with a coating thickness of 30 to 250 nm. More preferably, the composition is used with a coating thickness of 30 to 200 nm. This coating thickness can be attained by setting the solid content of the composition within an appropriate range so as to cause the composition to have an appropriate viscosity, thereby improving the applicability and film forming property.

The total solids content of the actinic-ray- or radiation-sensitive resin composition is generally in the range of 1 to 10 mass %, preferably 1 to 8 mass % and more preferably 1 to 6 mass %.

The composition of the present invention is used in such a manner that the above components are dissolved in a given organic solvent, preferably the above mixed solvent, and filtered and applied onto a given support in the following manner. The filter medium for the filtration preferably consists of a polytetrafluoroethylene, polyethylene or nylon having a pore size of 0.1 µm or less, especially 0.05 µm or less and more especially 0.03 µm or less.

For example, an actinic-ray- or radiation-sensitive resin composition is applied onto a substrate, such as one for use in the production of precision integrated circuit elements (e.g., silicon/silicon dioxide coating), by appropriate application means, such as a spinner or coater, and dried to thereby form a film.

The film is exposed through a given mask to actinic rays or radiation, preferably baked (heated), and developed and rinsed. Accordingly, a desirable pattern can be obtained.

As the actinic rays or radiation, there can be mentioned infrared rays, visible light, ultraviolet rays, far ultraviolet rays, extreme ultraviolet rays, X-rays, electron beams or the like. Among them, preferred use is made of far ultraviolet rays of especially 250 nm or less, more especially 220 nm or less and still more especially 1 to 200 nm wavelength, such as a KrF excimer laser (248 nm), an ArF excimer laser (193 nm) and an $F_2$ excimer laser (157 nm), as well as X-rays, electron beams and the like. More preferred use is made of an ArF excimer laser, an $F_2$ excimer laser, EUV (13 nm) and electron beams.

Prior to the formation of at film, the substrate may be coated with an antireflection film.

As the antireflection film, use can be made of not only an inorganic film of titanium, titanium oxide, titanium nitride, chromium oxide, carbon, amorphous silicon or the like but also an organic film composed of a light absorber and a polymer material. Also, as the organic antireflection film, use can be made of commercially available organic antireflection films, such as the DUV30 Series and DUV40 Series produced by Brewer Science Inc. and AR-2, AR-3 and AR-5 produced by Shipley Co., Ltd.

Generally, an aqueous solution of any of quaternary ammonium salts, a typical example thereof being tetramethylammonium hydroxide, is employed as the alkali developer for use in the development step. However, other aqueous alkali solutions of an inorganic alkali, a primary amine, a secondary amine, a tertiary amine, an alcoholamine, a cycloamine, etc. can also be employed.

Before the use of the above alkali developer, appropriate amounts of an alcohol and a surfactant may be added thereto.

The alkali concentration of the alkali developer is generally in the range of 0.1 to 20 mass %.

The pH value of the alkali developer is generally in the range of 10.0 to 15.0.

Before the use of the above alkaline aqueous solution, appropriate amounts of an alcohol and a surfactant may be added thereto.

Pure water can be used as the rinse liquid. Before the use, an appropriate amount of surfactant may be added thereto.

The development operation or rinse operation may be followed by the operation for removing any developer or rinse liquid adhering onto the pattern by the use of a supercritical fluid.

EXAMPLES

The present invention will be described in greater detail below by way of its examples. However, the gist of the present invention is in no way limited to these examples.

Synthetic Example 1

Synthesis of Resin (C-1)

In a nitrogen atmosphere, 14 g of propylene glycol monomethyl ether acetate (PGMEA) was placed in a three-necked flask, and heated to 80° C. A solution obtained by dissolving 13.4 g of 2,2,3,3,4,4,4-heptafluoro-1-butyl methacrylate, 7.1 g of t-butyl methacrylate, 3.0 mol %, based on the amount of monomers, of polymerization initiator V-65 (produced by Wako Pure Chemical Industries, Ltd.) and 3.0 mol % of trimethylolethane tris(2-mercaptoacetato)trimethylol in 33 g of PGMEA was dropped into the heated PGMEA over a period of four hours. After the completion of dropping, reaction was continued at 80° C. for four hours. The reaction liquid was allowed to stand still to cool, and was dropped into a liquid mixture of 760 g of methanol and 40 g of distilled water over a period of 20 minutes. The thus precipitated powder was collected by filtration, and dried, thereby obtaining 14.5 g of resin (C-1).

With respect to the obtained resin (C-1), the standard-polystyrene-equivalent weight average molecular weight was 6,000 and the dispersity (Mw/Mn) was 1.5.

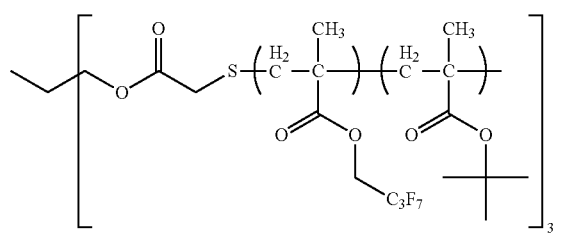

Synthetic Example 2

Synthesis of Resin (C-29)

In a nitrogen atmosphere, 10 g of methyl ethyl ketone was placed in a three-necked flask, and heated to 75° C. A solution obtained by dissolving 9.99 g of lactone monomer compound, 0.72 g of t-butylstyrene, 0.30 g of 2-ethylhexyl methacrylate, 3.0 mol %, based on the amount of monomers, of polymerization initiator V-601 (produced by Wako Pure Chemical Industries, Ltd.) and 1.5 mol % of pentaerythritol tetrakis(3-mercaptopropionate) in 18 g of methyl ethyl ketone was dropped into the heated methyl ethyl ketone over a period of four hours. After the completion of dropping, reaction was continued at 75° C. for four hours. The reaction liquid was allowed to stand still to cool, and was dropped into a liquid mixture of 350 g of hexane and 90 g of ethyl acetate over a period of 20 minutes. The thus precipitated powder was collected by filtration, and dried, thereby obtaining 9.9 g of resin (C-29).

With respect to the obtained resin (C-29), the standard-polystyrene-equivalent weight average molecular weight was 18,000 and the dispersity (Mw/Mn) was 1.8.

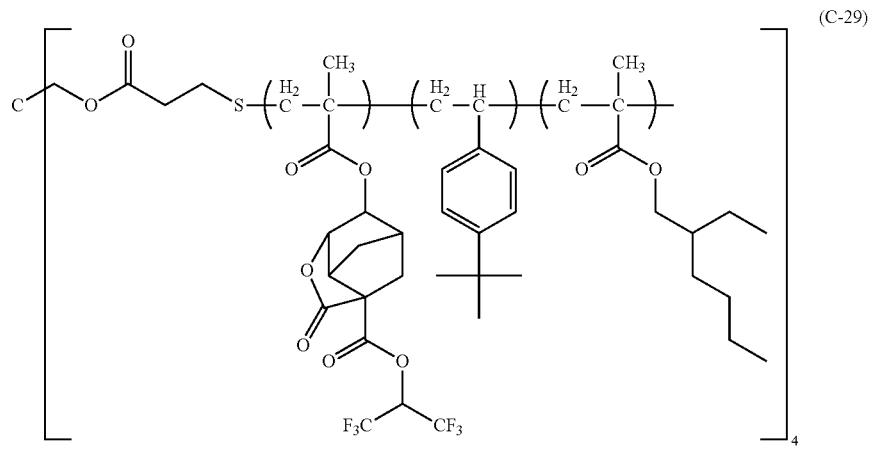

Other resins (C) of Table 3 below were synthesized in the same manner as described above.

Synthetic Example 3

Synthesis of Resin (C-56)

In a nitrogen atmosphere, 9.4 g of hexafluoroisopropyl methacrylate and 7.6 g of t-butyl acrylate were dissolved in 25 g of methyl ethyl ketone, and 1.84 g of mercaptoacetic acid and 3.0 mol %, based on the amount of monomers, of polymerization initiator V-65 (produced by Wako Pure Chemical Industries, Ltd.) were added to the solution. The reaction solution was heated at 70° C. for eight hours under agitation. The resultant reaction solution was allowed to stand still to cool to room temperature, and was dropped into a mixture of 300 ml of methanol and 30 ml of water, thereby precipitating a polymer. The precipitate was collected by filtration, and the thus obtained solid was dried in vacuum, thereby obtaining an intermediate. The obtained intermediate amounting to 10 g together with 9.4 g of triethylamine, 0.89 g of glycidyl methacrylate and 0.01 g of hydroquinone was dissolved in 20 ml of methyl ethyl ketone, heated to 60° C. and agitated for two hours. The reaction solution was allowed to stand still to cool to room temperature, and was dropped into a mixture of 300 ml of methanol and 30 ml of water, thereby precipitating a polymer. The precipitate was collected by filtration, and the thus obtained solid was dried in vacuum, thereby obtaining a macromonomer. A comb polymer was synthesized using the obtained macromonomer.

In a nitrogen atmosphere, 10 g of methyl ethyl ketone was placed in a three-necked flask, and heated to 75° C. A solution obtained by dissolving 7.5 g of lactone monomer compound, 1.2 g of t-butylstyrene, 5.5 g of macromonomer, 4.0 mol %, based on the amount of monomers, of polymerization initiator V-65 (produced by Wako Pure Chemical Industries, Ltd.) and 5.0 mol % of 1-dodecanethiol in 30 g of methyl ethyl ketone was dropped into the heated methyl ethyl ketone over a period of four hours. After the completion of dropping, reaction was continued at 75° C. for four hours. The reaction liquid was allowed to stand still to cool, and was dropped into a liquid mixture of 300 ml of methanol and 6 ml of water. The thus precipitated powder was collected by filtration, and dried, thereby obtaining 10.5 g of resin (C-56).

With respect to the obtained resin (C-56), the weight average molecular weight by GPC/MALLS was 19,000.

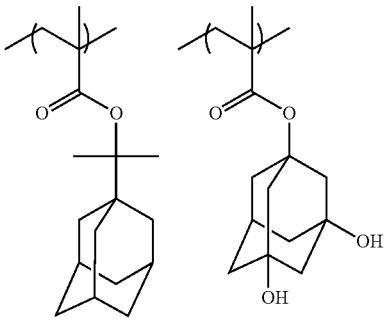

(1)

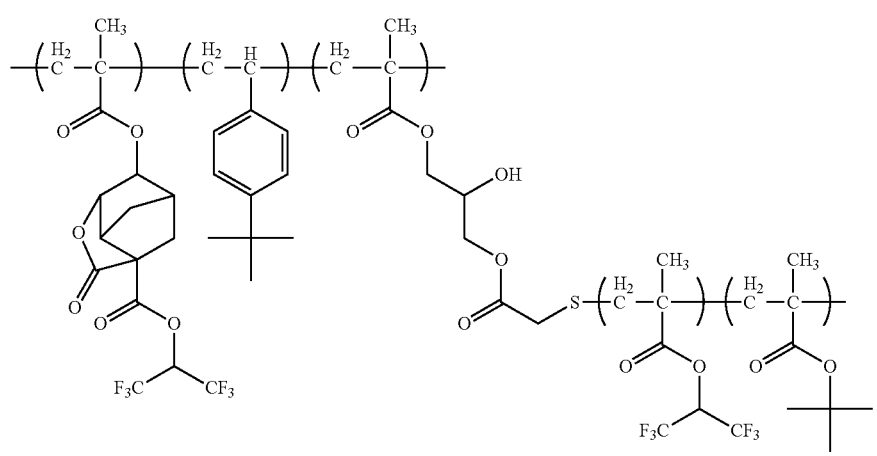

(C-56)

Synthetic Example 4

Synthesis of Resin (1)

In a nitrogen stream, 8.6 g of cyclohexanone was placed in a three-necked flask, and heated to 80° C. A solution obtained by dissolving 9.8 g of 2-adamantylisopropyl methacrylate, 4.4 g of dihydroxyadamantyl methacrylate, 8.9 g of norbornanelactone methacrylate and 8 mol %, based on the amount of monomers, of polymerization initiator V-601 (produced by Wako Pure Chemical Industries, Ltd.) in 79 g of cyclohexanone was dropped into the heated cyclohexanone over a period of six hours. After the completion of dropping, reaction was continued at 80° C. for two hours. The reaction liquid was allowed to stand still to cool, and was dropped into a liquid mixture of 800 ml of hexane and 200 ml of ethyl acetate over a period of 20 minutes. The thus precipitated powder was collected by filtration, and dried, thereby obtaining 19 g of resin (1).

With respect to the obtained resin (1), the standard-polystyrene-equivalent weight average molecular weight was 8,800 and the dispersity (Mw/Mn) was 1.9.

Other resins (A) (resins (2) to (25)) below were synthesized in the same manner as described above.

The structures of the acid-decomposable resins (A) used in the Examples are shown below. Table 2 below lists the molar ratios of individual repeating units (in order from the left in each structural formula), the weight average molecular weight (Mw) and the dispersity (Mw/Mn) with respect to each of the resins.

-continued

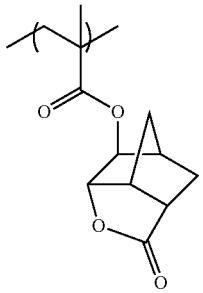

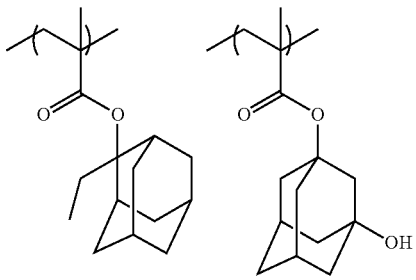

(2)

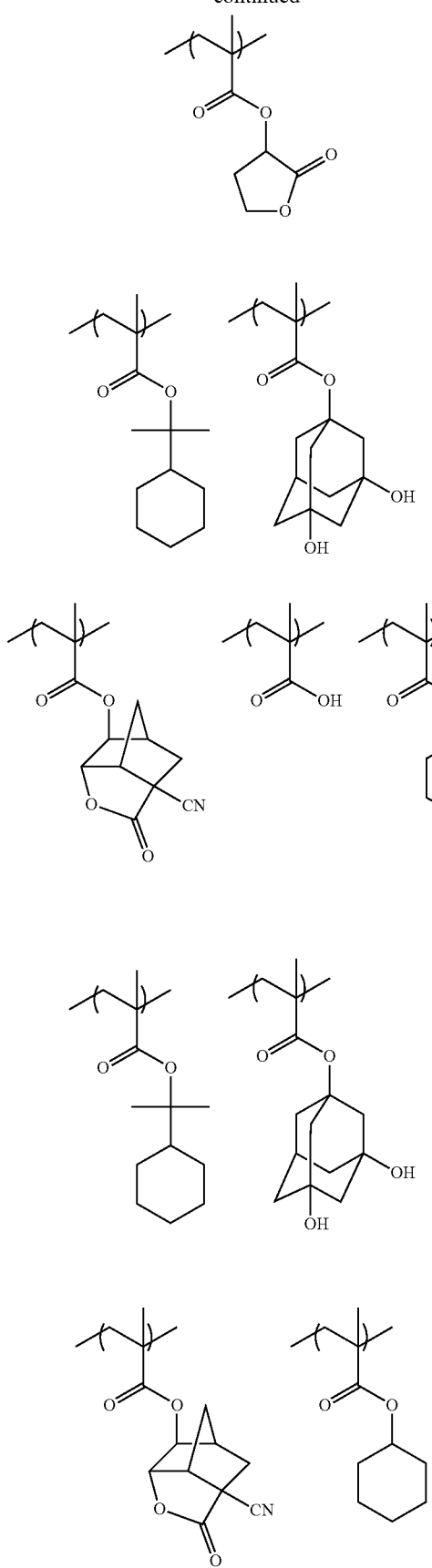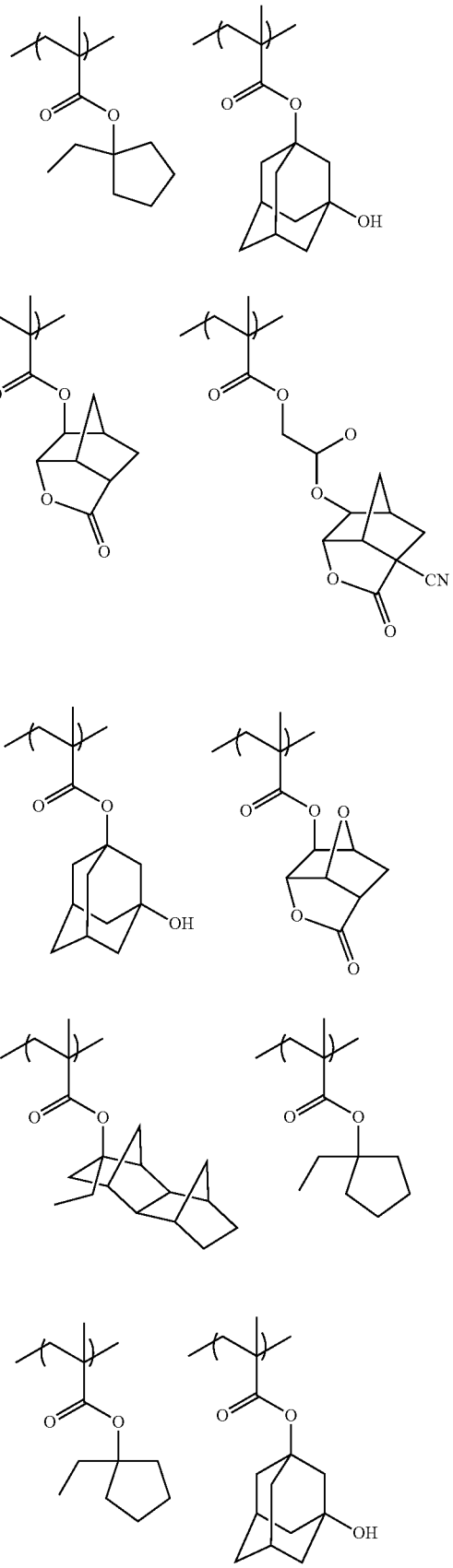

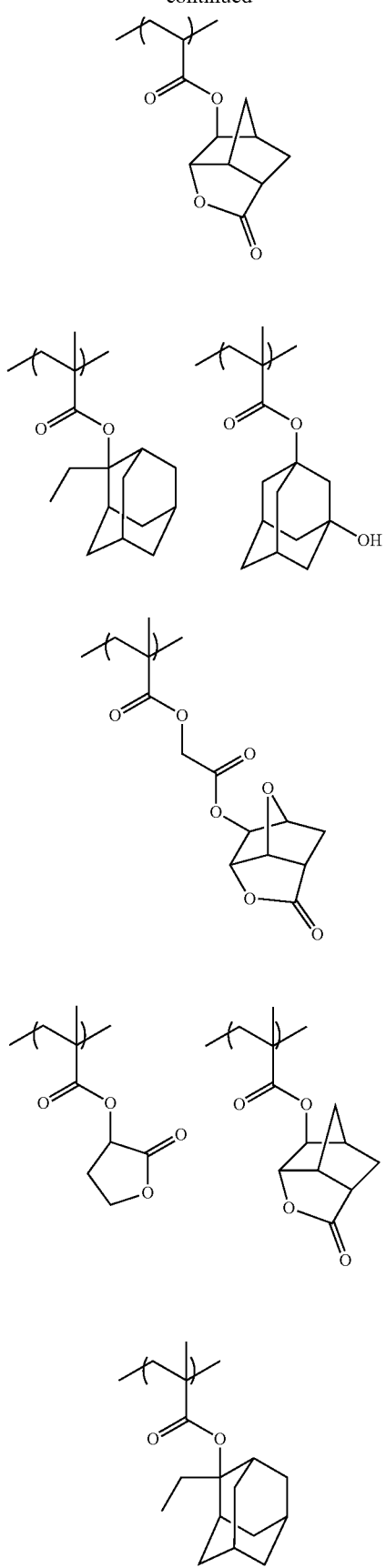
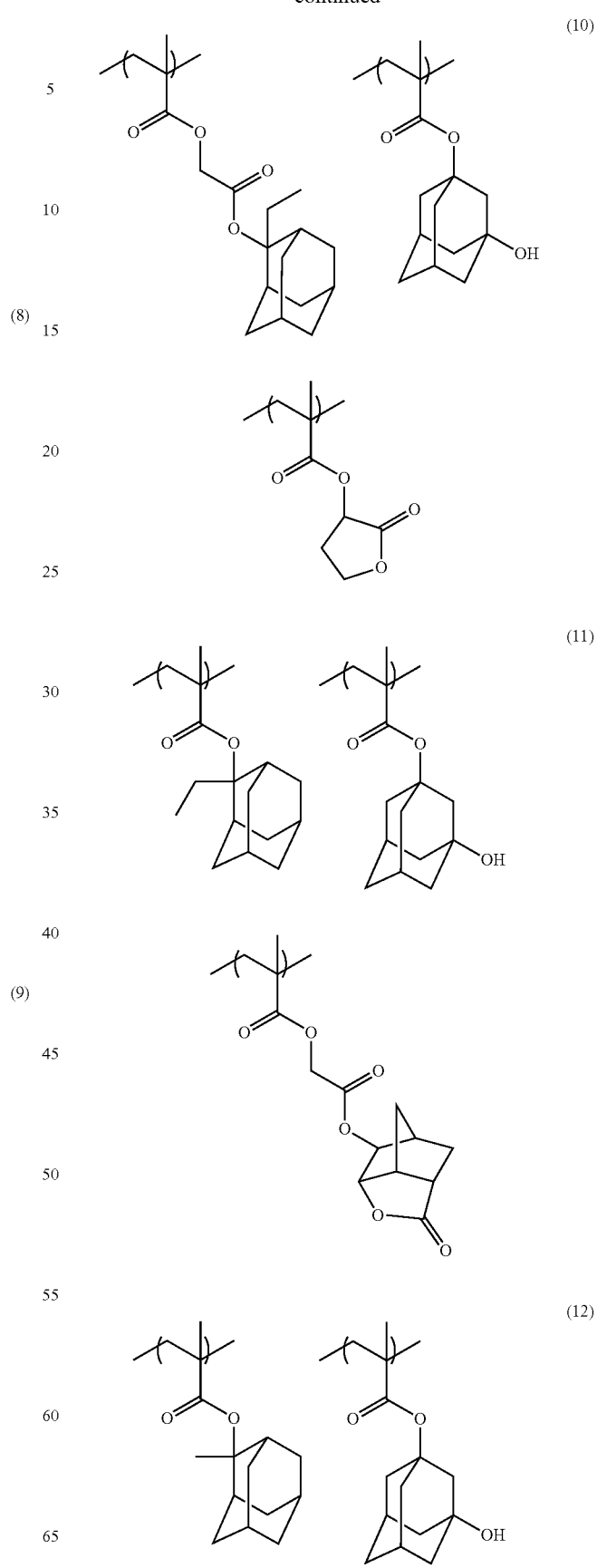

-continued
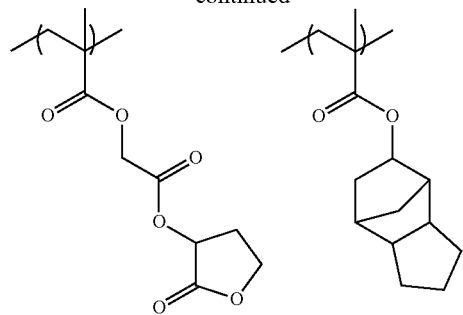
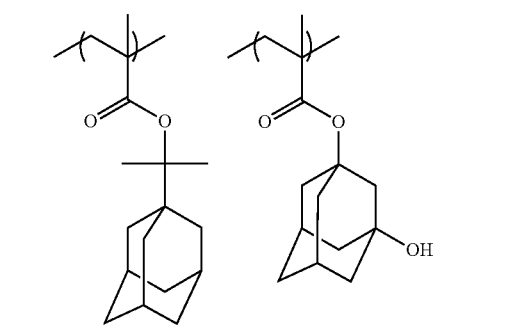
(13)
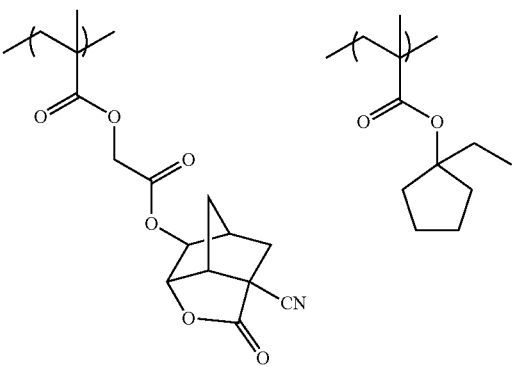
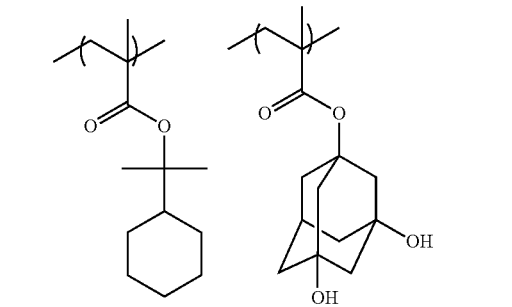
(14)
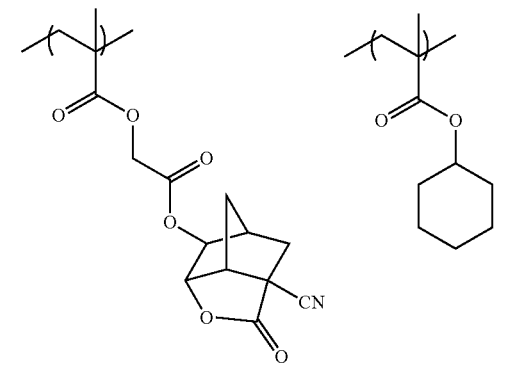
-continued
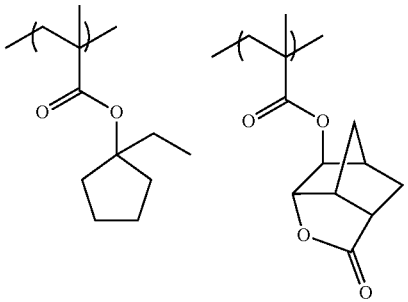
(15)
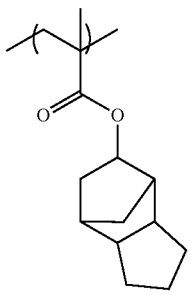
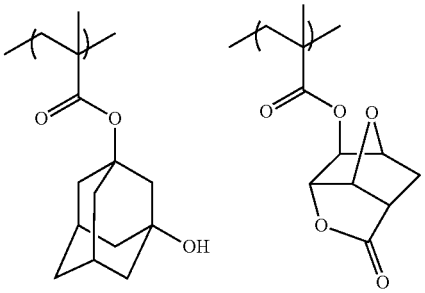
(16)
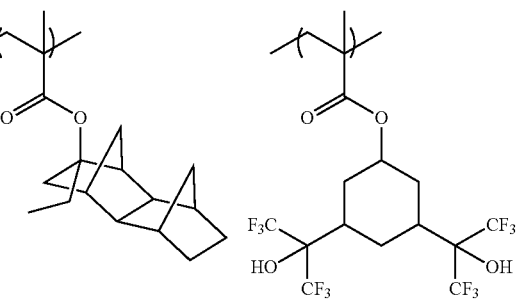
(17)
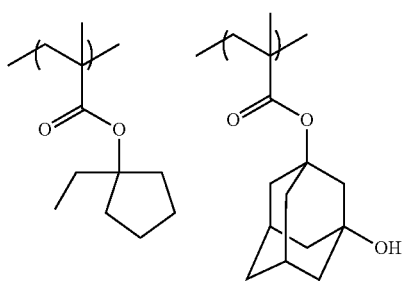

227
-continued
228
-continued
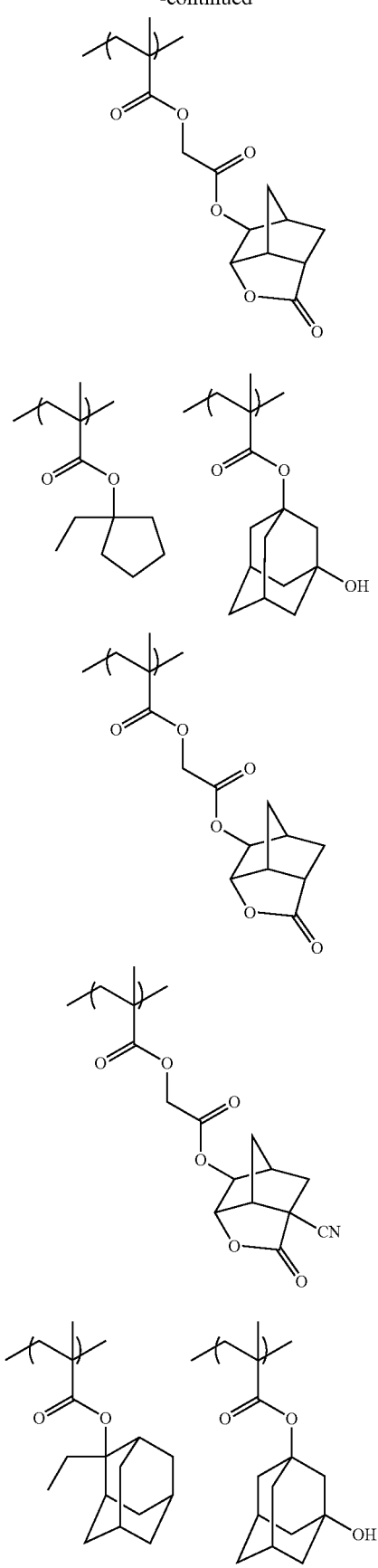
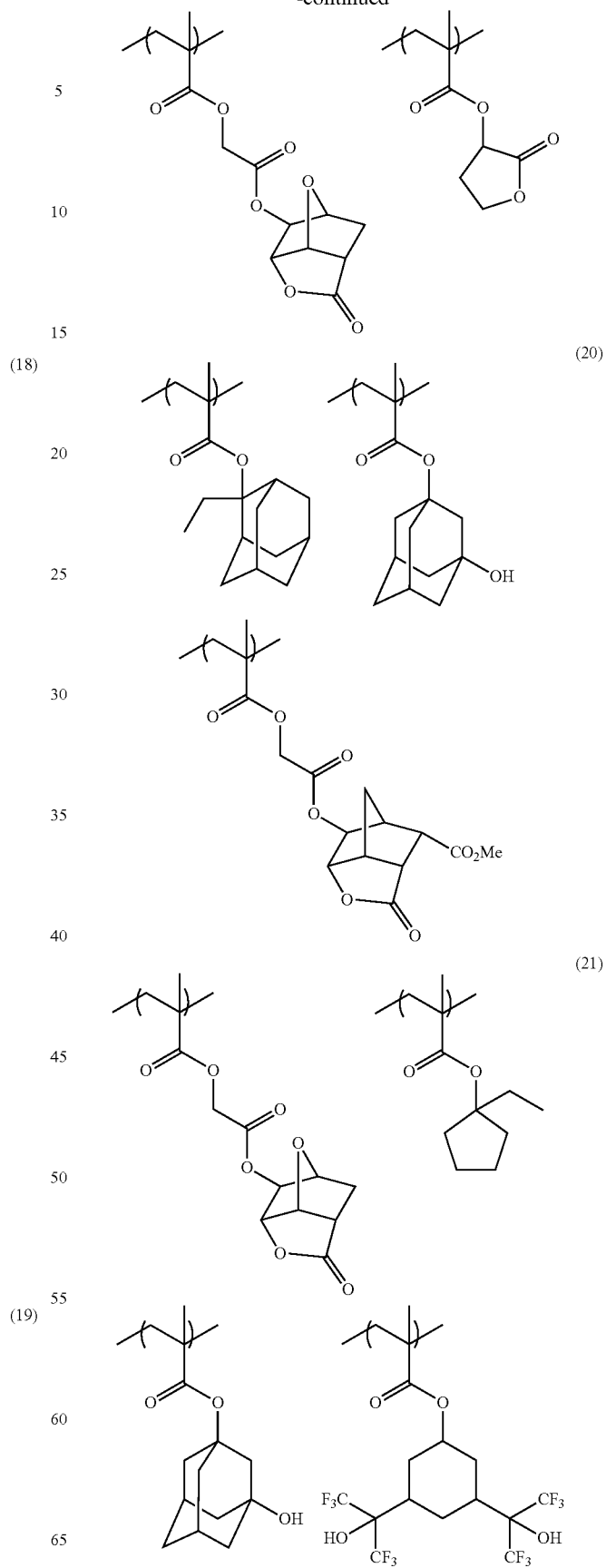

-continued
(22)
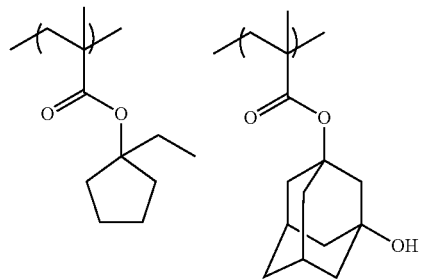
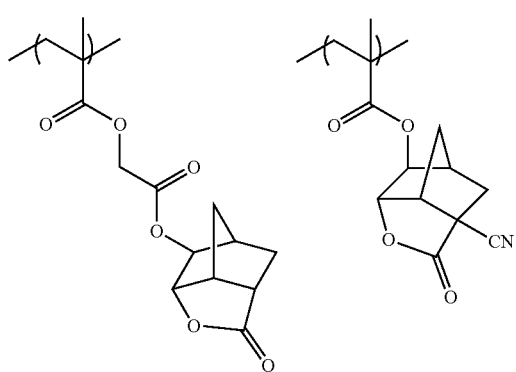
(23)
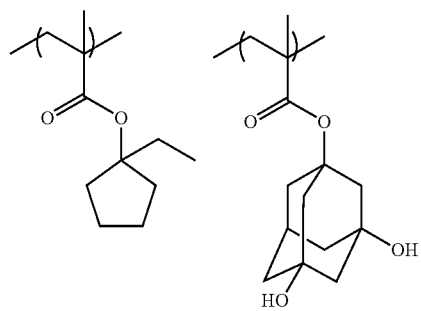
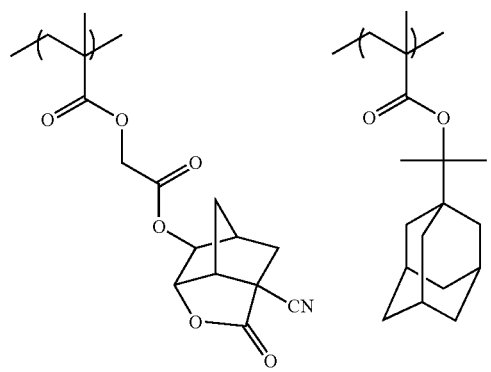
-continued
(24)
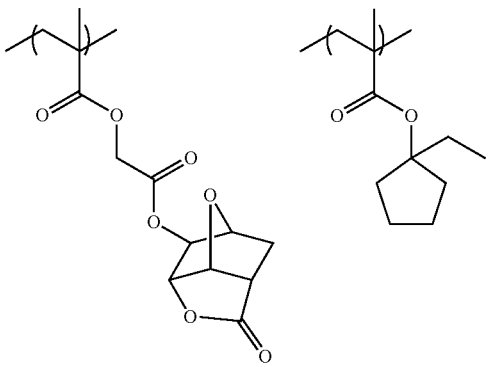
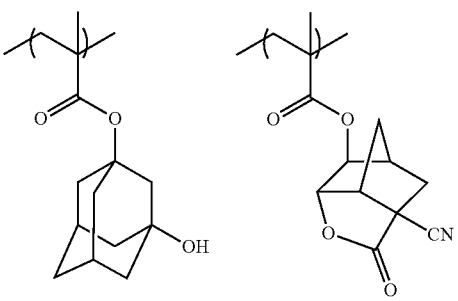
(25)
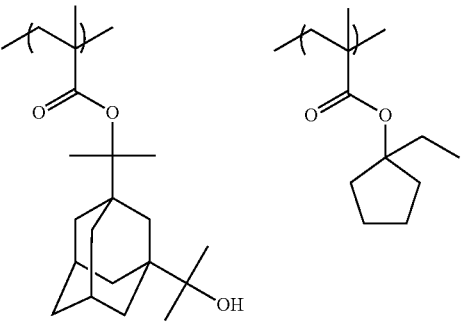
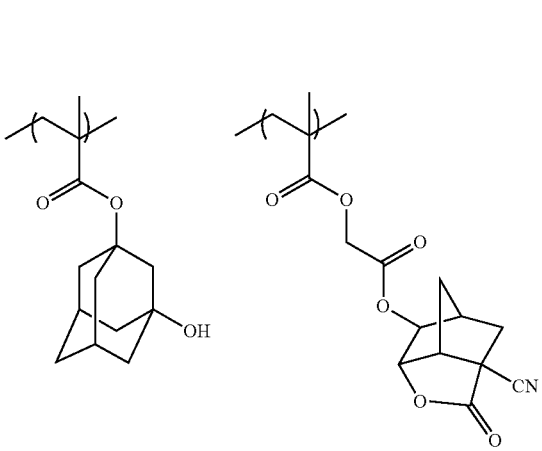

-continued

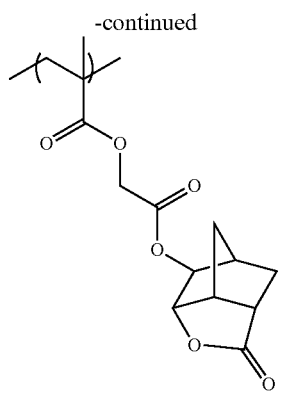

TABLE 2

| Resin (A) | Composition (molar ratio) | Mw | Mw/Mn |
|---|---|---|---|
| 1 | 50/10/40 | 8800 | 1.9 |
| 2 | 40/20/40 | 7000 | 1.6 |
| 3 | 40/10/35/5/10 | 10000 | 1.7 |
| 4 | 40/10/40/10 | 11000 | 1.8 |
| 5 | 40/15/20/25 | 8500 | 1.6 |
| 6 | 10/40/25/25 | 12000 | 1.8 |
| 7 | 50/20/30 | 6500 | 1.6 |
| 8 | 40/10/50 | 8000 | 1.7 |
| 9 | 25/25/50 | 9000 | 1.8 |
| 10 | 50/10/40 | 11000 | 1.8 |
| 11 | 50/10/40 | 8000 | 1.7 |
| 12 | 40/10/40/10 | 7000 | 1.7 |
| 13 | 20/15/35/30 | 10000 | 1.7 |
| 14 | 45/10/35/10 | 8500 | 1.7 |
| 15 | 50/40/10 | 10000 | 1.6 |
| 16 | 10/40/40/10 | 9000 | 1.8 |
| 17 | 55/10/35 | 12000 | 1.8 |
| 18 | 40/15/20/25 | 9000 | 1.7 |
| 19 | 40/15/30/15 | 7500 | 1.6 |
| 20 | 40/15/45 | 8000 | 1.6 |
| 21 | 40/40/10/10 | 9500 | 1.8 |
| 22 | 35/15/25/25 | 10000 | 1.7 |
| 23 | 30/15/40/15 | 8000 | 1.6 |
| 24 | 25/35/15/25 | 9000 | 1.8 |
| 25 | 15/30/10/23/22 | 10000 | 1.7 |

<Preparation of Actinic-Ray- or Radiation-Sensitive Resin Composition>

Components of Tables 3 and 4 below were dissolved in also indicated solvents, thereby obtaining solutions of 5 mass % solid content. The solutions were passed through a polyethylene filter of 0.1 μm pore size, thereby obtaining actinic-ray- or radiation-sensitive resin compositions (positive photosensitive resin compositions). The thus obtained positive photosensitive resin compositions were evaluated by the following methods, and the evaluation results are given in Tables 3 and 4.

<Image Performance Test>
[Exposure Condition: ArF Liquid-Immersion Exposure]

An organic antireflection film ARC29A (produced by Nissan Chemical Industries, Ltd.) was applied onto a silicon wafer (12 inch caliber) and baked at 205° C. for 60 seconds, thereby forming a 98 nm-thick antireflection film. Each of the prepared positive photosensitive resin compositions was applied thereonto and baked at 120° C. for 60 seconds, thereby forming a 120 nm-thick photosensitive film. The resultant wafer was exposed through a 6% half-tone mask of 1:1 line and space pattern of 75 nm line width by means of an ArF excimer laser liquid-immersion scanner (manufactured by ASML, XT1700i, NA 1.20, C-Quad, outer sigma 0.981, inner sigma 0.895, XY deflection). Ultrapure water was used as the immersion liquid. Thereafter, the exposed wafer was baked at 120° C. for 60 seconds, developed with an aqueous solution of tetramethylammonium hydroxide (2.38 mass %) for 30 seconds, rinsed with pure water and spin dried, thereby obtaining a resist pattern.

[Line Edge Roughness (LER)]

With respect to a 5 μm region of each longitudinal edge of a line pattern, the distance between actual edge and a reference line on which edges were to be present was measured at 50 points by means of a critical dimension scanning electron microscope (SEM model S-8840, manufactured by Hitachi, Ltd.). The standard deviation of measurements was determined, and 3σ was computed therefrom. The evaluation marks ○, Δ and x were given when the computed value was less than 5.0 nm, 5.0 to less than 7.0 nm and 7.0 nm or greater, respectively. The smaller the value thereof, the higher the performance exhibited.

[Scum]

The presence of any development residue (scum) on a resist pattern of 75 nm line width was observed by means of a scanning electron microscope (model 5-4800, manufactured by Hitachi, Ltd.). The evaluation mark ○* was given when no residue occurred at all. The evaluation mark x was given when the occurrence of residue was extreme. The evaluation mark ○ or Δ was given when the occurrence of residue was intermediate.

[Blob Defect]

With respect to each of the patterns formed on a silicon wafer (12 inch caliber) in the above-mentioned manner, random-mode measurement was carried out by means of a defect inspection apparatus KLA-2360 (trade name) manufactured by KLA-Tencor Corporation. In the defect inspection apparatus, the pixel size was set at 0.16 μm and the threshold value at 20. Any development defects extracted from differences generated by superimposition between a comparative image and the pixel unit were detected, and the number of development defects per area was calculated. The evaluation marks ○*, ○, Δ and x were given when the calculated value was less than 0.5, 0.5 to less than 1.0, 1.0 to less than 5.0 and 5.0 or greater, respectively. The less the value thereof, the better the performance exhibited.

[Receding Contact Angle]

Each of the prepared positive photosensitive resin compositions was applied onto a silicon wafer (8 inch caliber), and baked at 120° C. for 60 seconds, thereby forming a 120 nm-thick photosensitive film. The receding contact angle of each of the films with respect to a water droplet was measured in accordance with a dilation/contraction method by means of a dynamic contact angle meter (manufactured by Kyowa Interface Science Co., Ltd.). The receding contact angle was defined as the value of dynamic contact angle at which, in the five-seconds suction of a droplet of 35 μm initial size at a rate of 6 liter/second, the dynamic contact angle during suction was stabilized. The measurement was performed in an atmosphere of 23±3° C. and 45±5% relative humidity. The greater the value of the receding contact angle, the greater the scan speed at which water tracking is ensured.

TABLE 3

| | Resist composition | | | | | | Evaluation result | | | |
| --- | --- | --- | --- | --- | --- | --- | --- | --- | --- | --- |
| | Resin (A) (2 g) | Photoacid generator (mg) | Solvent (mass ratio) | Basic compound (mg) | Resin (C) (mg) | Surfactant (mg) | LER | Scum | BLOB defect | Receding contact angle (deg) |
| Ex. 1 | 1 | z55 (100) | SL-2/SL-4 60/40 | N-5/N-1 (7/7) | C-1 (80) | W-4 (2) | ○ | ○ | ○ | 75 |
| Ex. 2 | 2 | z66 (100) | SL-2/SL-4 60/40 | N-8/N-1 (7/7) | C-4 (80) | W-4 (2) | ○ | ○* | ○ | 65 |
| Ex. 3 | 3 | z70 (100) | SL-2/SL-4 60/40 | N-8/N-1 (7/7) | C-11 (100) | W-4 (2) | ○ | ○ | ○ | 70 |
| Ex. 4 | 4 | z72 (100) | SL-2/SL-4 60/40 | N-1 (10) | C-16 (20) | W-4 (2) | ○ | ○* | ○ | 80 |
| Ex. 5 | 5 | z67 (90) | SL-4/SL-2 40/60 | N-5 (7) | C-22 (80) | W-1 (3) | ○ | ○* | ○* | 65 |
| Ex. 6 | 6 | z72 (110) | SL-4/SL-2 40/60 | N-5 (7) | C-3 (80) | W-1 (3) | ○ | ○ | ○ | 70 |
| Ex. 7 | 7 | Y-7 (100) | SL-4/SL-2 40/60 | N-3 (6) | C-40 (20) | W-1 (3) | ○ | ○* | ○ | 80 |
| Ex. 8 | 8 | z2 (100) | SL-2/SL-4/SL-6 40/59/1 | N-6 (10) | C-15 (40) | W-3 (3) | ○ | ○* | ○ | 70 |
| Ex. 9 | 9 | Y-3 (100) | SL-2/SL-4/SL-6 40/59/1 | N-1 (7) | C-8 (40) | W-3 (3) | ○ | ○* | ○ | 70 |
| Ex. 10 | 10 | Y-43 (100) | SL-2/SL-4/SL-6 40/59/1 | N-2 (9) | C-13 (80) | W-3 (3) | ○ | ○* | ○* | 70 |
| Ex. 11 | 11 | z66 (100) | SL-2/SL-4 70/30 | N-3 (6) | C-37 (40) | W-6 (3) | ○ | ○* | ○* | 75 |
| Ex. 12 | 12 | z38/Y65 (40/60) | SL-2/SL-4 70/30 | N-3 (6) | C-53 (80) | W-6 (3) | ○ | ○* | ○ | 70 |
| Ex. 13 | 13 | z66 (100) | SL-2/SL-4 60/40 | N-7 (6) | C-55 (100) | W-1 (5) | ○ | ○* | ○* | 75 |
| Ex. 14 | 14 | Y-3 (100) | SL-3/SL-4 30/70 | N-6 (10) | C-49 (80) | W-5 (4) | ○ | ○* | ○* | 75 |
| Ex. 15 | 15 | z55 (100) | SL-2/SL-4/SL-5 40/58/2 | N-1 (7) | C-18 (40) | W-1 (4) | ○ | ○ | ○ | 70 |
| Ex. 16 | 16 | z72 (100) | SL-1/SL-2 60/40 | N-4 (13) | C-22 (80) | W-6 (4) | ○ | ○ | ○ | 70 |
| Ex. 17 | 17 | Y-4 (110) | SL-1/SL-2 60/40 | N-3 (6) | C-51 (100) | W-2 (3) | ○ | ○* | ○* | 70 |
| Ex. 18 | 18 | z-68 (100) | SL-2/SL-4/SL-6 40/59/1 | N-2 (9) | C-48 (60) | W-3 (3) | ○ | ○* | ○* | 75 |
| Ex. 19 | 19 | z66 (100) | SL-2/SL-4 60/40 | N-4 (7) | C-25 (160) | W-4 (2) | ○ | ○* | ○* | 75 |
| Ex. 20 | 20 | z90 (100) | SL-2/SL-4 60/40 | N-8/N-1 (7/7) | C-42 (80) | W-4 (2) | ○ | ○* | ○ | 70 |
| Ex. 21 | 21 | z44/z90 (300/80) | SL-2/SL-4 60/40 | N-4 (7) | C-29 (160) | W-4 (2) | ○ | ○* | ○* | 75 |
| Ex. 22 | 22 | z66/Y73 (80/400) | SL-2/SL-4 60/40 | N-1 (10) | C-25/C-16 (40/5) | W-4 (2) | ○ | ○* | ○* | 75 |
| Ex. 23 | 23 | z66 (100) | SL-4/SL-2 40/60 | N-5 (7) | C-31/C-16 (80/5) | W-4 (2) | ○ | ○* | ○* | 80 |
| Ex. 24 | 24 | z2 (100) | SL-4/SL-2 40/60 | D-51 (10) | C-26 80 | W-1 (3) | ○ | ○* | ○* | 70 |
| Ex. 25 | 25 | z66 (100) | SL-2/SL-4 60/40 | D-30/D-52 (7/7) | C-31 (80) | W-1 (5) | ○ | ○* | ○* | 75 |
| Ex. 26 | 25 | z2 (100) | SL-4/SL-2 40/60 | D-13 (10) | C-28 80 | — | ○ | ○* | ○* | 75 |
| Ex. 27 | 3/13 (1 g/1 g) | z66/Z44 (80/300) | SL-2/SL-4 60/40 | N-7 (6) | C-55 (100) | W-1 (5) | ○ | ○* | ○* | 75 |
| Ex. 28 | 13 | z66 (100) | SL-2/SL-4 60/40 | N-7 (6) | C-56 (50) | W-1 (5) | ○ | ○ | ○* | 75 |

TABLE 4

| | Resist composition | | | | | | Evaluation result | | | |
| --- | --- | --- | --- | --- | --- | --- | --- | --- | --- | --- |
| | Resin (A) (2 g) | Photoacid generator (mg) | Solvent (mass ratio) | Basic compound (mg) | Resin (C) (mg) | Surfactant (mg) | LER | Scum | BLOB defect | Receding contact angle (deg) |
| Ref. 1 | 21 | z44/z90 (300/80) | SL-2/SL-4 60/40 | N-4 (7) | C'-23 (160) | W-4 (2) | ○ | Δ | Δ | 75 |

TABLE 4-continued

| | Resist composition | | | | | | Evaluation result | | | Receding |
|---|---|---|---|---|---|---|---|---|---|---|
| | Resin (A) (2 g) | Photoacid generator (mg) | Solvent (mass ratio) | Basic compound (mg) | Resin (C) (mg) | Surfactant (mg) | LER | Scum | BLOB defect | contact angle (deg) |
| Ref. 2 | 22 | z66 (100) | SL-2/SL-4 60/40 | N-1 (10) | C'-25/C'-16 (40/5) | W-4 (2) | ○ | X | Δ | 75 |
| Comp. 1 | 1 | z55 (100) | SL-2/SL-4 60/40 | N-5/N-1 (7/7) | C'-1 (80) | W-4 (2) | X | X | X | 75 |
| Comp. 2 | 4 | z72 (100) | SL-2/SL-4 60/40 | N-1 (10) | C'-16 (20) | W-4 (2) | X | X | X | 80 |

The abbreviations and resins (C') of Tables 3 and 4 are as defined below.

The acid generators, resins (A), resins (C) and low-molecular basic compounds (D-30, 51 and 52) correspond to those set forth hereinbefore by way of example.

[Basic Compound]

N-1: N,N-dibutylaniline,

N-2: N,N-dihexylaniline,

N-3: 2,6-diisopropylaniline,

N-4: tri-n-octylamine,

N-5: N,N-dihydroxyethylaniline,

N-6: 2,4,5-triphenylimidazole,

N-7: tris(methoxyethoxyethyl)amine, and

N-8: 2-[2-{2-(2,2-dimethoxy-phenoxyethoxy)ethyl}-bis(2-methoxyethyl)]-amine.

[Surfactant]

W-1: Megafac F176 (produced by Dainippon Ink & Chemicals, Inc., fluorinated),

W-2: Megafac R08 (produced by Dainippon Ink & Chemicals, Inc., fluorinated and siliconized), W-3: polysiloxane polymer KP-341 (produced by Shin-Etsu Chemical Co., Ltd., siliconized), W-4: Troy Sol S-366 (produced by Troy Chemical Co., Ltd.), W-5: PF656 (produced by OMNOVA SOLUTIONS, INC., fluorinated), and W-6: PF6320 (produced by OMNOVA SOLUTIONS, INC., fluorinated).

[Solvent]

SL-1: cyclohexanone,

SL-2: propylene glycol monomethyl ether acetate (PGMEA: 1-methoxy-2-acetoxypropane), SL-3: ethyl lactate, SL-4: propylene glycol monomethyl ether (PGME: 1-methoxy-2-propanol), SL-5: γ-butyrolactone, and SL-6: propylene carbonate.

[Resin (C')]

Resins (C'-1), (C'-16), (C'-23) and (C'-25) were polymerized under the same conditions as in the polymerization of resins (C-1), (C-16), (C-23) and (C-25), respectively, except that the chain transfer agent was changed to 1-dodecanethiol.

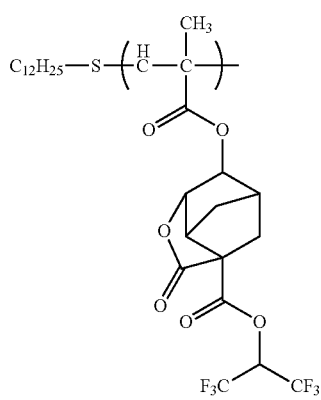

(C'-23)

It is apparent from the results of Tables 3 and 4 that the resist pattern formed using the actinic-ray- or radiation-sensitive resin composition of the present invention excels in all the performances of line edge roughness, scum, development defect and immersion liquid tracking property exhibited at liquid-immersion exposure.

What is claimed is:

1. An actinic-ray- or radiation-sensitive resin composition comprising:
   (A) a resin that when acted on by an acid, increases its solubility in an alkali developer,
       wherein the content ratio of the resin (A) is in the range of 60 to 95 mass % based on the total solids of the composition, and
       wherein the resin (A) is a linear polymer,
   (B) a compound that when exposed to actinic rays or radiation, generates an acid, and
   (C) a resin containing at least one group selected from among the following groups (x) to (z) and further containing at least a fluorine atom, in which three or more polymer chains which comprise a plurality of repeating units are contained through at least one branch point,
   (x) an alkali-soluble group,
   (y) a group that when acted on by an alkali developer, is decomposed to thereby increase its solubility in the alkali developer, and
   (z) a group that when acted on by an acid, is decomposed to thereby increase its solubility in an alkali developer,
   wherein the content ratio of the resin (C) is in the range of 0.01 to 20 mass % based on the total solids of the composition, and
   wherein the resin (C) is a star polymer.

2. The actinic-ray- or radiation-sensitive resin composition according to claim 1, wherein the content ratio of the resin (C) is in the range of 0.1 to 10 mass % based on the total solids of the composition.

3. The actinic-ray- or radiation-sensitive resin composition according to claim 1, wherein the resin (C) comprises a repeating unit containing at least one of groups of any of general formulae (F2) to (F4):

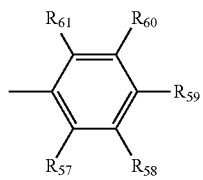
(F2)

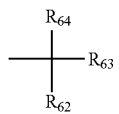
(F3)

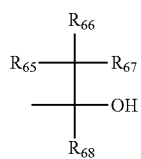
(F4)

in general formulae (F2) to (F4),
each of $R_{57}$ to $R_{68}$ independently represents a hydrogen atom, a fluorine atom or an alkyl group, provided that at least one among $R_{57}$ to $R_{61}$, among $R_{62}$ to $R_{64}$ and among $R_{65}$ to $R_{68}$ is a fluorine atom or an alkyl group substituted with at least one fluorine atom, and provided that $R_{62}$ and $R_{63}$ may be linked to each other to thereby form a ring.

4. The actinic-ray- or radiation-sensitive resin composition according to claim 1, wherein the resin (C) comprises a repeating unit containing in its side chain a group (y) that when acted on by an alkali developer, is decomposed to thereby increase its solubility in the alkali developer, which side chain contains at least either a fluorine atom or a silicon atom.

5. The actinic-ray- or radiation-sensitive resin composition according to claim 1, wherein the resin (A) comprises a repeating unit containing a lactone structure.

6. The actinic-ray- or radiation-sensitive resin composition according to claim 5, wherein the resin (A) comprises at least any of repeating units of general formula (1) as the repeating unit containing a lactone structure,

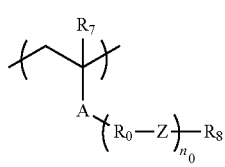
(1)

in which
A represents an ester bond (—COO—) or an amido bond (—CONH—), $R_0$ represents an alkylene group, a cycloalkylene group or a combination thereof, provided that a plurality of $R_0$'s may be identical to or different from each other, Z represents an ether bond, an ester bond, a carbonyl bond, an amido bond, a urethane bond or a urea bond, provided that a plurality of Z's may be identical to or different from each other, $R_8$ represents a monovalent organic group with a lactone structure, $n_0$ is the number of repetitions of the structure of the formula —$R_0$—Z—, being an integer of 1 to 5, and $R_7$ represents a hydrogen atom, a halogen atom or an alkyl group.

7. The actinic-ray- or radiation-sensitive resin composition according to claim 1, which produces a film that before exposure, exhibits a receding contact angle of 70° or greater with water.

8. A resist film produced from the actinic-ray- or radiation-sensitive resin composition according to claim 1.

9. A method of forming a pattern, comprising forming the actinic-ray- or radiation-sensitive resin composition of claim 1 into a film, exposing the film and developing the exposed film.

10. The method of forming a pattern according to claim 9, wherein the exposure is carried out by a liquid immersion exposure.

11. The actinic-ray- or radiation-sensitive resin composition according to claim 1, wherein the resin (A) contains no aromatic group.

12. The actinic-ray- or radiation-sensitive resin composition according to claim 1, wherein the resin (A) contains a repeating unit having an group that is decomposed by the action of an acid to thereby produce an alkali-soluble group, the repeating unit is at least either any of the repeating units of general formula (AI-1) below or any of the repeating units of general formula (AI-2) below,

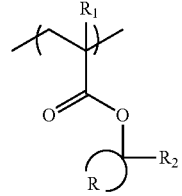
(AI-1)

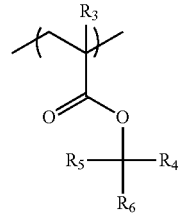
(AI-2)

in general formulae (AI-1) and (AI-2),
each of $R_1$ and $R_3$ independently represents a hydrogen atom, an optionally substituted methyl group or any of the groups of the formula —$CH_2$—$R_9$, $R_9$ represents a monovalent organic group, each of $R_2$, $R_4$, $R_5$ and $R_6$ independently represents an alkyl group or a cycloalkyl group, R represents an atomic group required for forming an alicyclic structure in cooperation with a carbon atom.

* * * * *